US011992935B2

(12) United States Patent
Bryner et al.

(10) Patent No.: US 11,992,935 B2
(45) Date of Patent: May 28, 2024

(54) METHODS AND APPARATUS FOR VERIFIABLE INSPECTION OPERATIONS

(71) Applicant: Gecko Robotics, Inc., Pittsburgh, PA (US)

(72) Inventors: Edward A. Bryner, Pittsburgh, PA (US); Edwin H. Cho, Pittsburgh, PA (US); Kevin Y. Low, Pittsburgh, PA (US); Michael A. Binger, Pittsburgh, PA (US)

(73) Assignee: Gecko Robotics, Inc., Pittsburgh, PA (US)

( * ) Notice: Subject to any disclaimer, the term of this patent is extended or adjusted under 35 U.S.C. 154(b) by 7 days.

(21) Appl. No.: 17/752,059

(22) Filed: May 24, 2022

(65) Prior Publication Data
US 2022/0331986 A1  Oct. 20, 2022

Related U.S. Application Data

(63) Continuation of application No. 17/716,249, filed on Apr. 8, 2022, now Pat. No. 11,865,698.
(Continued)

(51) Int. Cl.
*B62D 57/024* (2006.01)
*B25J 5/00* (2006.01)
(Continued)

(52) U.S. Cl.
CPC ............. *B25J 13/087* (2013.01); *B25J 5/007* (2013.01); *B25J 9/0009* (2013.01); *B25J 9/1617* (2013.01);
(Continued)

(58) Field of Classification Search
CPC . G01N 29/265; F16L 2101/30; B62D 57/024; G05B 2219/45066; Y10S 901/01;
(Continued)

(56) References Cited

U.S. PATENT DOCUMENTS 2,135,307 A   11/1938  Keator
2,694,164 A   11/1954  Geppelt
(Continued)

FOREIGN PATENT DOCUMENTS

BR   PI0805432 A2   9/2010
CN   101368932 A   2/2009
(Continued)

OTHER PUBLICATIONS

"All Metals Fabrication", Painting Metal, Aug. 27, 2015.
(Continued)

*Primary Examiner* — Dale Moyer
(74) *Attorney, Agent, or Firm* — GTC Law Group PC & Affiliates

(57) ABSTRACT

Methods and apparatus for verifiable inspection operations are described. An example apparatus may have an inspection description circuit to interpret an inspection definition value and a payload status circuit to provide a payload identification value in response to at least one of a payload specific configuration or signals from a payload. The example apparatus may also have an inspection integrity circuit to determine an inspection description value in response to the inspection definition value and the payload identification value and an inspection reporting circuit to communicate the inspection description value to an external device.

16 Claims, 87 Drawing Sheets

Related U.S. Application Data

(60) Provisional application No. 63/255,880, filed on Oct. 14, 2021, provisional application No. 63/177,141, filed on Apr. 20, 2021.

(51) Int. Cl.
    *B25J 9/00* (2006.01)
    *B25J 9/16* (2006.01)
    *B25J 13/00* (2006.01)
    *B25J 13/08* (2006.01)
    *B25J 19/02* (2006.01)
    *B60B 19/00* (2006.01)
    *B60B 19/12* (2006.01)
    *B60K 1/02* (2006.01)
    *B62D 53/02* (2006.01)
    *G01N 29/04* (2006.01)
    *G01N 29/22* (2006.01)
    *G01N 29/265* (2006.01)
    *G06F 1/20* (2006.01)
    *H05K 1/18* (2006.01)

(52) U.S. Cl.
    CPC .............. *B25J 9/163* (2013.01); *B25J 9/1653* (2013.01); *B25J 9/1664* (2013.01); *B25J 9/1674* (2013.01); *B25J 9/1694* (2013.01); *B25J 13/006* (2013.01); *B25J 19/021* (2013.01); *B25J 19/027* (2013.01); *B60B 19/006* (2013.01); *B60B 19/12* (2013.01); *B60K 1/02* (2013.01); *B62D 53/02* (2013.01); *B62D 57/024* (2013.01); *G01N 29/04* (2013.01); *G01N 29/226* (2013.01); *G01N 29/265* (2013.01); *G06F 1/206* (2013.01); *H05K 1/18* (2013.01); *B60B 2360/102* (2013.01); *B60B 2360/104* (2013.01); *B60B 2360/109* (2013.01); *B60B 2900/931* (2013.01); *G01N 2291/0289* (2013.01); *G01N 2291/2698* (2013.01); *G06F 2200/201* (2013.01); *H05K 2201/10151* (2013.01)

(58) Field of Classification Search
    CPC ........ B25J 5/007; B25J 9/0009; B25J 9/1653; B25J 9/1694; B25J 13/087; B25J 19/027
    See application file for complete search history.

(56) References Cited

U.S. PATENT DOCUMENTS

| | | | |
|---|---|---|---|
| 2,861,700 A | 11/1958 | James |
| 3,028,753 A | 4/1962 | Joy |
| 3,055,210 A | 9/1962 | Joy |
| 3,279,242 A | 10/1966 | Megoloff |
| 3,326,037 A | 6/1967 | John |
| 3,420,097 A | 1/1969 | Batterman et al. |
| 3,427,866 A | 2/1969 | Weighart |
| 3,437,786 A | 4/1969 | Colinet et al. |
| 3,483,734 A | 12/1969 | Wood |
| 3,486,368 A | 12/1969 | Brech |
| 3,690,393 A | 9/1972 | Guy |
| 3,741,003 A | 6/1973 | Gunkel |
| 3,789,700 A | 2/1974 | Cotreau et al. |
| 3,837,202 A | 9/1974 | Hetherington et al. |
| 3,895,685 A | 7/1975 | Gillette et al. |
| 3,952,581 A | 4/1976 | Gottelt |
| 4,027,528 A | 6/1977 | Tyree |
| 4,033,178 A | 7/1977 | Holt et al. |
| 4,043,185 A | 8/1977 | Siebert |
| 4,055,990 A | 11/1977 | Topping |
| 4,105,972 A | 8/1978 | Smith |
| 4,304,134 A | 12/1981 | Rouse et al. |
| 4,355,536 A | 10/1982 | McShane et al. |
| 4,368,644 A | 1/1983 | Wentzell et al. |
| 4,391,134 A | 7/1983 | Theurer et al. |
| 4,437,332 A | 3/1984 | Pittaro |
| 4,495,587 A | 1/1985 | Plante et al. |
| 4,526,037 A | 7/1985 | Wentzell et al. |
| 4,537,136 A | 8/1985 | Douglas |
| 4,567,514 A | 1/1986 | Morgan et al. |
| 4,596,144 A | 6/1986 | Panton et al. |
| 4,654,702 A | 3/1987 | Tolino et al. |
| 4,706,120 A | 11/1987 | Slaughter et al. |
| 4,757,258 A | 7/1988 | Kelly, Jr. et al. |
| 4,840,090 A | 6/1989 | Iwata |
| 4,862,748 A | 9/1989 | Woodmansee |
| 4,879,973 A | 11/1989 | Maeyama et al. |
| 4,881,405 A | 11/1989 | Paquet |
| 4,893,286 A | 1/1990 | Cobb |
| 4,954,949 A | 9/1990 | Rubin |
| 4,964,059 A | 10/1990 | Sugaya et al. |
| 5,006,799 A | 4/1991 | Pfanstiehl |
| 5,007,291 A | 4/1991 | Walters et al. |
| 5,038,615 A | 8/1991 | Trulson et al. |
| 5,062,298 A | 11/1991 | Falcoff et al. |
| 5,097,710 A | 3/1992 | Palynchuk |
| 5,175,415 A | 12/1992 | Guest |
| 5,269,202 A | 12/1993 | Kiyosawa et al. |
| 5,271,274 A | 12/1993 | Khuri-yakub et al. |
| 5,285,689 A | 2/1994 | Hapstack et al. |
| 5,350,033 A | 9/1994 | Kraft |
| 5,426,980 A | 6/1995 | Smith |
| 5,429,009 A | 7/1995 | Wolfe et al. |
| 5,440,929 A | 8/1995 | Huang et al. |
| 5,549,004 A | 8/1996 | Nugent |
| 5,559,696 A | 9/1996 | Borenstein |
| 5,619,423 A | 4/1997 | Scrantz |
| 5,635,644 A | 6/1997 | Ishikawa et al. |
| 5,663,502 A | 9/1997 | Nagashima et al. |
| 5,764,014 A | 6/1998 | Jakeway et al. |
| 5,782,253 A | 7/1998 | Cates et al. |
| 5,809,099 A | 9/1998 | Kim et al. |
| 5,853,655 A | 12/1998 | Baker |
| 5,857,534 A | 1/1999 | Devault et al. |
| 5,929,338 A | 7/1999 | Frankel et al. |
| 5,948,985 A | 9/1999 | Brautigan et al. |
| 6,000,484 A | 12/1999 | Zoretich et al. |
| 6,064,428 A | 5/2000 | Trosino et al. |
| 6,076,407 A | 6/2000 | Levesque et al. |
| 6,104,970 A | 8/2000 | Schmidt, Jr. et al. |
| 6,125,955 A | 10/2000 | Zoretich et al. |
| 6,145,583 A | 11/2000 | Gay et al. |
| 6,150,809 A | 11/2000 | Tiernan et al. |
| 6,220,099 B1 | 4/2001 | Marti et al. |
| 6,234,025 B1 | 5/2001 | Gieske et al. |
| 6,243,657 B1 | 6/2001 | Tuck et al. |
| 6,273,521 B1 | 8/2001 | Halvorson et al. |
| 6,298,727 B1 | 10/2001 | Fleming et al. |
| 6,317,387 B1 | 11/2001 | D'Amaddio et al. |
| 6,454,036 B1 | 9/2002 | Airey et al. |
| 6,931,931 B2 | 8/2005 | Graff et al. |
| 6,981,417 B1 | 1/2006 | Oravecz |
| 7,337,673 B2 | 3/2008 | Kennedy et al. |
| 7,430,913 B2 | 10/2008 | Sarr |
| 7,733,084 B1 | 6/2010 | Odell et al. |
| 7,743,660 B2 | 6/2010 | Marsh et al. |
| 7,859,655 B2 | 12/2010 | Troy et al. |
| 8,570,629 B2 | 10/2013 | Spears |
| 8,833,169 B2 | 9/2014 | Lute et al. |
| 8,943,892 B2 | 2/2015 | Garvey et al. |
| 9,121,817 B1 | 9/2015 | Roach et al. |
| 9,221,506 B1 | 12/2015 | Georgeson et al. |
| 9,285,296 B2 | 3/2016 | Georgeson et al. |
| 9,310,482 B2 | 4/2016 | Rosenberg et al. |
| 9,335,305 B2 | 5/2016 | Smith et al. |
| 9,427,874 B1 | 8/2016 | Rublee |
| 9,463,574 B2 | 10/2016 | Purkayastha et al. |
| 9,586,636 B1 | 3/2017 | Burmeister et al. |
| 9,664,652 B2 | 5/2017 | Fetzer et al. |
| 9,733,219 B2 | 8/2017 | Spencer et al. |
| 9,784,599 B1 | 10/2017 | Close et al. |
| 9,796,089 B2 | 10/2017 | Lawrence, III et al. |

(56) References Cited

U.S. PATENT DOCUMENTS

| | | |
|---|---|---|
| 9,863,891 B1 | 1/2018 | Lara Magallanes et al. |
| 9,863,919 B2 | 1/2018 | Carrasco Zanini et al. |
| 9,963,836 B1 | 5/2018 | Brenner et al. |
| 10,281,912 B2 | 5/2019 | Hollister |
| 10,317,905 B2 | 6/2019 | Ouellette et al. |
| 10,481,608 B2 | 11/2019 | Loosararian et al. |
| 10,534,365 B2 | 1/2020 | Loosararian et al. |
| 10,689,113 B2 | 6/2020 | Prager et al. |
| 10,698,412 B2 | 6/2020 | Loosararian et al. |
| 10,739,779 B2 | 8/2020 | Loosararian et al. |
| 10,795,373 B2 | 10/2020 | Loosararian et al. |
| 10,884,423 B2 | 1/2021 | Loosararian et al. |
| 10,895,878 B2 | 1/2021 | Loosararian et al. |
| 10,942,522 B2 | 3/2021 | Loosararian et al. |
| 11,135,721 B2 | 10/2021 | Bryner et al. |
| 11,144,063 B2 | 10/2021 | Loosararian et al. |
| 11,148,292 B2 | 10/2021 | Bryner et al. |
| 11,157,012 B2 | 10/2021 | Loosararian et al. |
| 11,157,013 B2 | 10/2021 | Loosararian et al. |
| 11,307,063 B2 | 4/2022 | Low et al. |
| 11,327,052 B2 | 5/2022 | Gagnon et al. |
| 11,365,068 B2 | 6/2022 | Wertenberger et al. |
| 11,385,650 B2 | 7/2022 | Loosararian et al. |
| 11,429,109 B2 | 8/2022 | Loosararian et al. |
| 11,511,426 B2 | 11/2022 | Bryner et al. |
| 11,518,030 B2 | 12/2022 | Bryner et al. |
| 11,518,031 B2 | 12/2022 | Bryner et al. |
| 11,529,735 B2 | 12/2022 | Bryner et al. |
| 11,548,577 B2 | 1/2023 | Abdellatif et al. |
| 11,565,417 B2 | 1/2023 | Bryner et al. |
| 11,648,671 B2 | 5/2023 | Bryner et al. |
| 11,669,100 B2 | 6/2023 | Loosararian et al. |
| 11,673,272 B2 | 6/2023 | Loosararian et al. |
| 11,740,635 B2 | 8/2023 | Loosararian et al. |
| 11,850,726 B2 | 12/2023 | Bryner et al. |
| 2002/0111712 A1 | 8/2002 | Peshkin et al. |
| 2002/0134159 A1 | 9/2002 | He |
| 2002/0143421 A1 | 10/2002 | Wetzer |
| 2002/0168532 A1 | 11/2002 | Sinsel et al. |
| 2002/0190682 A1 | 12/2002 | Schempf et al. |
| 2003/0060930 A1 | 3/2003 | Fujita et al. |
| 2003/0089267 A1 | 5/2003 | Ghorbel et al. |
| 2003/0129872 A1 | 7/2003 | Tolmie |
| 2003/0137268 A1 | 7/2003 | Papanikolopoulos et al. |
| 2003/0172735 A1 | 9/2003 | Lam et al. |
| 2003/0188589 A1 | 10/2003 | Harthorn et al. |
| 2004/0050165 A1 | 3/2004 | He |
| 2004/0173116 A1 | 9/2004 | Ghorbel et al. |
| 2004/0177681 A1 | 9/2004 | Harthorn et al. |
| 2004/0207394 A1 | 10/2004 | Harthorn et al. |
| 2004/0262060 A1 | 12/2004 | Kim |
| 2005/0016008 A1 | 1/2005 | Raab et al. |
| 2005/0056105 A1 | 3/2005 | Delacroix et al. |
| 2005/0065651 A1 | 3/2005 | Ayers et al. |
| 2005/0150300 A1 | 7/2005 | Nenno et al. |
| 2005/0174086 A1 | 8/2005 | Iwashita et al. |
| 2005/0183506 A1 | 8/2005 | Kawabata |
| 2005/0252296 A1 | 11/2005 | Hock et al. |
| 2006/0027952 A1 | 2/2006 | Meissner et al. |
| 2006/0037430 A1 | 2/2006 | Kiyosawa et al. |
| 2006/0055399 A1 | 3/2006 | Georgeson et al. |
| 2006/0138732 A1 | 6/2006 | Buma et al. |
| 2006/0162610 A1 | 7/2006 | Reboredo et al. |
| 2006/0243051 A1 | 11/2006 | Bui et al. |
| 2007/0006657 A1 | 1/2007 | Kennedy et al. |
| 2007/0006658 A1 | 1/2007 | Kennedy et al. |
| 2007/0044562 A1 | 3/2007 | Sarr |
| 2007/0044564 A1 | 3/2007 | Bui et al. |
| 2007/0146480 A1 | 6/2007 | Judge et al. |
| 2007/0195712 A1 | 8/2007 | Thayer et al. |
| 2007/0217672 A1 | 9/2007 | Shannon et al. |
| 2007/0227250 A1 | 10/2007 | Kennedy et al. |
| 2007/0278851 A1 | 12/2007 | Nakamura et al. |
| 2008/0039974 A1 | 2/2008 | Sandin et al. |
| 2008/0054540 A1 | 3/2008 | Buma |
| 2008/0059114 A1 | 3/2008 | Coperet |
| 2008/0079723 A1 | 4/2008 | Hanson et al. |
| 2008/0087112 A1 | 4/2008 | Bagley et al. |
| 2008/0087113 A1 | 4/2008 | Bagley et al. |
| 2008/0148876 A1 | 6/2008 | Hock et al. |
| 2008/0202245 A1 | 8/2008 | Young |
| 2008/0220692 A1 | 9/2008 | Torres et al. |
| 2008/0230289 A1 | 9/2008 | Schoon et al. |
| 2008/0302200 A1 | 12/2008 | Tobey |
| 2009/0078484 A1 | 3/2009 | Kocijan |
| 2009/0114025 A1 | 5/2009 | Sato et al. |
| 2009/0224493 A1 | 9/2009 | Buma et al. |
| 2009/0287450 A1 | 11/2009 | Dubois et al. |
| 2009/0301203 A1 | 12/2009 | Brussieux |
| 2010/0011522 A1 | 1/2010 | Kim et al. |
| 2010/0013174 A1 | 1/2010 | Buma et al. |
| 2010/0060273 A1 | 3/2010 | Couchman |
| 2010/0126403 A1 | 5/2010 | Rooney, III et al. |
| 2010/0212983 A1 | 8/2010 | Lama |
| 2010/0224001 A1 | 9/2010 | Brignac |
| 2010/0263948 A1 | 10/2010 | Couture et al. |
| 2011/0030478 A1 | 2/2011 | Park et al. |
| 2011/0130238 A1 | 6/2011 | Schoon |
| 2011/0167914 A1 | 7/2011 | Sutherland |
| 2011/0169938 A1 | 7/2011 | Webster et al. |
| 2011/0178727 A1 | 7/2011 | Hafenrichter et al. |
| 2011/0253470 A1 | 10/2011 | Fischer |
| 2012/0116583 A1 | 5/2012 | Beard et al. |
| 2012/0186874 A1 | 7/2012 | Malone et al. |
| 2012/0215348 A1 | 8/2012 | Skrinde |
| 2012/0215355 A1 | 8/2012 | Bewley et al. |
| 2012/0218868 A1 | 8/2012 | Kahn et al. |
| 2012/0238389 A1 | 9/2012 | Schoon |
| 2012/0257042 A1 | 10/2012 | McKaigue et al. |
| 2012/0273284 A1 | 11/2012 | Nesnas et al. |
| 2013/0024067 A1 | 1/2013 | Troy et al. |
| 2013/0070068 A1 | 3/2013 | Garvey, III et al. |
| 2013/0140801 A1 | 6/2013 | Schlee et al. |
| 2013/0142297 A1 | 6/2013 | Dean et al. |
| 2013/0166193 A1 | 6/2013 | Goldman et al. |
| 2013/0218490 A1 | 8/2013 | Poirier et al. |
| 2013/0289766 A1 | 10/2013 | Hafenrichter et al. |
| 2013/0317676 A1 | 11/2013 | Cooper et al. |
| 2013/0340529 A1 | 12/2013 | Lama |
| 2014/0069193 A1 | 3/2014 | Graham et al. |
| 2014/0076642 A1 | 3/2014 | Gettings et al. |
| 2014/0115860 A1 | 5/2014 | Sarh et al. |
| 2014/0230711 A1 | 8/2014 | Lovelace et al. |
| 2014/0268176 A1 | 9/2014 | Hundstad et al. |
| 2014/0278221 A1 | 9/2014 | Troy et al. |
| 2014/0305216 A1 | 10/2014 | Hafenrichter et al. |
| 2014/0350722 A1 | 11/2014 | Skrinde |
| 2015/0046018 A1 | 2/2015 | Hayashi et al. |
| 2015/0151572 A1 | 6/2015 | Parrott et al. |
| 2015/0151797 A1 | 6/2015 | Outa et al. |
| 2015/0153170 A1 | 6/2015 | Gonzalez et al. |
| 2015/0153312 A1 | 6/2015 | Gonzalez et al. |
| 2015/0177194 A1 | 6/2015 | Xu et al. |
| 2015/0226369 A1 | 8/2015 | Troy et al. |
| 2015/0240984 A1 | 8/2015 | Choi et al. |
| 2015/0316195 A1 | 11/2015 | Penza et al. |
| 2015/0329221 A1 | 11/2015 | Georgeson et al. |
| 2015/0369916 A1 | 12/2015 | Nikolov et al. |
| 2016/0023696 A1 | 1/2016 | Hakes et al. |
| 2016/0033453 A1 | 2/2016 | Cegla et al. |
| 2016/0059939 A1 | 3/2016 | Lamonby et al. |
| 2016/0121486 A1 | 5/2016 | Lipinski et al. |
| 2016/0123933 A1 | 5/2016 | Fetzer et al. |
| 2016/0176452 A1 | 6/2016 | Gettings et al. |
| 2016/0231279 A1 | 8/2016 | Hoyt |
| 2016/0238565 A1 | 8/2016 | Gonzalez et al. |
| 2016/0268823 A1 | 9/2016 | Gonzalez et al. |
| 2016/0273992 A1 | 9/2016 | Frueh |
| 2016/0281910 A1 | 9/2016 | Troy et al. |
| 2016/0282877 A1 | 9/2016 | Gonzalez et al. |
| 2016/0318182 A1 | 11/2016 | Nakaya et al. |
| 2016/0334301 A1 | 11/2016 | Hafenrichter et al. |
| 2016/0349213 A1 | 12/2016 | Kollgaard et al. |
| 2017/0108156 A1 | 4/2017 | Penza et al. |

(56) References Cited

U.S. PATENT DOCUMENTS

| | | |
|---|---|---|
| 2017/0191966 A1 | 7/2017 | Niri et al. |
| 2017/0199024 A1 | 7/2017 | Georgeson et al. |
| 2017/0221454 A1 | 8/2017 | Kim et al. |
| 2017/0225804 A1 | 8/2017 | Hafenrichter et al. |
| 2017/0305261 A1 | 10/2017 | Meager |
| 2017/0321790 A1 | 11/2017 | Klassen et al. |
| 2017/0347624 A1 | 12/2017 | Jorgensen et al. |
| 2018/0009113 A1 | 1/2018 | Lauder et al. |
| 2018/0024561 A1 | 1/2018 | Soh et al. |
| 2018/0036890 A1 | 2/2018 | Hollister |
| 2018/0065762 A1 | 3/2018 | Georgeson et al. |
| 2018/0073975 A1 | 3/2018 | Abdellatif et al. |
| 2018/0080904 A1 | 3/2018 | Al Nahwi et al. |
| 2018/0080905 A1 | 3/2018 | Al Nahwi et al. |
| 2018/0117718 A1 | 5/2018 | Rajagopalan et al. |
| 2018/0154954 A1 | 6/2018 | Bagheri et al. |
| 2018/0181136 A1* | 6/2018 | Loosararian ......... B60B 19/006 |
| 2018/0245923 A1 | 8/2018 | Han |
| 2018/0267554 A1 | 9/2018 | Loosararian et al. |
| 2018/0275670 A1 | 9/2018 | Loosararian et al. |
| 2018/0275671 A1 | 9/2018 | Loosararian et al. |
| 2018/0275672 A1 | 9/2018 | Loosararian et al. |
| 2018/0275673 A1 | 9/2018 | Loosararian et al. |
| 2018/0275674 A1 | 9/2018 | Loosararian et al. |
| 2018/0275675 A1 | 9/2018 | Loosararian et al. |
| 2018/0284794 A1 | 10/2018 | Loosararian et al. |
| 2018/0284795 A1 | 10/2018 | Loosararian et al. |
| 2018/0284796 A1 | 10/2018 | Loosararian et al. |
| 2018/0284797 A1 | 10/2018 | Loosararian et al. |
| 2018/0292838 A1 | 10/2018 | Loosararian et al. |
| 2019/0005465 A1 | 1/2019 | Taylor et al. |
| 2019/0015971 A1 | 1/2019 | Carrasco Zanini et al. |
| 2019/0017656 A1 | 1/2019 | Carrasco Zanini et al. |
| 2019/0018080 A1 | 1/2019 | Marauska et al. |
| 2019/0022848 A1 | 1/2019 | Akin et al. |
| 2019/0022849 A1 | 1/2019 | Akin et al. |
| 2019/0022877 A1 | 1/2019 | Akin et al. |
| 2019/0025851 A1 | 1/2019 | Ebrahimi Afrouzi |
| 2019/0046373 A1 | 2/2019 | Coulter et al. |
| 2019/0086020 A1 | 3/2019 | Wehlin et al. |
| 2019/0118881 A1 | 4/2019 | Mcginn |
| 2019/0128851 A1 | 5/2019 | Wells |
| 2019/0152544 A1 | 5/2019 | Outa |
| 2019/0242728 A1 | 8/2019 | Low et al. |
| 2019/0242743 A1 | 8/2019 | Patel et al. |
| 2019/0346034 A1 | 11/2019 | Noda |
| 2019/0360976 A1 | 11/2019 | Frueh et al. |
| 2019/0368594 A1 | 12/2019 | Sakata |
| 2019/0388998 A1 | 12/2019 | Huggett et al. |
| 2020/0011840 A1 | 1/2020 | Hafenrichter et al. |
| 2020/0133285 A1 | 4/2020 | Xiong et al. |
| 2020/0159237 A1 | 5/2020 | Loosararian et al. |
| 2020/0173879 A1 | 6/2020 | Morris et al. |
| 2020/0175667 A1 | 6/2020 | Morris et al. |
| 2020/0254615 A1 | 8/2020 | Bryner et al. |
| 2020/0262052 A1 | 8/2020 | Bryner et al. |
| 2020/0262066 A1 | 8/2020 | Bryner et al. |
| 2020/0262067 A1 | 8/2020 | Bryner et al. |
| 2020/0262072 A1 | 8/2020 | Bryner et al. |
| 2020/0262077 A1 | 8/2020 | Bryner et al. |
| 2020/0262261 A1 | 8/2020 | Loosararian et al. |
| 2020/0264614 A1 | 8/2020 | Bryner et al. |
| 2020/0264615 A1 | 8/2020 | Bryner et al. |
| 2020/0306969 A1 | 10/2020 | Bryner et al. |
| 2020/0310456 A1 | 10/2020 | Loosararian et al. |
| 2020/0393418 A1 | 12/2020 | Fetzer et al. |
| 2021/0060782 A1 | 3/2021 | Bryner et al. |
| 2021/0060783 A1 | 3/2021 | Bryner et al. |
| 2021/0310597 A1 | 10/2021 | Takashima et al. |
| 2021/0336924 A1 | 10/2021 | Katoh |
| 2022/0011777 A1 | 1/2022 | Loosararian et al. |
| 2022/0196445 A1 | 6/2022 | Low et al. |
| 2022/0331945 A1 | 10/2022 | Bryner et al. |
| 2022/0331949 A1 | 10/2022 | Bryner et al. |
| 2022/0331978 A1 | 10/2022 | Bryner et al. |
| 2022/0331979 A1 | 10/2022 | Jourde et al. |
| 2022/0331980 A1 | 10/2022 | Jourde et al. |
| 2022/0331981 A1 | 10/2022 | Bryner et al. |
| 2022/0331982 A1 | 10/2022 | Jourde et al. |
| 2022/0331983 A1 | 10/2022 | Bryner et al. |
| 2022/0331984 A1 | 10/2022 | Bryner et al. |
| 2022/0331985 A1 | 10/2022 | Jourde et al. |
| 2022/0331987 A1 | 10/2022 | Bryner et al. |
| 2022/0331988 A1 | 10/2022 | Bryner et al. |
| 2022/0334087 A1 | 10/2022 | Jourde et al. |
| 2022/0334582 A1 | 10/2022 | Bryner et al. |
| 2022/0341886 A1 | 10/2022 | David et al. |
| 2022/0341887 A1 | 10/2022 | David et al. |
| 2022/0341888 A1 | 10/2022 | David et al. |
| 2022/0341889 A1 | 10/2022 | David et al. |
| 2022/0341890 A1 | 10/2022 | David et al. |
| 2022/0341891 A1 | 10/2022 | David et al. |
| 2022/0341892 A1 | 10/2022 | David et al. |
| 2023/0003687 A1 | 1/2023 | Vaganay et al. |
| 2023/0044908 A1 | 2/2023 | Jourde et al. |
| 2023/0087654 A1 | 3/2023 | Bryner et al. |
| 2023/0228719 A1 | 7/2023 | David et al. |
| 2023/0333566 A1 | 10/2023 | Loosararian et al. |
| 2023/0341865 A1 | 10/2023 | Loosararian et al. |
| 2023/0390930 A1 | 12/2023 | Loosararian et al. |

FOREIGN PATENT DOCUMENTS

| | | |
|---|---|---|
| CN | 102356311 A | 2/2012 |
| CN | 105150834 A | 12/2015 |
| CN | 205503912 U | 8/2016 |
| CN | 113319839 A | 8/2021 |
| DE | 009206011 U | 7/1992 |
| DE | 10300383 A1 | 7/2004 |
| DE | 102016117237 A1 | 3/2018 |
| EP | 1107442 A3 | 12/2003 |
| EP | 1870313 A2 | 12/2007 |
| FR | 2861457 A1 | 4/2005 |
| FR | 2970199 A1 | 7/2012 |
| GB | 548910 A | 10/1942 |
| JP | 6018640 A | 1/1985 |
| JP | 61090052 | 5/1986 |
| JP | 61144503 A | 7/1986 |
| JP | 11211707 | 8/1999 |
| JP | 2006219048 A | 8/2006 |
| JP | 2007302075 A | 11/2007 |
| KR | 200410388 Y1 | 3/2006 |
| KR | 200431177 Y1 | 11/2006 |
| KR | 200438708 Y1 | 2/2008 |
| KR | 20100078898 A | 7/2010 |
| KR | 20140040692 A | 4/2014 |
| KR | 20150123371 A | 11/2015 |
| KR | 102263706 B1 | 6/2021 |
| WO | 03087733 A2 | 10/2003 |
| WO | 2006114485 A1 | 11/2006 |
| WO | 2007082594 A2 | 7/2007 |
| WO | 2015059916 A1 | 4/2015 |
| WO | 2016051147 A1 | 4/2016 |
| WO | 2018119450 A1 | 6/2018 |
| WO | 2019204504 A1 | 10/2019 |
| WO | 2020185719 A2 | 9/2020 |
| WO | 2020185719 A3 | 10/2020 |
| WO | 2022225725 A1 | 10/2022 |
| WO | 2022226222 A1 | 10/2022 |

OTHER PUBLICATIONS

"Coordinate Systems in Two and Three Dimensions", Oregon State University, Department of Mathematics, 2015, 3 pages.
"Horizontal definition", Merrian-Webster Dictionary, 2014, 1 page.
"International Federation of Robotics,", World Robotics, Chapter 1 section 2, 2016, 10 pages.
"Merriam-Webster", Definition of Pivot, 2015, 5 pages.
"Vertical Definition", Merriam Webster, 2014, 1 page.
"Yaskawa Motoman Robotics,", Robotics Glossary, 2019, 20 pages.
17884897.4, "European Application Serial No. 17884897.4, Extended European Search Report dated Jun. 25, 2020", Gecko Robotics, Inc., 5 pages.

(56) References Cited

OTHER PUBLICATIONS 20769832.5, "European Application Serial No. 20769832.5, Extended European Search Report dated Nov. 4, 2022", Gecko Robotics, Inc., 8 pages.
21201397.3, "European Application Serial No. 21201397.3, Extended European Search Report dated May 11, 2022", Gecko Robotics, Inc., 12 pages.
AMS Controls, "Encoder Tracking and Mounting", 2015, 18 pages.
Bell, Stephanie, "Measurement Good Practice Guide a Beginner's Guide to Uncertainty of Measurement", National Physical Laboratory, Issue 2, 2001, 41 pages.
Berendsen, A.M, "Ship Painting: Current Practice and Systems in Europe", Technology Publishing Company, Sep. 1998, 10.
Borenstein, Johann et al., "Where am I? Sensors and Methods for Mobile Robot Positioning", Retrieved from the Internet :URL :http ://www-personal.umich.edu/~johannb/Papers/pos96rep.pdf, Apr. 22, 1996, pp. 1-282.
Cai, Mingxue et al., "A Novel Pipeline Inspection Robot with Two Angle-changeable Crawler Drive Modules", Proceedings of 2018 IEEE 8th Annual International Conference on Cyber Technology in Automation, Control, and Intelligent Systems, Jul. 2018, 6 pages.
Carlsten, Roy, "Understanding Corrosion and How to Protect Against It", manufacturing.net, Mar. 11, 2002, 8.
Connor, David et al., "Improved dead reckoning using caster wheel sensing on a differentially steered 3-wheeled autonomous vehicle", Proceedings vol. 4195, Mobile Robots XV and Telemanipulator and Telepresence Technologies VII, 2001, 13 pages.
Curran, Patrick, "Make the right choice for metal coating for the right application", Design World, Jun. 2, 2016, 18.
Felsch, Torsten et al., "Robotized Inspection of Vertical Structures of a Solar Power Plant Using NDT Techniques", doi:10.3390/robotics4020103, 2015, pp. 103-119.
Few, Stephen, "Practical Rules for Using Color in Charts", Perceptual Edge, Visual Business Intelligence Newsletter, Feb. 2008, 13 pages.
Fowler, Kenneth A. et al., "Theory and Application of Precious Ultrasonic Thickness Gaging", 2015, 12 pages.
General Electric, "BWCI Automated Boiler Wall Cleaning & Inspection", inspection-robotics.com, 2016, 4.
Ginzel, et al., "Acoustic Properties of the Elastomeric Materials Aqualene and ACE", The e-Journal of Nondestructive Testing—ISSN 1435-4934, Dec. 2015, 13.
Gonzalez, Carlos, "What's the Difference between Pneumatic, Hydraulic, and Electrical Actuators", Machine Design, 2015, 4 pages.
Guglielmelli, E. et al., "Avoiding obstacles by using a proximity US/IR sensitive skin", IEEE, 1993, pp. 2207-2214.
Harrison, David M., "Uncertainty in Physical Measurements", Module 4—Repeated Measurements, Dept. of Physics, Univ. of Toronto, 2015, 18 pages.
Hutter, Marco et al., "Force Control for Active Chassis Balancing", IEEE/ASME Transactions on Mechatronics, vol. 22, No. 2, Apr. 2017, 10 pages.
Lebowitz, Carol A. et al., "Ultrasonic Measurement of Pipe Thickness", Review of Progress in Quantitative Nondestructive Evaluation, vol. 12, 1987, 8 pages.
Lee, Giuk et al., "Combot: Compliant Climbing Robotic Platform with Transitioning Capability and Payload Capacity", IEEE International Conference on Robotics and Automation RiverCentre, Saint Paul, Minnesota,, 2012, 6 pages.
Lins, Romulo G. et al., "Autonomous Robot System for Inspection of Defects in Civil Infrastructures", IEEE, 2016, pp. 1414-1422.
Lion Precision, "Understanding Sensor Resolution Specifications and Performance", TechNote, LT05-0010, 2014, pp. 1-6.
Martinez, Angelo et al., "Fuzzy logic based collision avoidance for a mobile robot", IEEE, 1993, pp. 66-69.
Miskon, Muhammad F. et al., "Close Range Inspection Using Novelty Detection Results", Intelligent Robotic Research Center (IRRC), Monash University, Australia, ICIRA2009, LNAI 5928,, 2009, pp. 947-956.

Myers, Brad A., "The importance of percent-done progress indicators for computer-human interfaces", Proceedings of the SIGCHI conference on Human factors in computing systems., CHI '85. ACM, New York, NY., 1985, 11-17.
National Geographic, "Encyclopedic Entry Location", 2016, 3 pages.
NDT Resource Center, "NDT Glossary D", Webpage, 2016, 4 pages.
NDT Resource Center, "NDT Glossary R", Webpage, 2016, 5 pages.
NDT Resource Center, "Transducer Types", Webpage, 2005, 1.
Nidec, "Flexwave Catalog", 2018, 52 pages.
Olympus, "BondMaster Probes and Accessories Catalog", Catalog, 2008, 24.
Olympus, "Flaw Detectors Delay Line", Olympus, Flaw Detectors Delay Line, 2014, Jan. 9, 2014, 1.
Olympus, "Ultrasonic Transducers Technical Notes", Notes, 2006,.
Openstax College, "College Physics Textbook Equity Edition", vol. 1 of 3: Chapters 1-12, Chapter 9 p. 294, 464 pages.
Parallax Tutorial, "Going the Distance—Using the Drive Distance Block Encoders and Motor Gearing", 2017, 5 pages.
PCT/US17/68326, "International Application Serial No. PCT/US17/68326, International Preliminary Report on Patentability dated Jul. 4, 2019", Gecko Robotics, Inc., 11 pages.
PCT/US20/21779, "International Application Serial No. PCT/US20/21779, International Preliminary Report on Patentability dated Sep. 23, 2021", Gecko Robotics, Inc., 13 pages.
PCT/US20/21779, "International Application Serial No. PCT/US20/21779, International Search Report and Written Opinion dated Sep. 2, 2020", Gecko Robotics, Inc., 14 pages.
PCT/US20/21779, "International Application Serial No. PCT/US20/21779, Invitation to Pay Additional Fees and, Where Applicable, Protest Fee dated Jul. 9, 2020", Gecko Robotics, Inc., 2 pages.
PCT/US2017/068326, "International Application Serial No. PCT/US2017/068326, International Search Report and Written Opinion dated May 4, 2018", Gecko Robotics, Inc., 14 pages.
PCT/US2017068326, "International Application Serial No. PCT/US2017068326, Invitation to Pay Additional Fees and, Where Applicable, Protest Fee dated Feb. 27, 2018", Gecko Robotics, Inc., 2 Pages.
PCT/US2019/027958, "International Application Serial No. PCT/US2019/027958, International Preliminary Report on Patentability dated Oct. 29, 2020", Gecko Robotics, Inc., 8 pages.
PCT/US2019/027958, "International Application Serial No. PCT/US2019/027958, International Search Report and Written Opinion dated Jul. 16, 2019", Gecko Robotics, Inc., 9 pages.
PCT/US2022/023993, "International Application Serial No. PCT/US2022/023993, International Search Report and Written Opinion dated Aug. 24, 2022", Gecko Robotics, Inc., 31 pages.
PCT/US2022/023993, "International Application Serial No. PCT/US2022/023993, Invitation to Pay Additional Fees and, Where Applicable, Protest Fee dated Jun. 16, 2022", Gecko Robotics, Inc., 3 pages.
PCT/US2022/025816, "International Application Serial No. PCT/US2022/025816, International Search Report and Written Opinion dated Sep. 28, 2022", Gecko Robotics, Inc, 33 pages.
PCT/US2022/025816, "International Application Serial No. PCT/US2022/025816, Invitation to Pay Additional Fees and, Where Applicable, Protest Fee dated Jul. 8, 2022", Gecko Robotics, Inc., 3 pages.
Reinhold, Reif, "Machine Translation DE 10300383", 2019, 4 pages.
Sabatini, Angelo M. et al., "Correlation Techniques for Digital Time-of-Flight Measurement by Airborne Ultrasonic Rangefinders", Published in: Proceedings of IEEE/RSJ International Conference on Intelligent Robots and Systems (IROS'94), Date of Conference: Sep. 12-16, 1994,, 1994, pp. 2168-2175.
Salik, John et al., "Pipe Inspections: Robotic Laser Profiling Demystified", National Precast Concrete Association, Apr. 1, 2013, 12 pages.
Schroeder, S C. et al., "Ultrasonic Culvert Thickness Determination", US Army Armament Research Development and Engineering, Technical Report ARCCB-TR-95027, 1995, 36 pages.

(56) References Cited

OTHER PUBLICATIONS

Sirken, Aaron et al., "Bridge Risk Investigation Diagnostic Grouped Exploratory (Bridge)", IEEE/RSJ International Conference on Intelligent Robots and Systems (IROS), Sep. 24-28, 2017, Vancouver, BC, Canada (Year: 2017), 2017, 7 pages.

Smith, Oliver et al., "Machine Translation KR20140040692A", 18 pages.

Stepson, W.A.V et al., "Design and Development of a Mobile Crawling Robot with Novel Halbach Array Based Magnetic Wheels", IEEE/ RSJ International Conference on Intelligent Robots and Systems (IROS), Vancouver, BC, Canada, Sep. 2017, 6 pages.

Svilainis, Linas , "Review of high resolution time of flight estimation techniques for ultrasonic signals,", September 2013Conference: NDT 2013At: Telford Project: In-SMART, 2013, 13 pages.

Takero, Hongo et al., "An Automatic Guidance System of a Self-Controlled Vehicle", In: "Autonomous Robot Vehicles", Jan. 1, 1990 (Jan. 1, 1990), Springer New York, New York, NY,, Retrieved from the Internet: URL:https://ieeexplore.ieee.org/stampPDF/getPDF.jsp?tp=&arnumber=4158818&ref=aHR0cHM6Ly9pZWVleHBsb3JlLmllZWUub3JnL2RvY3VtZW50LzQxNTg4MTg=, Jan. 1, 1990, pp. 32-37.

Tufte, Edward R. , "The Visual Display of Quantitative Information", Published by Graphics Press LLC, Second edition, fifth printing, Aug. 2007, 191 pages.

Tufte, Edward R. , "The Visual Display of Quantitative Information", Published by Graphics Press LLC, Second edition, fifth printing, 2007, 191 pages.

Ueura, Keiji et al., "Development of the Harmonic Drive Gear for Space Applications", 1999, 6 pages.

Wisegeek, "What is an Articulated Robot?", Webpage, 2015, 4 pages.

Yasuda, Gen'ichi , "Behavior-based autonomous cooperative control of intelligent mobile robot systems with embedded Petri nets", IEEE, 2014, pp. 1085-1090.

Zaho, B. et al., "Estimation of ultrasound attenuation and dispersion using short time Fourier transform,", Ultrasonics 43 (2005) 375-381, 2005, pp. 375-381.

Zhang, Lei et al., "Analysis of Traveling-capability and Obstacle-climbing Capability for Radially Adjustable Tracked Pipeline Robot", Proceedings of the 2016 IEEE International Conference on Robotics and Biomimetics Gingdao, China, Dec. 2016, 6 pages.

Zhang, Lei et al., "Stable Motion Analysis and Verification of a Radial Adjustable Pipeline Robot", Proceedings of the 2016 IEEE International Conference on Robotics and Biomimetics Oingdao, China, Dec. 2016, 6 pages.

Haitao , et al., "Simulation, Test and Analysis of Three-phase Short-Circuit Braking in IGCT-based MV Adjustable Speed Drive Systems", 2005 International Conference on Electrical Machines and Systems, Nanjing, China, IEEE, 2005, pp. 1437-1441.

Papadimitriou, Vasileious , et al., "An adaptable and self-calibrating service robotic nozzle-vessel welds", 2012 2nd International Conference on Applied Robotics for the Power Industry (CARPI), 2012, 6 pages.

Xing , et al., "Design and Realization of DC Motor Speed Measurement and Control Based on an Electromagnetic Sensor", Atlantis Press, DOI10.2991/cisia-15.2015.69, 2015, 4 pages.

U.S. Appl. No. 18/057,544, filed Nov. 21, 2022, Pending, Edward A. Bryner, et al.

U.S. Appl. No. 17/729,037, filed Apr. 26, 2022, Pending, Dillon R. Jourde, et al.

Mims, Christopher , "America's Bridges, Factories and Highways Are in Dire Need of Repairs. Bring in the Robots.", The Wall Street Journal, available at https://www.wsj.com/tech/inspection-robots-infrastructure-ebb4172c, Aug. 2023, 5 pages.

PCT/US2022/023993 , "International Application Serial No. PCT/US2022/023993, International Preliminary Report on Patentability dated Nov. 2, 2023", Gecko Robotics, Inc., 28 pages.

PCT/US2022/025816 , "International Application Serial No. PCT/US2022/025816, International Preliminary Report on Patentability dated Oct. 24, 2023", Gecko Robotics, Inc., 30 pages.

PCT/US2023/075722 , "International Application Serial No. PCT/US2023/075722, Invitation to Pay Additional Fees and, Where Applicable, Protest Fee dated Dec. 12, 2023", Gecko Robotics, Inc., 3 pages.

\* cited by examiner

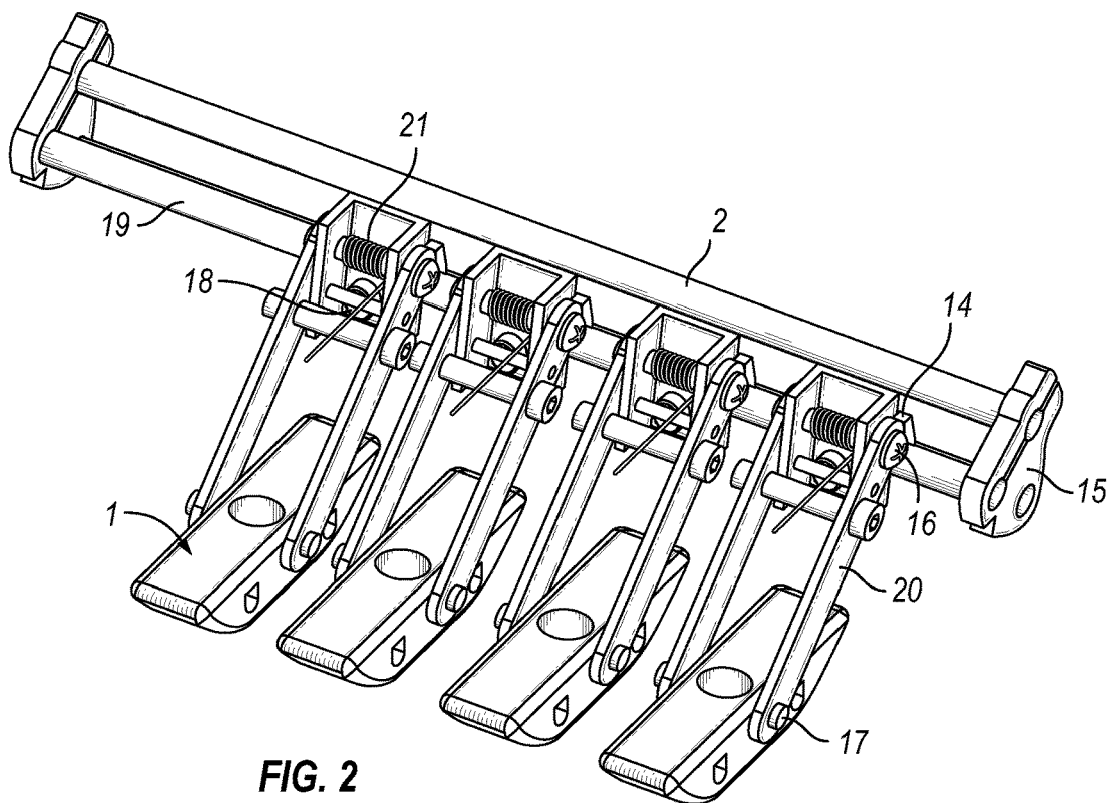
FIG. 2
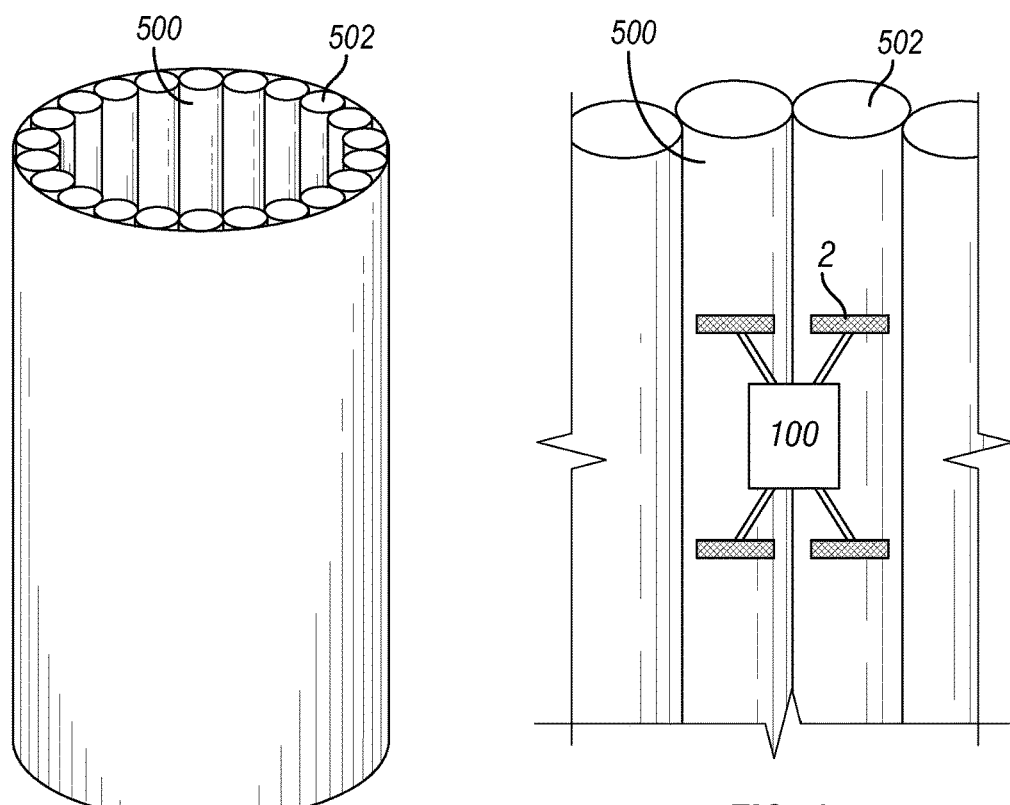
FIG. 3
FIG. 4

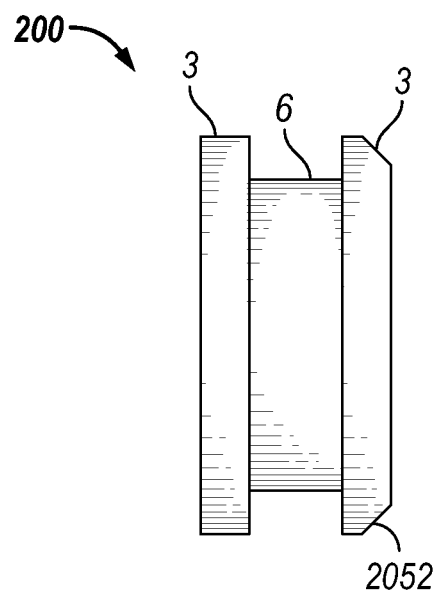
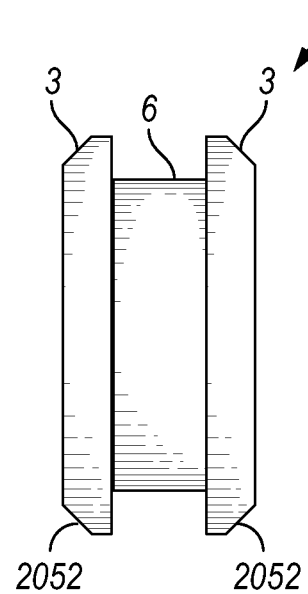
FIG. 9    FIG. 10
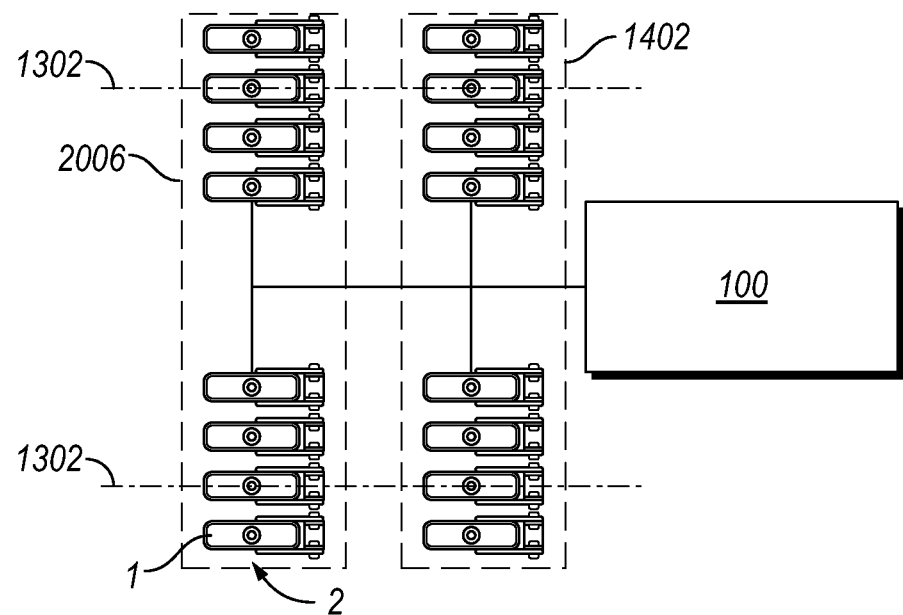
FIG. 11

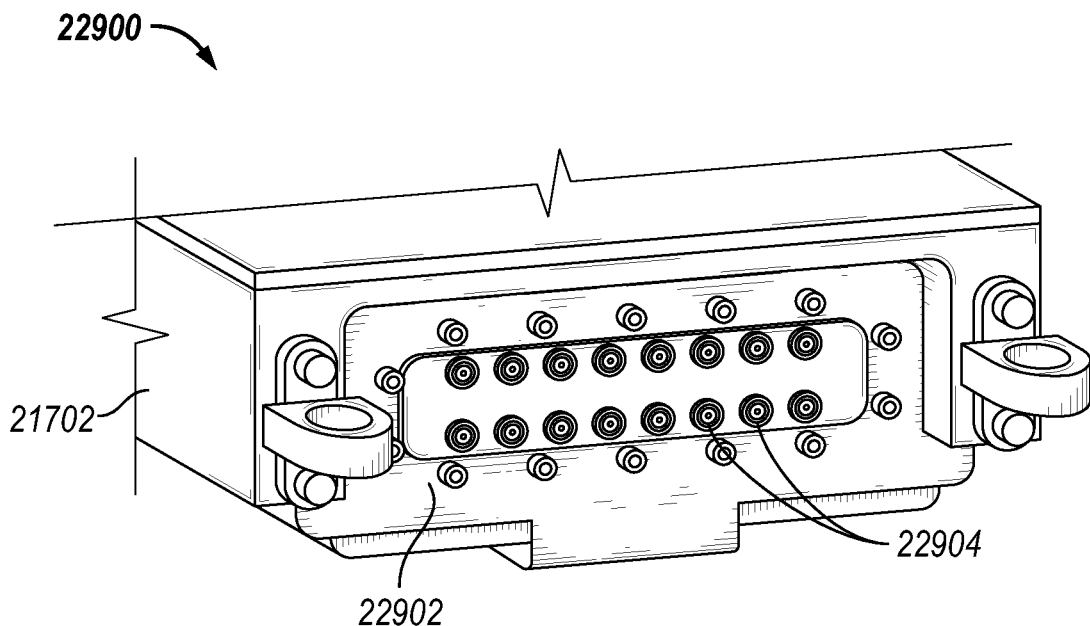
FIG. 69
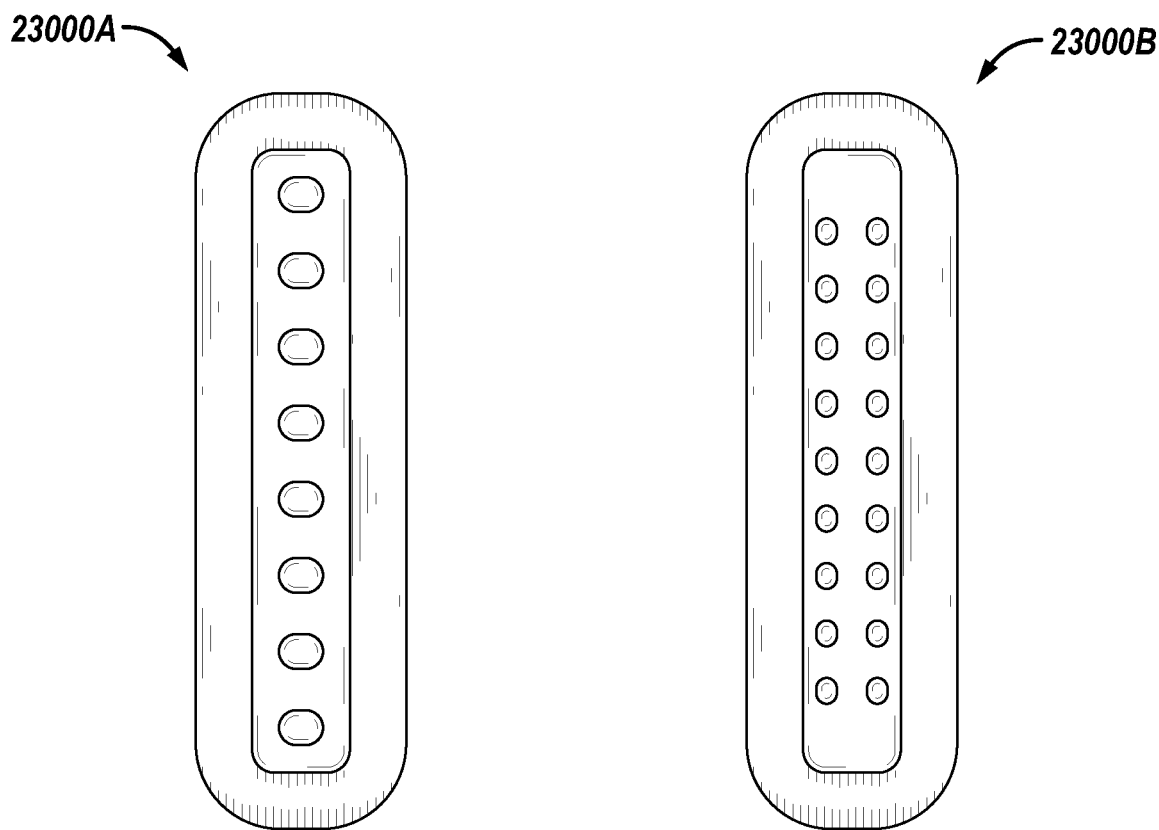
FIG. 70A  FIG. 70B

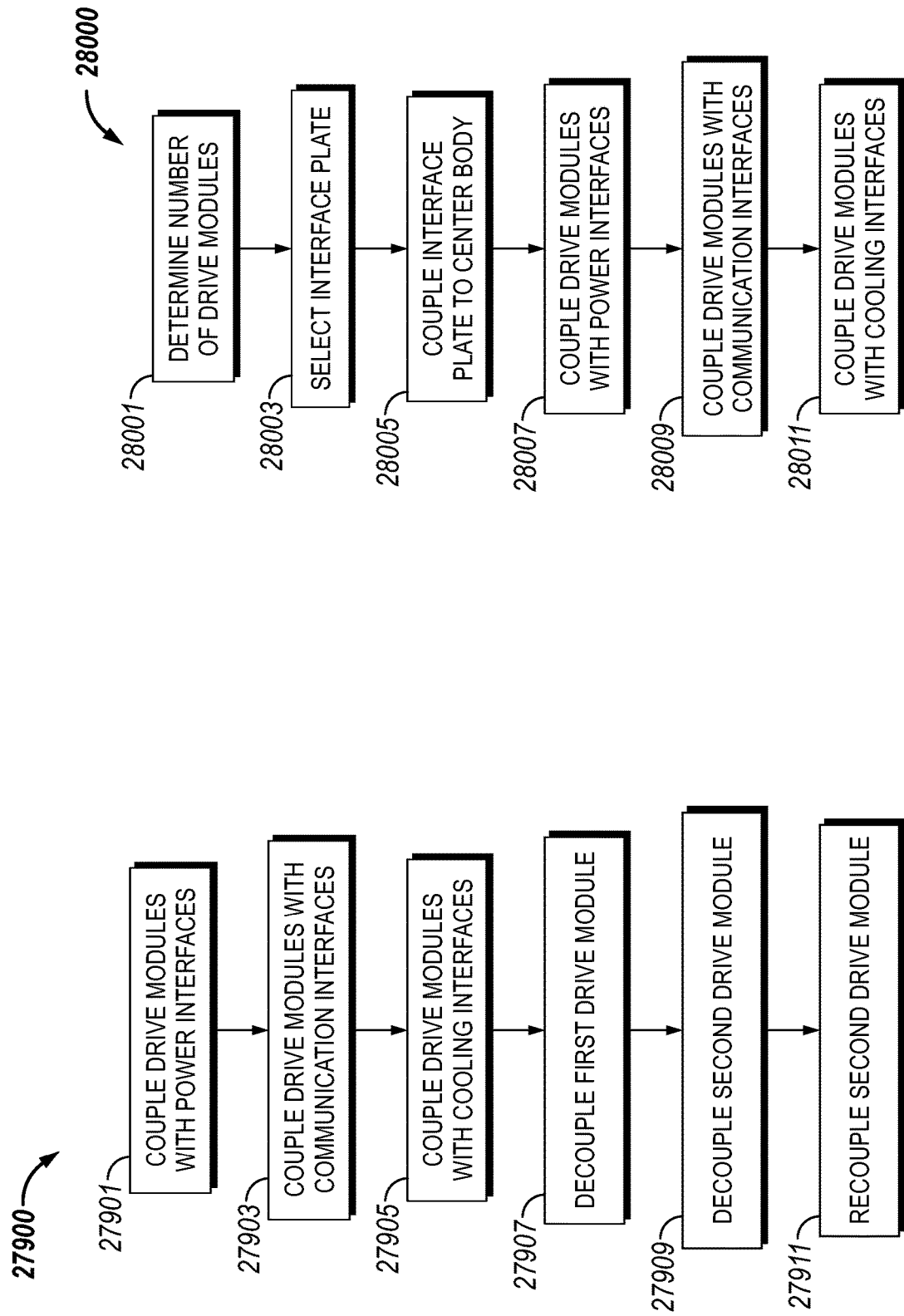

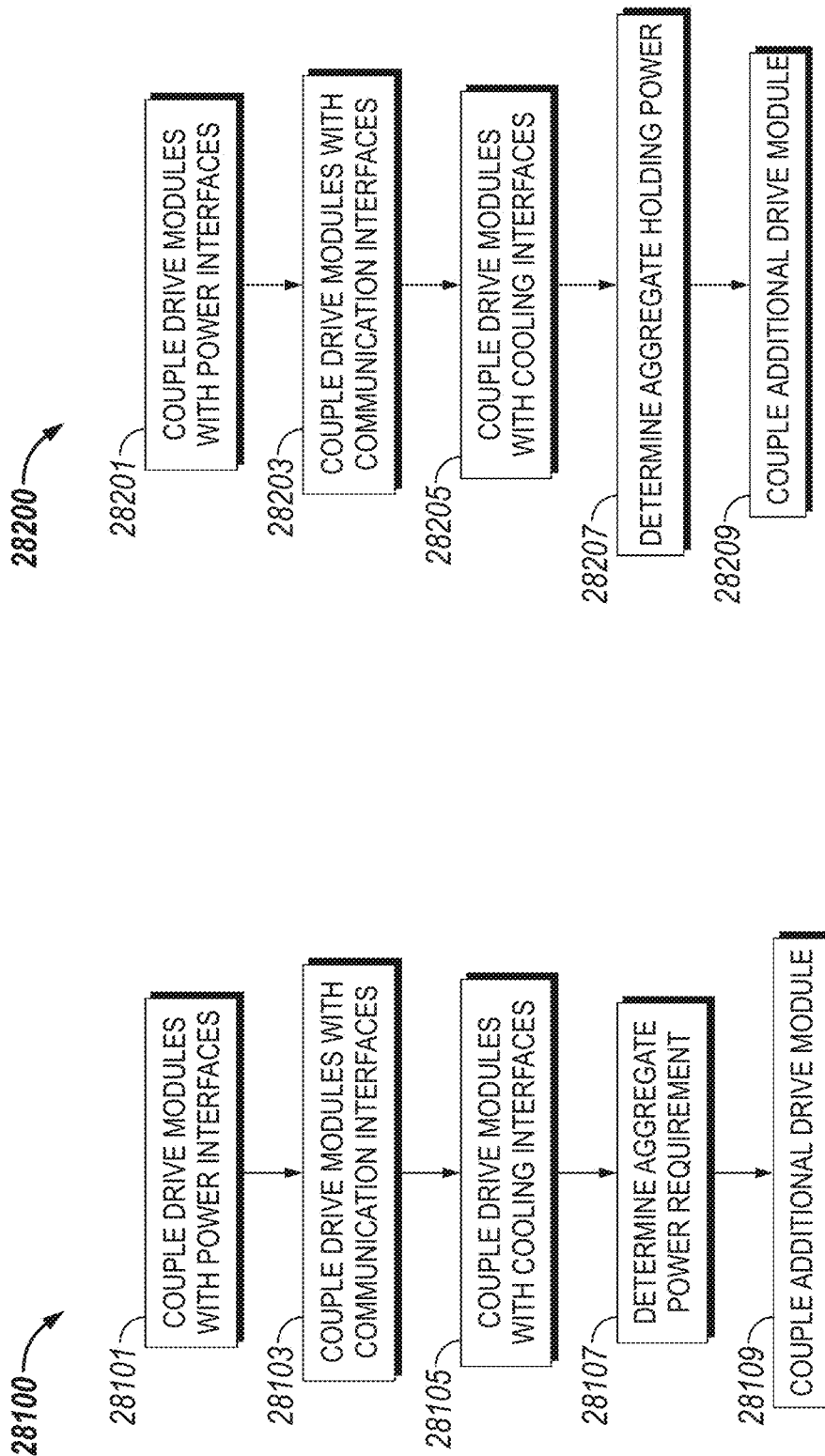

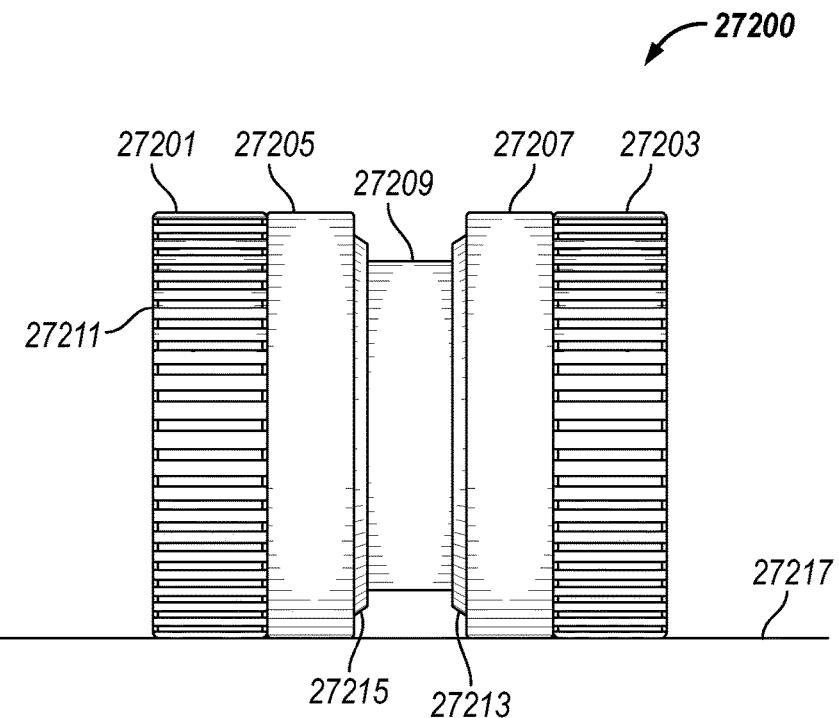
FIG. 125
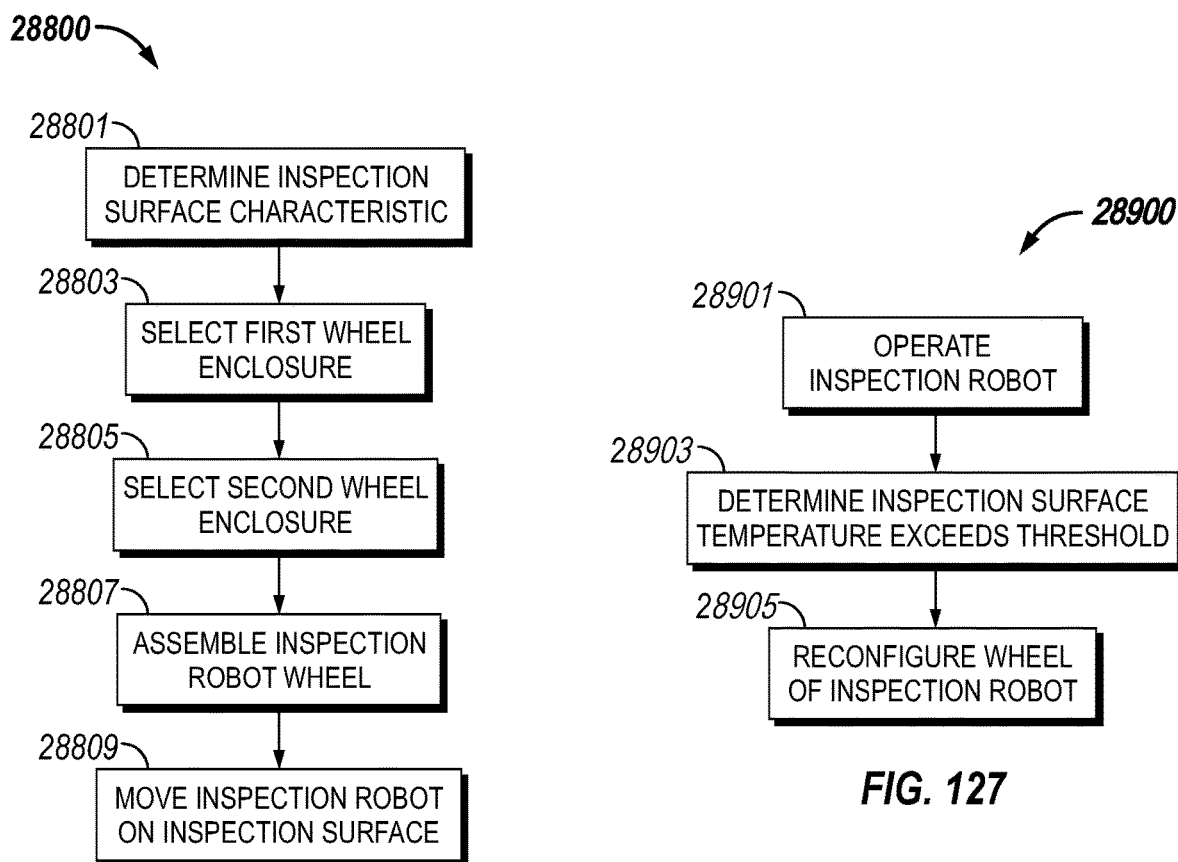
FIG. 126
FIG. 127

METHODS AND APPARATUS FOR VERIFIABLE INSPECTION OPERATIONS

CROSS-REFERENCE TO RELATED APPLICATIONS

This application is a continuation of U.S. application Ser. No. 17/716,249 filed Apr. 8, 2022, U.S. Publication No. 20220331978, and entitled "INSPECTION ROBOT WITH REMOVEABLE INTERFACE PLATES AND METHOD FOR CONFIGURING PAYLOAD INTERFACES."

U.S. application Ser. No. 17/716,249 claims priority to the following U.S. Provisional Applications: Ser. No. 63/177,141 filed Apr. 20, 2021, and entitled "FLEXIBLE INSPECTION ROBOT FOR INDUSTRIAL ENVIRONMENTS"; and Ser. No. 63/255,880 filed Oct. 14, 2021, and entitled "FLEXIBLE INSPECTION ROBOT."

Each of the foregoing applications is incorporated herein by reference in its entirety.

This application also incorporates herein U.S. application Ser. No. 16/863,594, now U.S. Pat. No. 11,511,426, by reference in its entirety.

BACKGROUND

The present disclosure relates to robotic inspection and treatment of industrial surfaces.

SUMMARY

Previously known inspection and treatment systems for industrial surfaces suffer from a number of drawbacks. Industrial surfaces are often required to be inspected to determine whether a pipe wall, tank surface, or other industrial surface feature has suffered from corrosion, degradation, loss of a coating, damage, wall thinning or wear, or other undesirable aspects. Industrial surfaces are often present within a hazardous location—for example in an environment with heavy operating equipment, operating at high temperatures, in a confined environment, at a high elevation, in the presence of high voltage electricity, in the presence of toxic or noxious gases, in the presence of corrosive liquids, and/or in the presence of operating equipment that is dangerous to personnel. Accordingly, presently known systems require that a system be shutdown, that a system be operated at a reduced capacity, that stringent safety procedures be followed (e.g., lockout/tagout, confined space entry procedures, harnessing, etc.), and/or that personnel are exposed to hazards even if proper procedures are followed. Additionally, the inconvenience, hazards, and/or confined spaces of personnel entry into inspection areas can result in inspections that are incomplete, of low resolution, that lack systematic coverage of the inspected area, and/or that are prone to human error and judgement in determining whether an area has been properly inspected.

Embodiments of the present disclosure provide for systems and methods of inspecting an inspection surface with an improved inspection robot. Example embodiments include modular drive assemblies that are selectively coupled to a chassis of the inspection robot, wherein each drive assembly may have distinct wheels suited to different types of inspection surfaces. Other embodiments include payloads selectively couplable to the inspection robot chassis via universal connectors that provide for the exchange of couplant, electrical power and/or data communications. The payload may each have different sensor configurations suited for interrogating different types of inspection surfaces.

Embodiments of the present disclosure may provide for improved customer responsiveness by generating interactive inspection maps that depict past, present and/or predicted inspection data of an inspection surface. In embodiments, the inspection maps may be transmitted and displayed on user electronic devices and may provide for control of the inspection robot during an inspection run.

Embodiments of the present disclosure may provide for an inspection robot with improved environmental capabilities. For example, some embodiments have features for operating in hostile environments, e.g., high temperature environments. Such embodiments may include low operational impact capable cooling systems.

Embodiments of the present disclosure may provide for an inspection robot having an improved, e.g., reduced, footprint which may further provide for increased climbing of inclined and/or vertical inspection surfaces. The reduced footprint of certain embodiments may also provide for inspection robots having improve the horizontal range due to reduced weight.

BRIEF DESCRIPTION OF THE FIGURES

FIG. 2 is a schematic depiction of a payload consistent with certain embodiments of the present disclosure.

FIG. 3 is a schematic depiction of an inspection surface.

FIG. 4 is a schematic depiction of an inspection robot positioned on an inspection surface.

FIGS. 9-10 are schematic depictions of wheels for an inspection robot.

FIG. 11 is a schematic diagram of a payload arrangement.

FIG. 69 depicts an example removeable interface plate.

FIGS. 70A-70B depict example gaskets for a removeable interface plate.

FIGS. 116-124 are flowcharts illustrating example processes for assembling an inspection robot.

FIG. 125 is a block diagram illustrating an example inspection system on an inspection surface.

FIG. 126 is a flowchart illustrating an example process for inspecting an inspection surface.

FIG. 127 is a flowchart illustrating an example process for reconfiguring an inspection robot wheel in response to an inspection environment.

DETAILED DESCRIPTION

Figure 1:
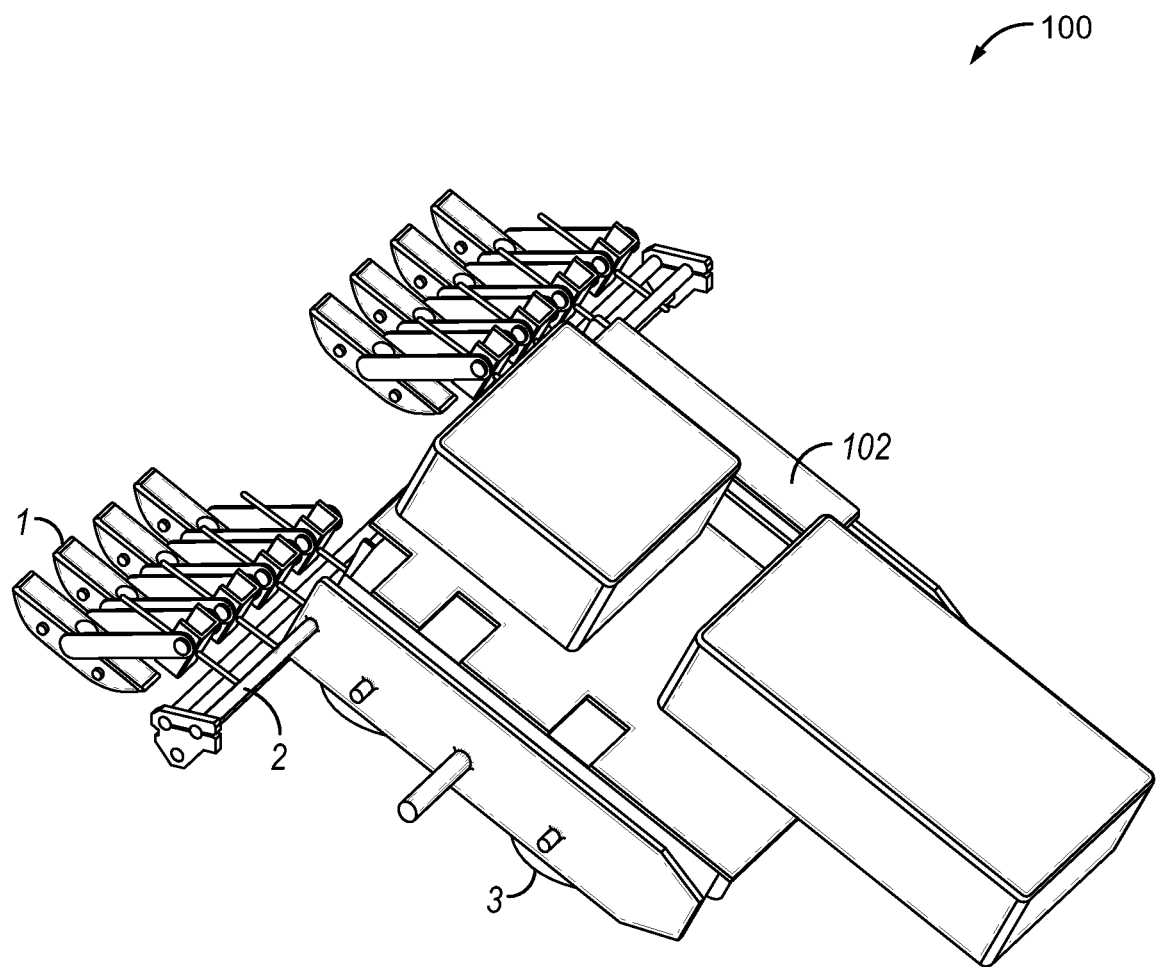
FIG. 1 is a schematic depiction of an inspection robot consistent with certain embodiments of the present disclosure.

The present disclosure relates to a system developed for traversing, climbing, or otherwise traveling over walls (curved or flat), or other industrial surfaces. Industrial surfaces, as described herein, include any tank, pipe, housing, or other surface utilized in an industrial environment, including at least heating and cooling pipes, conveyance pipes or conduits, and tanks, reactors, mixers, or containers. In certain embodiments, an industrial surface is ferromagnetic, for example including iron, steel, nickel, cobalt, and alloys thereof. In certain embodiments, an industrial surface is not ferromagnetic.

Certain descriptions herein include operations to inspect a surface, an inspection robot or inspection device, or other descriptions in the context of performing an inspection. Inspections, as utilized herein, should be understood broadly. Without limiting any other disclosures or embodiments herein, inspection operations herein include operating one or more sensors in relation to an inspected surface, electromagnetic radiation inspection of a surface (e.g., operating a camera) whether in the visible spectrum or otherwise (e.g., infrared, UV, X-Ray, gamma ray, etc.), high-resolution inspection of the surface itself (e.g., a laser profiler, caliper, etc.), performing a repair operation on a surface, performing a cleaning operation on a surface, and/or marking a surface for a later operation (e.g., for further inspection, for repair, and/or for later analysis). Inspection operations include operations for a payload carrying a sensor or an array of sensors (e.g. on sensor sleds) for measuring characteristics of a surface being traversed such as thickness of the surface, curvature of the surface, ultrasound (or ultra-sonic) measurements to test the integrity of the surface and/or the thickness of the material forming the surface, heat transfer, heat profile/mapping, profiles or mapping any other parameters, the presence of rust or other corrosion, surface defects or pitting, the presence of organic matter or mineral deposits on the surface, weld quality and the like. Sensors may include magnetic induction sensors, acoustic sensors, laser sensors, LIDAR, a variety of image sensors, and the like. The inspection sled may carry a sensor for measuring characteristics near the surface being traversed, such as emission sensors to test for gas leaks, air quality monitoring, radioactivity, the presence of liquids, electro-magnetic interference, visual data of the surface being traversed such as uniformity, reflectance, status of coatings such as epoxy coatings, wall thickness values or patterns, wear patterns, and the like. The term inspection sled may indicate one or more tools for repairing, welding, cleaning, applying a treatment or coating the surface being treated. Treatments and coatings may include rust proofing, sealing, painting, application of a coating, and the like. Cleaning and repairing may include removing debris, sealing leaks, patching cracks, and the like. The term inspection sled, sensor sled, and sled may be used interchangeably throughout the present disclosure.

In certain embodiments, for clarity of description, a sensor is described in certain contexts throughout the present disclosure, but it is understood explicitly that one or more tools for repairing, cleaning, and/or applying a treatment or coating to the surface being treated are likewise contemplated herein wherever a sensor is referenced. In certain embodiments, where a sensor provides a detected value (e.g., inspection data or the like), a sensor rather than a tool may be contemplated, and/or a tool providing a feedback value (e.g., application pressure, application amount, nozzle open time, orientation, etc.) may be contemplated as a sensor in such contexts.

Inspections are conducted with a robotic system 100 (e.g., an inspection robot, a robotic vehicle, etc.) which may utilize sensor sleds 1 and a sled array system 2 which enables accurate, self-aligning, and self-stabilizing contact with a surface (not shown) while also overcoming physical obstacles and maneuvering at varying or constant speeds. In certain embodiments, mobile contact of the system 100 with the surface includes a magnetic wheel 3. In certain embodiments, a sled array system 2 is referenced herein as a payload 2—wherein a payload 2 is an arrangement of sleds 1 with sensor mounted thereon, and wherein, in certain embodiments, an entire payload 2 can be changed out as a unit. The utilization of payloads 2, in certain embodiments, allows for a pre-configured sensor array that provides for rapid re-configuration by swapping out the entire payload 2. In certain embodiments, sleds 1 and/or specific sensors on sleds 1, are changeable within a payload 2 to reconfigure the sensor array.

An example sensor sled 1 includes, without limitation, one or more sensors mounted thereon such that the sensor(s) is operationally couplable to an inspection surface in contact with a bottom surface of the corresponding one of the sleds. For example, the sled 1 may include a chamber or mounting structure, with a hole at the bottom of the sled 1 such that the sensor can maintain line-of-sight and/or acoustic coupling with the inspection surface. The sled 1 as described throughout the present disclosure is mounted on and/or operationally coupled to the inspection robot 100 such that the sensor maintains a specified alignment to the inspection surface 500—for example a perpendicular arrangement to the inspection surface, or any other specified angle. In certain embodiments, a sensor mounted on a sled 1 may have a line-of-sight or other detecting arrangement to the inspection surface that is not through the sled 1—for example a sensor may be mounted at a front or rear of a sled 1, mounted on top of a sled 1 (e.g., having a view of the inspection surface that is forward, behind, to a side, and/or oblique to the sled 1). It will be seen that, regardless of the sensing orientation of the sensor to the inspection surface, maintenance of the sled 1 orientation to the inspection surface will support more consistent detection of the inspection surface by the sensor, and/or sensed values (e.g., inspection data) that is more consistently comparable over the inspection surface and/or that has a meaningful position relationship compared to position information determined for the sled 1 or inspection robot 100. In certain embodiments, a sensor may be mounted on the inspection robot 100 and/or a payload 2—for example a camera mounted on the inspection robot 100.

The present disclosure allows for gathering of structural information from a physical structure. Example physical structures include industrial structures such as boilers, pipelines, tanks, ferromagnetic structures, and other structures. An example system 100 is configured for climbing the outside of tube walls.

As described in greater detail below, in certain embodiments, the disclosure provides a system that is capable of integrating input from sensors and sensing technology that may be placed on a robotic vehicle. The robotic vehicle is capable of multi-directional movement on a variety of surfaces, including flat walls, curved surfaces, ceilings, and/or floors (e.g., a tank bottom, a storage tank floor, and/or a recovery boiler floor). The ability of the robotic vehicle to operate in this way provides unique access especially to traditionally inaccessible or dangerous places, thus permitting the robotic vehicle to gather information about the structure it is climbing on.

The system 100 (e.g., an inspection robot, a robotic vehicle, and/or supporting devices such as external computing devices, couplant or fluid reservoirs and delivery systems, etc.) in FIG. 1 includes the sled 1 mounted on a payload 2 to provide for an array of sensors having selectable contact (e.g., orientation, down force, sensor spacing from the surface, etc.) with an inspected surface. The payload 2 includes mounting posts mounted to a housing (main body) 102 of the system 100. The payload 2 thereby provides a convenient mounting position for a number of sleds 1, allowing for multiple sensors to be positioned for inspection in a single traverse of the inspected surface. The number and distance of the sleds 1 on the payload 2 are readily adjustable—for example by sliding the sled mounts on the payload 2 to adjust spacing.

Referencing FIG. 2, an example system 100 includes the sled 1 held by an arm 20 that is connected to the payload 2 (e.g., a sensor array or sensor suite). An example system includes the sled 1 coupled to the arm 20 at a pivot point 17, allowing the sensor sled to rotate and/or tilt. On top of the arm 20, an example payload 2 includes a biasing member 21 (e.g., a torsion spring) with another pivot point 16, which provides for a selectable down-force of the arm 20 to the surface being inspected, and for an additional degree of freedom in sled 1 movement to ensure the sled 1 orients in a desired manner to the surface. In certain embodiments, down-force provides for at least a partial seal between the sensor sled 1 and surface to reduce or control couplant loss (e.g., where couplant loss is an amount of couplant consumed that is beyond what is required for operations), control distance between the sensor and the surface, and/or to ensure orientation of the sensor relative to the surface. Additionally, or alternatively, the arm 20 can lift in the presence of an obstacle, while traversing between surfaces, or the like, and return to the desired position after the maneuver is completed. In certain embodiments, an additional pivot 18 couples the arm 20 to the payload 2, allowing for an additional rolling motion. In certain embodiments, pivots 16, 17, 18 provide for three degrees of freedom on arm 20 motion, allowing the arm 20 to be responsive to almost any obstacle or surface shape for inspection operations. In certain embodiments, various features of the system 100, including one or more pivots 16, 17, 18, co-operate to provide self-alignment of the sled 1 (and thus, the sensor mounted on the sled) to the surface. In certain embodiments, the sled 1 self-aligns to a curved surface and/or to a surface having variability in the surface shape.

In certain embodiments, the system is also able to collect information at multiple locations at once. This may be accomplished through the use of a sled array system. Modular in design, the sled array system allows for mounting sensor mounts, like the sleds, in fixed positions to ensure thorough coverage over varying contours. Furthermore, the sled array system allows for adjustment in spacing between sensors, adjustments of sled angle, and traveling over obstacles. In certain embodiments, the sled array system was designed to allow for multiplicity, allowing sensors to be added to or removed from the design, including changes in the type, quantity, and/or physical sensing arrangement of sensors. The sensor sleds that may be employed within the context of the present invention may house different sensors for diverse modalities useful for inspection of a structure. These sensor sleds are able to stabilize, align, travel over obstacles, and control, reduce, or optimize couplant delivery which allows for improved sensor feedback, reduced couplant loss, reduced post-inspection clean-up, reduced downtime due to sensor re-runs or bad data, and/or faster return to service for inspected equipment.

Figure 13:
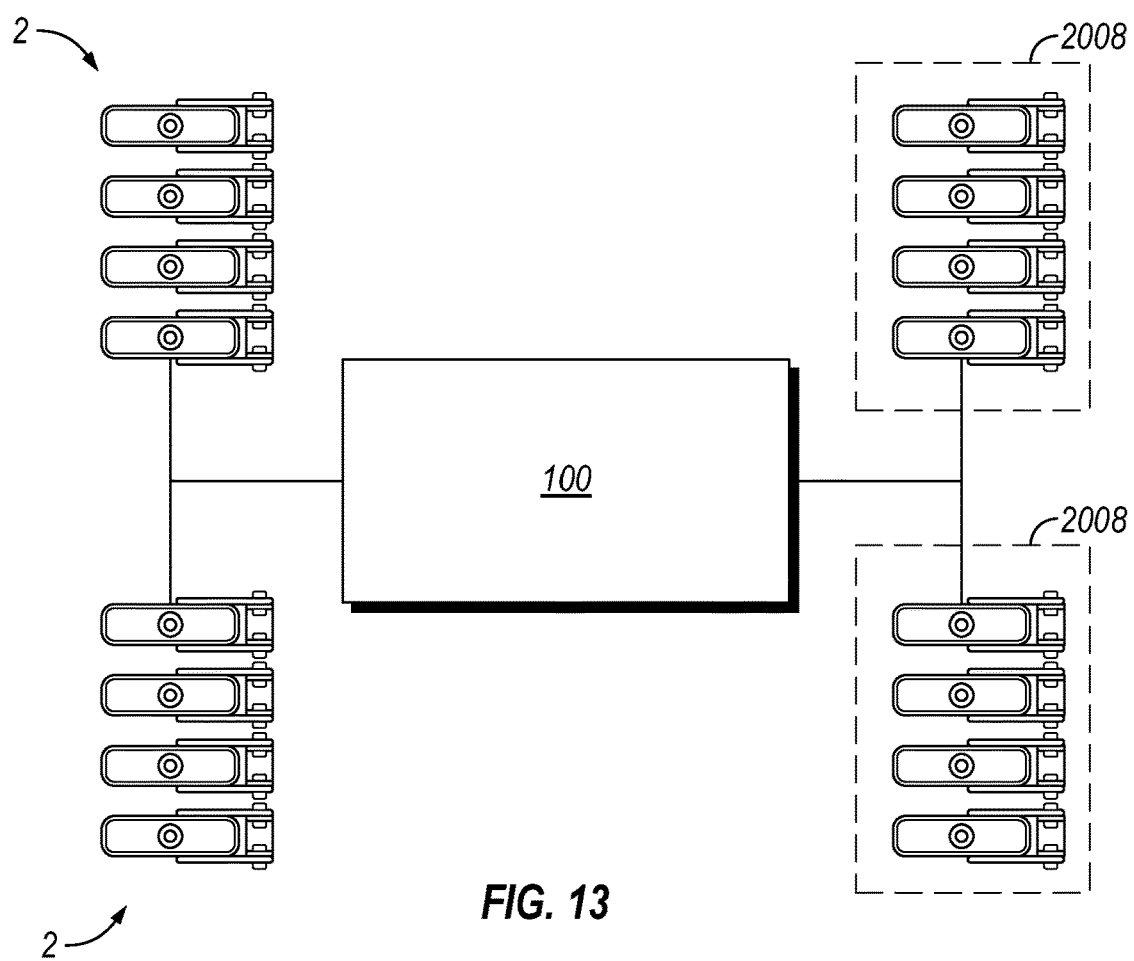
FIG. 13 is another schematic diagram of a payload arrangement.

There may be advantages to maintaining a sled with associated sensors or tools in contact and/or in a fixed orientation relative to the surface being traversed even when that surface is contoured, includes physical features, obstacles, and the like. In embodiments, there may be sled assemblies which are self-aligning to accommodate variabilities in the surface being traversed (e.g., an inspection surface) while maintaining the bottom surface of the sled (and/or a sensor or tool, e.g. where the sensor or tool protrudes through or is flush with a bottom surface of the sled) in contact with the inspection surface and the sensor or tool in a fixed orientation relative to the inspection surface. In an embodiment, as shown in FIG. 13 there may be a number of payloads 2, each payload 2 including a sled 1 positioned between a pair of sled arms 20, with each side exterior of the sled 1 attached to one end of each of the sled arms 20 at a pivot point 17 so that the sled 1 is able to rotate around an axis that would run between the pivot points 17 on each side of the sled 1. As described elsewhere herein, the payload 2 may include one or more inspection sleds 1 being pushed ahead of the payload 2, pulled behind the payload 2, or both. The other end of each sled arm 20 is attached to an inspection sled mount 14 with a pivot connection 16 which allows the sled arms to rotate around an axis running through the inspection sled mount 14 between the two pivot connections 16. Accordingly, each pair of sled arms 20 can raise or lower independently from other sled arms 20, and with the corresponding sled 1. The inspection sled mount 14 attaches to the payload 2, for example by mounting on shaft 19. The inspection sled mount 14 may connect to the payload shaft 19 with a connection 18 which allows the sled 1 and corresponding arms 20 to rotate from side to side in an arc around a perpendicular to the shaft 19. Together the up and down and side to side arc, where present, allow two degrees of rotational freedom to the sled arms. Connection 18 is illustrated as a gimbal mount in the example of FIG. 4, although any type of connection providing a rotational degree of freedom for movement is contemplated herein, as well as embodiments that do not include a rotational degree of freedom for movement. The gimbal mount 18 allows the sled 1 and associated arms 20 to rotate to accommodate side to side variability in the surface being traversed or obstacles on one side of the sled 1. The pivot points 17 between the sled arms 20 and the sled 1 allow the sled 1 to rotate (e.g., tilt in the direction of movement of the inspection robot 100) to conform to the surface being traversed and accommodate to variations or obstacles in the surface being traversed. Pivot point 17, together with the rotational freedom of the arms, provides the sled three degrees of rotational freedom relative to the inspection surface. The ability to conform to the surface being traversed facilitated the maintenance of a perpendicular interface between the sensor and the surface allowing for improved interaction between the sled 1 and the inspection surface. Improved interaction may include ensuring that the sensor is operationally couplable to the inspection surface.

Within the inspection sled mount 14 there may be a biasing member (e.g., torsion spring 21) which provides a down force to the sled 1 and corresponding arms 20. In the example, the down force is selectable by changing the torsion spring, and/or by adjusting the configuration of the torsion spring (e.g., confining or rotating the torsion spring to increase or decrease the down force). Analogous operations or structures to adjust the down force for other biasing members (e.g., a cylindrical spring, actuator for active down force control, etc.) are contemplated herein.

In certain embodiments, the inspection robot 100 includes a tether (not shown) to provide power, couplant or other fluids, and/or communication links to the robot 100. It has been demonstrated that a tether to support at least 200 vertical feet of climbing can be created, capable of couplant delivery to multiple ultra-sonic sensors, sufficient power for the robot, and sufficient communication for real-time processing at a computing device remote from the robot. Certain aspects of the disclosure herein, such as but not limited to utilizing couplant conservation features such as sled downforce configurations, the acoustic cone, and water as a couplant, support an extended length of tether. In certain embodiments, multiple ultra-sonic sensors can be provided with sufficient couplant through a ⅛" couplant delivery line, and/or through a ¼" couplant delivery line to the inspection robot 100, with ⅛" final delivery lines to individual sensors. While the inspection robot 100 is described as receiving power, couplant, and communications through a tether, any or all of these, or other aspects utilized by the inspection robot 100 (e.g., paint, marking fluid, cleaning fluid, repair solutions, etc.) may be provided through a tether or provided in situ on the inspection robot 100. For example, the inspection robot 100 may utilize batteries, a fuel cell, and/or capacitors to provide power; a couplant reservoir and/or other fluid reservoir on the robot to provide fluids utilized during inspection operations, and/or wireless communication of any type for communications, and/or store data in a memory location on the robot for utilization after an inspection operation or a portion of an inspection operation.

In certain embodiments, maintaining sleds 1 (and sensors or tools mounted thereupon) in contact and/or selectively oriented (e.g., perpendicular) to a surface being traversed provides for: reduced noise, reduced lost-data periods, fewer false positives, and/or improved quality of sensing; and/or improved efficacy of tools associated with the sled (less time to complete a repair, cleaning, or marking operation; lower utilization of associated fluids therewith; improved confidence of a successful repair, cleaning, or marking operation, etc.). In certain embodiments, maintaining sleds 1 in contacts and/or selectively oriented to the surface being traversed provides for reduced losses of couplant during inspection operations.

In certain embodiments, the combination of the pivot points 16, 17, 18) and torsion spring 21 act together to position the sled 1 perpendicular to the surface being traversed. The biasing force of the spring 21 may act to extend the sled arms 20 downward and away from the payload shaft 19 and inspection sled mount 14, pushing the sled 1 toward the inspection surface. The torsion spring 21 may be passive, applying a constant downward pressure, or the torsion spring 21 or other biasing member may be active, allowing the downward pressure to be varied. In an illustrative and non-limiting example, an active torsion spring 21 might be responsive to a command to relax the spring tension, reducing downward pressure and/or to actively pull the sled 1 up, when the sled 1 encounters an obstacle, allowing the sled 1 to more easily move over the obstacle. The active torsion spring 21 may then be responsive to a command to restore tension, increasing downward pressure once the obstacle is cleared to maintain the close contact between the sled 1 and the surface. The use of an active spring may enable changing the angle of a sensor or tool relative to the surface being traversed during a traverse. Design considerations with respect to the surfaces being inspected may be used to design the active control system. If the spring 21 is designed to fail closed, the result would be similar to a passive spring and the sled 1 would be pushed toward the surface being inspected. If the spring 21 is designed to fail open, the result would be increased obstacle clearance capabilities. In embodiments, spring 21 may be a combination of passive and active biasing members.

The downward pressure applied by the torsion spring 21 may be supplemented by a spring within the sled 1 further pushing a sensor or tool toward the surface. The downward pressure may be supplemented by one or more magnets in/on the sled 1 pulling the sled 1 toward the surface being traversed. The one or more magnets may be passive magnets that are constantly pulling the sled 1 toward the surface being traversed, facilitating a constant distance between the sled 1 and the surface. The one or magnets may be active magnets where the magnet field strength is controlled based on sensed orientation and/or distance of the sled 1 relative to the inspection surface. In an illustrative and non-limiting example, as the sled 1 lifts up from the surface to clear an obstacle and it starts to roll, the strength of the magnet may be increased to correct the orientation of the sled 1 and draw it back toward the surface.

The connection between each sled 1 and the sled arms 20 may constitute a simple pin or other quick release connect/disconnect attachment. The quick release connection at the pivot points 17 may facilitate attaching and detaching sleds 1 enabling a user to easily change the type of inspection sled attached, swapping sensors, types of sensors, tools, and the like.

Figure 16:
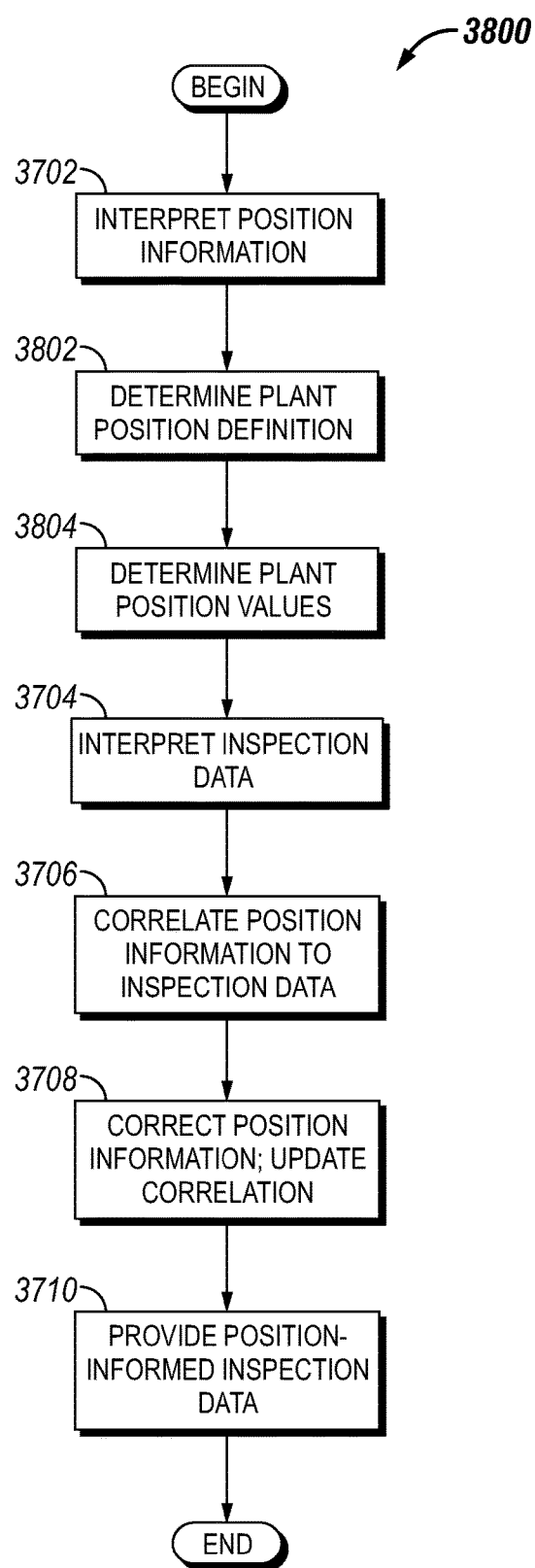
FIG. 16 is a schematic flow diagram of another procedure to provide position informed inspection data.

In embodiments, as depicted in FIG. 16, there may be multiple attachment or pivot point accommodations 9 available on the sled 1 for connecting the sled arms 20. The location of the pivot point accommodations 9 on the sled 1 may be selected to accommodate conflicting goals such as sled 1 stability and clearance of surface obstacles. Positioning the pivot point accommodations 9 behind the center of sled in the longitudinal direction of travel may facilitate clearing obstacles on the surface being traversed. Positioning the pivot point accommodation 9 forward of the center may make it more difficult for the sled 1 to invert or flip to a position where it cannot return to a proper inspection operation position. It may be desirable to alter the connection location of the sled arms 20 to the pivot point accommodations 9 (thereby defining the pivot point 17) depending on the direction of travel. The location of the pivot points 17 on the sled 1 may be selected to accommodate conflicting goals such as sensor positioning relative to the surface and avoiding excessive wear on the bottom of the sled. In certain embodiments, where multiple pivot point accommodations 9 are available, pivot point 17 selection can occur before an inspection operation, and/or be selectable during an inspection operation (e.g., arms 20 having an actuator to engage a selected one of the pivot points 9, such as extending pegs or other actuated elements, thereby selecting the pivot point 17).

In embodiments, the degree of rotation allowed by the pivot points 17 may be adjustable. This may be done using mechanical means such as a physical pin or lock. In embodiments, the connection between the sled 1 and the sled arms 20 may include a spring that biases the pivot points 17 to tend to pivot in one direction or another. The spring may be passive, with the selection of the spring based on the desired strength of the bias, and the installation of the spring may be such as to preferentially push the front or the back of the sled 1 down. In embodiments, the spring may be active, and the strength and preferential pivot may be varied based on direction of travel, presence of obstacles, desired pivoting responsiveness of the sled 1 to the presence of an obstacle or variation in the inspection surface, and the like. In certain embodiments, opposing springs or biasing members may be utilized to bias the sled 1 back to a selected position (e.g., neutral/flat on the surface, tilted forward, tilted rearward, etc.). Where the sled 1 is biased in a given direction (e.g., forward or rearward), the sled 1 may nevertheless operate in a neutral position during inspection operations, for example due to the down force from the arm 20 on the sled 1.

For a surface having a variable curvature, a chamfer or curve on the bottom surface of a sled 1 tends to guide the sled 1 to a portion of the variable curvature matching the curvature of the bottom surface. Accordingly, the curved bottom surface supports maintaining a selected orientation of the sled 1 to the inspection surface. In certain embodiments, the bottom surface of the sled 1 is not curved, and one or more pivots 16, 17, 18 combined with the down force from the arms 20 combine to support maintaining a selected orientation of the sled 1 to the inspection surface. In some embodiments, the bottom of the sled 1 may be flexible such that the curvature may adapt to the curvature of the surface being traversed.

The material on the bottom of the sled 1 may be chosen to prevent wear on the sled 1, reduce friction between the sled 1 and the surface being traversed, or a combination of both. Materials for the bottom of the sled may include materials such as plastic, metal, or a combination thereof. Materials for the bottom of the sled may include an epoxy coat, a replaceable layer of polytetrafluoroethylene (e.g., Teflon), acetyl (e.g.—Delrin® acetyl resin), ultrafine molecular weight polyethylene (PMW), and the like.

Certain embodiments include an apparatus for providing acoustic coupling between a carriage (or sled) mounted sensor and an inspection surface. Example and non-limiting structures to provide acoustic coupling between a carriage mounted sensor and an inspection surface include an acoustic (e.g., an ultra-sonic) sensor mounted on a sled 1, the sled 1 mounted on a payload 2, and the payload 2 coupled to an inspection robot. An example apparatus further includes providing the sled 1 with a number of degrees of freedom of motion, such that the sled 1 can maintain a selected orientation with the inspection surface—including a perpendicular orientation and/or a selected angle of orientation. Additionally or alternatively, the sled 1 is configured to track the surface, for example utilizing a shaped bottom of the sled 1 to match a shape of the inspection surface or a portion of the inspection surface, and/or the sled 1 having an orientation such that, when the bottom surface of the sled 1 is positioned against the inspection surface, the sensor maintains a selected angle with respect to the inspection surface.

Certain additional embodiments of an apparatus for providing acoustic coupling between a carriage mounted sensor and an inspection surface include utilization of a fixed-distance structure that ensures a consistent distance between the sensor and the inspection surface. For example, the sensor may be mounted on a cone, wherein an end of the cone touches the inspection surface and/or is maintained in a fixed position relative to the inspection surface, and the sensor mounted on the cone thereby is provided at a fixed distance from the inspection surface. In certain embodiments, the sensor may be mounted on the cone, and the cone mounted on the sled 1, such that a change-out of the sled 1 can be performed to change out the sensor, without engaging or disengaging the sensor from the cone. In certain embodiments, the cone may be configured such that couplant provided to the cone results in a filled couplant chamber between a transducer of the sensor and the inspection surface. In certain additional embodiments, a couplant entry position for the cone is provided at a vertically upper position of the cone, between the cone tip portion and the sensor mounting end, in an orientation of the inspection robot as it is positioned on the surface, such that couplant flow through the cone tends to prevent bubble formation in the acoustic path between the sensor and the inspection surface. In certain further embodiments, the couplant flow to the cone is adjustable, and is capable, for example, to be increased in response to a determination that a bubble may have formed within the cone and/or within the acoustic path between the sensor and the inspection surface. In certain embodiments, the sled 1 is capable of being lifted, for example with an actuator that lifts an arm 20, and/or that lifts a payload 2, such that a free fluid path for couplant and attendant bubbles to exit the cone and/or the acoustic path is provided. In certain embodiments, operations to eliminate bubbles in the cone and/or acoustic path are performed periodically, episodically (e.g., after a given inspection distance is completed, at the beginning of an inspection run, after an inspection robot pauses for any reason, etc.), and/or in response to an active determination that a bubble may be present in the cone and/or the acoustic path.

An example apparatus provides for low or reduced fluid loss of couplant during inspection operations. Example and non-limiting structures to provide for low or reduced fluid loss include providing for a limited flow path of couplant out of the inspection robot system—for example utilizing a cone having a smaller exit couplant cross-sectional area than a cross-sectional area of a couplant chamber within the cone. In certain embodiments, an apparatus for low or reduced fluid loss of couplant includes structures to provide for a selected down force on a sled 1 which the sensor is mounted on, on an arm 20 carrying a sled 1 which the sensor is mounted on, and/or on a payload 2 which the sled 1 is mounted on. Additionally, or alternatively, an apparatus providing for low or reduced fluid loss of couplant includes a selected down force on a cone providing for couplant connectivity between the sensor and the inspection surface—for example, a leaf spring or other biasing member within the sled 1 providing for a selected down force directly to the cone. In certain embodiments, low or reduced fluid loss includes providing for an overall fluid flow of between 0.12 to 0.16 gallons per minute to the inspection robot to support at least 10 ultra-sonic sensors. In certain embodiments, low or reduced fluid loss includes providing for an overall fluid flow of less than 50 feet per minute, less than 100 feet per minute, and less than 200 feet per minute fluid velocity in a tubing line feeding couplant to the inspection robot. In certain embodiments, low or reduced fluid loss includes providing sufficient couplant through a ¼" tubing line to feed couplant to at least 6, at least 8, at least 10, at least 12, or at least 16 ultra-sonic sensors to a vertical height of at least 25 feet, at least 50 feet, at least 100 feet, at least 150 feet, or at least 200 feet. An example apparatus includes a ¼" feed line to the inspection robot and/or to the payload 2, and a ⅛" feed line to individual sleds 1 and/or sensors (or acoustic cones associated with the sensors). In certain embodiments, larger and/or smaller diameter feed and individual fluid lines are provided.

The wheel 200 includes a channel 7 formed between enclosures 3, for example at the center of the wheel 200. In certain embodiments, the channel 7 provides for self-alignment on surfaces such as tubes or pipes. In certain embodiments, the enclosures 3 include one or more chamfered edges or surfaces, for example to improve contact with a rough or curved surface, and/or to provide for a selected surface contact area to avoid damage to the surface and/or the wheel 200. The flat face along the rim also allows for adhesion and predictable movement on flat surfaces.

The wheel 200 may be connected to the shaft using a splined hub 8. This design makes the wheel modular and also prevents it from binding due to corrosion. The splined hub 8 transfers the driving force from the shaft to the wheel. An example wheel 200 includes a magnetic aspect (e.g., magnet 6) capable to hold the robot on the wall, and accept a driving force to propel the robot, the magnet 6 positioned between conductive and/or ferromagnetic plates or enclosures, a channel 7 formed by the enclosures or plates, one or more chamfered and/or shaped edges, and/or a splined hub attachment to a shaft upon which the wheel is mounted.

The robotic vehicle may utilize a magnet-based wheel design that enables the vehicle to attach itself to and operate on ferromagnetic surfaces, including vertical and inverted surfaces (e.g., walls and ceilings).

The wheel 200 may have guiding features 2052 (reference FIGS. 9 to 10), such as grooves, concave or convex curvature, chamfers on the inner and/or outer edges, and the like. Referencing FIG. 9, an example guiding feature 2052 includes a chamfer on an outer edge of one or both enclosures 3, for example providing self-alignment of the wheels along a surface feature, such as between raised features, on top of raised features, between two pipes 502 (which may be adjacent pipes or spaced pipes), and/or a curvature of a tube, pipe, or tank (e.g., when the inspection robot 100 traverses the interior of a pipe 502). For instance, having a chamfer on the outer edge of the outside enclosure may enable the wheel to more easily seat next to, and track along a pipe 502 that is located outside the wheel. In another instance, having chamfers on both edges may enable the wheel to track with greater stability between two pipes 502. Referencing FIG. 10, guiding features 2052 are depicted as chamfers on both sides of the wheel enclosures 3—for example allowing the inspection robot 100 to traverse between pipes 502; on top of a single pipe 502 or on top of a span of pipes 502; along the exterior of a pipe, tube, or tank; and/or along the interior of a pipe, tube, or tank.

One skilled in the art will appreciate that a great variety of different guiding features 2052 may be used to accommodate the different surface characteristics to which the robotic vehicle may be applied. In certain embodiments, combinations of features provide for the inspection robot 100 to traverse multiple surfaces for a single inspection operation, reducing change-time for the wheels and the like. In certain embodiments, chamfer angles, radius of curvature, vertical depth of chamfers or curves, and horizontal widths of chamfers or curves are selectable to accommodate the sizing of the objects to be traversed during inspection operations. It can be seen that the down force provided by the magnet 6 combined with the shaping of the enclosure 3 guiding features 2052 combine to provide for self-alignment of the inspection robot 100 on the surface 500, and additionally provide for protection of the magnet 6 from exposure to shock, impacts, and/or materials that may be present on the inspection surface.

Figure 6:
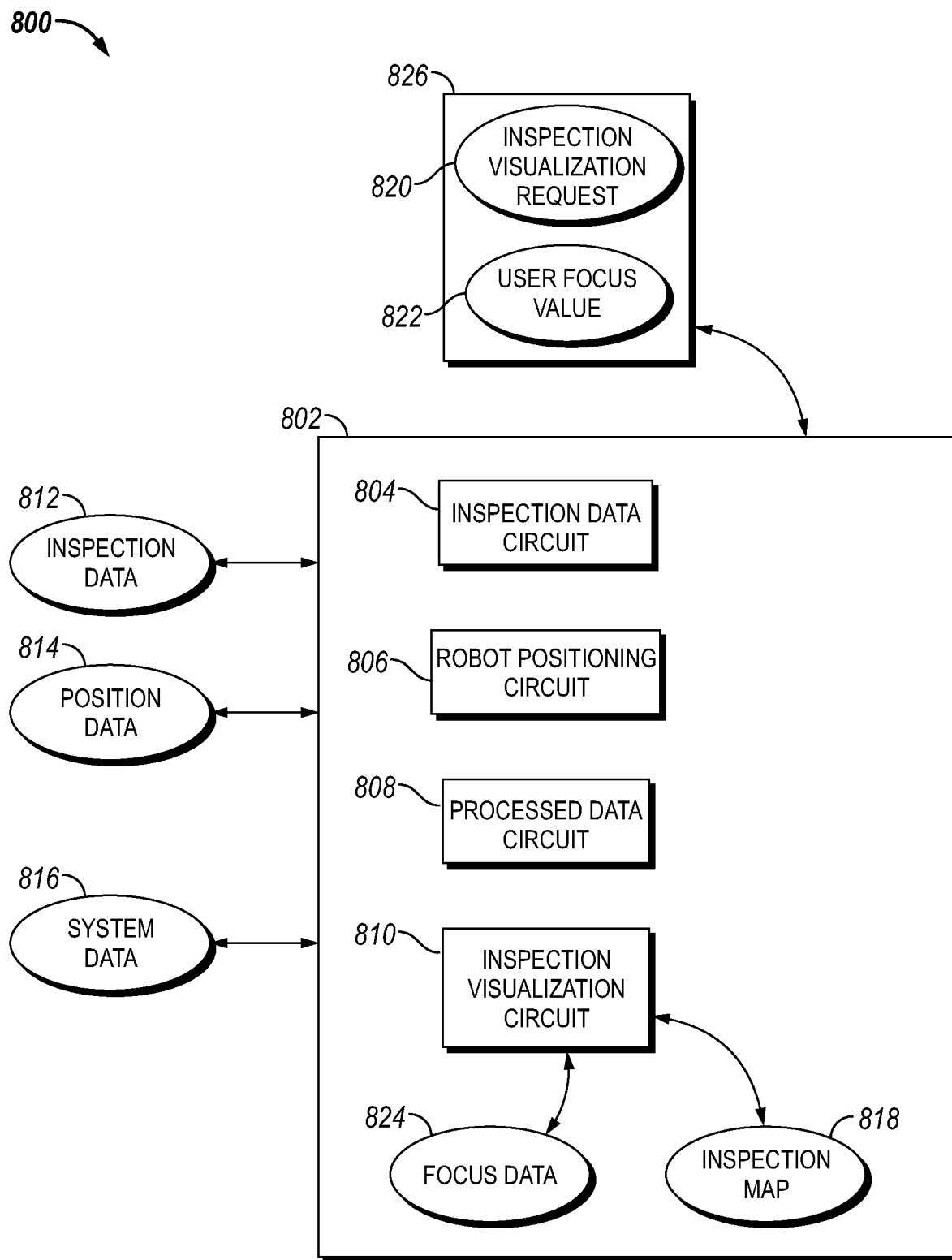
FIG. 6 is a schematic block diagram of an apparatus for providing an inspection map.

Additionally, or alternatively, guiding features may be selectable for the inspection surface—for example multiple enclosures and/or multiple wheel assemblies may be present for an inspection operation, and a suitable one of the multiple enclosures provided according to the curvature of surfaces present, the spacing of pipes, the presence of obstacles, or the like. In certain embodiments, an enclosure 3 may have an outer layer (e.g., a removable layer—not shown)—for example a snap on, slide over, coupled with set screws, or other coupling mechanism for the outer layer, such that just an outer portion of the enclosure is changeable to provide the guiding features. In certain embodiments, the outer layer may be a non-ferrous material (e.g., making installation and changes of the outer layer more convenient in the presence to the magnet, which may complicate quick changes of a fully ferromagnetic enclosure 3), such as a plastic, elastomeric material, aluminum, or the like. In certain embodiments, the outer layer may be a 3-D printable material (e.g., plastics, ceramics, or any other 3-D printable material) where the outer layer can be constructed at an inspection location after the environment of the inspection surface 500 is determined. An example includes the controller 802 (e.g., reference FIG. 6 and the related description) structured to accept inspection parameters (e.g., pipe spacing, pipe sizes, tank dimensions, etc.), and to provide a command to a 3-D printer responsive to the command to provide an outer layer configured for the inspection surface 500. In certain embodiments, the controller 802 further accepts an input for the wheel definition (e.g., where selectable wheel sizes, clearance requirements for the inspection robot 100, or other parameters not necessarily defined by the inspection surface 500), and further provides the command to the 3-D printer, to provide an outer layer configured for the inspection surface 500 and the wheel definition.

An example splined hub 8 design of the wheel assembly may enable modular re-configuration of the wheel, enabling each component to be easily switched out to accommodate different operating environments (e.g., ferromagnetic surfaces with different permeability, different physical characteristics of the surface, and the like). For instance, enclosures with different guiding features may be exchanged to accommodate different surface features, such as where one wheel configuration works well for a first surface characteristic (e.g., a wall with tightly spaced small pipes) and a second wheel configuration works well for a second surface characteristic (e.g., a wall with large pipes). The magnet 6 may also be exchanged to adjust the magnetic strength available between the wheel assembly and the surface, such as to accommodate different dimensional characteristics of the surface (e.g., features that prevent close proximity between the magnet 6 and a surface ferromagnetic material), different permeability of the surface material, and the like. Further, one or both enclosures 3 may be made of ferromagnetic material, such as to direct the flux lines of the magnet toward a surface upon which the robotic vehicle is riding, to direct the flux lines of the magnet away from other components of the robotic vehicle, and the like, enabling the modular wheel configuration to be further configurable for different ferromagnetic environments and applications.

In summary, an example robotic vehicle 100 includes sensor sleds having the following properties capable of providing a number of sensors for inspecting a selected object or surface, including a soft or hard bottom surface, including a bottom surface that matches an inspection surface (e.g., shape, contact material hardness, etc.), having a curved surface and/or ramp for obstacle clearance (including a front ramp and/or a back ramp), includes a column and/or couplant insert (e.g., a cone positioned within the sled, where the sensor couples to the cone) that retains couplant, improves acoustic coupling between the sensor and the surface, and/or assists in providing a consistent distance between the surface and the sensor; a plurality of pivot points between the main body (housing) 102 and the sled 1 to provide for surface orientation, improved obstacle traversal, and the like, a sled 1 having a mounting position configured to receive multiple types of sensors, and/or magnets in the sled to provide for control of downforce and/or stabilized positioning between the sensor and the surface. In certain implementations of the present invention, it is advantageous to not only be able to adjust spacing between sensors but also to adjust their angular position relative to the surface being inspected. The present invention may achieve this goal by implementing systems having several translational and rotational degrees of freedom.

Referencing FIG. 2, an example payload 2 includes selectable spacing between sleds 1, for example to provide selectable sensor spacing. In certain embodiments, spacing between the sensors may be adjusted using a lockable translational degree of freedom such as a set screw allowing for the rapid adjustment of spacing. Additionally, or alternatively, any coupling mechanism between the arm 20 and the payload 2 is contemplated herein. In certain embodiments, a worm gear or other actuator allows for the adjustment of sensor spacing by a controller and/or in real time during operations of the system 100. In certain embodiments, the payload 2 includes a shaft 19 whereupon sleds 1 are mounted (e.g., via the arms 20). In these embodiments, the sensor mounts 14 are mounted on a shaft 19. The example of FIG. 2 includes a shaft cap 15 providing structural support to a number of shafts of the payload 2. In the example of FIG. 2, two shafts are utilized to mount the payload 2 onto the housing 102, and one shaft 19 is utilized to mount the arms 20 onto the payload 2. The arrangement utilizing a payload 2 is a non-limiting example, that allows multiple sensors and sleds 1 to be configured in a particular arrangement, and rapidly changed out as a group (e.g., swapping out a first payload and set of sensors for a second payload and set of sensors, thereby changing an entire sensor arrangement in a single operation). However, in certain embodiments one or more of the payload 2, arms 20, and/or sleds 1 may be fixedly coupled to the respective mounting features, and numerous benefits of the present disclosure are nevertheless achieved in such embodiments.

During operation, an example system 100 encounters obstacles on the surface of the structure being evaluated, and the pivots 16, 17, 18 provide for movement of the arm 20 to traverse the obstacle. In certain embodiments, the system 100 is a modular design allowing various degrees of freedom of movement of sleds 1, either in real-time (e.g., during an inspection operation) and/or at configuration time (e.g., an operator or controller adjusts sensor or sled positions, down force, ramp shapes of sleds, pivot angles of pivots 16, 17, 18 in the system 100, etc.) before an inspection operation or a portion of an inspection operation, and including at least the following degrees of freedom: translation (e.g., payload 2 position relative to the housing 102); translation of the sled arm 20 relative to the payload 2, rotation of the sled arm 20, rotation of the sled arm 20 mount on the payload 2, and/or rotation of the sled 1 relative to the sled arm 20.

In certain embodiments, a system 100 allows for any one or more of the following adjustments: spacing between sensors (perpendicular to the direction of inspection motion, and/or axially along the direction of the inspection motion); adjustments of an angle of the sensor to an outer diameter of a tube or pipe; momentary or longer term displacement to traverse obstacles; provision of an arbitrary number and positioning of sensors; etc.

An example inspection robot 100 may utilize downforce capabilities for sensor sleds 1, such as to control proximity and lateral stabilization of sensors. For instance, an embedded magnet (not shown) positioned within the sled 1 may provide passive downforce that increases stabilization for sensor alignment. In another example, the embedded magnet may be an electromagnet providing active capability (e.g., responsive to commands from a controller 802—reference FIG. 6) that provide adjustable or dynamic control of the downforce provided to the sensor sled. In another example, magnetic downforce may be provided through a combination of a passive permanent magnet and an active electromagnet, providing a default minimum magnetic downforce, but with further increases available through the active electromagnet. In embodiments, the electromagnet may be controlled by a circuit where the downforce is set by the operator, controlled by an on-board processor, controlled by a remote processor (e.g., through wireless communications), and the like, where processor control may utilize sensor data measurements to determine the downforce setting. In embodiments, downforce may be provided through suction force, spring force, and the like. In certain embodiments, downforce may be provided by a biasing member, such as a torsion spring or leaf spring, with active or passive control of the downforce—for example positioning a tension or confinement of the spring to control the downforce. In certain embodiments, the magnet, biasing member, or other downforce adjusting member may adjust the downforce on the entire sled 1, on an entire payload 2, and/or just on the sensor (e.g., the sensor has some flexibility to move within the sled 1, and the downforce adjustment acts on the sensor directly).

An example system 100 includes an apparatus 800 (reference FIG. 6 and the disclosure referencing FIG. 6) for providing enhanced inspection information, including position-based information. The apparatus 800 and operations to provide the position-based information are described in the context of a particular physical arrangement of an industrial system for convenient illustration, however any physical arrangement of an industrial system is contemplated herein. Referencing FIG. 3, an example system includes a number of pipes 502—for example vertically arranged pipes such as steam pipes in a power plant, pipes in a cooling tower, exhaust or effluent gas pipes, or the like. The pipes 502 in FIG. 3 are arranged to create a tower having a circular cross-section for ease of description. In certain embodiments, periodic inspection of the pipes is utilized to ensure that pipe degradation is within limits, to ensure proper operation of the system, to determine maintenance and repair schedules, and/or to comply with policies or regulations. In the example of FIG. 3, an inspection surface 500 includes the inner portion of the tower, whereby an inspection robot 100 traverses the pipes 502 (e.g., vertically, inspecting one or more pipes on each vertical run). An example inspection robot 100 includes configurable payloads 2, and may include ultra-sonic sensors (e.g., to determine wall thickness and/or pipe integrity), magnetic sensors (e.g., to determine the presence and/or thickness of a coating on a pipe), cameras (e.g., to provide for visual inspection, including in EM ranges outside of the visual range, temperatures, etc.), composition sensors (e.g., gas chromatography in the area near the pipe, spectral sensing to detect leaks or anomalous operation, etc.), temperature sensing, pressure sensing (ambient and/or specific pressures), vibration sensing, density sensing, etc. The type of sensing performed by the inspection robot 100 is not limiting to the present disclosure except where specific features are described in relation to specific sensing challenges and opportunities for those sensed parameters as will be understood to one of skill in the art having the benefit of the disclosures herein.

In certain embodiments, the inspection robot 100 has alternatively or additionally, payload(s) 2 configured to provide for marking of aspects of the inspection surface 500 (e.g., a paint sprayer, an invisible or UV ink sprayer, and/or a virtual marking device configured to mark the inspection surface 500 in a memory location of a computing device but not physically), to repair a portion of the inspection surface 500 (e.g., apply a coating, provide a welding operation, apply a temperature treatment, install a patch, etc.), and/or to provide for a cleaning operation. Referencing FIG. 4, an example inspection robot 100 is depicted in position on the inspection surface 500 at a location. In the example, the inspection robot 100 traverses vertically and is positioned between two pipes 502, with payloads 2 configured to clean, sense, treat, and/or mark two adjacent pipes 502 in a single inspection run. The inspection robot 100 in the example includes two payloads 2 at the "front" (ahead of the robot housing in the movement direction) and two payloads 2 at the "rear" (behind the robot housing in the movement direction). The inspection robot 100 may include any arrangement of payloads 2, including just one or more payloads in front or behind, just one or more payloads off to either or both sides, and combinations of these. Additionally, or alternatively, the inspection robot 100 may be positioned on a single pipe, and/or may traverse between positions during an inspection operation, for example to inspect selected areas of the inspection surface 500 and/or to traverse obstacles which may be present.

In certain embodiments, a "front" payload 2 includes sensors configured to determine properties of the inspection surface, and a "rear" payload 2 includes a responsive payload, such as an enhanced sensor, a cleaning device such as a sprayer, scrubber, and/or scraper, a marking device, and/or a repair device. The front-back arrangement of payloads 2 provides for adjustments, cleaning, repair, and/or marking of the inspection surface 500 in a single run—for example where an anomaly, gouge, weld line, area for repair, previously repaired area, past inspection area, etc., is sensed by the front payload 2, the anomaly can be marked, cleaned, repaired, etc. without requiring an additional run of the inspection robot 100 or a later visit by repair personnel. In another example, a first calibration of sensors for the front payload may be determined to be incorrect (e.g., a front ultra-sonic sensor calibrated for a particular coating thickness present on the pipes 502) and a rear sensor can include an adjusted calibration to account for the detected aspect (e.g., the rear sensor calibrated for the observed thickness of the coating). In another example, certain enhanced sensing operations may be expensive, time consuming, consume more resources (e.g., a gamma ray source, an alternate coupling such as a non-water or oil-based acoustic coupler, require a high energy usage, require greater processing resources, and/or incur usage charges to an inspection client for any reason) and the inspection robot 100 can thereby only utilize the enhanced sensing operations selectively and in response to observed conditions.

Figure 5:
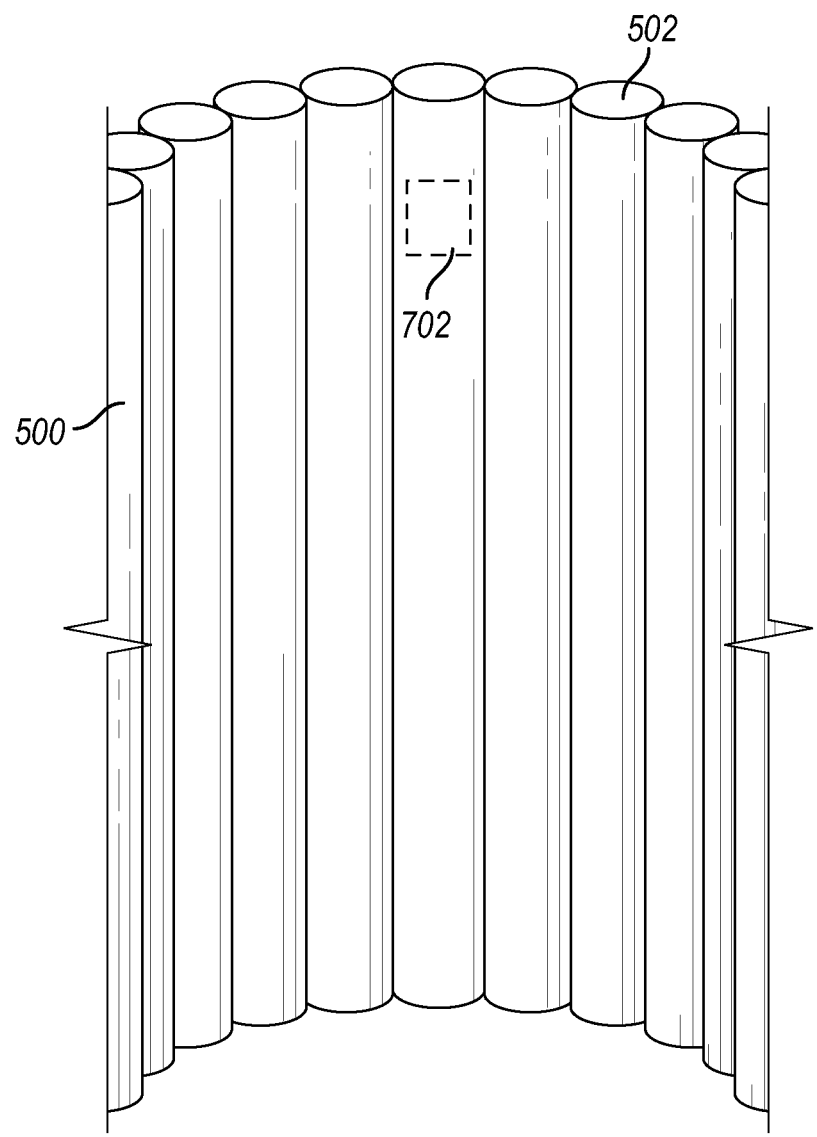
FIG. 5 is a schematic depiction of a location on an inspection surface.

Referencing FIG. 5, a location 702 on the inspection surface 500 is identified for illustration. In certain embodiments, the inspection robot 100 and/or apparatus 800 includes a controller 802 having a number of circuits structured to functionally execute operations of the controller 802. The controller 802 may be a single device (e.g., a computing device present on the robot 100, a computing device in communication with the robot 100 during operations and/or post-processing information communicated after inspection operations, etc.) and/or a combination of devices, such as a portion of the controller 802 positioned on the robot 100, a portion of the controller 802 positioned on a computing device in communication with the robot 100, a portion of the controller 802 positioned on a handheld device (not shown) of an inspection operator, and/or a portion of the controller 802 positioned on a computing device networked with one or more of the preceding devices. Additionally or alternatively, aspects of the controller 802 may be included on one or more logic circuits, embedded controllers, hardware configured to perform certain aspects of the controller 802 operations, one or more sensors, actuators, network communication infrastructure (including wired connections, wireless connections, routers, switches, hubs, transmitters, and/or receivers), and/or a tether between the robot 100 and another computing device. The described aspects of the example controller 802 are non-limiting examples, and any configuration of the robot 100 and devices in communication with the robot 100 to perform all or selected ones of operations of the controller 802 are contemplated herein as aspects of an example controller 802.

An example controller 802 includes an inspection data circuit 804 that interprets inspection data 812—for example sensed information from sensors mounted on the payload and determining aspects of the inspection surface 500, the status, deployment, and/or control of marking devices, cleaning devices, and/or repair devices, and/or post-processed information from any of these such as a wall thickness determined from ultra-sonic data, temperature information determined from imaging data, and the like. The example controller 802 further includes a robot positioning circuit 806 that interprets position data 814. An example robot positioning circuit 806 determines position data by any available method, including at least triangulating (or other positioning methods) from a number of available wireless devices (e.g., routers available in the area of the inspection surface 500, intentionally positioned transmitters/transceivers, etc.), a distance of travel measurement (e.g., a wheel rotation counter which may be mechanical, electro-magnetic, visual, etc.; a barometric pressure measurement; direct visual determinations such as radar, Lidar, or the like), a reference measurement (e.g., determined from distance to one or more reference points); a time-based measurement (e.g., based upon time and travel speed); and/or a dead reckoning measurement such as integration of detection movements. In the example of FIG. 5, a position measurement may include a height determination combined with an azimuthal angle measurement and/or a pipe number value such that the inspection surface 500 location is defined thereby. Any coordinate system and/or position description system is contemplated herein. In certain embodiments, the controller 802 includes a processed data circuit 808 that combines the inspection data 812 with the position data 814 to determine position-based inspection data. The operations of the processed data circuit 808 may be performed at any time—for example during operations of the inspection robot 100 such that inspection data 812 is stored with position data 814, during a post-processing operation which may be completed separately from the inspection robot 100, and/or which may be performed after the inspection is completed, and/or which may be commenced while the inspection is being performed. In certain embodiments, the linking of the position data 814 with the inspection data 812 may be performed if the linked position-inspection data is requested—for example upon a request by a client for an inspection map 818. In certain embodiments, portions of the inspection data 812 are linked to the position data 814 at a first time, and other portions of the inspection data 812 are linked to the position data 814 at a later time and/or in response to post-processing operations, an inspection map 818 request, or other subsequent event.

The example controller 802 further includes an inspection visualization circuit 810 that determines the inspection map 818 in response to the inspection data 812 and the position data 814, for example using post-processed information from the processed data circuit 808. In a further example, the inspection visualization circuit 810 determines the inspection map 818 in response to an inspection visualization request 820, for example from a client computing device 826. In the example, the client computing device 826 may be communicatively coupled to the controller 802 over the internet, a network, through the operations of a web application, and the like. In certain embodiments, the client computing device 826 securely logs in to control access to the inspection map 818, and the inspection visualization circuit 810 may prevent access to the inspection map 818, and/or provide only portions of the inspection map 818, depending upon the successful login from the client computing device 826, the authorizations for a given user of the client computing device 826, and the like.

In certain embodiments, the inspection visualization circuit 810 and/or inspection data circuit 804 further accesses system data 816, such as a time of the inspection, a calendar date of the inspection, the robot 100 utilized during the inspection and/or the configurations of the robot 100, a software version utilized during the inspection, calibration and/or sensor processing options selected during the inspection, and/or any other data that may be of interest in characterizing the inspection, that may be requested by a client, that may be required by a policy and/or regulation, and/or that may be utilized for improvement to subsequent inspections on the same inspection surface 500 or another inspection surface. In certain embodiments, the processed data circuit 808 combines the system data 816 with the processed data for the inspection data 812 and/or the position data 814, and/or the inspection visualization circuit incorporates the system data 816 or portions thereof into the inspection map 818. In certain embodiments, any or all aspects of the inspection data 812, position data 814, and/or system data 816 may be stored as meta-data (e.g., not typically available for display), may be accessible in response to prompts, further selections, and/or requests from the client computing device 826, and/or may be utilized in certain operations with certain identifiable aspects removed (e.g., to remove personally identifiable information or confidential aspects) such as post-processing to improve future inspection operations, reporting for marketing or other purposes, or the like.

In certain embodiments, the inspection visualization circuit 810 is further responsive to a user focus value 822 to update the inspection map 818 and/or to provide further information (e.g., focus data 824) to a user, such as a user of the client computing device 826. For example, a user focus value 822 (e.g., a user mouse position, menu selection, touch screen indication, keystroke, or other user input value indicating that a portion of the inspection map 818 has received the user focus) indicates that a location 702 of the inspection map 818 has the user focus, and the inspection visualization circuit 810 generates the focus data 824 in response to the user focus value 822, including potentially the location 702 indicated by the user focus value 822.

Figure 7:
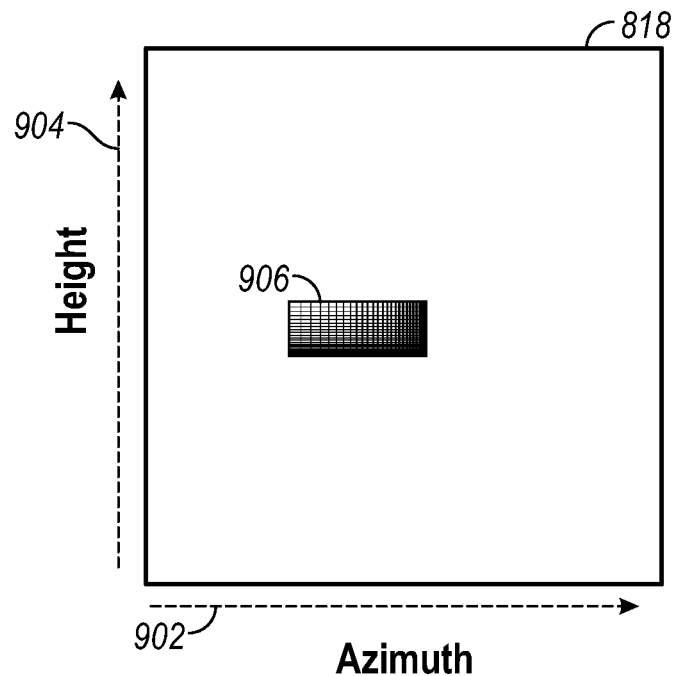
FIG. 7 depicts an illustrative inspection map.

Referencing FIG. 7, an example inspection map 818 is depicted. In the example, the inspection surface 500 may be similar to that depicted in FIG. 3—for example the interior surface of tower formed by a number of pipes to be inspected. The example inspection map 818 includes an azimuthal indication 902 and a height indication 904, with data from the inspection depicted on the inspection map 818 (e.g., shading at 906 indicating inspection data corresponding to that visual location). Example and non-limiting inspection maps 818 include numeric values depicted on the visualization, colors, shading or hatching, and/or any other visual depiction method. In certain embodiments, more than one inspection dimension may be visualized (e.g., temperatures and wall thickness), and/or the inspection dimension may be selected or changed by the user. Additionally, or alternatively, physical elements such as obstacles, build up on the inspection surface, weld lines, gouges, repaired sections, photos of the location (e.g., the inspection map 818 laid out over a panoramic photograph of the inspection surface 500 with data corresponding to the physical location depicted), may be depicted with or as a part of the inspection map 818. Additionally or alternatively, visual markers may be positioned on the inspection map 818—for example a red "X" (or any other symbol, including a color, bolded area, highlight, image data, a thumbnail, etc.) at a location of interest on the map—which marking may be physically present on the actual inspection surface 500 or only virtually depicted on the inspection map 818. It can be seen that the inspection map 818 provides for a convenient and powerful reference tool for a user to determine the results of the inspection operation and plan for future maintenance, repair, or inspections, as well as planning logistics in response to the number of aspects of the system requiring further work or analysis and the location of the aspects requiring further work or analysis. Accordingly, inspection results can be analyzed more quickly, regulatory or policy approvals and system up-time can be restored more quickly (if the system was shut-down for the inspection), configurations of an inspection robot 100 for a future inspection can be performed more quickly (e.g. preparing payload 2 configurations, obstacle management, and/or sensor selection or calibration), any of the foregoing can be performed with greater confidence that the results are reliable, and/or any combinations of the foregoing. Additionally or alternatively, less invasive operations can be performed, such as virtual marking which would not leave marks on the inspection surface 500 that might be removed (e.g., accidentally) before they are acted upon, which may remain after being acted upon, or which may create uncertainty as to when the marks were made over the course of multiple inspections and marking generations.

Figure 8:
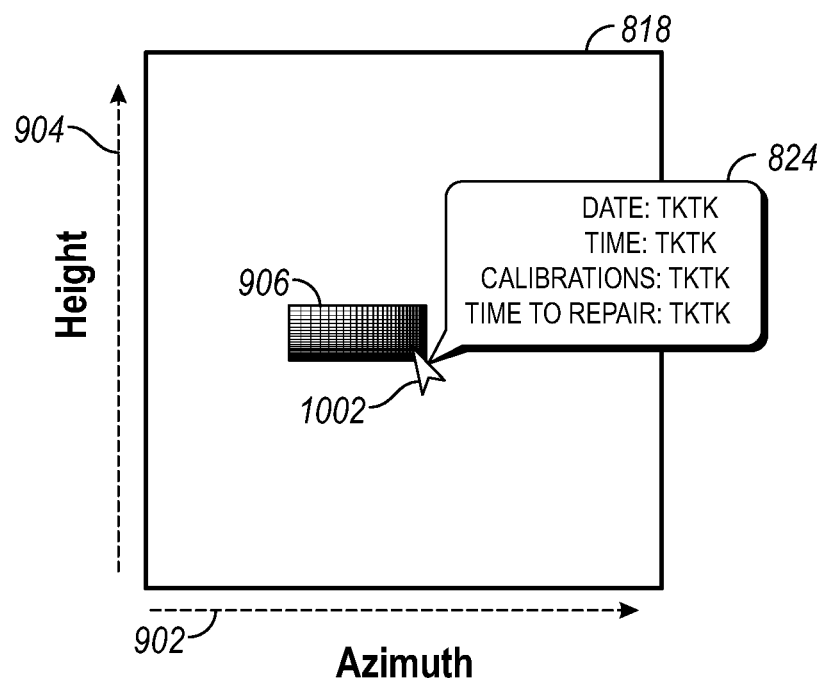
FIG. 8 depicts an illustrative inspection map and focus data.

Referencing FIG. 8, an illustrative example inspection map 818 having focus data 824 is depicted. The example inspection map 818 is responsive to a user focus value 822, such as a mouse cursor 1002 hovering over a portion of the inspection map 818. In the example, the focus data 824 comes up as a tool-tip, although any depiction operations such as output to a file, populating a static window for focus data 824, or any other operations known in the art are contemplated herein. The example focus data 824 includes a date (e.g., of the inspection), a time (e.g., of the inspection), the sensor calibrations utilized for the inspection, and the time to repair (e.g., down-time that would be required, actual repair time that would be required, the estimated time until the portion of the inspection surface 500 will require a repair, or any other description of a "time to repair"). The depicted focus data 824 is a non-limiting example, and any other information of interest may be utilized as focus data 824. In certain embodiments, a user may select the information, or portions thereof, utilized on the inspection map 818—including at least the axes 902, 904 (e.g., units, type of information, relative versus absolute data, etc.) and the depicted data (e.g., units, values depicted, relative versus absolute values, thresholds or cutoffs of interest, processed values such as virtually determined parameters, and/or categorical values such as "PASSED" or "FAILED"). Additionally, or alternatively, a user may select the information, or portions thereof, utilized as the focus data 824.

In certain embodiments, an inspection map 818 (or display) provides an indication of how long a section of the inspection surface 500 is expected to continue under nominal operations, how much material should be added to a section of the inspection surface 500 (e.g., a repair coating or other material), and/or the type of repair that is needed (e.g., wall thickness correction, replacement of a coating, fixing a hole, breach, rupture, etc.).

In embodiments, the robotic vehicle may incorporate a number of sensors distributed across a number of sensor sleds 1, such as with a single sensor mounted on a single sensor sled 1, a number of sensors mounted on a single sensor sled 1, a number of sensor sleds 1 arranged in a linear configuration perpendicular to the direction of motion (e.g., side-to-side across the robotic vehicle), arranged in a linear configuration along the direction of motion (e.g., multiple sensors on a sensor sled 1 or multiple sensor sleds 1 arranged to cover the same surface location one after the other as the robotic vehicle travels). Additionally, or alternatively, a number of sensors may be arranged in a two-dimensional surface area, such as by providing sensor coverage in a distributed manner horizontally and/or vertically (e.g., in the direction of travel), including offset sensor positions (e.g., reference FIG. 12). In certain embodiments, the utilization of payloads 2 with sensor sleds mounted thereon enables rapid configuration of sensor placement as desired, sleds 1 on a given payload 2 can be further adjusted, and/or sensor (s) on a given sled can be changed or configured as desired.

In certain embodiments, two payloads 2 side-by-side allow for a wide horizontal coverage of sensing for a given travel of the inspection robot 100—for example as depicted in FIG. 1. In certain embodiments, a payload 2 is coupled to the inspection robot 100 with a pin or other quick-disconnect arrangement, allowing for the payload 2 to be removed, to be reconfigured separately from the inspection robot 100, and/or to be replaced with another payload 2 configured in a desired manner. The payload 2 may additionally have a couplant connection to the inspection robot 100 (e.g., reference FIG. 29—where a single couplant connection provides coupling connectivity to all sleds 1A and 1B) and/or an electrical connection to the inspection robot 100. Each sled may include a couplant connection conduit where the couplant connection conduit is coupled to a payload couplant connection at the upstream end and is coupled to the couplant entry of the cone at the downstream end. Multiple payload couplant connections on a single payload may be coupled together to form a single couplant connection between the payload and the inspection robot. The single couplant connection per payload facilitates the changing of the payload without having to connect/disconnect the couplant line connections at each sled. The couplant connection conduit between the payload couplant connection and the couplant entry of the cone facilitates connecting/disconnecting a sled from a payload without having to connect/disconnect the couplant connection conduit from the couplant entry of the cone. The couplant and/or electrical connections may include power for the sensors as required, and/or communication coupling (e.g., a datalink or network connection). Additionally, or alternatively, sensors may communicate wirelessly to the inspection robot 100 or to another computing device, and/or sensors may store data in a memory associated with the sensor, sled 1, or payload 2, which may be downloaded at a later time. Any other connection type required for a payload 2, such as compressed air, paint, cleaning solutions, repair spray solutions, or the like, may similarly be coupled from the payload 2 to the inspection robot 100.

The horizontal configuration of sleds 1 (and sensors) is selectable to achieve the desired inspection coverage. For example, sleds 1 may be positioned to provide a sled running on each of a selected number of pipes of an inspection surface, positioned such that several sleds 1 combine on a single pipe of an inspection surface (e.g., providing greater radial inspection resolution for the pipe), and/or at selected horizontal distances from each other (e.g., to provide 1 inch resolution, 2 inch resolution, 3 inch resolution, etc.). In certain embodiments, the degrees of freedom of the sensor sleds 1 (e.g., from pivots 16, 17, 18) allow for distributed sleds 1 to maintain contact and orientation with complex surfaces.

In certain embodiments, sleds 1 are articulable to a desired horizontal position. For example, quick disconnects may be provided (pins, claims, set screws, etc.) that allow for the sliding of a sled 1 to any desired location on a payload 2, allowing for any desired horizontal positioning of the sleds 1 on the payload 2. Additionally, or alternatively, sleds 1 may be movable horizontally during inspection operations. For example, a worm gear or other actuator may be coupled to the sled 1 and operable (e.g., by a controller 802) to position the sled 1 at a desired horizontal location. In certain embodiments, only certain ones of the sleds 1 are moveable during inspection operations—for example outer sleds 1 for maneuvering past obstacles. In certain embodiments, all of the sleds 1 are moveable during inspection operations—for example to support arbitrary inspection resolution (e.g., horizontal resolution, and/or vertical resolution), to configure the inspection trajectory of the inspection surface, or for any other reason. In certain embodiments, the payload 2 is horizontally moveable before or during inspection operations. In certain embodiments, an operator configures the payload 2 and/or sled 1 horizontal positions before inspection operations (e.g., before or between inspection runs). In certain embodiments, an operator or a controller 802 configures the payload 2 and/or sled 1 horizontal positions during inspection operations. In certain embodiments, an operator can configure the payload 2 and/or sled 1 horizontal positions remotely, for example communicating through a tether or wirelessly to the inspection robot.

The vertical configuration of sleds 1 is selectable to achieve the desired inspection coverage (e.g., horizontal resolution, vertical resolution, and/or redundancy). For example, referencing FIG. 11, multiple payloads 2 are positioned on a front side of the inspection robot 100, with forward payloads 2006 and rear payloads 1402. In certain embodiments, a payload 2 may include a forward payload 2006 and a rear payload 1402 in a single hardware device (e.g., with a single mounting position to the inspection robot 100), and/or may be independent payloads 2 (e.g., with a bracket extending from the inspection robot 100 past the rear payload 1402 for mounting the forward payloads 2006). In the example of FIG. 11, the rear payload 1402 and forward payload 2006 include sleds 1 mounted thereupon which are in vertical alignment 1302—for example a given sled 1 of the rear payload 1402 traverses the same inspection position (or horizontal lane) of a corresponding sled 1 of the forward payload 2006. The utilization of aligned payloads 2 provides for a number of capabilities for the inspection robot 100, including at least: redundancy of sensing values (e.g., to develop higher confidence in a sensed value); the utilization of more than one sensing calibration for the sensors (e.g., a front sensor utilizes a first calibration set, and a rear sensor utilizes a second calibration set); the adjustment of sensing operations for a rear sensor relative to a forward sensor (e.g., based on the front sensed parameter, a rear sensor can operate at an adjusted range, resolution, sampling rate, or calibration); the utilization of a rear sensor in response to a front sensor detected value (e.g., a rear sensor may be a high cost sensor—either high power, high computing/processing requirements, an expensive sensor to operate, etc.) where the utilization of the rear sensor can be conserved until a front sensor indicates that a value of interest is detected; the operation of a repair, marking, cleaning, or other capability rear payload 1402 that is responsive to the detected values of the forward payload 2006; and/or for improved vertical resolution of the sensed values (e.g., if the sensor has a given resolution of detection in the vertical direction, the front and rear payloads can be operated out of phase to provide for improved vertical resolution).

Figure 12:
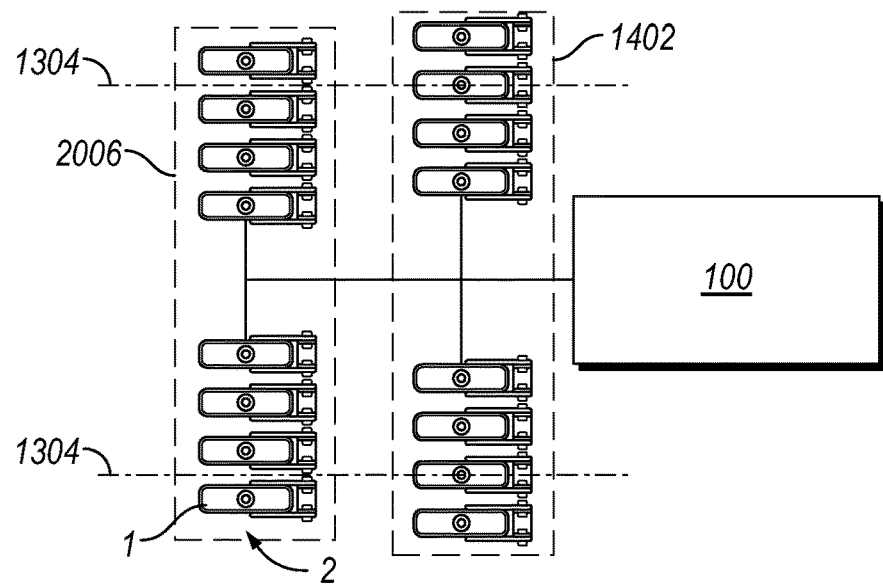
FIG. 12 is another schematic diagram of a payload arrangement.

In another example, referencing FIG. 12, multiple payloads 2 are positioned on the front of the inspection robot 100, with sleds 1 mounted on the front payload 2006 and rear payload 1402 that are not aligned (e.g., lane 1304 is not shared between sleds of the front payload 2006 and rear payload 1402). The utilization of not aligned payloads 2 allows for improved resolution in the horizontal direction for a given number of sleds 1 mounted on each payload 2. In certain embodiments, not aligned payloads may be utilized where the hardware space on a payload 2 is not sufficient to conveniently provide a sufficient number or spacing of sleds 1 to achieve the desired horizontal coverage. In certain embodiments, not aligned payloads may be utilized to limit the number of sleds 1 on a given payload 2, for example to provide for a reduced flow rate of couplant through a given payload-inspection robot connection, to provide for a reduced load on an electrical coupling (e.g., power supply and/or network communication load) between a given payload and the inspection robot. While the examples of FIGS. 11 and 12 depict aligned or not aligned sleds for convenience of illustration, a given inspection robot 100 may be configured with both aligned and not aligned sleds 1, for example to reduce mechanical loads, improve inspection robot balance, in response to inspection surface constraints, or the like.

It can be seen that sensors may be modularly configured on the robotic vehicle to collect data on specific locations across the surface of travel (e.g., on a top surface of an object, on the side of an object, between objects, and the like), repeat collection of data on the same surface location (e.g., two sensors serially collecting data from the same location, either with the same sensor type or different sensor types), provide predictive sensing from a first sensor to determine if a second sensor should take data on the same location at a second time during a single run of the robotic vehicle (e.g., an ultra-sonic sensor mounted on a leading sensor sled taking data on a location determines that a gamma-ray measurement should be taken for the same location by a sensor mounted on a trailing sensor sled configured to travel over the same location as the leading sensor), provide redundant sensor measurements from a plurality of sensors located in leading and trailing locations (e.g., located on the same or different sensor sleds to repeat sensor data collection), and the like.

In certain embodiments, the robotic vehicle includes sensor sleds with one sensor and sensor sleds with a plurality of sensors. A number of sensors arranged on a single sensor sled may be arranged with the same sensor type across the direction of robotic vehicle travel (e.g., perpendicular to the direction of travel, or "horizontal") to increase coverage of that sensor type (e.g., to cover different surfaces of an object, such as two sides of a pipe), arranged with the same sensor type along the direction of robotic vehicle travel (e.g., parallel to the direction of travel, or "vertical") to provide redundant coverage of that sensor type over the same location (e.g., to ensure data coverage, to enable statistical analysis based on multiple measurements over the same location), arranged with a different sensor type across the direction of robotic vehicle travel to capture a diversity of sensor data in side-by-side locations along the direction of robotic vehicle travel (e.g., providing both ultra-sonic and conductivity measurements at side-by-side locations), arranged with a different sensor type along the direction of robotic vehicle travel to provide predictive sensing from a leading sensor to a trailing sensor (e.g., running a trailing gamma-ray sensor measurement only if a leading ultra-sonic sensor measurement indicates the need to do so), combinations of any of these, and the like. The modularity of the robotic vehicle may permit exchanging sensor sleds with the same sensor configuration (e.g., replacement due to wear or failure), different sensor configurations (e.g., adapting the sensor arrangement for different surface applications), and the like.

Providing for multiple simultaneous sensor measurements over a surface area, whether for taking data from the same sensor type or from different sensor types, provides the ability to maximize the collection of sensor data in a single run of the robotic vehicle. If the surface over which the robotic vehicle was moving were perfectly flat, the sensor sled could cover a substantial surface with an array of sensors. However, the surface over which the robotic vehicle travels may be highly irregular, and have obstacles over which the sensor sleds must adjust, and so the preferred embodiment for the sensor sled is relatively small with a highly flexible orientation, as described herein, where a plurality of sensor sleds is arranged to cover an area along the direction of robotic vehicle travel. Sensors may be distributed amongst the sensor sleds as described for individual sensor sleds (e.g., single sensor per sensor sled, multiple sensors per sensor sled (arranged as described herein)), where total coverage is achieved through a plurality of sensor sleds mounted to the robotic vehicle. One such embodiment, as introduced herein, such as depicted in FIG. 1, comprises a plurality of sensor sleds arranged linearly across the direction of robotic vehicle travel, where the plurality of sensor sleds is capable of individually adjusting to the irregular surface as the robotic vehicle travels. Further, each sensor sled may be positioned to accommodate regular characteristics in the surface (e.g., positioning sensor sleds to ride along a selected portion of a pipe aligned along the direction of travel), to provide for multiple detections of a pipe or tube from a number of radial positions, sensor sleds may be shaped to accommodate the shape of regular characteristics in the surface (e.g., rounded surface of a pipe), and the like. In this way, the sensor sled arrangement may accommodate both the regular characteristics in the surface (e.g., a series of features along the direction of travel) and irregular characteristics along the surface (e.g., obstacles that the sensor sleds flexibly mitigate during travel along the surface).

Although FIG. 1 depicts a linear arrangement of sensor sleds with the same extension (e.g., the same connector arm length), another example arrangement may include sensor sleds with different extensions, such as where some sensor sleds are arranged to be positioned further out, mounted on longer connection arms. This arrangement may have the advantage of allowing a greater density of sensors across the configuration, such as where a more leading sensor sled could be positioned linearly along the configuration between two more trailing sensor sleds such that sensors are provided greater linear coverage than would be possible with all the sensor sleds positioned side-by-side. This configuration may also allow improved mechanical accommodation between the springs and connectors that may be associated with connections of sensor sleds to the arms and connection assembly (e.g., allowing greater individual movement of sensor sleds without the sensor sleds making physical contact with one another).

Referring to FIG. 11, an example configuration of sensor sleds includes the forward payload 2006 ahead of the rear payload 1402, such as where each utilizes a payload mount assembly 6900 (see FIG. 32) for mounting the payloads. Again, although FIG. 11 depicts the sensor sled arrays with equal lengths, different lengths, as shown in FIG. 12, may be utilized to position, for instance, sensor sleds of sensor sled array 1402 in intermediate positions between rear sensor sleds of rear payload 1402 and forward sensor sleds of the forward payload 2006. As was the case with the arrangement of a plurality of sensors on a single sensor sled to accommodate different coverage options (e.g., maximizing coverage, predictive capabilities, redundancy, and the like), the extended area configuration of sensors in this multiple sensor sled array arrangement allows similar functionality. For instance, a sensor sled positioned in a lateral position on the forward payload 2006 may provide redundant or predictive functionality for another sensor sled positioned in the same lateral position on the rear payload 1402. In the case of a predictive functionality, the greater travel distance afforded by the separation between a sensor sled mounted on the front payload 2006 and a sensor sled mounted on the rear payload 1402 may provide for additional processing time for determining, for instance, whether the sensor in the trailing sensor sled should be activated. For example, the leading sensor collects sensor data and sends that data to a processing function (e.g., wired communication to on-board or external processing, wireless communication to external processing), the processor takes a period of time to determine if the trailing sensor should be activated, and after the determination is made, activates the trailing sensor. The separation of the two sensors, divided by the rate of travel of the robotic vehicle, determines the time available for processing. The greater the distance, the greater the processing time allowed. Referring to FIG. 13, in another example, distance is increased further by utilizing a trailing payload 2008, thus increasing the distance and processing time further. Additionally, or alternatively, the hardware arrangement of FIG. 13 may provide for more convenient integration of the trailing payload 2008 rather than having multiple payloads 1402, 2006 in front of the inspection robot 100. In certain embodiments, certain operations of a payload 2 may be easier or more desirable to perform on a trailing side of the inspection robot 100—such as spraying of painting, marking, or repair fluids, to avoid the inspection robot 100 having to be exposed to such fluids as a remaining mist, by gravity flow, and/or having to drive through the painted, cleaned, or repaired area. In certain embodiments, an inspection robot 100 may additionally or alternatively include both multiple payloads 1402, 2006 in front of the inspection robot (e.g., as depicted in FIGS. 11 and 12) and/or one or more trailing payloads (e.g., as depicted in FIG. 13).

In another example, the trailing payload 2008 may provide a greater distance for functions that would benefit the system by being isolated from the sensors in the forward end of the robotic vehicle. For instance, the robotic vehicle may provide for a marking device (e.g., visible marker, UV marker, and the like) to mark the surface when a condition alert is detected (e.g., detecting corrosion or erosion in a pipe at a level exceeding a predefined threshold, and marking the pipe with visible paint).

Embodiments with multiple sensor sled connector assemblies provide configurations and area distribution of sensors that may enable greater flexibility in sensor data taking and processing, including alignment of same-type sensor sleds allowing for repeated measurements (e.g., the same sensor used in a leading sensor sled as in a trailing sensor sled, such as for redundancy or verification in data taking when leading and trailing sleds are co-aligned), alignment of different-type sensor sleds for multiple different sensor measurements of the same path (e.g., increase the number of sensor types taking data, have the lead sensor provide data to the processor to determine whether to activate the trailing sensor (e.g., ultra-sonic/gamma-ray, and the like)), off-set alignment of same-type sensor sleds for increased coverage when leading and trailing sleds are off-set from one another with respect to travel path, off-set alignment of different-type sensor sleds for trailing sensor sleds to measure surfaces that have not been disturbed by leading sensor sleds (e.g., when the leading sensor sled is using a couplant), and the like.

The modular design of the robotic vehicle may provide for a system flexible to different applications and surfaces (e.g., customizing the robot and modules of the robot ahead of time based on the application, and/or during an inspection operation), and to changing operational conditions (e.g., flexibility to changes in surface configurations and conditions, replacement for failures, reconfiguration based on sensed conditions), such as being able to change out sensors, sleds, assemblies of sleds, number of sled arrays, and the like.

An example inspection robot utilizes a magnet-based wheel design Although the inspection robot may utilize flux directing ferromagnetic wheel components, such as ferromagnetic magnet enclosures 3 to minimize the strength of the extended magnetic field, ferromagnetic components within the inspection robot may be exposed to a magnetic field. One component that may experience negative effects from the magnetic field is the gearbox, which may be mounted proximate to the wheel assembly.

Throughout the present description, certain orientation parameters are described as "horizontal," "perpendicular," and/or "across" the direction of travel of the inspection robot, and/or described as "vertical," "parallel," and/or in line with the direction of travel of the inspection robot. It is specifically contemplated herein that the inspection robot may be travelling vertically, horizontally, at oblique angles, and/or on curves relative to a ground-based absolute coordinate system. Accordingly, except where the context otherwise requires, any reference to the direction of travel of the inspection robot is understood to include any orientation of the robot—such as an inspection robot traveling horizontally on a floor may have a "vertical" direction for purposes of understanding sled distribution that is in a "horizontal" absolute direction. Additionally, the "vertical" direction of the inspection robot may be a function of time during inspection operations and/or position on an inspection surface—for example as an inspection robot traverses over a curved surface. In certain embodiments, where gravitational considerations or other context based aspects may indicate—vertical indicates an absolute coordinate system vertical—for example in certain embodiments where couplant flow into a cone is utilized to manage bubble formation in the cone. In certain embodiments, a trajectory through the inspection surface of a given sled may be referenced as a "horizontal inspection lane"—for example, the track that the sled takes traversing through the inspection surface.

Certain embodiments include an apparatus for acoustic inspection of an inspection surface with arbitrary resolution. Arbitrary resolution, as utilized herein, includes resolution of features in geometric space with a selected resolution—for example resolution of features (e.g., cracks, wall thickness, anomalies, etc.) at a selected spacing in horizontal space (e.g., perpendicular to a travel direction of an inspection robot) and/or vertical space (e.g., in a travel direction of an inspection robot). While resolution is described in terms of the travel motion of an inspection robot, resolution may instead be considered in any coordinate system, such as cylindrical or spherical coordinates, and/or along axes unrelated to the motion of an inspection robot. It will be understood that the configurations of an inspection robot and operations described in the present disclosure can support arbitrary resolution in any coordinate system, with the inspection robot providing sufficient resolution as operated, in view of the target coordinate system. Accordingly, for example, where inspection resolution of 6-inches is desired in a target coordinate system that is diagonal to the travel direction of the inspection robot, the inspection robot and related operations described throughout the present disclosure can support whatever resolution is required (whether greater than 6-inches, less than 6-inches, or variable resolution depending upon the location over the inspection surface) to facilitate the 6-inch resolution of the target coordinate system. It can be seen that an inspection robot and/or related operations capable of achieving an arbitrary resolution in the coordinates of the movement of the inspection robot can likewise achieve arbitrary resolution in any coordinate system for the mapping of the inspection surface. For clarity of description, apparatus and operations to support an arbitrary resolution are described in view of the coordinate system of the movement of an inspection robot.

An example apparatus to support acoustic inspection of an inspection surface includes an inspection robot having a payload and a number of sleds mounted thereon, with the sleds each having at least one acoustic sensor mounted thereon. Accordingly, the inspection robot is capable of simultaneously determining acoustic parameters at a range of positions horizontally. Sleds may be positioned horizontally at a selected spacing, including providing a number of sleds to provide sensors positioned radially around several positions on a pipe or other surface feature of the inspection surface. In certain embodiments, vertical resolution is supported according to the sampling rate of the sensors, and/or the movement speed of the inspection robot. Additionally, or alternatively, the inspection robot may have vertically displaced payloads, having an additional number of sleds mounted thereon, with the sleds each having at least one acoustic sensor mounted thereon. The utilization of additional vertically displaced payloads can provide additional resolution, either in the horizontal direction (e.g., where sleds of the vertically displaced payload(s) are offset from sleds in the first payload(s)) and/or in the vertical direction (e.g., where sensors on sleds of the vertically displaced payload(s) are sampling such that sensed parameters are vertically offset from sensors on sleds of the first payload (s)). Accordingly, it can be seen that, even where physical limitations of sled spacing, numbers of sensors supported by a given payload, or other considerations limit horizontal resolution for a given payload, horizontal resolution can be enhanced through the utilization of additional vertically displaced payloads. In certain embodiments, an inspection robot can perform another inspection run over a same area of the inspection surface, for example with sleds tracking in an offset line from a first run, with positioning information to ensure that both horizontal and/or vertical sensed parameters are offset from the first run.

Accordingly, an apparatus is provided that achieves significant resolution improvements, horizontally and/or vertically, over previously known systems. Additionally, or alternatively, an inspection robot performs inspection operations at distinct locations on a descent operation than on an ascent operation, providing for additional resolution improvements without increasing a number of run operations required to perform the inspection (e.g., where an inspection robot ascends an inspection surface, and descends the inspection surface as a normal part of completing the inspection run). In certain embodiments, an apparatus is configured to perform multiple run operations to achieve the selected resolution. It can be seen that the greater the number of inspection runs required to achieve a given spatial resolution, the longer the down time for the system (e.g., an industrial system) being inspected (where a shutdown of the system is required to perform the inspection), the longer the operating time and greater the cost of the inspection, and/or the greater chance that a failure occurs during the inspection. Accordingly, even where multiple inspection runs are required, a reduction in the number of the inspection runs is beneficial.

In certain embodiments, an inspection robot includes a low fluid loss couplant system, enhancing the number of sensors that are supportable in a given inspection run, thereby enhancing available sensing resolution. In certain embodiments, an inspection robot includes individual down force support for sleds and/or sensors, providing for reduced fluid loss, reduced off-nominal sensing operations, and/or increasing the available number of sensors supportable on a payload, thereby enhancing available sensing resolution. In certain embodiments, an inspection robot includes a single couplant connection for a payload, and/or a single couplant connection for the inspection robot, thereby enhancing reliability and providing for a greater number of sensors on a payload and/or on the inspection robot that are available for inspections under commercially reasonable operations (e.g., configurable for inspection operations with reasonable reliability, checking for leaks, expected to operate without problems over the course of inspection operations, and/or do not require a high level of skill or expensive test equipment to ensure proper operation). In certain embodiments, an inspection robot includes acoustic sensors coupled to acoustic cones, enhancing robust detection operations (e.g., a high percentage of valid sensing data, ease of acoustic coupling of a sensor to an inspection surface, etc.), reducing couplant fluid losses, and/or easing integration of sensors with sleds, thereby supporting an increased number of sensors per payload and/or inspection robot, and enhancing available sensing resolution. In certain embodiments, an inspection robot includes utilizing water as a couplant, thereby reducing fluid pumping losses, reducing risks due to minor leaks within a multiple plumbing line system to support multiple sensors, and/or reducing the impact (environmental, hazard, clean-up, etc.) of performing multiple inspection runs and/or performing an inspection operation with a multiplicity of acoustic sensors operating.

Example and non-limiting configuration adjustments include changing of sensing parameters such as cut-off times to observe peak values for ultra-sonic processing, adjustments of rationality values for ultra-sonic processing, enabling of trailing sensors or additional trailing sensors (e.g., X-ray, gamma ray, high resolution camera operations, etc.), adjustment of a sensor sampling rate (e.g., faster or slower), adjustment of fault cut-off values (e.g., increase or decrease fault cutoff values), adjustment of any transducer configurable properties (e.g., voltage, waveform, gain, filtering operations, and/or return detection algorithm), and/or adjustment of a sensor range or resolution value (e.g., increase a range in response to a lead sensing value being saturated or near a range limit, decrease a range in response to a lead sensing value being within a specified range window, and/or increase or decrease a resolution of the trailing sensor). In certain embodiments, a configuration adjustment to adjust a sampling rate of a trailing sensor includes by changing a movement speed of an inspection robot.

An example apparatus is disclosed to perform an inspection of an industrial surface. Many industrial surfaces are provided in hazardous locations, including without limitation where heavy or dangerous mechanical equipment operates, in the presence of high temperature environments, in the presence of vertical hazards, in the presence of corrosive chemicals, in the presence of high pressure vessels or lines, in the presence of high voltage electrical conduits, equipment connected to and/or positioned in the vicinity of an electrical power connection, in the presence of high noise, in the presence of confined spaces, and/or with any other personnel risk feature present. Accordingly, inspection operations often include a shutdown of related equipment, and/or specific procedures to mitigate fall hazards, confined space operations, lockout-tagout procedures, or the like. In certain embodiments, the utilization of an inspection robot allows for an inspection without a shutdown of the related equipment. In certain embodiments, the utilization of an inspection robot allows for a shutdown with a reduced number of related procedures that would be required if personnel were to perform the inspection. In certain embodiments, the utilization of an inspection robot provides for a partial shutdown to mitigate some factors that may affect the inspection operations and/or put the inspection robot at risk, but allows for other operations to continue. For example, it may be acceptable to position the inspection robot in the presence of high pressure or high voltage components, but operations that generate high temperatures may be shut down.

In certain embodiments, the utilization of an inspection robot provides additional capabilities for operation. For example, an inspection robot having positional sensing within an industrial environment can request shutdown of only certain aspects of the industrial system that are related to the current position of the inspection robot, allowing for partial operations as the inspection is performed. In another example, the inspection robot may have sensing capability, such as temperature sensing, where the inspection robot can opportunistically inspect aspects of the industrial system that are available for inspection, while avoiding other aspects or coming back to inspect those aspects when operational conditions allow for the inspection. Additionally, in certain embodiments, it is acceptable to risk the industrial robot (e.g., where shutting down operations exceed the cost of the loss of the industrial robot) to perform an inspection that has a likelihood of success, where such risks would not be acceptable for personnel. In certain embodiments, a partial shutdown of a system has lower cost than a full shutdown, and/or can allow the system to be kept in a condition where restart time, startup operations, etc. are at a lower cost or reduced time relative to a full shutdown. In certain embodiments, the enhanced cost, time, and risk of performing additional operations beyond mere shutdown, such as compliance with procedures that would be required if personnel were to perform the inspection, can be significant.

Figure 14:
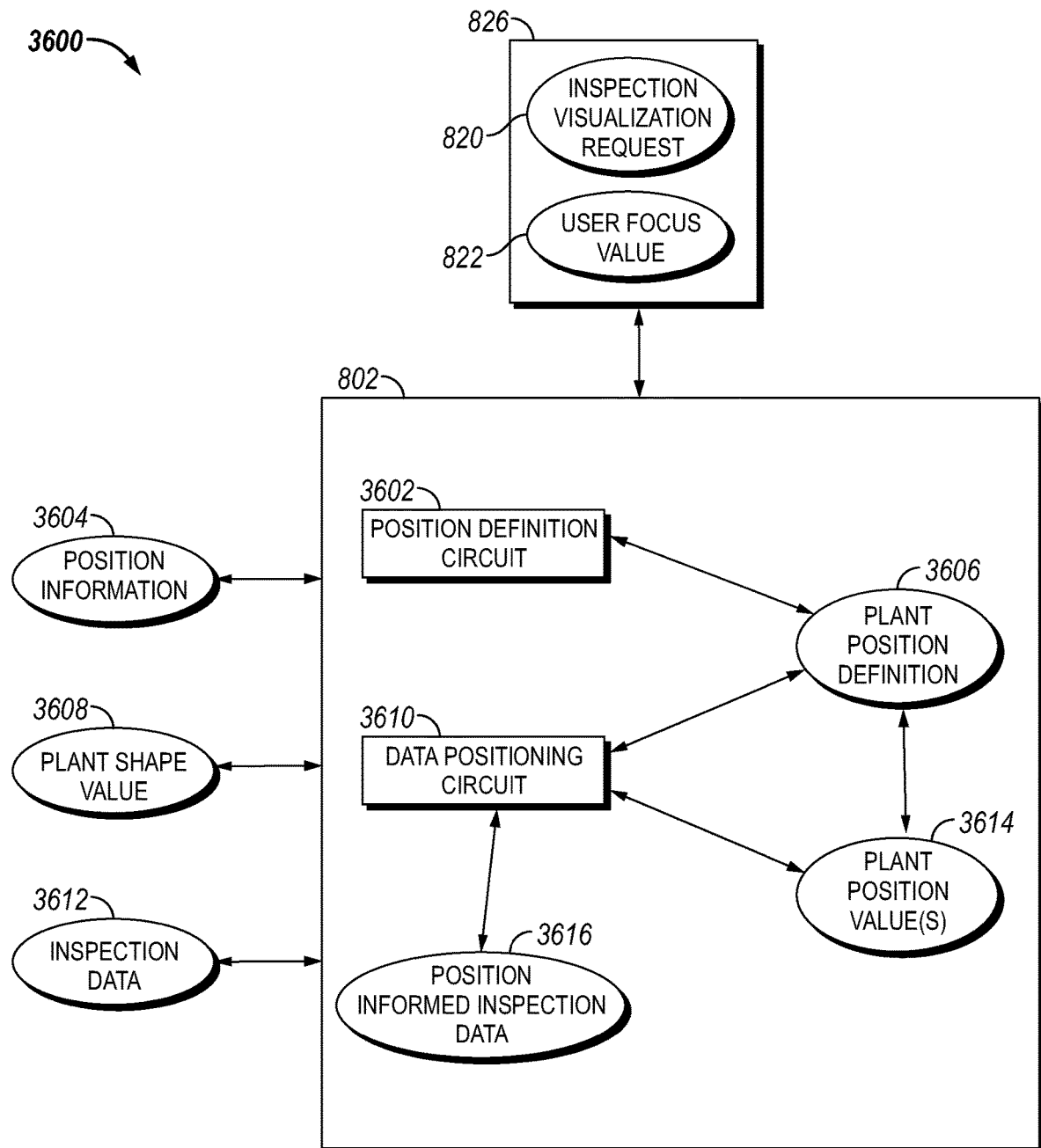
FIG. 14 is a schematic block diagram of an apparatus for providing position informed inspection data.

Referencing FIG. 14, an example apparatus 3600 to inspect a plant, industrial system, and/or inspection surface utilizing position information is depicted schematically. The example apparatus 3600 includes a position definition circuit 3602 that interprets position information 3604, and/or determines a plant position definition 3606 (e.g., a plant definition value) and an inspection robot position (e.g., as one or more plant position values 3614) in response to the position information 3604. Example and non-limiting position information 3604 includes relative and/or absolute position information—for example, a distance from a reference position (e.g., a starting point, stopping point, known object in proximity to the plant, industrial system, and/or inspection surface, or the like). In certain embodiments, position information 3604 is determinable according to a global positioning service (GPS) device, ultra-wide band radio frequency (RF) signaling, LIDAR or other direct distance measurement devices (including line-of-sight and/or sonar devices), aggregating from reference points (e.g., routers, transmitters, know devices in communication with the inspection robot, or the like), utilizing known obstacles as a reference point, encoders (e.g., a wheel counter or other device), barometric sensors (e.g., altitude determination), utilization of a known sensed value correlated to position (e.g., sound volume or frequency, temperature, vibration, etc.), and/or utilizing an inertial measurement unit (e.g., measuring and/or calculating utilizing an accelerometer and/or gyroscope). In certain embodiments, values may be combined to determine the position information 3604—for example in 3-D space without further information, four distance measurements are ordinarily required to determine a specific position value. However, utilizing other information, such as a region of the inspection surface that the inspection robot is operating on (e.g., which pipe the inspection robot is climbing), an overlay of the industrial surface over the measurement space, a distance traveled from a reference point, a distance to a reference point, etc., the number of distance measurements required to determine a position value can be reduced to three, two, one, or even eliminated and still position information 3604 is determinable. In certain embodiments, the position definition circuit 3602 determines the position information 3604 completely or partially on dead reckoning (e.g., accumulating speed and direction from a known position, and/or direction combined with a distance counter), and/or corrects the position information 3604 when feedback based position data (e.g., a true detected position) is available.

Example and non-limiting plant position values 3614 include the robot position information 3604 integrated within a definition of the plant space, such as the inspection surface, a defined map of a portion of the plant or industrial system, and/or the plant position definition 3606. In certain embodiments, the plant space is predetermined, for example as a map interpreted by the controller 802 and/or pre-loaded in a data file describing the space of the plant, inspection surface, and/or a portion of the plant or industrial surface. In certain embodiments, the plant position definition 3606 is created in real-time by the position definition circuit 3602—for example by integrating the position information 3604 traversed by the inspection robot, and/or by creating a virtual space that includes the position information 3604 traversed by the inspection robot. For example, the position definition circuit 3602 may map out the position information 3604 over time, and create the plant position definition 3606 as the aggregate of the position information 3604, and/or create a virtual surface encompassing the aggregated plant position values 3614 onto the surface. In certain embodiments, the position definition circuit 3602 accepts a plant shape value 3608 as an input (e.g., a cylindrical tank being inspected by the inspection robot having known dimensions), deduces the plant shape value 3608 from the aggregated position information 3604 (e.g., selecting from one of a number of simple or available shapes that are consistent with the aggregated plant position definition 3606), and/or prompts a user (e.g., an inspection operator and/or a client for the data) to select one of a number of available shapes to determine the plant position definition 3606.

The example apparatus 3600 includes a data positioning circuit 3610 that interprets inspection data 3612 and correlates the inspection data 3612 to the position information 3604 and/or to the plant position values 3614. Example and non-limiting inspection data 3612 includes: sensed data by an inspection robot; environmental parameters such as ambient temperature, pressure, time-of-day, availability and/or strength of wireless communications, humidity, etc.; image data, sound data, and/or video data taken during inspection operations; metadata such as an inspection number, customer number, operator name, etc.; setup parameters such as the spacing and positioning of sleds, payloads, mounting configuration of sensors, and the like; calibration values for sensors and sensor processing; and/or operational parameters such as fluid flow rates, voltages, pivot positions for the payload and/or sleds, inspection robot speed values, downforce parameters, etc. In certain embodiments, the data positioning circuit 3610 determines the positional information 3604 corresponding to inspection data 3612 values, and includes the positional information 3604 as an additional parameter with the inspection data 3612 values and/or stores a correspondence table or other data structure to relate the positional information 3604 to the inspection data 3612 values. In certain embodiments, the data positioning circuit 3610 additionally or alternatively determines the plant position definition 3606, and includes a plant position value 3614 (e.g., as a position within the plant as defined by the plant position definition 3606) as an additional parameter with the inspection data 3612 values and/or stores a correspondence table or other data structure to relate the plant position values 3614 to the inspection data 3612 values. In certain embodiments, the data positioning circuit 3610 creates position informed data 3616, including one or more, or all, aspects of the inspection data 3612 correlated to the position information 3604 and/or to the plant position values 3614.

In certain embodiments, for example where dead reckoning operations are utilized to provide position information 3604 over a period of time, and then a corrected position is available through a feedback position measurement, the data positioning circuit 3610 updates the position informed inspection data 3616—for example re-scaling the data according to the estimated position for values according to the changed feedback position (e.g., where the feedback position measurement indicates the inspection robot traveled 25% further than expected by dead reckoning, position information 3604 during the dead reckoning period can be extended by 25%) and/or according to rationalization determinations or externally available data (e.g., where over 60 seconds the inspection robot traverses 16% less distance than expected, but sensor readings or other information indicate the inspection robot may have been stuck for 10 seconds, then the position information 3604 may be corrected to represent the 10-seconds of non-motion rather than a full re-scale of the position informed inspection data 3616). In certain embodiments, dead reckoning operations may be corrected based on feedback measurements as available, and/or in response to the feedback measurement indicating that the dead reckoning position information exceeds a threshold error value (e.g., 1%, 0.1%, 0.01%, etc.).

It can be seen that the operations of apparatus 3600 provide for position-based inspection information. Certain systems, apparatuses, and procedures throughout the present disclosure utilize and/or can benefit from position informed inspection data 3616, and all such embodiments are contemplated herein. Without limitation to any other disclosures herein, certain aspects of the present disclosure include: providing a visualization of inspection data 3612 in position information 3604 space and/or in plant position value 3614 space; utilizing the position informed inspection data 3616 in planning for a future inspection on the same or a similar plant, industrial system, and/or inspection surface (e.g., configuring sled number and spacing, inspection robot speed, inspection robot downforce for sleds and/or sensors, sensor calibrations, planning for traversal and/or avoidance of obstacles, etc.); providing a format for storing a virtual mark (e.g., replacing a paint or other mark with a virtual mark as a parameter in the inspection data 3612 correlated to a position); determining a change in a plant condition in response to the position informed inspection data 3616 (e.g., providing an indication that expected position information 3604 did not occur in accordance with the plant position definition 3606—for example indicating a failure, degradation, or unexpected object in a portion of the inspected plant that is not readily visible); and/or providing a health indicator of the inspection surface (e.g., depicting regions that are nominal, passed, need repair, will need repair, and/or have failed). In certain embodiments, it can be seen that constructing the position informed inspection data 3616 using position information 3604 only, including dead reckoning based position information 3604, nevertheless yields many of the benefits of providing the position informed inspection data 3616. In certain further embodiments, the position informed inspection data 3616 is additionally or alternatively constructed utilizing the plant position definition 3606, and/or the plant position values 3614.

Figure 15:
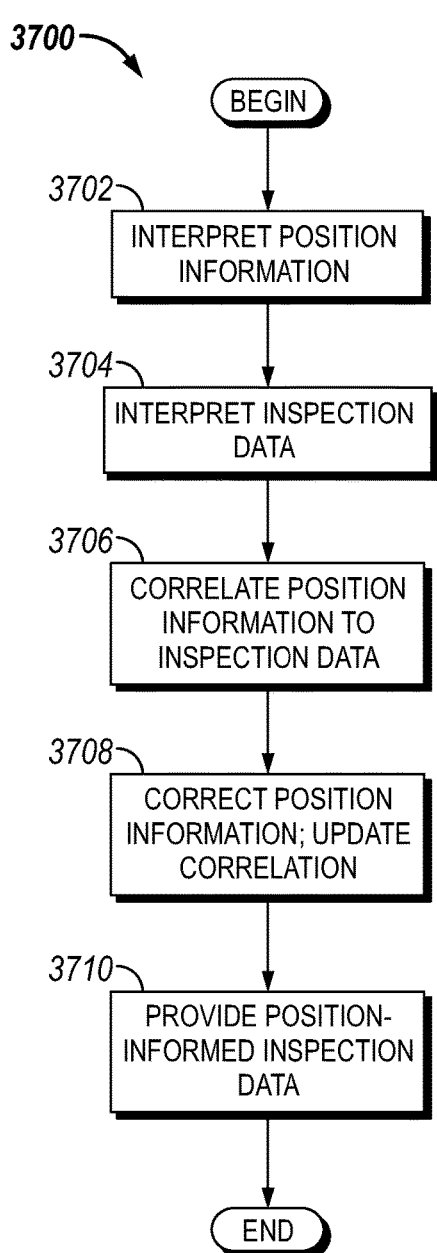
FIG. 15 is a schematic flow diagram of a procedure to provide position informed inspection data.

Referencing FIG. 15, an example procedure 3700 to inspect a plant, industrial system, and/or inspection surface utilizing position information is depicted. The example procedure 3700 includes an operation 3702 to interpret position information, an operation 3704 to interpret inspection data, and an operation 3706 correlate the inspection data to the position information. The example procedure 3700 further includes an operation 3708 to correct the position information (e.g., updating a dead reckoning-based position information), and to update the correlation of the inspection data to the position information. The example procedure further includes an operation 3710 to provide position informed inspection data in response to the correlated inspection data. In certain embodiments, operation 3706 is additionally or alternatively performed on the position informed inspection data, where the position informed inspection data is corrected, and operation 3710 includes providing the position informed inspection data. In certain embodiments, one or more operations of a procedure 3700 are performed by a controller 802.

Referencing FIG. 16, an example procedure 3800 to inspect a plant, industrial system, and/or inspection surface utilizing position information is depicted. In addition to operations of procedure 3700, example procedure 3800 includes an operation 3802 to determine a plant definition value, and an operation 3804 to determine plant position values in response to the position information and the plant position definition. Operation 3706 further includes an operation to correlate the inspection data with the position information and/or the plant position values. In certain embodiments, one or more operations of procedure 3800 are performed by a controller 802.

One or more certain further aspects of the example method may be incorporated in certain embodiments. The personnel risk feature may include a portion of the inspection surface having an elevated height. The elevated height may include at least one height value consisting of the height values selected from: at least 10 feet, at least 20 feet, at least 30 feet, greater than 50 feet, greater than 100 feet, and up to 150 feet. The personnel risk feature may include an elevated temperature of at least a portion of the inspection surface. The personnel risk feature may include an enclosed space, and wherein at least a portion of the inspection surface is positioned within the enclosed space. The personnel risk feature may include an electrical power connection. Determining a position of the inspection robot within the industrial system during the operating the inspection robot, and shutting down only a portion of the industrial system during the inspection operation in response to the position of the inspection robot.

Figure 17:
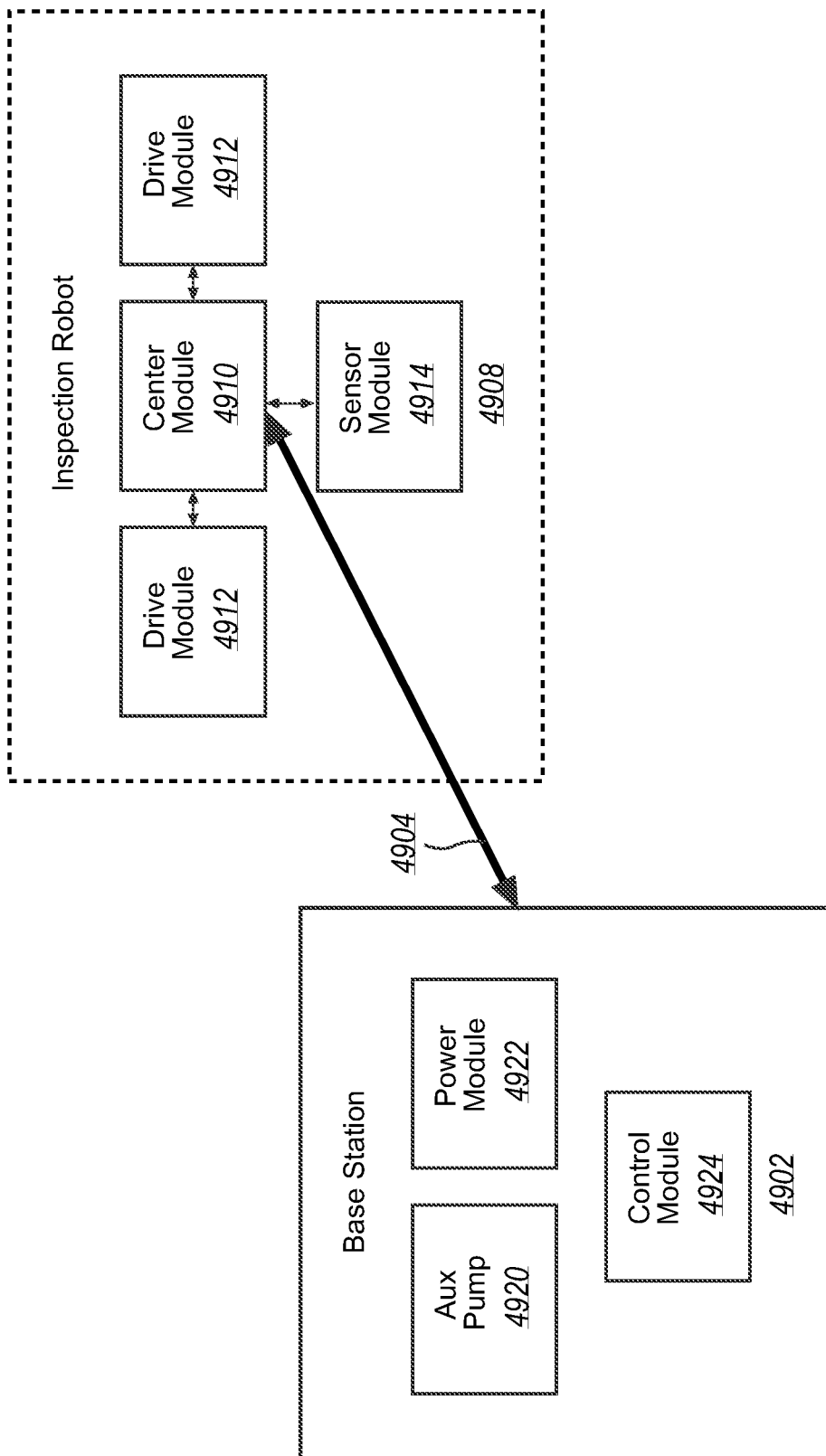
FIG. 17 depicts a schematic of an example system including a base station and an inspection robot.

As shown in FIG. 17, a system may comprise a base station 4902 connected by a tether 4904 to a housing or center module 4910 of a robot 4908 used to traverse an industrial surface. The tether 4904 may be a conduit for power, fluids, control, and data communications between the base station 4902 and the robot 4908. The robot 4908 may include a center module 4910 connected to one or more drive modules 4912 which enable the robot 4908 to move along an industrial surface. The center module 4910 may be coupled to one or more sensor modules 4914 for measuring an industrial surface—for example, the sensor modules 4914 may be positioned on a drive module 4912, on the payload, in the center body housing, and/or aspects of a sensor module 4914 may be distributed among these. An example embodiment includes the sensor modules 4914 each positioned on an associated drive module 4912, and electrically coupled to the center module 4910 for power, communications, and/or control. The base station 4902 may include an auxiliary pump 4920, a control module 4924 and a power module 4922. The example robot 4908 may be an inspection robot, which may include any one or more of the following features: inspection sensors, cleaning tools, and/or repair tools. In certain embodiments, it will be understood that an inspection robot 4908 is configured to perform only cleaning and/or repair operations, and/or may be configured for sensing, inspection, cleaning, and/or repair operations at different operating times (e.g., performing one type of operation at a first operating time, and performing another type of operation at a second operating time), and/or may be configured to perform more than one of these operations in a single run or traversal of an industrial surface (e.g., the "inspection surface"). The modules 4910, 4912, 4914, 4920, 4922, 4924 are configured to functionally execute operations described throughout the present disclosure, and may include any one or more hardware aspects as described herein, such as sensors, actuators, circuits, drive wheels, motors, housings, payload configurations, and the like.

The control module 4924 may be in communication with the robot 4908 by way of the tether 4904. Additionally, or alternatively, the control module 4924 may communicate with the robot 4908 wirelessly, through a network, or in any other manner. The robot 4908 may provide the base station 4902 with any available information, such as, without limitation: the status of the robot 4908 and associated components, data collected by the sensor module 4914 regarding the industrial surface, vertical height of the robot 4908, water pressure and/or flow rate coming into the robot 4908, visual data regarding the robot's environment, position information for the robot 4908 and/or information (e.g., encoder traversal distances) from which the control module 4924 can determine the position of the robot. The control module 4924 may provide the robot 4908 with commands such as navigational commands, commands to the sensor modules regarding control of the sensor modules and the like, warning of an upcoming power loss, couplant pressure information, and the like.

The base station 4902 may receive an input of couplant, typically water, from an external source such as a plant or municipal water source. The base station 4902 may include a pressure and/or flow sensing device to measure incoming flow rate and/or pressure. Typically, the incoming couplant may be supplied directly to the tether 4904 for transport to the robot 4908. However, if the incoming pressure is low or the flow rate is insufficient, the couplant may be run through the auxiliary pump 4920 prior to supplying the couplant to the tether 4904. In certain embodiments, the base station 4902 may include a make-up tank and/or a couplant source tank, for example to supply couplant if an external source is unavailable or is insufficient for an extended period. The auxiliary pump 4920 may be regulated by the control module 4924 based on data from the sensor and/or combined with data received from the robot 4908. The auxiliary pump 4920 may be used to: adjust the pressure of the couplant sent to the robot 4908 based on the vertical height of the robot 4908; adjust for spikes or drops in the incoming couplant; provide intermittent pressure increases to flush out bubbles in the acoustic path of ultra-sonic sensors, and the like. The auxiliary pump 4920 may include a shut off safety valve in case the pressure exceeds a threshold.

Figure 18:
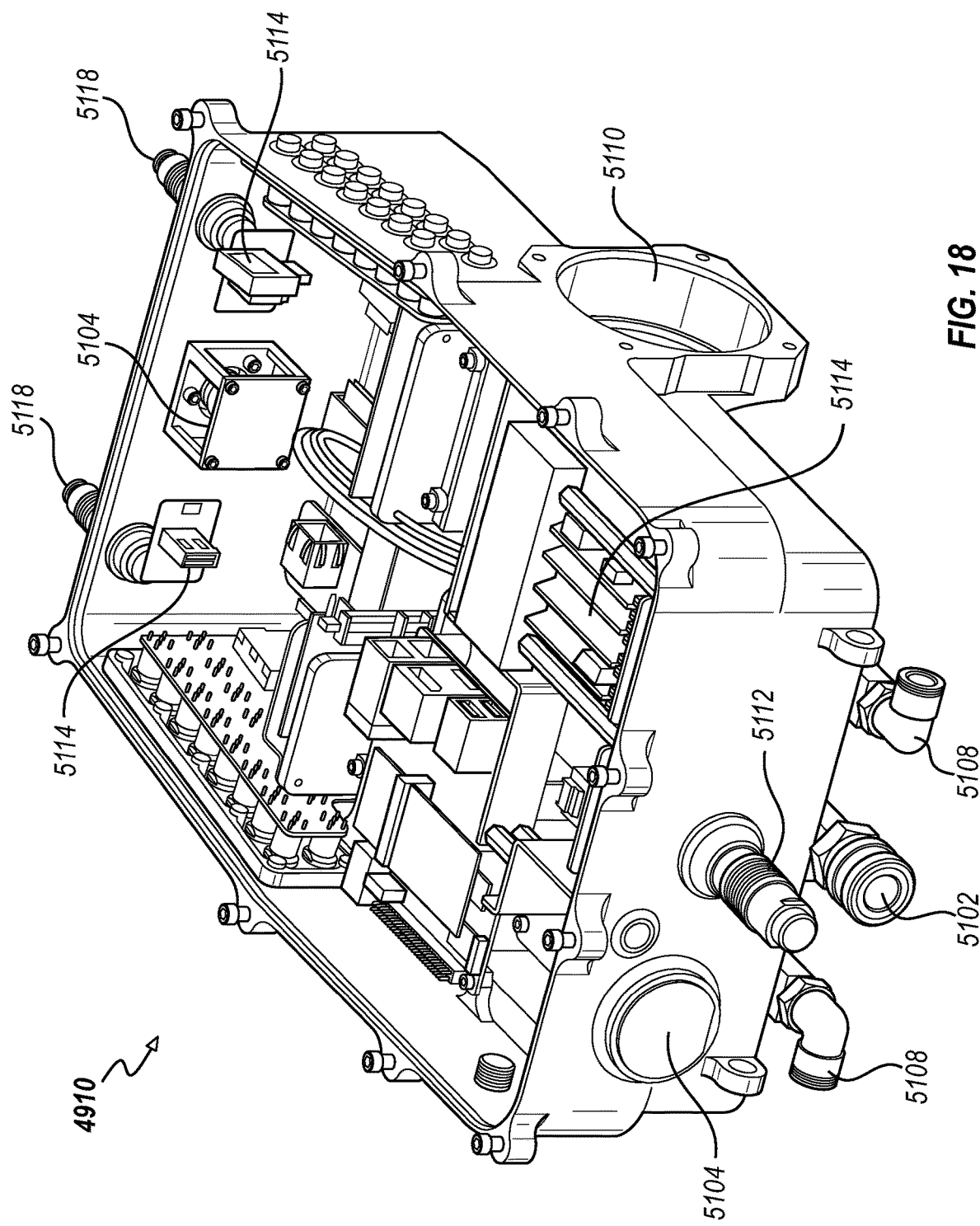
FIG. 18 depicts an internal view of certain components of the center module.

As shown in FIG. 18, the center module 4910 (or center body) of the robot may include a chassis couplant interface 5102, a data communications/control tether input 5112, forward facing and reverse facing navigation cameras 5104, multiple sensor connectors 5118, couplant outlets 5108 (e.g., to each payload), and one or more drive module connections 5110 (e.g., one on each side). An example center module 4910 includes a distributed controller design, with low-level and hardware control decision making pushed down to various low level control modules (e.g., 5114, and/or further control modules on the drive modules as described throughout the present disclosure). The utilization of a distributed controller design facilitates rapid design, rapid upgrades to components, and compatibility with a range of components and associated control modules 5114. For example, the distributed controller design allows the high level controller (e.g., the brain/gateway) to provide communications in a standardized high-level format (e.g., requesting movement rates, sensed parameter values, powering of components, etc.) without utilizing the hardware specific low-level controls and interfaces for each component, allowing independent development of hardware components and associated controls. The use of the low-level control modules may improve development time and enable the base level control module to be component neutral and send commands, leaving the specific implementation up to the low-level control module 5114 associated with a specific camera, sensor, sensor module, actuator, drive module, and the like. The distributed controller design may extend to distributing the local control to the drive module(s) and sensor module(s) as well.

Figure 19:
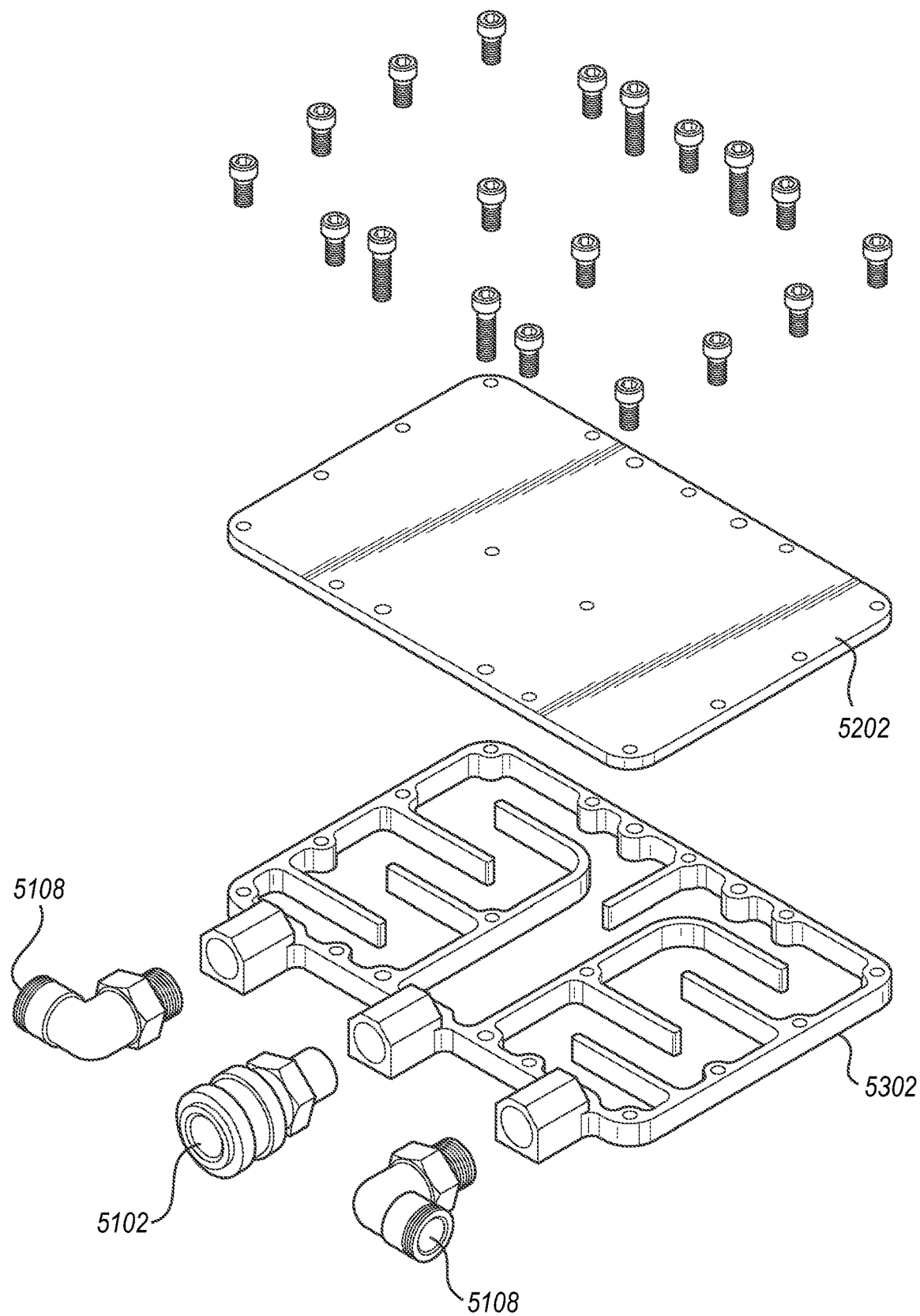
FIG. 19 depicts an exploded view of a cold plate on the bottom surface of the center module.
Figure 20:
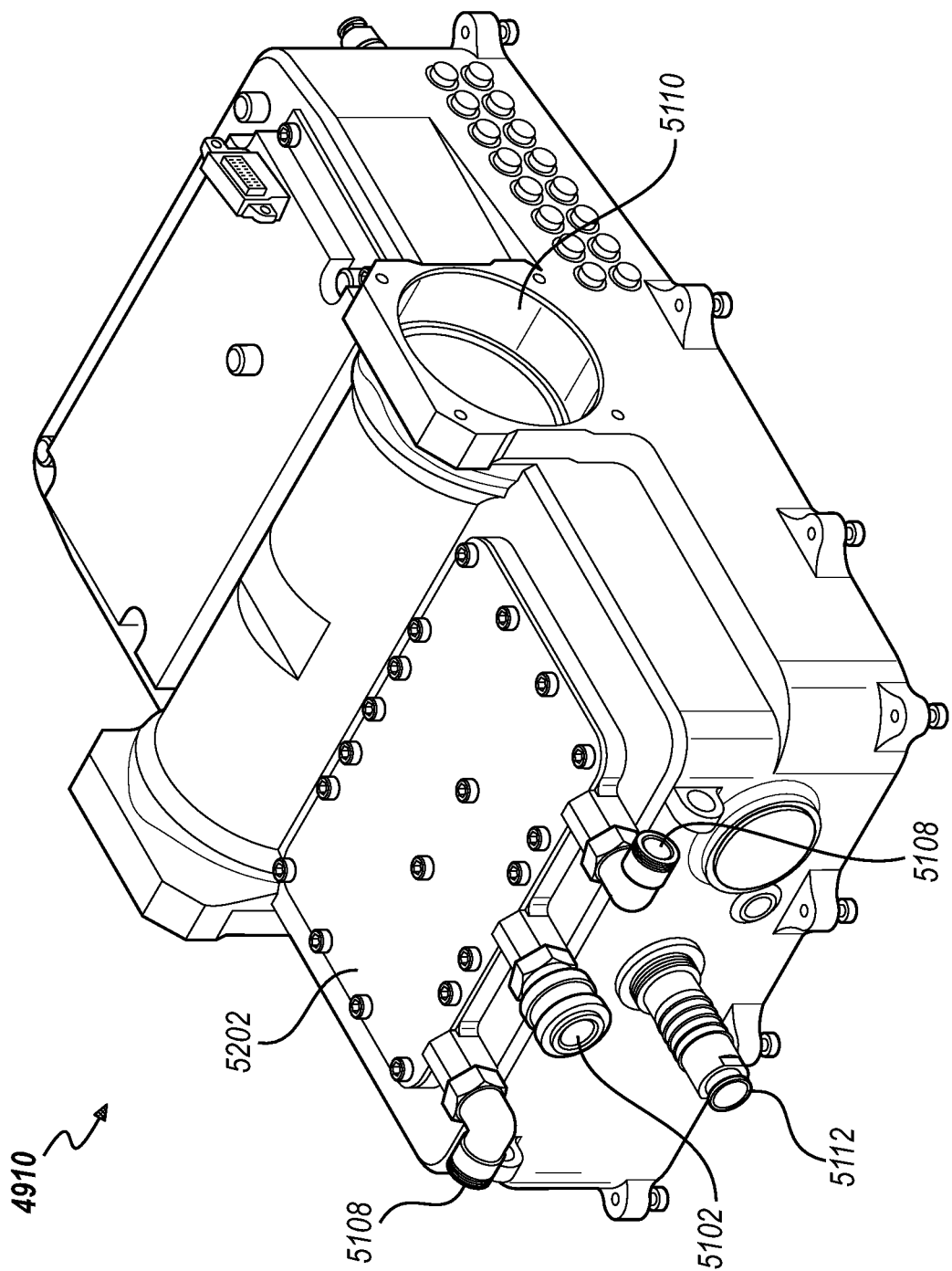
FIG. 20 depicts an example bottom surface of the center module.

Referring to FIGS. 19-20, the bottom surface of the center module 4910 may include a cold plate 5202 to disperse heat built up by electronics in the center module 4910. Couplant transferred from the base station 4902 using the tether 4904 may be received at the chassis couplant interface 5102 where it then flows through a manifold 5302 where the couplant may transfer excess heat away from the center module 4910. The manifold 5302 may also split the water into multiple streams for output through two or more couplant outlets 5108. The utilization of the cold plate 5202 and heat transfer to couplant passing through the center body as a part of operations of the inspection robot provides for greater capability and reliability of the inspection robot by providing for improved heat rejection for heat generating components (e.g., power electronics and circuits), while adding minimal weight to the robot and tether. FIG. 19 depicts an example distribution of couplant flow through the cold plate and to each payload. In certain embodiments, couplant flow may also be provided to a rear payload, which may have a direct flow passage and/or may further include an additional cold plate on a rear portion of the inspection robot.

Figure 24:
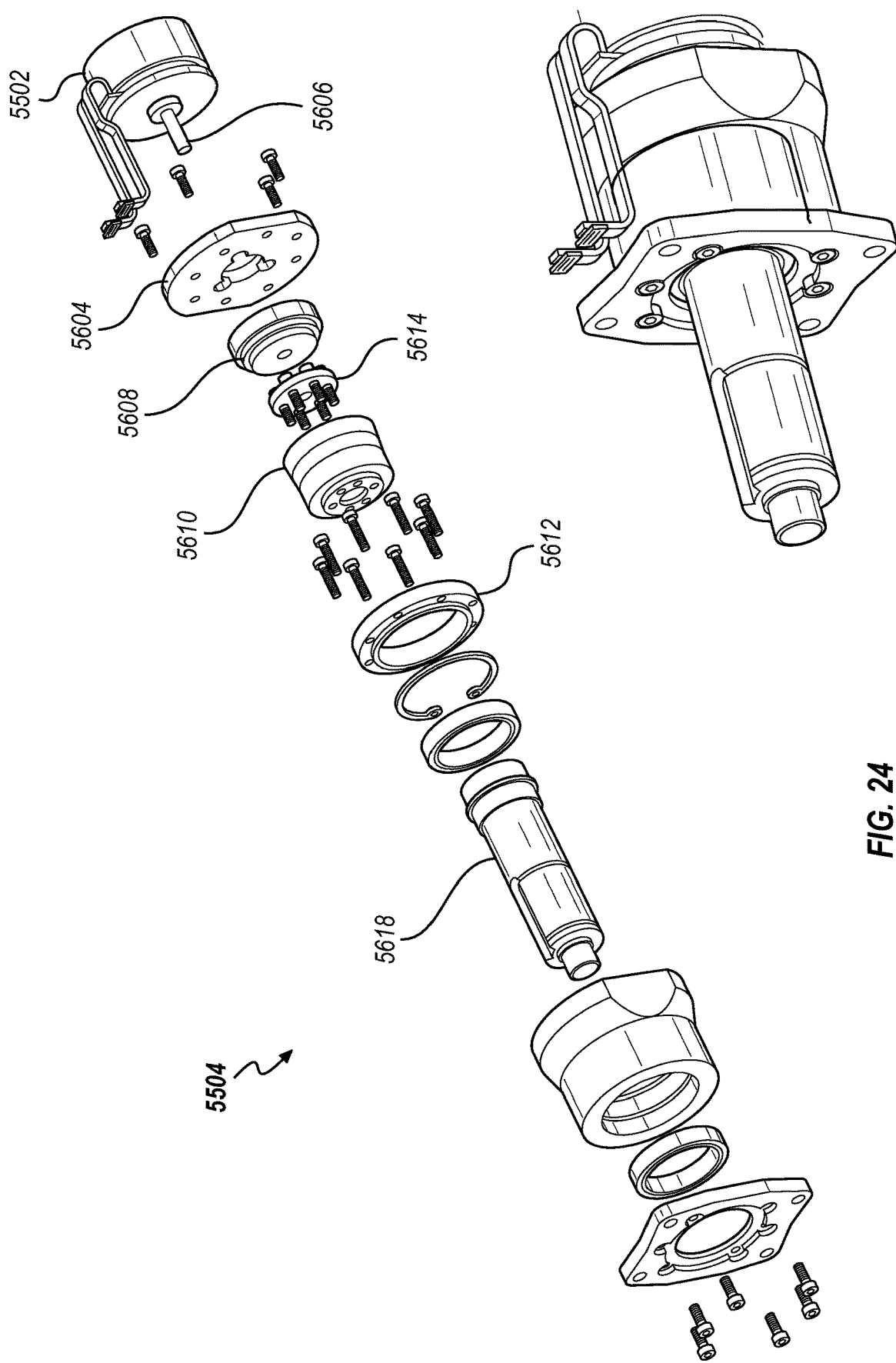
FIG. 24 depicts an exploded view of a drive wheel actuator.

FIG. 24 shows an exterior and exploded view of a drive module 4912. A drive module 4912 may include motors 5502 and motor shielding 5508, a wheel actuator assembly 5504 housing the motor, and wheel assemblies 5510 including, for example, a magnetic wheel according to any magnetic wheel described throughout the present disclosure. An example drive module 4912 includes a handle 5512 to enable an operator to transport the robot 4908 and position the robot 4908 on an industrial surface. The motor shielding 5508 may be made of an electrically conductive material, and provide protection for the motors 5502 and associated motor position and/or speed sensors (e.g., a hall effect sensor) from electro-magnetic interference (EMI) generated by the wheel assembly 5510. The drive module 4912 provides a mounting rail 5514 for a payload and/or sensor module 4914, which may cooperate with a mounting rail on the center body to support the payload. An example drive module 4912 includes one or more payload actuators 5518 (e.g., the payload gas spring) for engaging and disengaging the payload or sensor module 4914 from an inspection surface (or industrial surface), and/or for adjusting a down force of the payload (and thereby a downforce for specific sensor carriages and/or sleds) relative to the inspection surface. The drive module 4912 may include a connector 5520 that provides an interface with the center module for power and communications.

Figure 22:
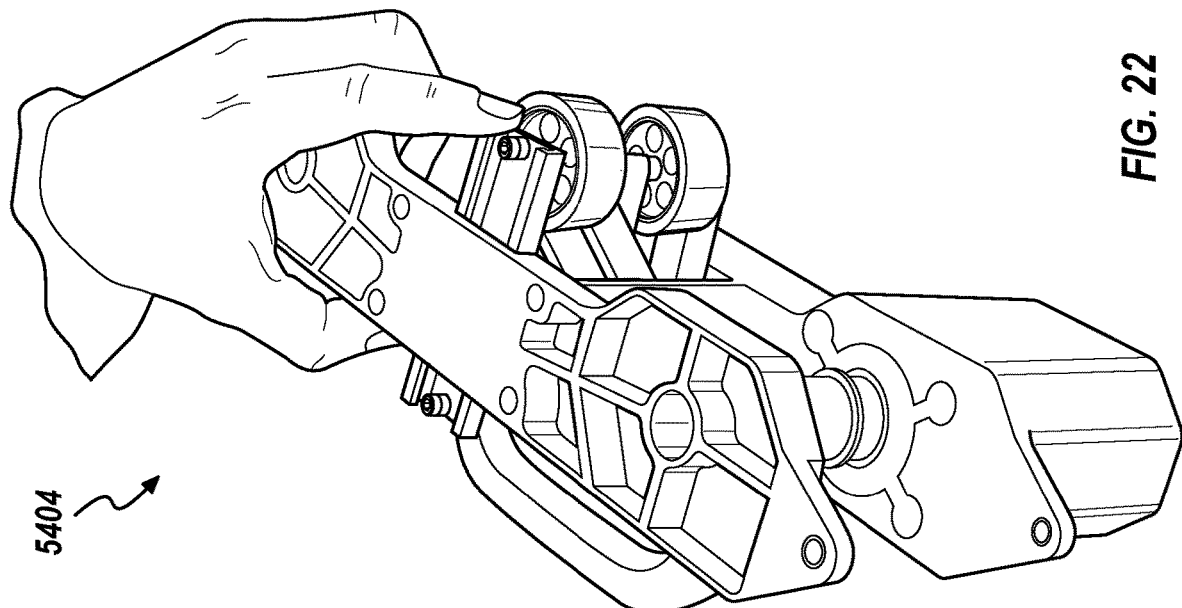
FIGS. 21-22 depict an exterior view of a drive module, having an encoder in a first position and in a second position.
Figure 21:
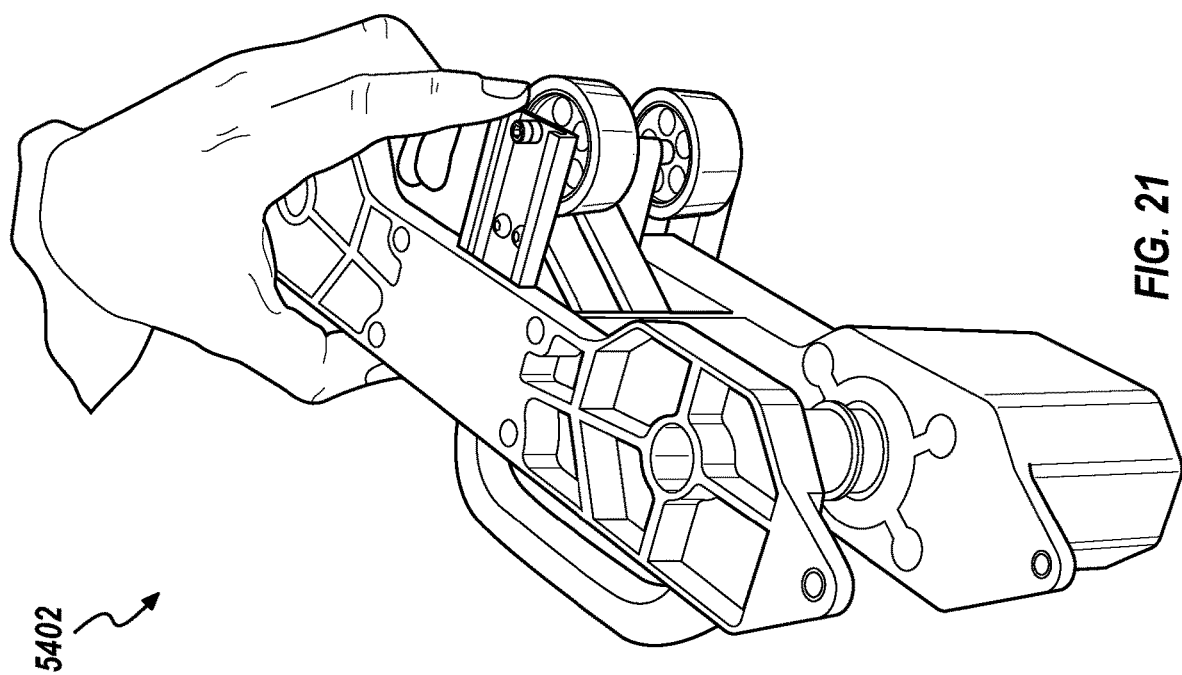

FIGS. 21-22 depicts an external view of an example drive module 5402, 5404, with an encoder assembly 5524 (reference FIG. 23) depicted in an extended position (FIG. 21) or a partially retracted position (FIG. 22). The encoder assembly 5524 in the examples of FIGS. 21-23 includes a passive wheel that remains in contact with the inspection surface, and an encoder detecting the turning of the wheel (e.g., including a hall effect sensor). The encoder assembly 5524 provides for an independent determination of the movement of the inspection robot, thereby allowing for corrections, for example, where the magnetic wheels may slip or lose contact with the inspection surface, and accordingly the determination of the inspection robot position and/or movement from the magnetic wheels may not provide an accurate representation of the movement of the inspection robot. In certain embodiments, a drive module on each side of the center body each include a separate encoder assembly 5524, thereby providing for detection and control for turning or other movement of the inspection robot.

Figure 23:
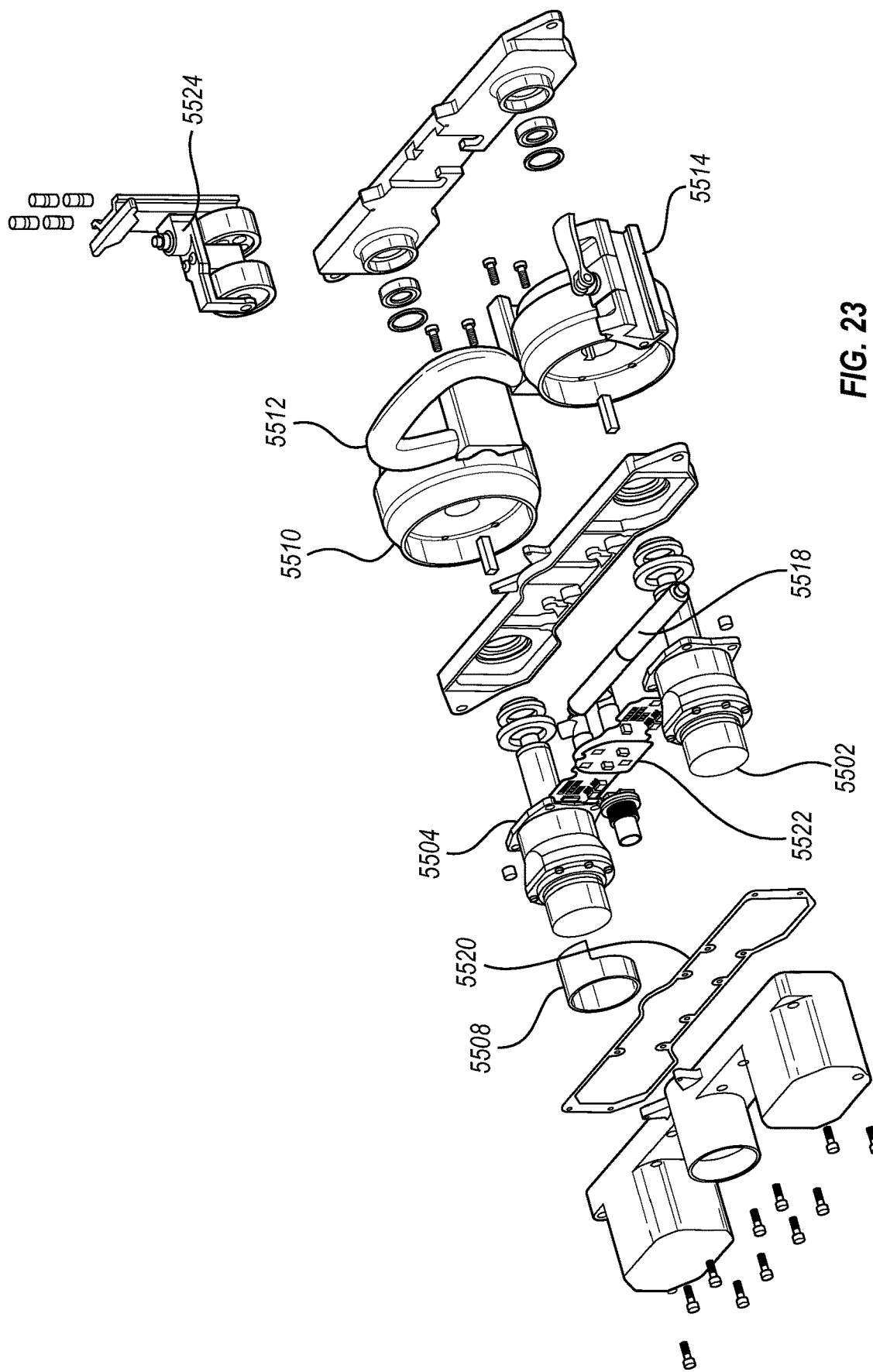
FIG. 23 depicts an exploded view of a drive module.

Referring to FIG. 23, each drive module 5402 may have an embedded microcontroller 5522 which provides control and communications relating to the motors, actuators, sensors, and/or encoders associated with that drive module 5402. The embedded microcontroller 5522 responds to navigational and/or speed commands from the base station 4902 and/or high level center body controller, obstacle detection, error detection, and the like. In certain embodiments, the drive module 5402 is reversible and will function appropriately, independent of the side of the center module 4910 to which it is attached. The drive module 5402 may have hollowed out portions (e.g., the frame visible in FIG. 18) which may be covered, at least in part, of a screen (e.g., a carbon fiber screen) to reduce the overall weight of the drive module. The utilization of a screen, in certain embodiments, provides protection from the hollowed out portion filling with debris or other material that may provide increased weight and/or undesirable operation of the inspection robot.

FIG. 24 shows an exploded view of a wheel actuator assembly 5504 that drives a wheel assembly 5510 of the drive module 5402. A motor 5502 may be attached to an aft plate 5604 with the motor shaft 5606 protruding through the aft plate 5604. A wave generator 5608, a non-circular ball bearing, may be mounted to the motor shaft 5606. The wave generator 5608 is spun inside of a cup style strain wave gearbox (flex spline cup 5610). The flex spline cup 5610 may spin on the wave generator 5608 and interact with a ring gear 5612, the ring gear 5612, having fewer teeth than the flex spline cup 5610. This causes the gear set to "walk" which provides for a high ratio of angular speed reduction in a compact form (e.g., a short axial distance). The flex spline cup 5610 may be bolted, using the bolt plate 5614 to the driveshaft output shaft 5618. The interaction of the wave generator 5608 and the flex spline cup 5610 result in, for example, a fifty to one (50:1) reduction in rotational speed between the motor shaft 5606 and the driveshaft output shaft 5618. The example reduction ratio is non-limiting, and any desired reduction ratio may be utilized. Example and non-limiting considerations for the reduction ratio include: the speed and/or torque profile of available motors 5502; the weight, desired trajectory (e.g., vertical, horizontal, or mixed), and/or desired speed of the inspection robot; the available space within the inspection robot for gear ratio management; the size (e.g. diameter) of the drive wheels, drive shaft, and/or any other aspect of the driveline (e.g., torque path between the motor 5502 and the drive wheels); and/or the available power to be provided to the inspection robot. Further, the use of this mechanical method of reduction in rotational speed is not affected by any EMI produced by the magnets in the wheel modules (e.g., as a planetary gear set, or other gear arrangements might be).

In addition to providing power to drive a wheel assembly, a motor 5502 may act as a braking mechanism for the wheel assembly. The board with the embedded microcontroller 5522 for the motor 5502 may include a pair of power-off relays. When power to the drive module 5402 is lost or turned off, the power-off relays may short the three motor phases of the motor 5502 together, thus increasing the internal resistance of the motor 5502. The increased resistance of the motor 5502 may be magnified by the flex spline cup 5610, preventing the inspection robot 100 from rolling down a wall in the event of a power loss.

There may be a variety of wheel assembly 5510 configurations, which may be provided in alternate embodiments, swapped by changing out the wheels, and/or swapped by changing out the drive modules 5402.

Referring to FIGS. 25-28, a stability module, also referred to as a wheelie bar, may provide additional stability to a robot when the robot is moving vertically up an industrial surface. The wheelie bar 6000 may be mounted at the back (relative to an upward direction of travel) of a drive module or to both ends of a drive module. If the front wheel of a drive module encounters a nonferrous portion of the industrial surface or a large obstacle is encountered, the wheelie bar 6000 limits the ability of the robot to move away from the industrial surface beyond a certain angle, thus limiting the possibility of a backward roll-over by the robot. The wheelie bar 6000 may be designed to be easily attached and removed from the drive module connection points 6010. The strength of magnets in the drive wheels may be such that each wheel is capable of supporting the weight of the robot even if the other wheels lost contact with the surface. The wheels on the stability module may be magnetic helping the stability bar engage or "snap" into place when pushed into place by the actuator.

Figure 25:
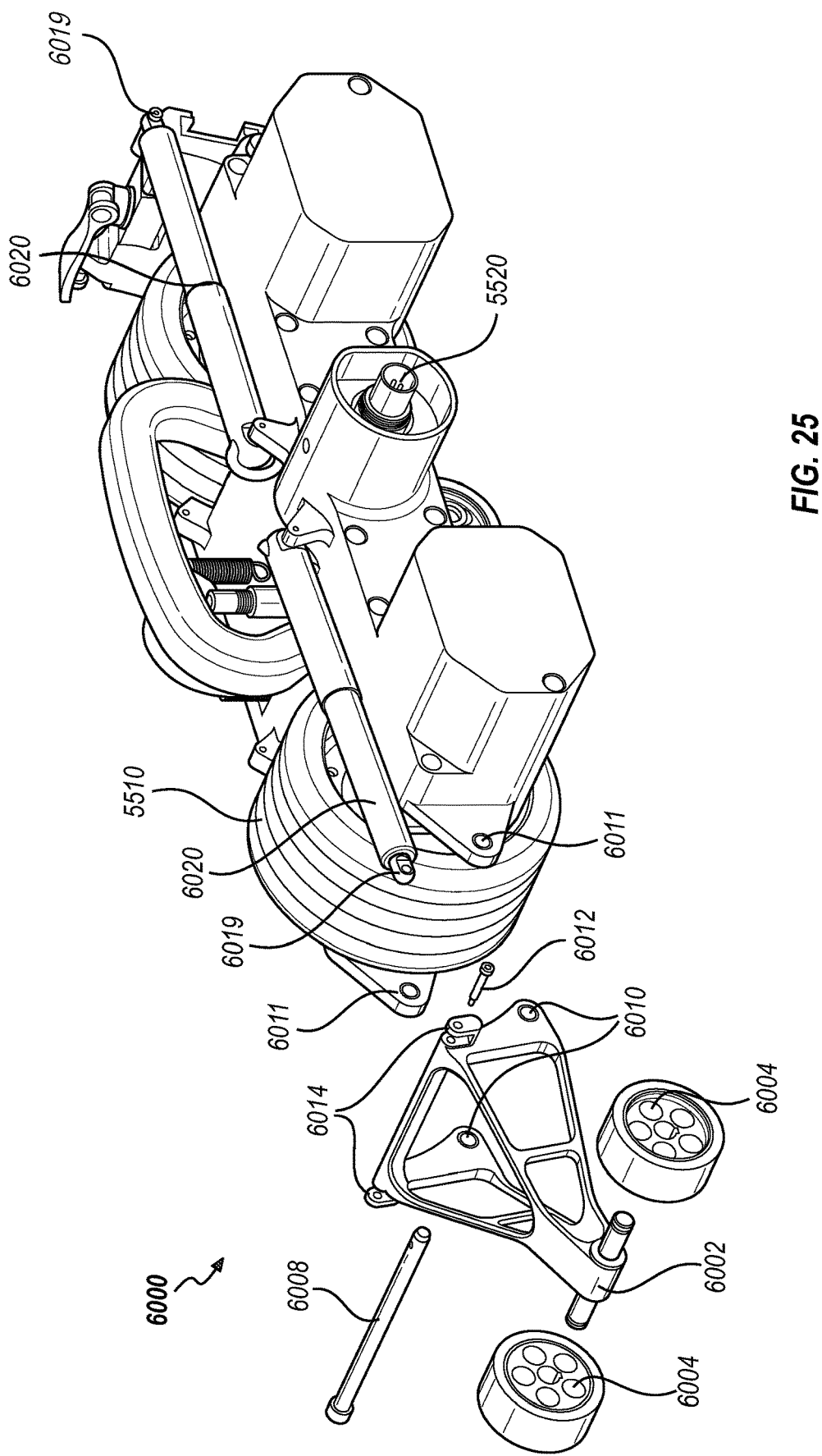
FIG. 25 depicts an exploded view of a first embodiment of a stability module and drive module.
Figure 26:
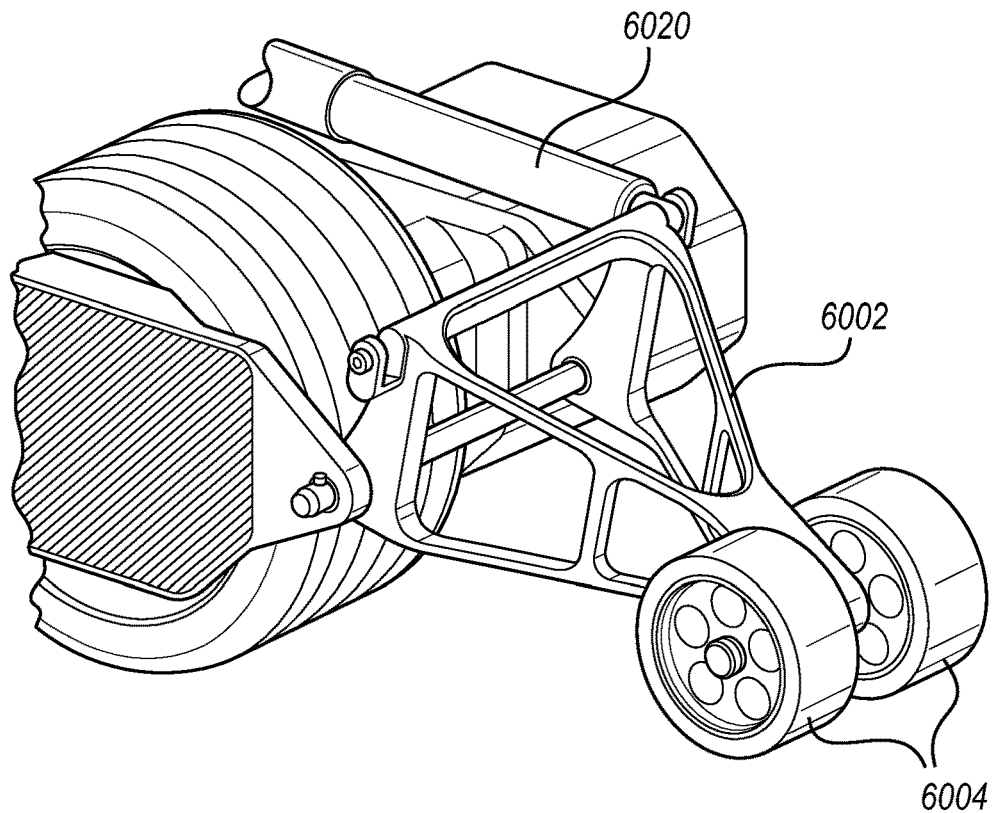
FIGS. 26-27 depict two side views of the first embodiment of the stability module.

A stability module 6000 may attach to a drive module 5402 such that it is pulled behind or below the robot. FIG. 25 shows an exploded view of a stability module 6000 which may include a pair of wheels 6004, a stability body 6002, a connection bolt 6008 and two drive module connection points 6010, an actuator pin 6012, and two actuator connection points 6014. An actuator may couple with one of the actuator connection points 6014, and/or a given embodiment may have a pair of actuators, with one coupled to each actuator connection point 6014. There may be two drive module connection points 6010 which may be quickly aligned with corresponding stability module connection points 6011 located adjacent to each wheel module on the drive module and held together with the connection bolt 6008. The drive module may include a gas spring 6020, which may be common with the payload gas spring 6020 (e.g., providing for ease of reversibility of the drive module 4912 on either side of the inspection robot), although the gas spring 6020 for the stability module may have different characteristics and/or be a distinct actuator relative to the payload gas spring. The example stability module includes a connection pin 6012 for rapid coupling and/or decoupling of the gas spring. The stability module may be attached, using stability module connection points, adjoining either of the wheel modules of the drive module. In certain embodiments, a stability module 6000 may be coupled to the rear position of the drive modules to assemble the inspection robot, and/or a stability module 6000 may be provided in both the front and back of the inspection robot (e.g., using separate and/or additional actuators from the payload actuators).

The strength of magnets in the drive wheels may be such that each wheel is capable of supporting the weight of the robot even if the other wheels lose contact with the surface. In certain embodiments, the wheels on the stability module may be magnetic, helping the stability module engage or "snap" into place upon receiving downward pressure from the gas spring or actuator. In certain embodiments, the stability module limits the rearward rotation of the inspection robot, for example if the front wheels of the inspection robot encounter a non-magnetic or dirty surface and lose contact. In certain embodiments, the stability module 6000 can return the front wheels to the inspection surface (e.g., by actuating and rotating the front of the inspection robot again toward the surface, which may be combined with backing the inspection robot onto a location of the inspection surface where the front wheels will again encounter a magnetic surface).

Figure 28:
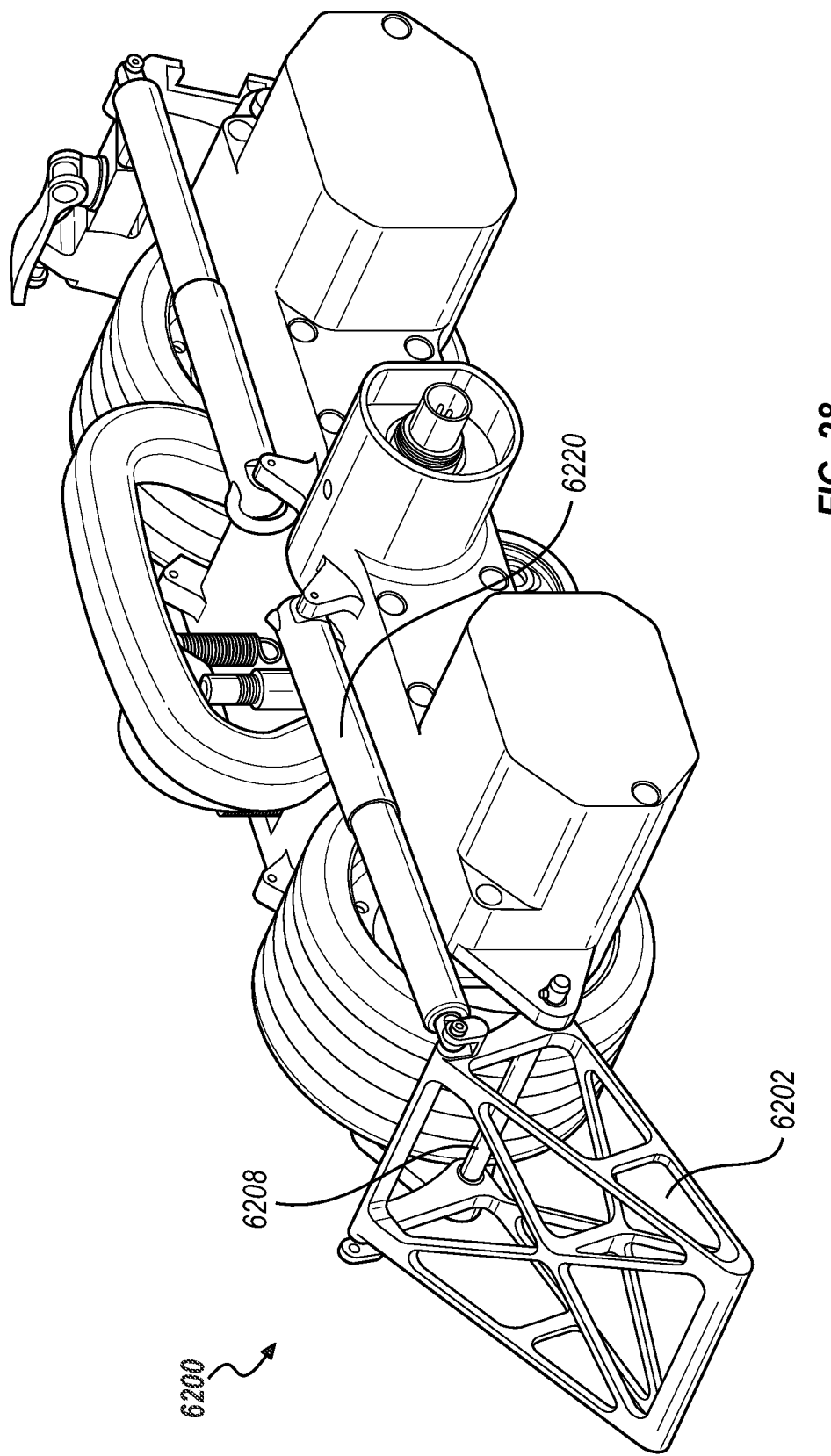
FIG. 28 depicts an alternate embodiment of a stability module and wheel assembly.

FIG. 28 depicts an alternate stability module 6200 including a stability body 6202 which does not have wheels but does have a similar connection bolt 6208 and two drive module connection points, and a similar actuator pin and two actuator connection points. Again, the stability module 6200 may have two drive module connection points 6010 which may be quickly aligned with corresponding stability module connection points 6011 located adjacent to each wheel module on the drive module and held together with the connection bolt 6208. The drive module may include a payload gas spring 6220 which may be connected to the stability module 6200 at one of two spring connection points with an actuator pin. The operations of stability module 6200 may otherwise be similar to the operations of the wheeled stability module 6000.

Figure 29:
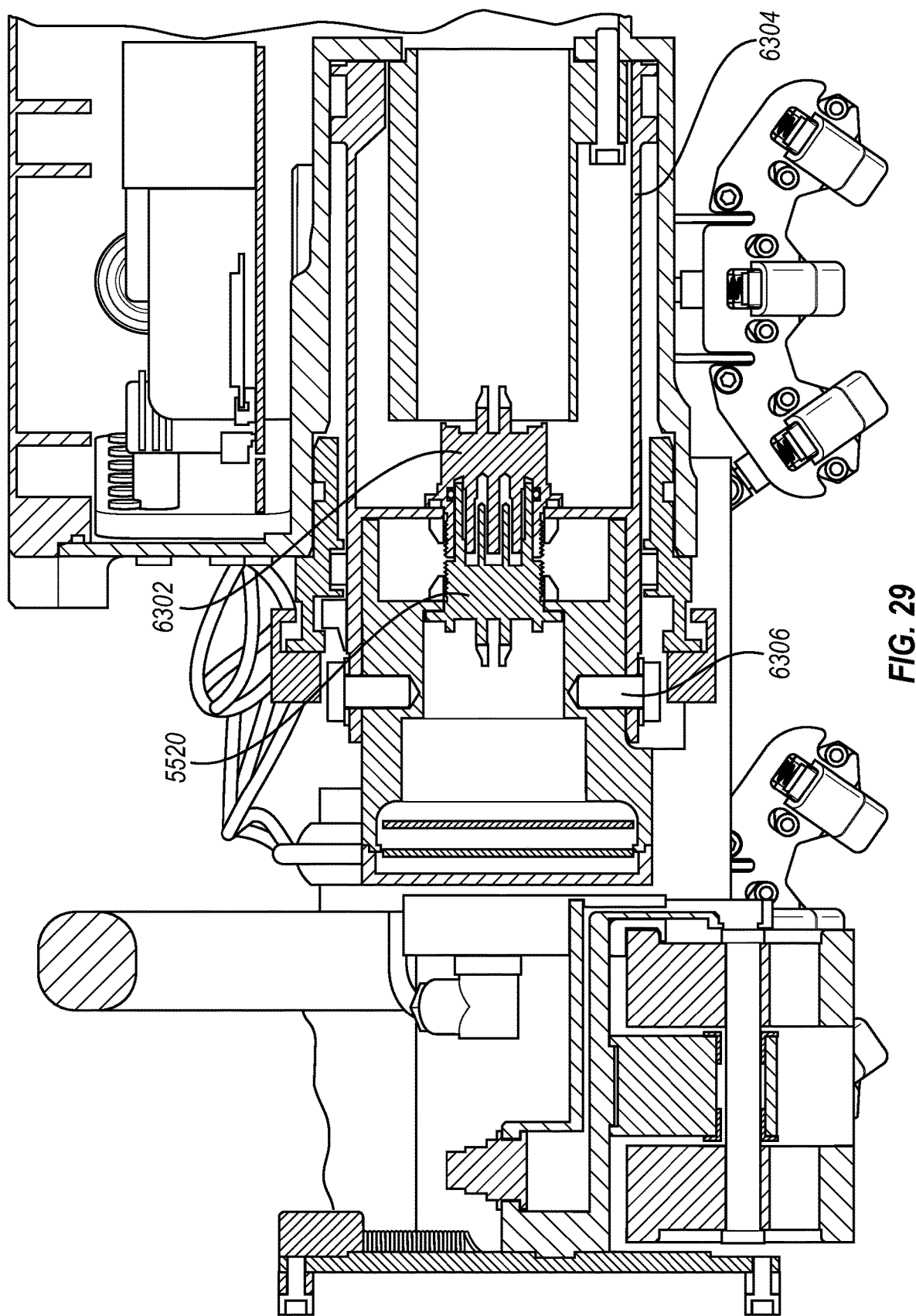
FIG. 29 depicts a cross section view of drive module coupling to a center module.
Figure 30:
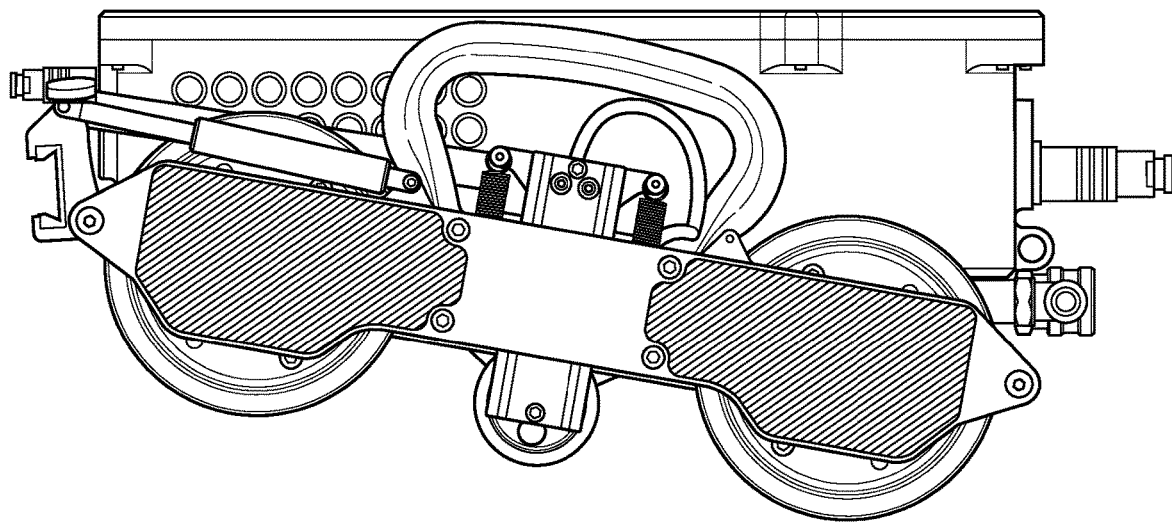
FIGS. 30-31 depicts two side views of a drive module rotated relative to the center module.
Figure 31:
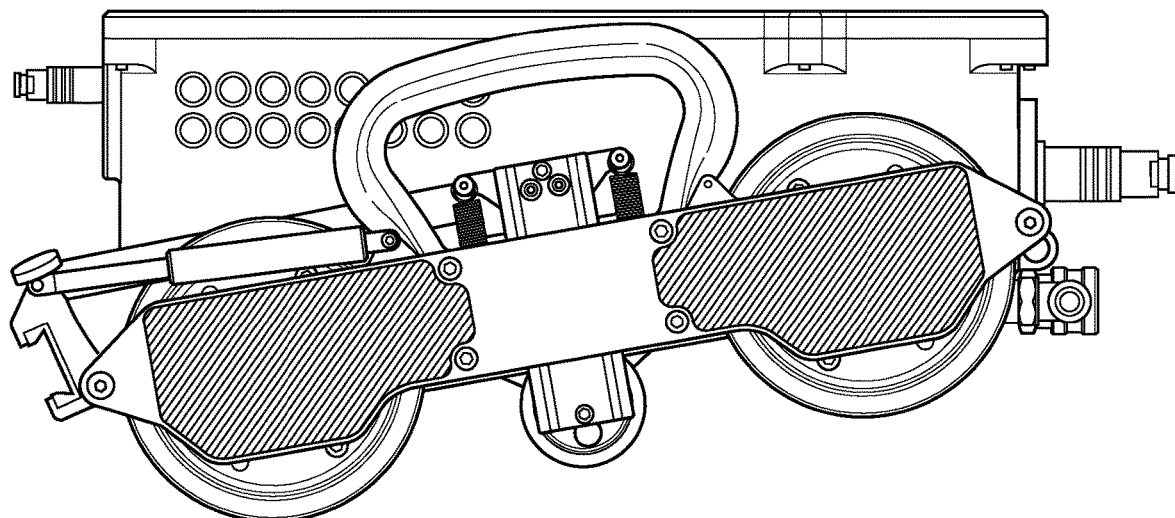

FIGS. 29-31 depict details of the suspension between the center body and a drive module. The center module 4910 may include a piston 6304 to enable adjustments to the distance between the center module 4910 and a drive module 4912 to accommodate the topography of a given industrial surface and facilitate the stability and maneuverability of the robot. The piston may be bolted to the drive module such that the piston does not rotate relative to the drive module. Within the piston, and protected by the piston from the elements, there may be a power and communication center module connector 5520 to which a drive module connector 5520 engages to provide for the transfer of power and data between the center module and a drive module.

The suspension may include a translation limiter 6302 that limits the translated positions of the piston, a rotation limiter 6306 which limits how far the center module may rotate relative to the drive module (see examples in FIGS. 30-31), and replaceable wear rings to reduce wear on the piston 6304 and the center module 4910 as they move relative to one another. The drive module may be spring biased to a central, no rotation, position, and/or may be biased to any other selected position (e.g., rotated at a selected angle). An example drive module-center body coupling includes a passive rotation that occurs as a result of variations in the surface being traversed.

The robot may have information regarding absolute and relative position. The drive module may include both contact and non-contact encoders to provide estimates of the distance travelled. In certain embodiments, absolute position may be provided through integration of various determinations, such as the ambient pressure and/or temperature in the region of the inspection robot, communications with positional elements (e.g., triangulation and/or GPS determination with routers or other available navigation elements), coordinated evaluation of the driven wheel encoders (which may slip) with the non-slip encoder assembly, and/or by any other operations described throughout the present disclosure. In certain embodiments, an absolute position may be absolute in one sense (e.g., distance traversed from a beginning location or home position) but relative in another sense (e.g., relative to that beginning location).

There may be one or two encoder wheels positioned between the drive wheels, either side by side or in a linear orientation, and in certain embodiments a sensor may be associated with only one, or with both, encoder wheels. In certain embodiments, each of the drive modules 4912 may have a separate encoder assembly associated therewith, providing for the capability to determine rotational angles (e.g., as a failure condition where linear motion is expected, and/or to enable two-dimensional traversal on a surface such as a tank or pipe interior), differential slip between drive modules 4912, and the like.

A drive module (FIG. 23) may include a hall effect sensor in each of the motors 5502 as part of non-contact encoder for measuring the rotation of each motor as it drives the associated wheel assembly 5510. There may be shielding 5508 (e.g., a conductive material such as steel) to prevent unintended EMI noise from a magnet in the wheel inducing false readings in the hall effect sensor.

Data from the encoder assembly 5524 encoder and the driven wheel encoder (e.g., the motion and/or position sensor associated with the drive motor for the magnetic wheels) provide an example basis for deriving additional information, such as whether a wheel is slipping by comparing the encoder assembly readings (which should reliably show movement only when actual movement is occurring) to those of the driven wheel encoders on the same drive module. If the encoder assembly shows limited or no motion while the driven wheel encoder(s) show motion, drive wheels slipping may be indicated. Data from the encoder assembly and the driven wheel encoders may provide a basis for deriving additional information such as whether the robot is travelling in a straight line, as indicated by similar encoder values between corresponding encoders in each of the two drive modules on either side of the robot. If the encoders on one of the drive modules indicate little or no motion while the encoders of the other drive module show motion, a turning of the inspection robot toward the side with limited movement may be indicated.

The base station may include a GPS module or other facility for recognizing the position of the base station in a plant. The encoders on the drive module provide both absolute (relative to the robot) and relative information regarding movement of the robot over time. The combination of data regarding an absolute position of the base station and the relative movement of the robot may be used to ensure complete plant inspection and the ability to correlate location with inspection map.

The center module may have a camera 5104 that may be used for navigation and obstacle detection, and/or may include both a front and rear camera 5104 (e.g., as shown in FIG. 18). A video feed from a forward facing camera (relative to the direction of travel) may be communicated to the base station to assist an operator in obstacle identification, navigation, and the like. The video feed may switch between cameras with a change in direction, and/or an operator may be able to selectively switch between the two camera feeds. Additionally, or alternatively, both cameras may be utilized at the same time (e.g., provided to separate screens, and/or saved for later retrieval). The video and the sensor readings may be synchronized such that, for example: an operator (or display utility) reviewing the data would be able to have (or provide) a coordinated visual of the inspection surface in addition to the sensor measurements to assist in evaluating the data; to provide repairs, mark repair locations, and/or confirm repairs; and/or to provide cleaning operations and/or confirm cleaning operations. The video camera feeds may also be used for obstacle detection and path planning, and/or coordinated with the encoder data, other position data, and/or motor torque data for obstacle detection, path planning, and/or obstacle clearance operations.

Figure 32:
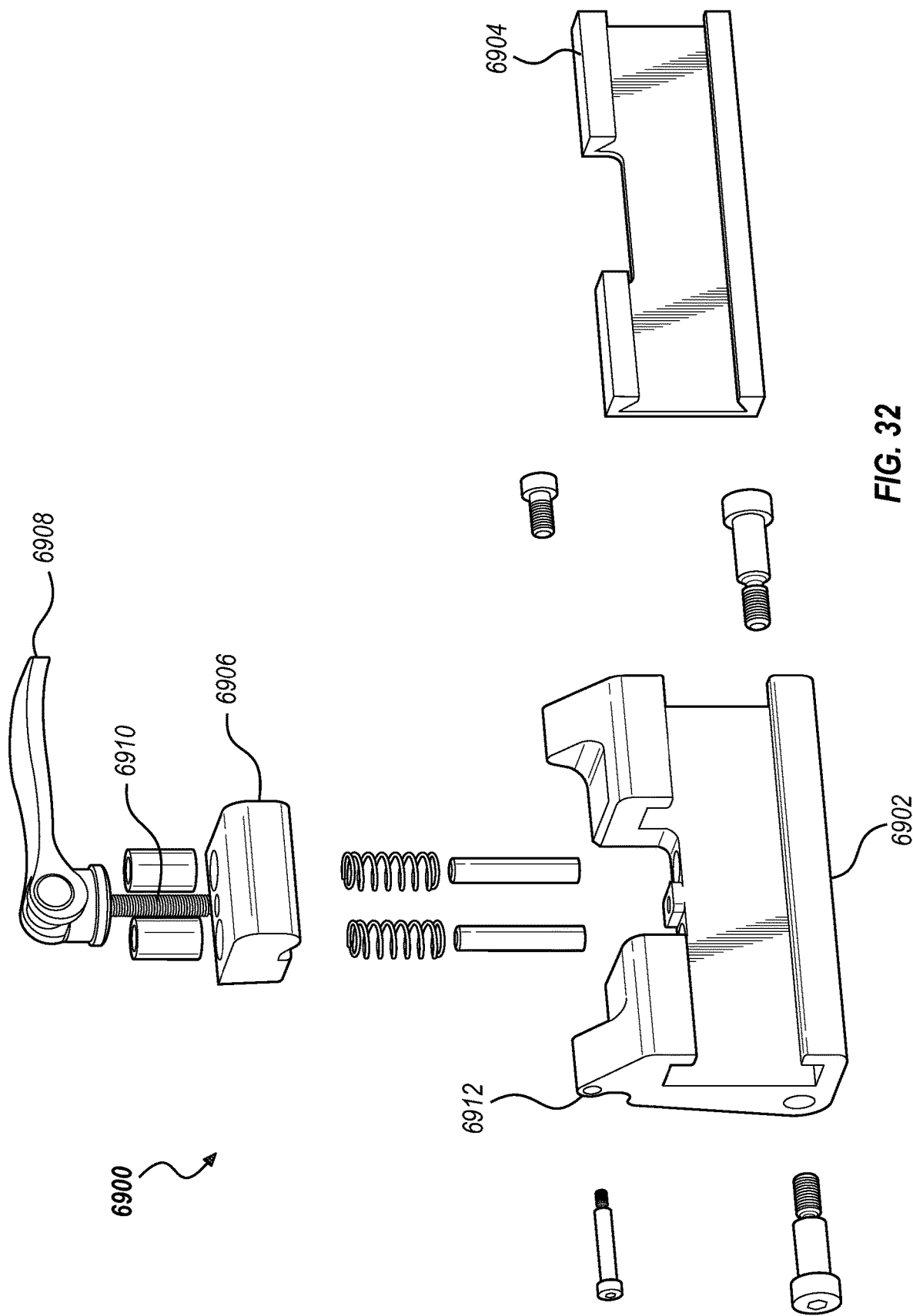
FIG. 32 depicts an exploded view of a dovetail payload rail mount assembly.

Referring to FIG. 32, a drive module (and/or the center body) may include one or more payload mount assemblies 6900. The payload mount assembly 6900 may include a rail mounting block 6902 with a wear resistant sleeve 6904 and a rail actuator connector 6912. Once a rail of the payload is slid into position, a dovetail clamping block 6906 may be screwed down with a thumbscrew 6910 to hold the rail in place with a cam-lock clamping handle 6908. The wear resistant sleeve 6904 may be made of Polyoxymethylene (POM), a low friction, strong, high stiffness material such as Delrin, Celecon, Ramtal, Duracon, and the like. The wear resistant sleeve 6904 allows the sensor to easily slide laterally within the rail mounting block 6902. The geometry of the dovetail clamping block 6906 limits lateral movement of the rail once it is clamped in place. However, when unclamped, it is easy to slide the rail off to change the rail. In another embodiment, the rail mounting block may allow for open jawed, full rail coupling allowing the rail to be rapidly attached and detached without the need for sliding into position.

Figure 33:
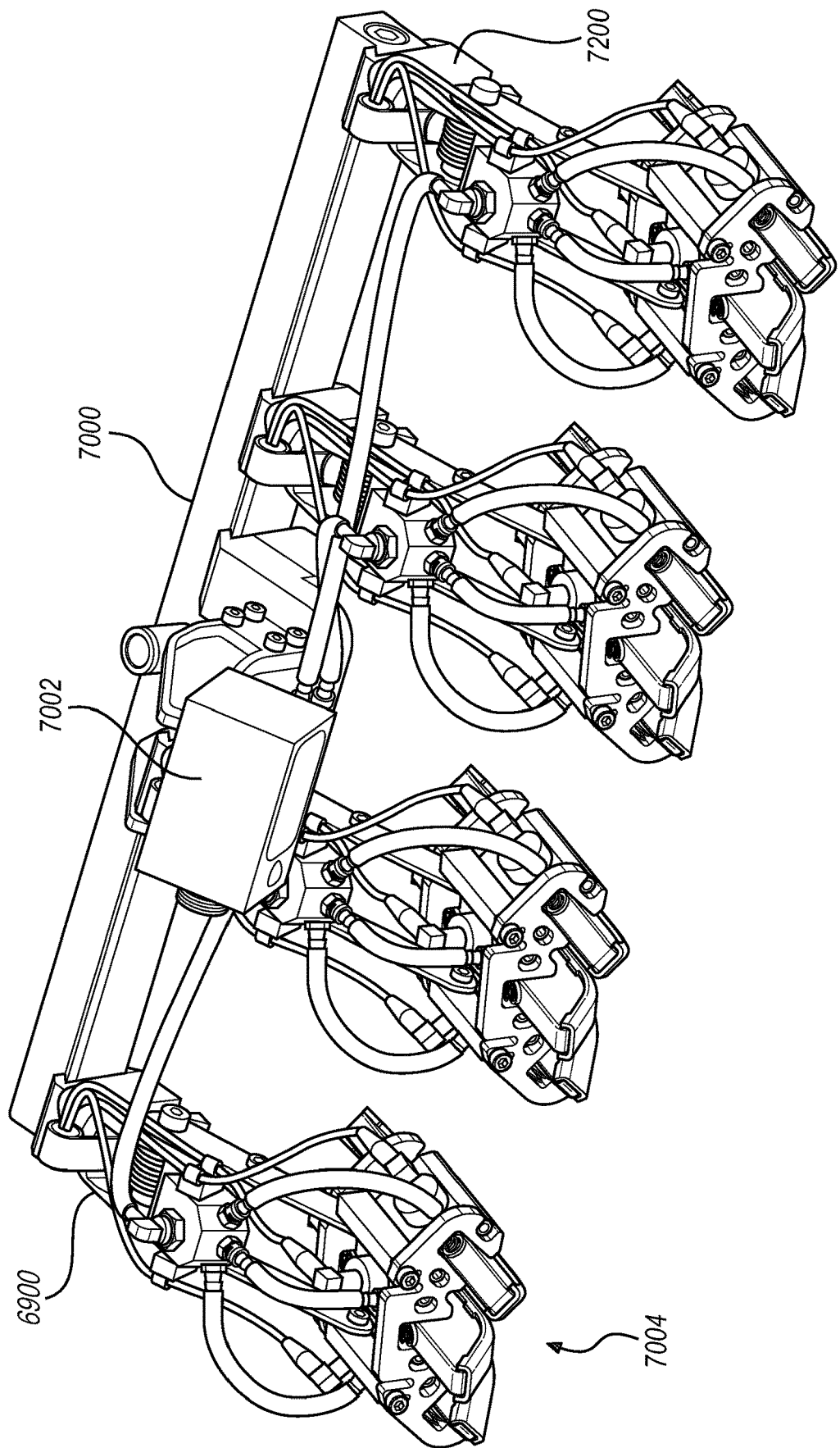
FIG. 33 depicts a payload with sensor carriages and an inspection camera.
Figure 34:
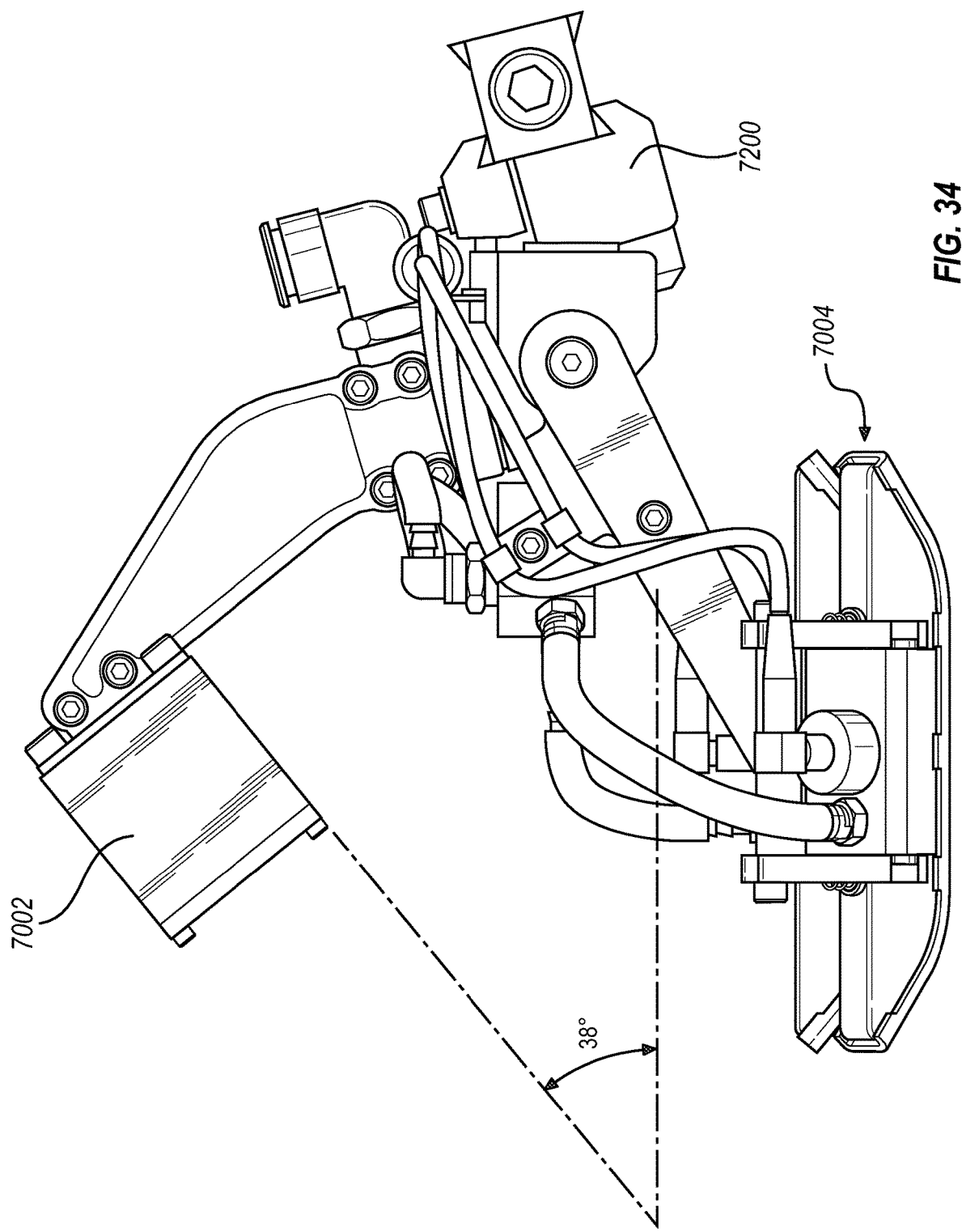
FIG. 34 depicts an example side view of a payload and inspection camera.
Figure 35:
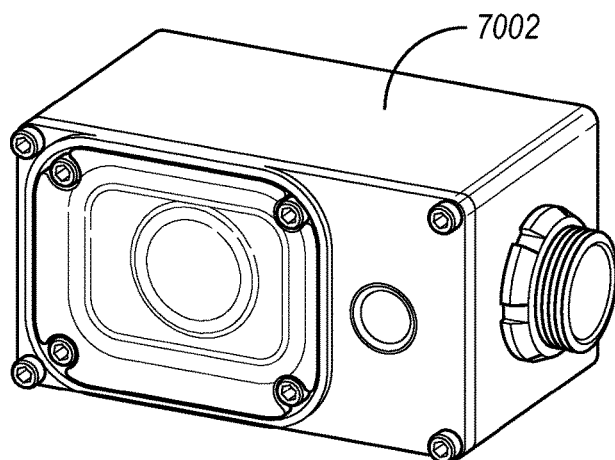
FIGS. 35-36 depict details of an example inspection camera.
Figure 36:
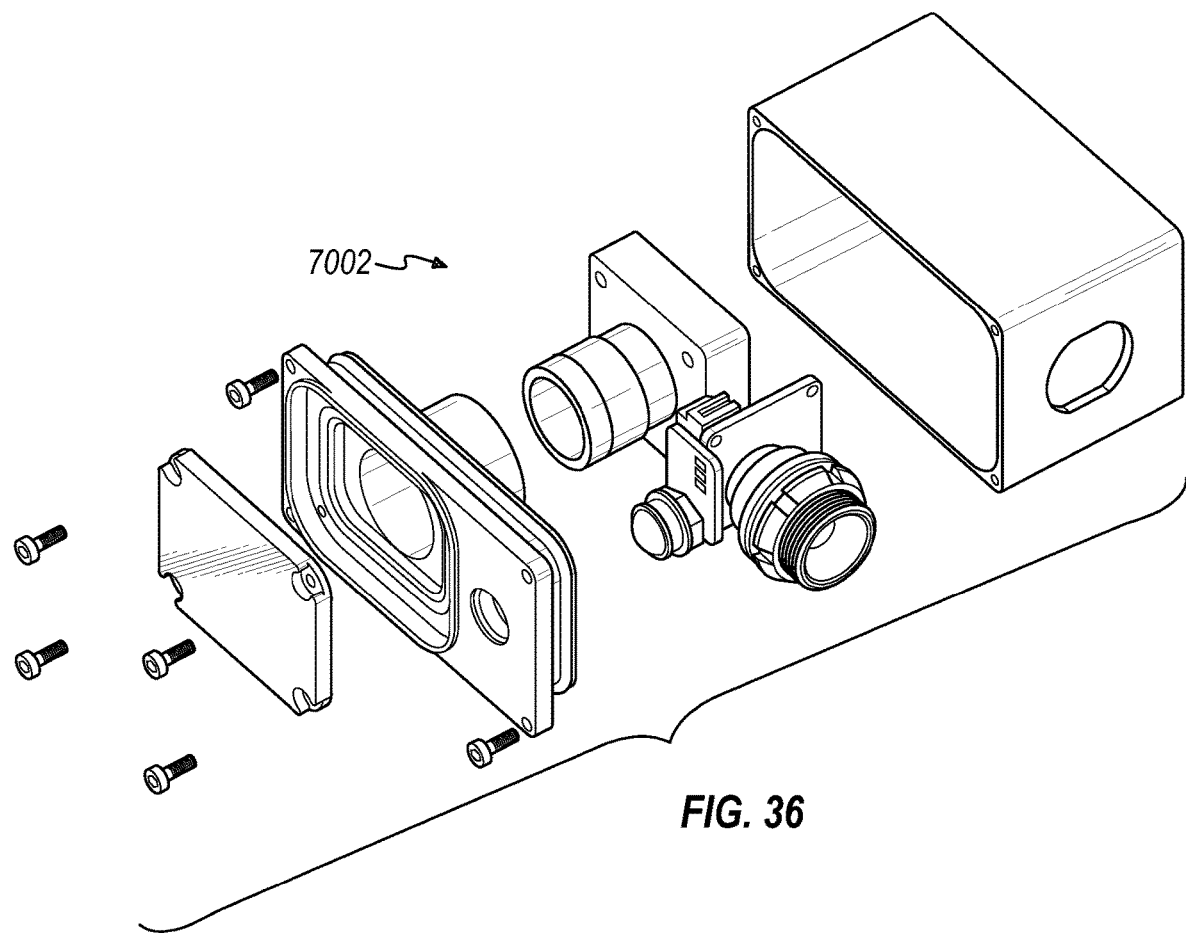

Referring to FIGS. 33, an example of a rail 7000 is seen with a plurality of sensor carriages 7004 attached and an inspection camera 7002 attached. As shown in FIGS. 34-36, the inspection camera 7002 may be aimed downward (e.g., at 38 degrees) such that it captures an image of the inspection surface that can be coordinated with sensor measurements. The inspection video captured may be synchronized with the sensor data and/or with the video captured by the navigation cameras on the center module. The inspection camera 7002 may have a wide field of view such that the image captured spans the width of the payload and the surface measured by all of the sensor carriages 7004 on the rail 7000.

Figure 38:
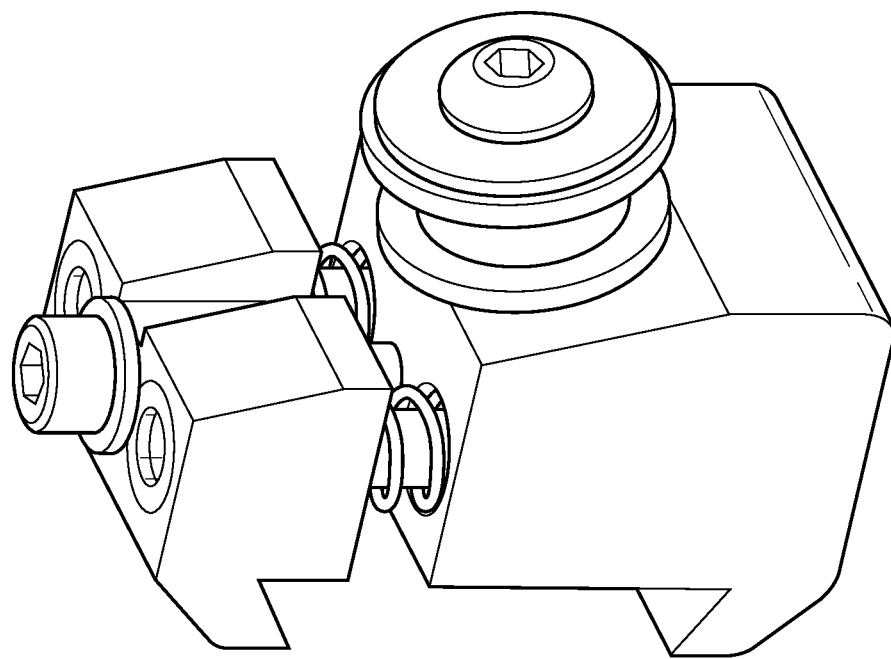
FIGS. 37-38 depict clamped and un-clamped views of a sensor clamp.
Figure 37:
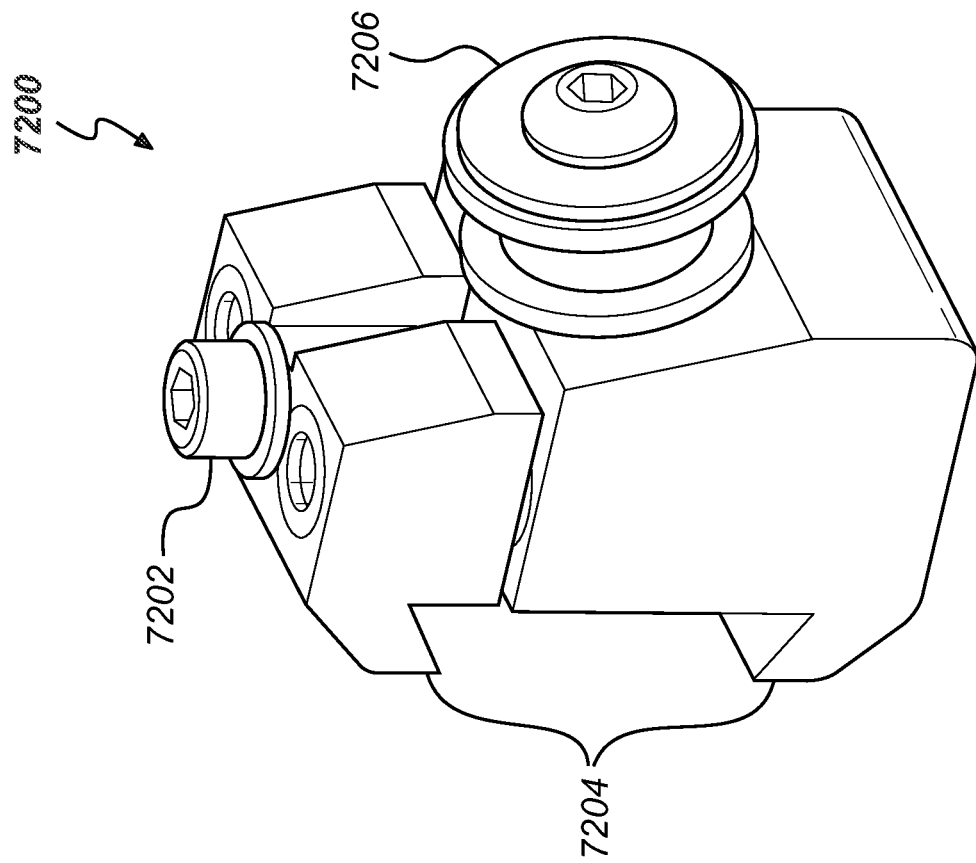
Figure 39:
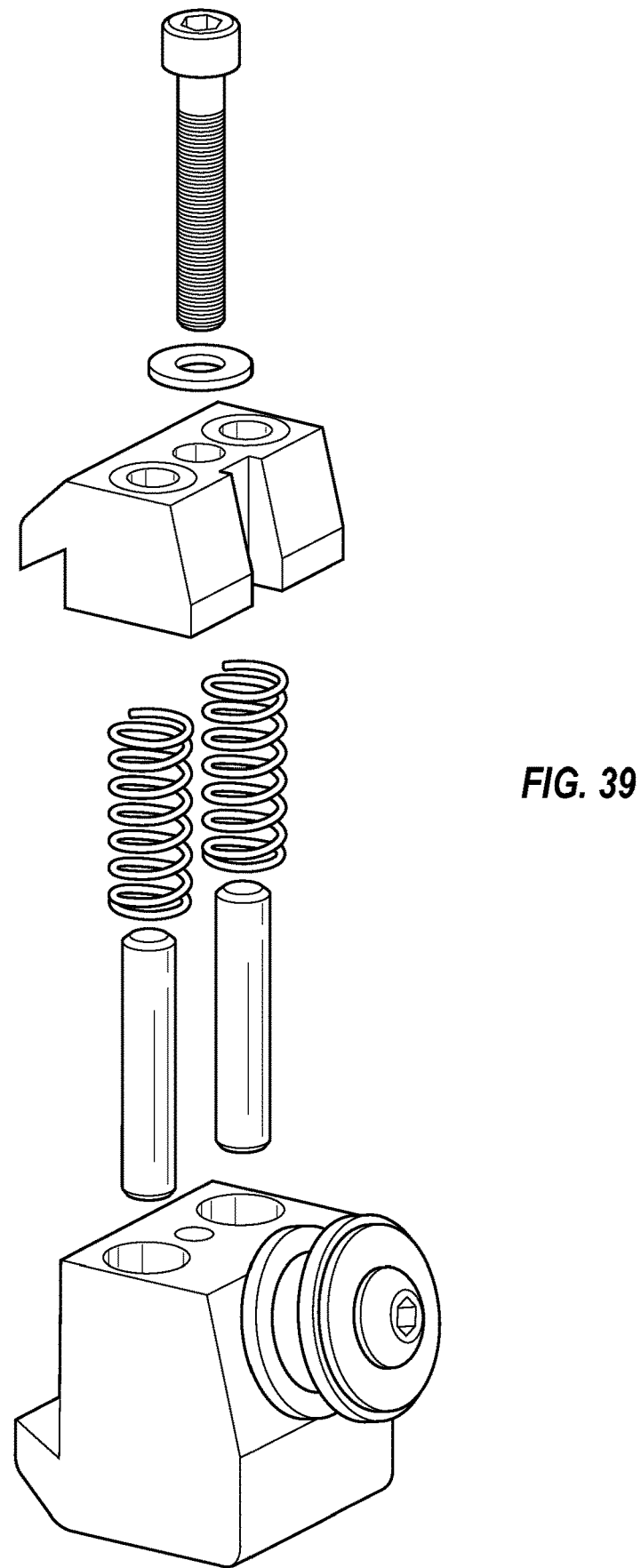
FIG. 39 depicts an exploded view of a sensor carriage clamp.

The length of the rail may be designed to according to the width of sensor coverage to be provided in a single pass of the inspection robot, the size and number of sensor carriages, the total weight limit of the inspection robot, the communication capability of the inspection robot with the base station (or other communicated device), the deliverability of couplant to the inspection robot, the physical constraints (weight, deflection, etc.) of the rail and/or the clamping block, and/or any other relevant criteria. Referring to FIGS. 37-39, a rail may include one or more sensor carriage clamps 7200 having joints with several degrees of freedom for movement to allow the robot to continue even if one or more sensor carriages encounter unsurmountable obstacles (e.g., the entire payload can be raised, the sensor carriage can articulate vertically and raise over the obstacle, and/or the sensor carriage can rotate and traverse around the obstacle).

The rail actuator connector 6912 may be connected to a rail (payload) actuator 5518 (FIG. 24) which is able to provide a configurable down-force on the rail 7000 and the attached sensor carriages 7004 to assure contact and/or desired engagement angle with the inspection surface. The payload actuator 5518 may facilitate engaging and disengaging the rail 7000 (and associated sensor carriages 7004) from the inspection surface to facilitate obstacle avoidance, angle transitions, engagement angle, and the like. Rail actuators 5518 may operate independently of one another. Thus, rail engagement angle may vary between drive modules on either side of the center module, between front and back rails on the same drive module, and the like.

A sensor clamp 7200 may allow sensor carriages 7004 to be easily added individually to the rail (payload) 7000 without disturbing other sensor carriages 7004. A simple sensor set screw 7202 tightens the sensor clamp edges 7204 of the sensor clamp 7200 over the rail. In the example of FIGS. 38-39, a sled carriage mount 7206 provides a rotational degree of freedom for movement.

Figure 40:
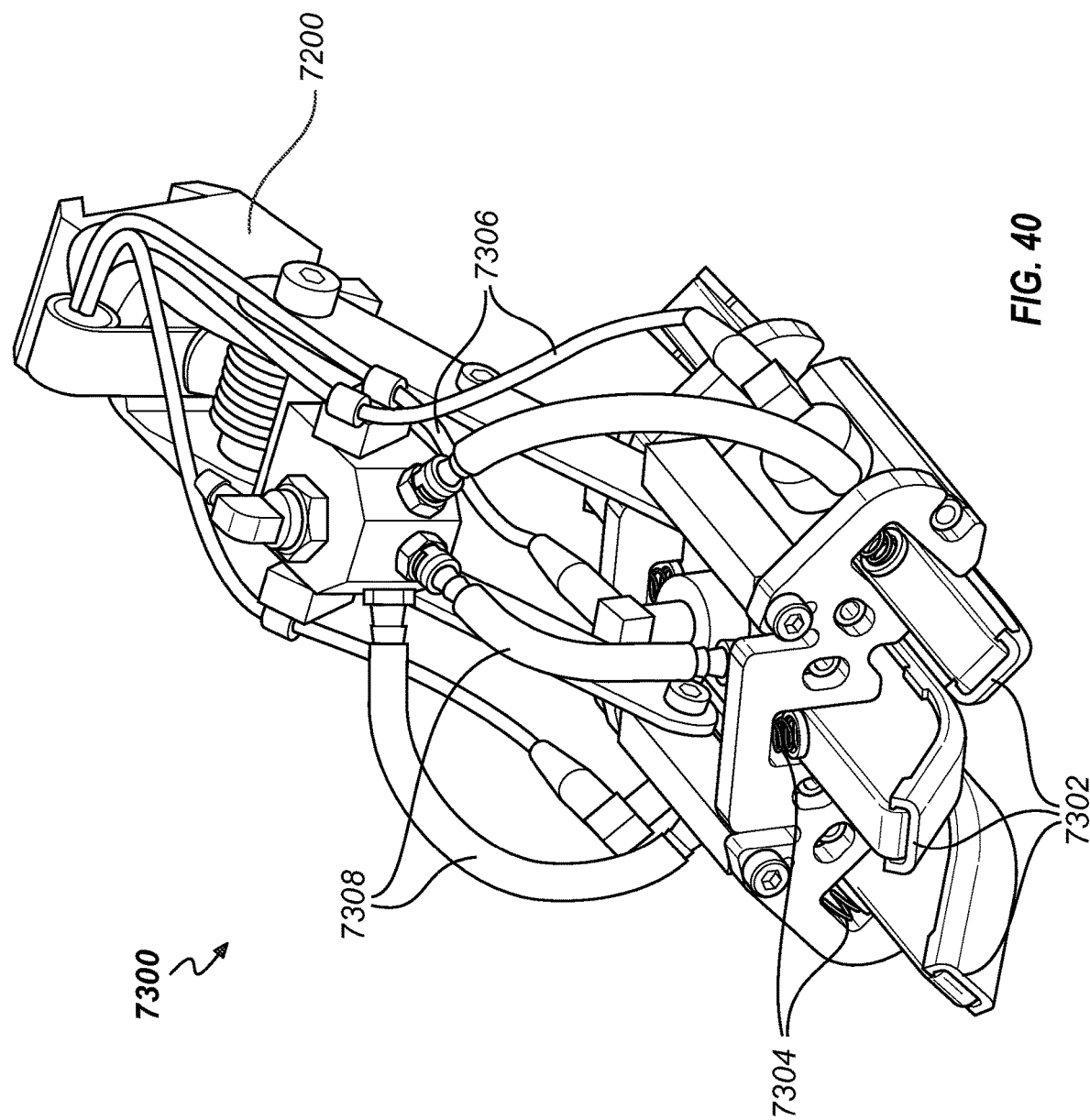
FIG. 40 depicts a sensor carriage having a multi-sensor sled assembly.

FIG. 40 depicts a multi-sensor sled carriage 7004, 7300. The embodiment of FIG. 40 depicts multiple sleds arranged on a sled carriage, but any features of a sled, sled arm, and/or payload described throughout the present disclosure may otherwise be present in addition to, or as alternatives to, one or more features of the multi-sensor sled carriage 7004, 7300. The multi-sensor sled carriage 7300 may include a multiple sled assembly, each sled 7302 having a sled spring 7304 at the front and back (relative to direction of travel) to enable the sled 7302 to tilt or move in and out to accommodate the contour of the inspection surface, traverse obstacles, and the like. The multi-sensor sled carriage 7300 may include multiple power/data connectors 7306, one running to each sensor sled 7302, to power the sensor and transfer acquired data back to the robot. Depending on the sensor type, the multi-sensor sled carriage 7300 may include multiple couplant lines 7308 providing couplant to each sensor sled 7302 requiring couplant.

Figure 41:
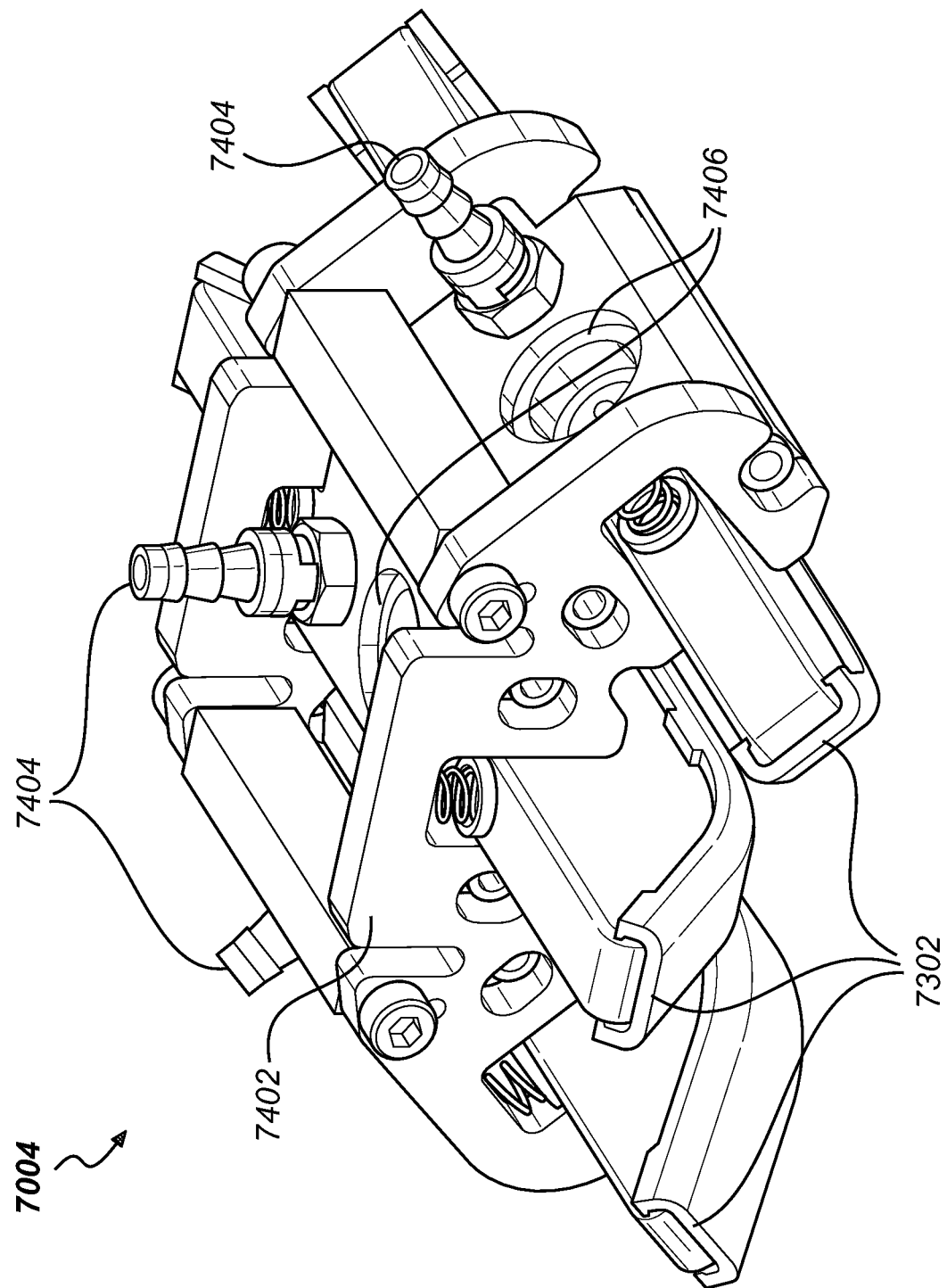
FIGS. 41-42 depict views of two different sized multi-sensor sled assemblies.
Figure 42:
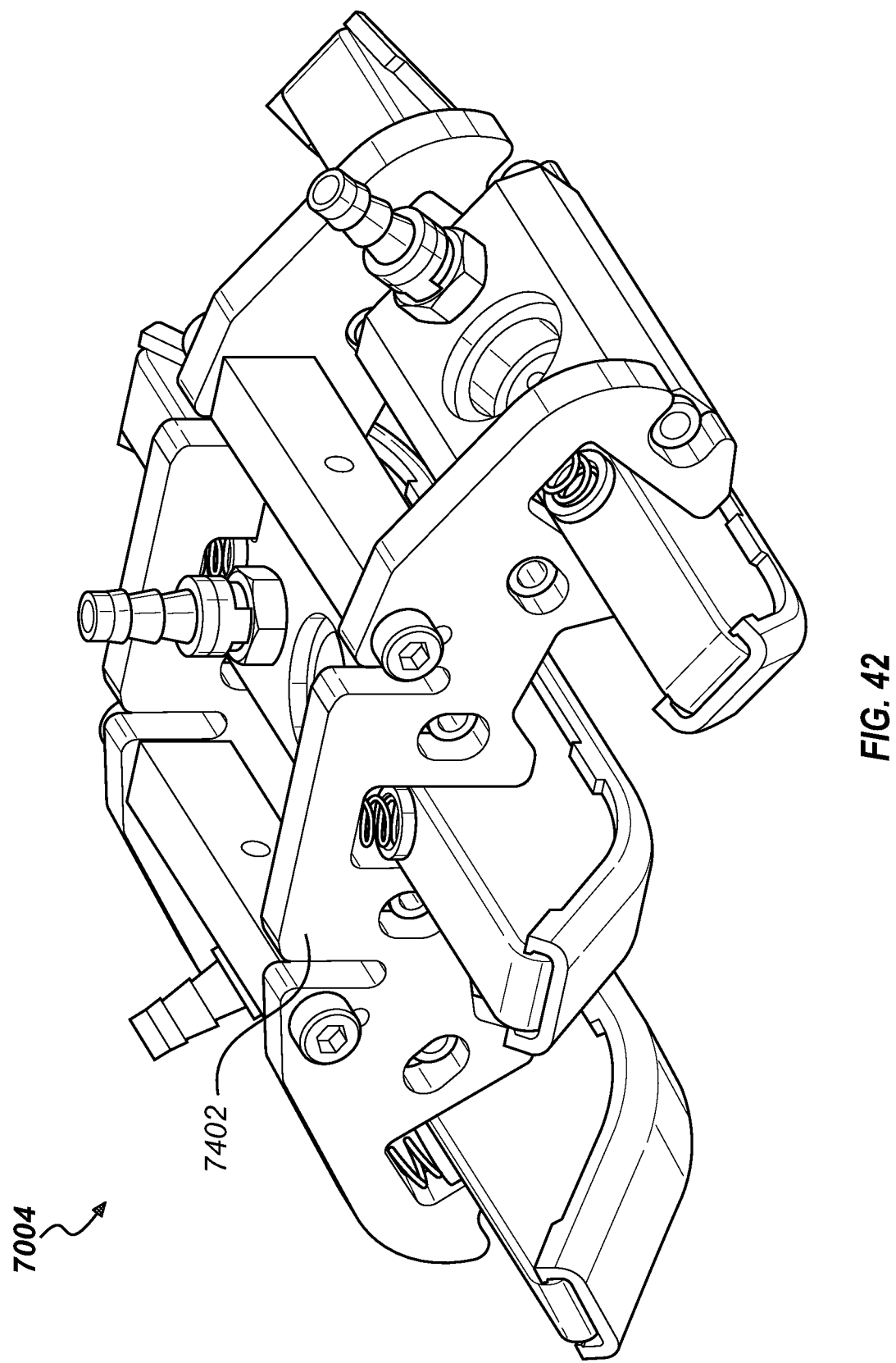
Figure 43:
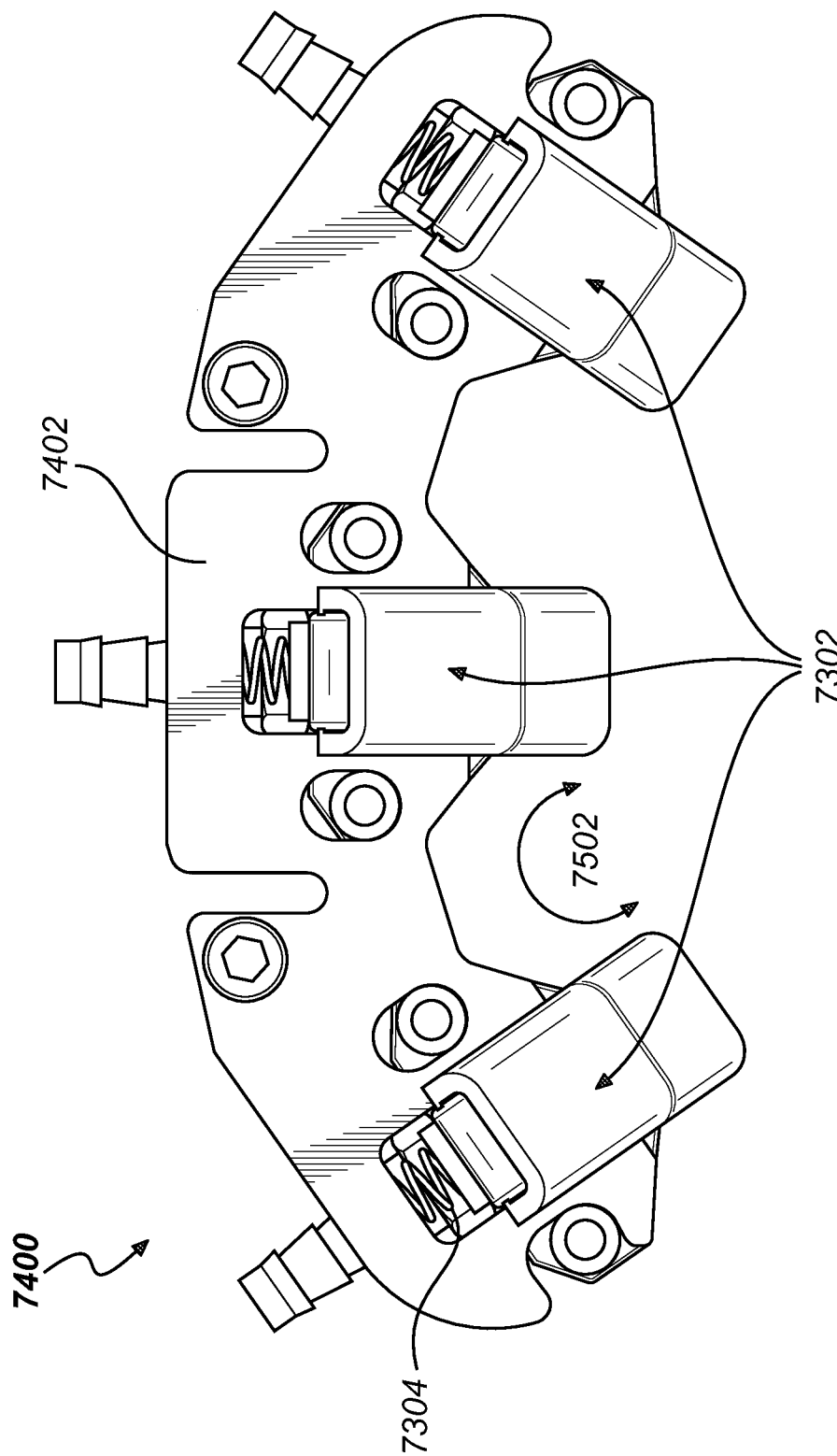
FIG. 43 depicts a front view of a multi-sensor sled assembly.

Referring to FIGS. 41-42, in a top perspective depiction, two multiple-sensor sled assemblies 7400 of different widths are shown, as indicated by the width label 7402. A multiple sled assembly may include multiple sleds 7302. Acoustic sleds may include a couplant port 7404 for receiving couplant from the robot. Each sled may have a sensor opening 7406 to accommodate a sensor and engage a power/data connector 7306. A multiple-sensor sled assembly width may be selected to accommodate the inspection surface to be traversed such as pipe outer diameter, anticipated obstacle size, desired inspection resolution, a desired number of contact points (e.g., three contact points ensuring self-alignment of the sled carriage and sleds), and the like. As shown in FIG. 43, an edge-on depiction of a multiple-sensor sled assembly, the sled spring 7304 may allow independent radial movement of each sled to self-align with the inspection surface. The rotational spacing 7502 (tracing a circumference on an arc) between sleds may be fixed or may be adjustable.

Figure 44:
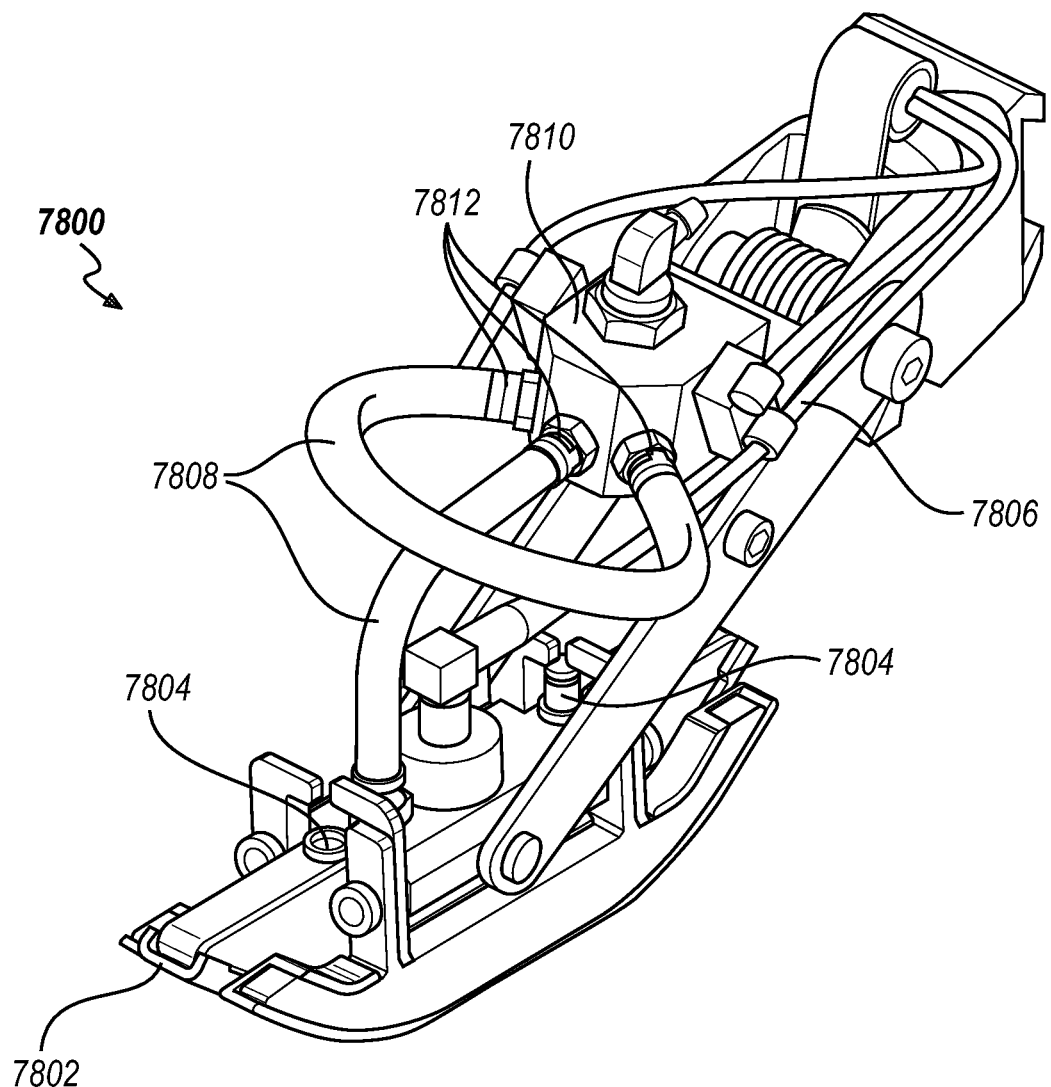
FIG. 44 depicts a sensor carriage with a universal single-sensor sled assembly.

In embodiments, a sensor carriage may comprise a universal single sled sensor assembly 7800 as shown in FIGS. 44. The universal single sled sensor assembly 7800 may include a single sensor housing 7802 having sled springs 7804 at the front and back (relative to direction of travel) to enable the sensor housing (sled) 7802 to tilt or move in and out to accommodate the contour of the inspection surface, traverse obstacles, and the like. The universal single sled sensor assembly 7800 may have a power/data connector 7806 to power the sensor and transfer acquired data back to the robot. The universal single sled sensor assembly 7800 may include multiple couplant lines 7808 attached to a multi-port sled couplant distributor 7810. Unused couplant ports 7812 may be connected to one another to simply reroute couplant back into a couplant system.

In embodiments, identification of a sensor and its location on a rail and relative to the center module may be made in real-time during a pre-processing/calibration process immediately prior to an inspection run, and/or during an inspection run (e.g., by stopping the inspection robot and performing a calibration). Identification may be based on a sensor ID provided by an individual sensor, visual inspection by the operator or by image processing of video feeds from navigation and inspection cameras, and user input include including specifying the location on the robot and where it is plugged in. In certain embodiments, identification may be automated, for example by powering each sensor separately and determining which sensor is providing a signal.

An example procedure for detecting and/or traversing obstacles is described following. An example procedure includes evaluating at least one of: a wheel slippage determination value, a motor torque value, and a visual inspection value (e.g., through the camera, by an operator or controller detecting an obstacle directly and/or verifying motion). The example procedure further includes determining that an obstacle is present in response to the determinations. In certain embodiments, one or more determinations are utilized to determine that an obstacle may be present (e.g., a rapid and/or low-cost determination, such as the wheel slippage determination value and/or the motor torque value), and another determination is utilized to confirm the obstacle is present and/or to confirm the location of the obstacle (e.g., the visual inspection value and/or the wheel slippage determination value, which may be utilized to identify the specific obstacle and/or confirm which side of the inspection robot has the obstacle). In certain embodiments, one or more obstacle avoidance maneuvers may be performed, which may be scheduled in an order of cost, risk, and/or likelihood of success, including such operations as: raising the payload, facilitating a movement of the sensor carriage around the obstacle, reducing and/or manipulating a down force of the payload and/or of a sensor carriage, moving the inspection robot around and/or to avoid the obstacle, and/or changing the inspection run trajectory of the inspection robot.

Figure 49:
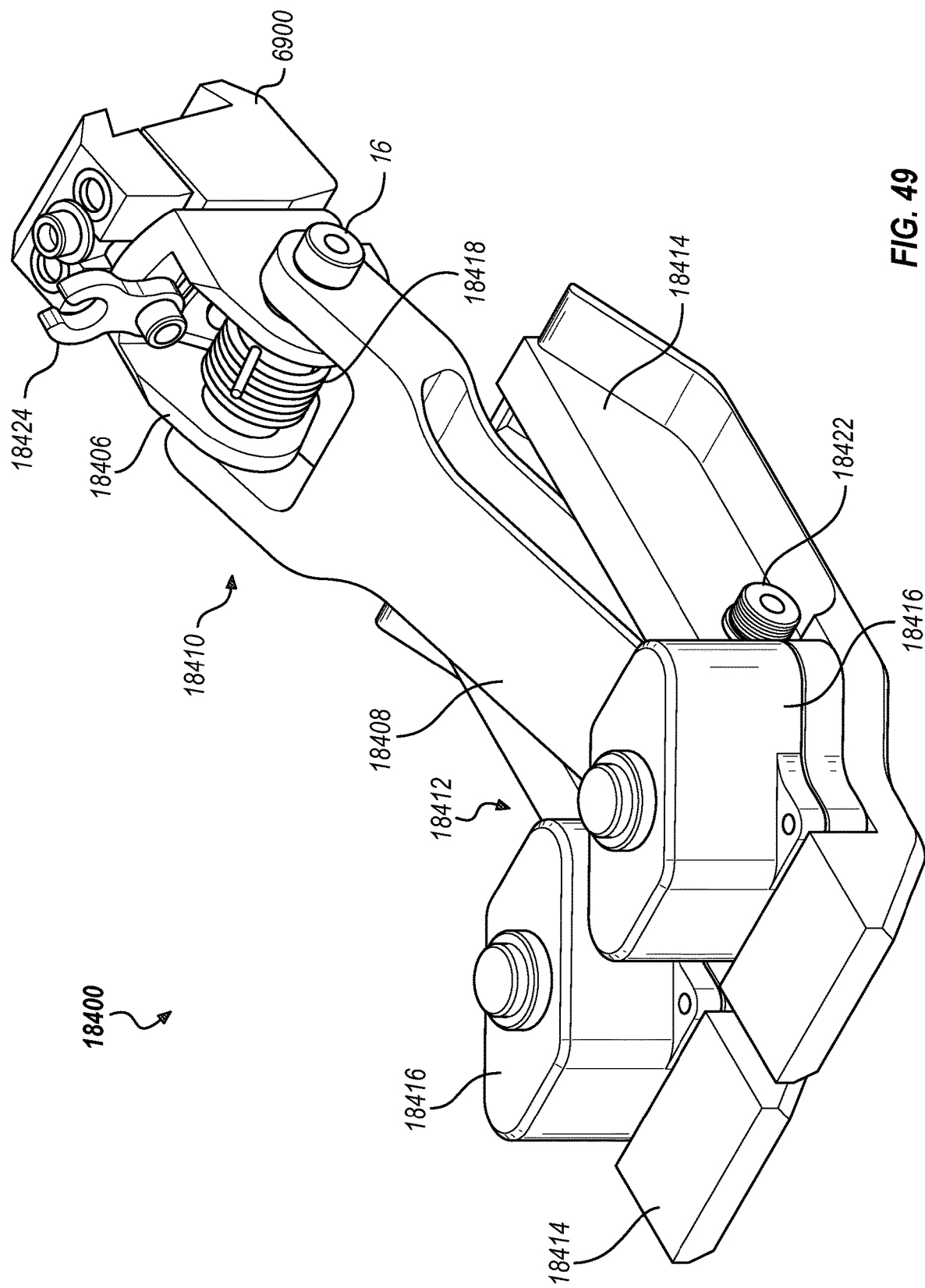
FIG. 49 depicts a payload for an inspection robot.

In an embodiment, and referring to FIG. 49, a payload 18400 for an inspection robot for inspecting an inspection surface may include a payload mount assembly 6900 couplable to a rail selectively coupled to a chassis or the inspection robot or a drive module of the inspection robot, an arm 18408 having a first end 18410 and a second end 18412, the first end 18410 coupled to an arm mount 18406 of the payload; one or more sleds 18414 mounted to the second end 18412 of the arm 18408; and at least two inspection sensors 18416, wherein each of the at least two inspection sensors 18416 are mounted to a corresponding sled 18414 of the one or more sleds, and operationally couplable to the inspection surface; wherein the arm mount 18406 may be moveable in relation to the payload mount assembly 6900. The arm mount 18406 may further include a hose guide 18424 to manage a coolant hose position.

The term selectively couplable (and similar terms) as utilized herein should be understood broadly. Without limitation to any other aspect or description of the present disclosure, selectively couplable describes a selected association between objects. For example, an interface of object 1 may be so configured as to couple with an interface of object 2 but not with the interface of other objects. An example of selective coupling includes a power cord designed to couple to certain models of a particular brand of computer, while not being able to couple with other models of the same brand of computer. In certain embodiments, selectively couplable includes coupling under selected circumstances and/or operating conditions, and/or includes de-coupling under selected circumstances and/or operating conditions.

In an embodiment, the arm mount 18406 may be moveable in relation to the payload mount assembly 6900. In an embodiment, the first end of the arm 18408 may be moveable in relation to the arm mount 18406. In an embodiment, the first end 18410 of the arm 18408 may rotate in relation to the arm mount 18406 around pivot point 16. In an embodiment, the payload mount assembly 6900 is rotatable with respect to a first axis, and wherein the first end of the arm is rotatable in a second axis distinct from the first axis.

In an embodiment, the one or more sleds 18414 may be rotatable in relation to the second end 18412 of the arm 18408 at joint 18422. The payload may further include at least two sleds 18414, and wherein the at least two sleds 18414 may be rotatable as a group in relation to the second end 18412 of the arm 18408. The payload may further include a downward biasing force device 18418 structured to selectively apply a downward force to the at least two inspection sensors 18416 with respect to the inspection surface. In embodiments, the weight position of the device 18418 may be set at design time or run time. In some embodiments, weight positions may only include a first position or a second position, or positions in between (a few, a lot, or continuous). In embodiments, the downward biasing force device 18418 may be disposed on the second portion 18406 of the payload mount assembly 6900. The downward biasing force device 18418 may be one or more of a weight, a spring, an electromagnet, a permanent magnet, or an actuator. The downward biasing force device 18418 may include a weight moveable between a first position applying a first downward force and a second position applying a second downward force. The downward biasing force device 18418 may include a spring, and a biasing force adjustor moveable between a first position applying a first downward force and a second position applying a second downward force. In embodiments, the force of the device 18418 may be set at design time or run time. In embodiments, the force of the device 18418 may be available only at a first position/second position, or positions in between (a few, a lot, or continuous). For example, setting the force may involve compressing a spring or increasing a tension, such as in a relevant direction based on spring type. In another example, setting the force may involve changing out a spring to one having different properties, such as at design time. In embodiments, the spring may include at least one of a torsion spring, a tension spring, a compression spring, or a disc spring. The payload 18400 may further include an inspection sensor position actuator, structured to adjust a position of the at least two inspection sensors 18416 with respect to the inspection surface. The payload may further include at least two sensors 18416, wherein the payload mount assembly 6900 may be moveable with respect to the chassis of the inspection robot and the inspection sensor position actuator may be coupled to the chassis, wherein the inspection sensor position actuator in a first position moves the payload mount assembly 6900 to a corresponding first coupler position, thereby moving the at least two sensors 18416 to a corresponding first sensor position, and wherein the inspection sensor position actuator in a second position moves the payload mount assembly 6900 to a corresponding second coupler position, thereby moving the at least two sensors 18416 to a corresponding second sensor position. In some embodiments, the inspection sensor position actuator may be coupled to a drive module. In some embodiments, a payload position may include a down force selection (e.g., actuator moves to touch sensors down, further movement may be applying force and may not correspond to fully matching geometric movement of the payload coupler). In embodiments, the inspection sensor position actuator may be structured to rotate the payload mount assembly 6900 between the first coupler position and the second coupler position. The actuator may be structured to horizontally translate the payload mount assembly 6900 between the first coupler position and the second coupler position. The payload may further include a couplant conduit 10510 (FIG. 131) structured to fluidly communicate couplant between a chassis couplant interface 5102 (FIG. 18) and a payload couplant interface and wherein each of the at least two inspection sensors 18416 may be fluidly coupled to the payload couplant interface. In an embodiment, the couplant conduit 10510 may be from the chassis to the payload such that a single payload connection supplies all related sensors.

The term fluidly communicate (and similar terms) as utilized herein should be understood broadly. Without limitation to any other aspect or description of the present disclosure, fluid communication describes a movement of a fluid, a gas, or a liquid, between two points. In some examples, the movement of the fluid between the two points can be one of multiple ways the two points are connected, or may be the only way they are connected. For example, a device may supply air bubbles into a liquid in one instance, and in another instance the device may also supply electricity from a battery via the same device to electrochemically activate the liquid.

The term universal conduit (and similar terms) as utilized herein should be understood broadly. Without limitation to any other aspect or description of the present disclosure, a universal conduit describes a conduit capable of providing multiple other conduits or connectors, such as fluid, electricity, communications, or the like. In certain embodiments, a universal conduit includes a conduit at least capable to provide an electrical connection and a fluid connection. In certain embodiments, a universal conduit includes a conduit at least capable to provide an electrical connection and a communication connection.

The term mechanically couple (and similar terms) as utilized herein should be understood broadly. Without limitation to any other aspect or description of the present disclosure, mechanically coupling describes connecting objects using a mechanical interface, such as joints, fasteners, snap fit joints, hook and loop, zipper, screw, rivet, or the like.

The example controller 802 is depicted schematically as a single device for clarity of description, but the controller 802 may be a single device, a distributed device, and/or may include portions at least partially positioned with other devices in the system (e.g., on the inspection robot 100). In certain embodiments, the controller 802 may be at least partially positioned on a computing device associated with an operator of the inspection (not shown), such as a local computer at a facility including the inspection surface 500, a laptop, and/or a mobile device. In certain embodiments, the controller 802 may alternatively or additionally be at least partially positioned on a computing device that is remote to the inspection operations, such as on a web-based computing device, a cloud computing device, a communicatively coupled device, or the like.

Figure 45:
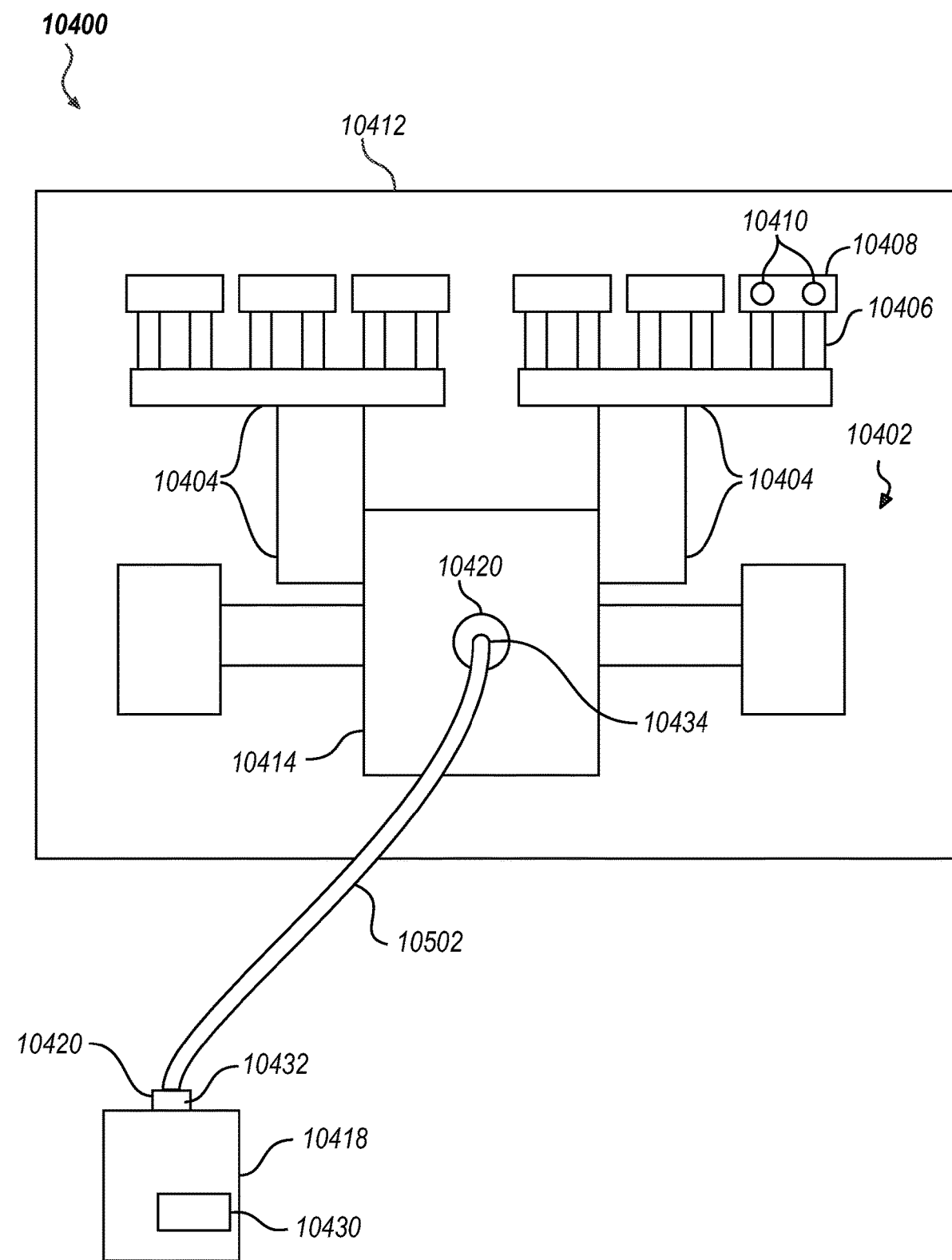
FIG. 45 depicts an embodiment of an inspection robot with a tether.

In an embodiment, and referring to FIG. 45, a system 10400 may include an inspection robot 10402 comprising a payload 10404; at least one arm 10406, wherein each arm 10406 is pivotally mounted to a payload 10404; at least two sleds 10408, wherein each sled 10408 is mounted to the at least one arm 10406; a plurality of inspection sensors 10410, each of the inspection sensors 10410 coupled to one of the sleds 10408 such that each sensor is operationally couplable to an inspection surface 10412, wherein the at least one arm is horizontally moveable relative to a corresponding payload 10404; and a tether 10502 including an electrical power conduit 10506 operative to provide electrical power; and a working fluid conduit 10504 operative to provide a working fluid. In an embodiment, the working fluid may be a couplant and the working fluid conduit 10504 may be structured to fluidly communicate with at least one sled 10408 to provide for couplant communication via the couplant between an inspection sensor 10410 mounted to the at least one sled 10408 and the inspection surface 10412. In an embodiment, the couplant provides acoustic communication between the inspection sensor and the inspection surface. In an embodiment, the couplant does not perform work (W). In an embodiment, the working fluid conduit 10504 has an inner diameter 10512 of about one eighth of an inch. In an embodiment, the tether 10502 may have an approximate length selected from a list consisting of: 4 feet, 6 feet, 10 feet, 15 feet, 24 feet, 30 feet, 34 feet, 100 feet, 150 feet, 200 feet, or longer than 200 feet. In an embodiment, the working fluid may be at least one of: a paint; a cleaning solution; and a repair solution. In certain embodiments, the working fluid additionally or alternatively is utilized to cool electronic components of the inspection robot, for example by being passed through a cooling plate in thermal communication with the electronic components to be cooled. In certain embodiments, the working fluid is utilized as a cooling fluid in addition to performing other functions for the inspection robot (e.g., utilized as a couplant for sensors). In certain embodiments, a portion of the working fluid may be recycled to the base station and/or purged (e.g., released from the inspection robot and/or payload), allowing for a greater flow rate of the cooling fluid through the cooling plate than is required for other functions in the system such as providing sensor coupling.

It should be understood that any operational fluid of the inspection robot 10402 may be a working fluid. The tether 10502 may further include a couplant conduit 10510 operative to provide a couplant. The system 10400 may further include a base station 10418, wherein the tether 10502 couples the inspection robot 10402 to the base station 10418. The tether 10502 may couple to a central chassis 10414 of the inspection robot 10402. In an embodiment, the base station 10418 may include a controller 10430; and a lower power output electrically coupled to each of the electrical power conduit 10506 and the controller 10430, wherein the controller 10430 may be structured to determine whether the inspection robot 10402 is connected to the tether 10502 in response to an electrical output of the lower power output. In embodiments, the electrical output may be at least 18 Volts DC. In an embodiment, the controller 10430 may be further structured to determine whether an overcurrent condition exists on the tether 10502 based on an electrical output of the lower power output. The tether 10502 may further include a communication conduit 10508 operative to provide a communication link, wherein the communication conduit 10508 comprises an optical fiber or a metal wire. Since fiber is lighter than metal for communication lines, the tether 10502 can be longer for vertical climbs because it weighs less. A body of the tether 10502 may include at least one of: a strain relief 10420; a heat resistant jacketing 10514; a wear resistant outer layer 10516; and electromagnetic shielding 10518. In embodiments, the tether 10502 may include similar wear materials. In embodiments, the sizing of the conduits 10504, 10506, 10508, 10510 may be based on power requirements, couplant flow rate, recycle flow rate, or the like.

Figure 131:
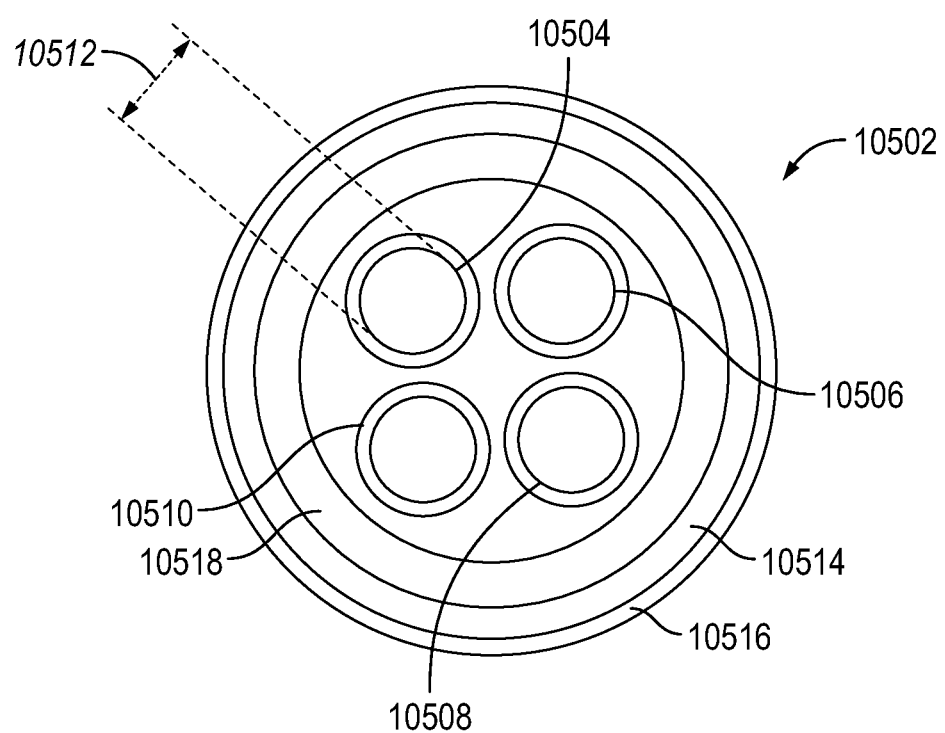
FIG. 131 depicts a schematic of a tether.

In an embodiment, and referring to FIGS. 45 and 131, a tether 10502 for connecting an inspection robot 10402 to a base station 10418 may include an electrical power conduit 10506 comprising an electrically conductive material; a working fluid conduit 10504 defining a working fluid passage therethrough; a base station interface 10432 positioned at a first end of the tether 10502, the base station interface operable to couple the tether 10502 to a base station 10418; a robot interface 10434 positioned at a second end of the tether, the robot interface operable to couple the tether 10502 to the inspection robot 10402; a strain relief 10420; a wear resistance outer layer 10516; and electromagnetic shielding 10518. The tether may further include a communication conduit 10508, wherein the communication conduit 10508 may include an optical fiber or a metal wire. The electrical power conduit 10506 may further include a communications conduit 10508. In an embodiment, the working fluid conduit 10504 may have an inner diameter 10512 of about one eighth of an inch.

Operations of the inspection robot 100 provide the sensors 2202 in proximity to selected locations of the inspection surface 500 and collect associated data, thereby interrogating the inspection surface 500. Interrogating, as utilized herein, includes any operations to collect data associated with a given sensor, to perform data collection associated with a given sensor (e.g., commanding sensors, receiving data values from the sensors, or the like), and/or to determine data in response to information provided by a sensor (e.g., determining values, based on a model, from sensor data; converting sensor data to a value based on a calibration of the sensor reading to the corresponding data; and/or combining data from one or more sensors or other information to determine a value of interest). A sensor 2202 may be any type of sensor as set forth throughout the present disclosure, but includes at least a UT sensor, an EMI sensor (e.g., magnetic induction or the like), a temperature sensor, a pressure sensor, an optical sensor (e.g., infrared, visual spectrum, and/or ultra-violet), a visual sensor (e.g., a camera, pixel grid, or the like), or combinations of these.

Figure 46:
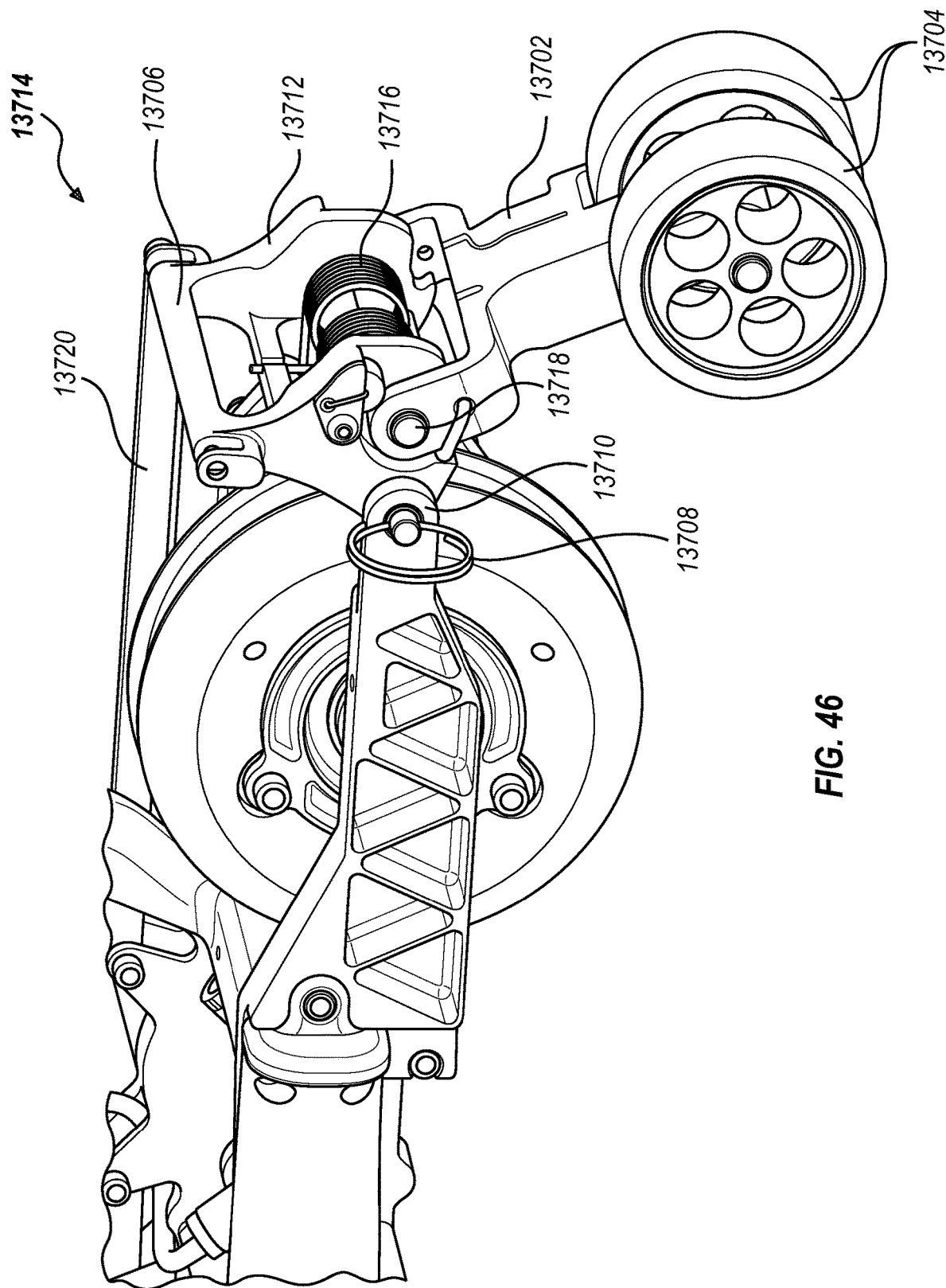
FIG. 46 depicts an example stability module assembly.

Referencing FIG. 46, an example stability module assembly 13714 is depicted. The example stability module assembly is couplable to a drive module and/or a center chassis of an inspection robot, and is positioned at a rear of the inspection robot to assist in ensuring the robot does not rotate backwards away from the inspection surface (e.g., upon hitting an obstacle, debris, encountering a non-ferrous portion of the inspection surface with front drive wheels, etc.). The example includes a coupling interface 13710, 13706 of any type, depicted as axles of engaging matching holes defined in the stability module assembly 13714 and the coupled device 13720 (e.g., a drive module, chassis, etc.). The example coupling arrangement utilizes a pin 13708 to secure the connection. The example stability module assembly 13714 includes an engaging member 13704 for the inspection surface, which may include one or more wheels, and/or a drag bar. In certain embodiments, the engaging member 13704 is nominally positioned to contact the inspection surface throughout inspection operations, but may additionally or alternatively be positioned to engage the inspection surface in response to the inspection robot rotating away from the inspection surface by a selected amount. The example stability module assembly 13714 includes a biasing member 13716, for example a spring, that opposes further rotation of the inspection robot when the stability module assembly 13714 engages the inspection surface. The biasing member 13716 in the example is engaged at a pivot axle 13718 of the stability module assembly 13714, and within an enclosure 13712 or upper portion. In certain embodiments, the upper portion 13712 (or upper stability body) and lower portion 13702 (or lower stability body) are rotationally connected, where the biasing member opposes rotation of the upper portion 13712 toward the lower portion 13702.

Figure 27:
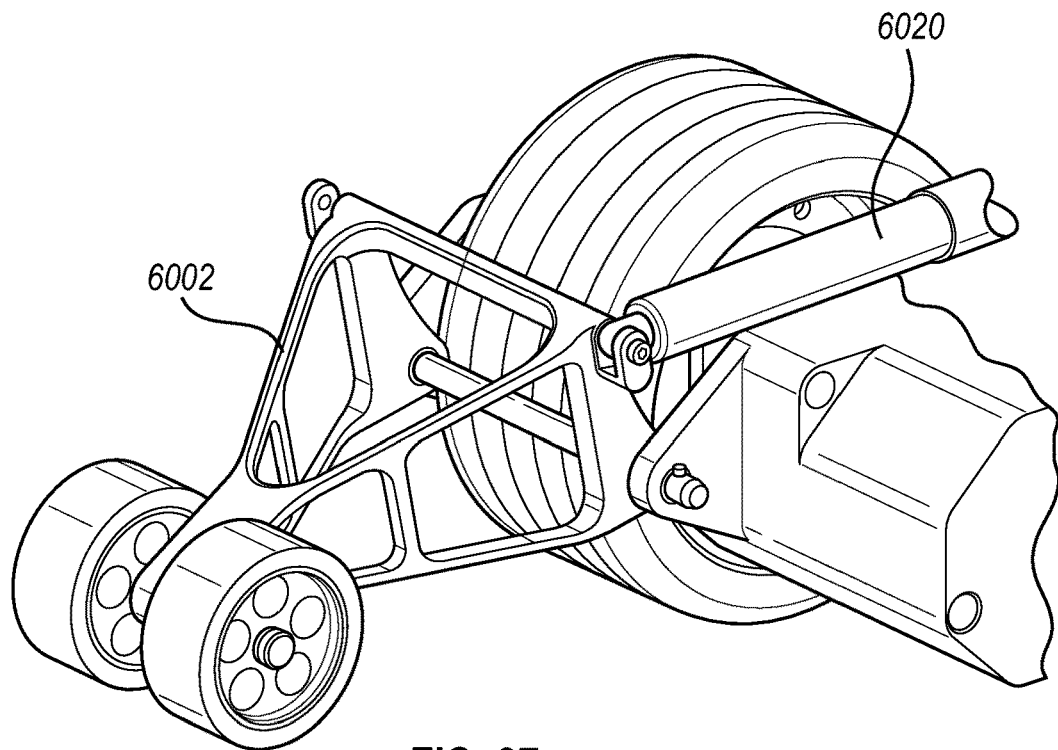

Referencing again FIGS. 27-29, examples of stability module assembly 13714 arrangements are depicted. In certain embodiments, the engaging member may be a drag bar (e.g., FIG. 29). In certain embodiments, the stability module assembly 13714 may be coupled to an actuator 6020 at connection point 6019 allowing for deployment of the stability module assembly, and/or for the application of selected down force by the stability module assembly to provide an urging force to the inspection robot to return front wheels and/or a payload to the inspection surface, and/or to adjust a down force applied by a payload, sensor, and/or sled. In certain embodiments, where a wheel of the stability module assembly 13714 engages the inspection surface, an encoder may be operationally coupled to the wheel, and may provide position information to the drive module and/or a controller of the inspection robot. In certain embodiments, the stability module assembly 13714 may move between a stored position (e.g., rotated away from the inspection surface, and/or positioned above the chassis and/or a drive module of the inspection robot). Without limitation to any other aspect of the present disclosure, FIG. 26 additionally depicts an example stability module assembly in an exploded view.

Operations of the inspection robot 100 provide the sensors 2202 in proximity to selected locations of the inspection surface 500 and collect associated data, thereby interrogating the inspection surface 500. Interrogating, as utilized herein, includes any operations to collect data associated with a given sensor, to perform data collection associated with a given sensor (e.g., commanding sensors, receiving data values from the sensors, or the like), and/or to determine data in response to information provided by a sensor (e.g., determining values, based on a model, from sensor data; converting sensor data to a value based on a calibration of the sensor reading to the corresponding data; and/or combining data from one or more sensors or other information to determine a value of interest). A sensor 2202 may be any type of sensor as set forth throughout the present disclosure, but includes at least a UT sensor, an EMI sensor (e.g., magnetic induction or the like), a temperature sensor, a pressure sensor, an optical sensor (e.g., infrared, visual spectrum, and/or ultra-violet), a visual sensor (e.g., a camera, pixel grid, or the like), or combinations of these.

Figure 54:
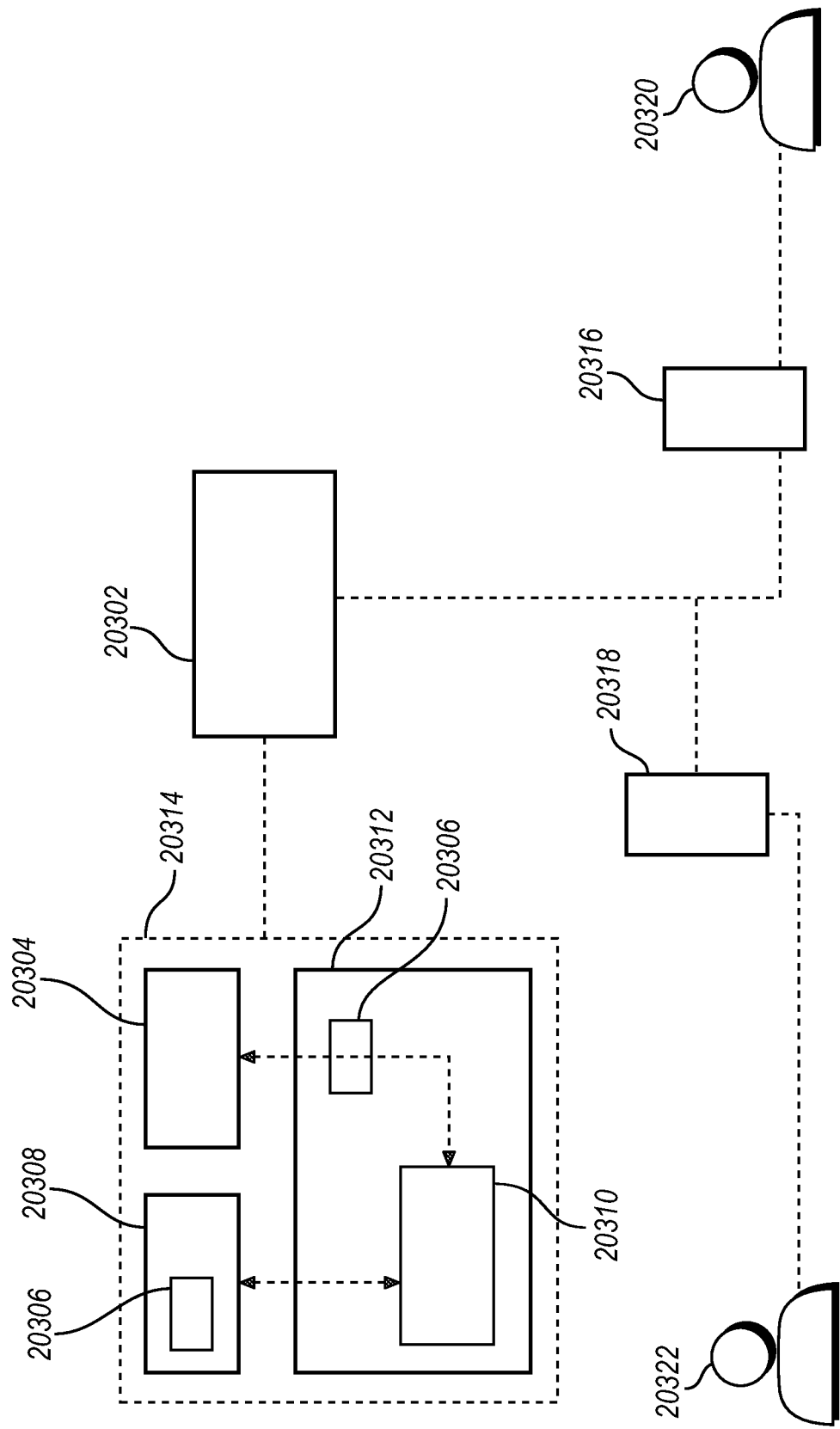
FIG. 54 depicts a system capable to perform rapid configuration of an inspection robot.

Referencing FIG. 54, an example system is depicted, capable to perform rapid configuration of an inspection robot in response to planned inspection operations and/or an inspection request from a consumer of the inspection data and/or processed values and/or visualizations determined from the inspection data.

The example system includes an inspection robot 20314. The inspection robot 20314 includes any inspection robot configured according to any embodiment set forth throughout the present disclosure, including for example, an inspection robot configured to interrogate an inspection surface using a number of input sensors. In certain embodiments, the sensors may be coupled to the inspection robot body 20312 (and/or center chassis, chassis housing, center module, housing, or similar components of the inspection robot) using one or more payloads. Each payload may additionally include components such as arms (e.g., to fix horizontal positions of a sensor or group of sensors relative to the payload, to allow for freedom of movement pivotally, rotationally, or the like). Each arm, where present, or the payload directly, may be coupled to a sled housing one or more of the input sensors. The inspection robot 20314 may further include a tether providing for freedom of movement along an inspection surface, while having supplied power, couplant, communications, or other aspects as described herein. The inspection robot 20314 and/or components thereof may include features to allow for quick changes to sleds or sled portions (e.g., a bottom contact surface), to arms of a payload, and/or for entire payload changes (e.g., from first payload having a first sensor group to a second payload having a second sensor group, between payloads having pre-configured and distinct sensor arrangements or horizontal spacing, between payloads having pre-configured arrangements for different types or characteristics of an inspection surface, etc.). The inspection robot may include features allowing for rapid changing of payloads, for example having a single interface for communications and/or couplant compatible with multiple payloads, removable and/or switchable drive modules allowing for rapid changing of wheel configurations, encoder configurations, motor power capabilities, stabilizing device changes, and/or actuator changes (e.g., for an actuator coupled to a payload to provide for raising/lowering operations of the payload, selectable down force applied to the payload, etc.). The inspection robot may further include a distribution of controllers and/or control modules within the inspection robot body, on drive modules, and/or associated with sensors, such that hardware changes can be implemented without changes required for a high level inspection controller. The inspection robot may further include distribution of sensor processing or post-processing, for example between the inspection controller or another controller positioned on the inspection robot, a base station computing device, an operator computing device, and/or a non-local computing device (e.g., on a cloud server, a networked computing device, a base facility computing device where the base facility is associated with an operator for the inspection robot), or the like. Any one or more of the described features for the inspection robot 20314, without limitation to any other aspect of the present disclosure, may be present and/or may be available for a particular inspection robot 20314. It can be seen that the embodiments of the present disclosure provide for multiple options to configure an inspection robot 20314 for the specific considerations of a particular inspection surface and/or inspection operation of an inspection surface. The embodiments set forth in FIGS. 55-56, and other embodiments set forth in the present disclosure, provide for rapid configuration of the inspection robot, and further provide for, in certain embodiments, responsiveness to inspection requirements and/or inspection requests, improved assurance that a configuration will be capable to perform a successful inspection operation including capability to retrieve the selected data and to successfully traverse the inspection surface.

The example inspection robot 20314 includes one or more hardware components 20304, 20308, which may be sensors and/or actuators of any type as set forth throughout the present disclosure. The hardware components 20304, 20308 are depicted schematically as coupled to the center chassis 20312 of the inspection robot 20314, and may further be mounted on, or form part of a sled, arm, payload, drive module, or any other aspect as set forth herein. The example inspection robot 20314 includes hardware controller 20306, with one example hardware controller positioned on an associated component, and another example hardware controller separated from the inspection controller 20310, and interfacing with the hardware component and the inspection controller.

Figure 55:
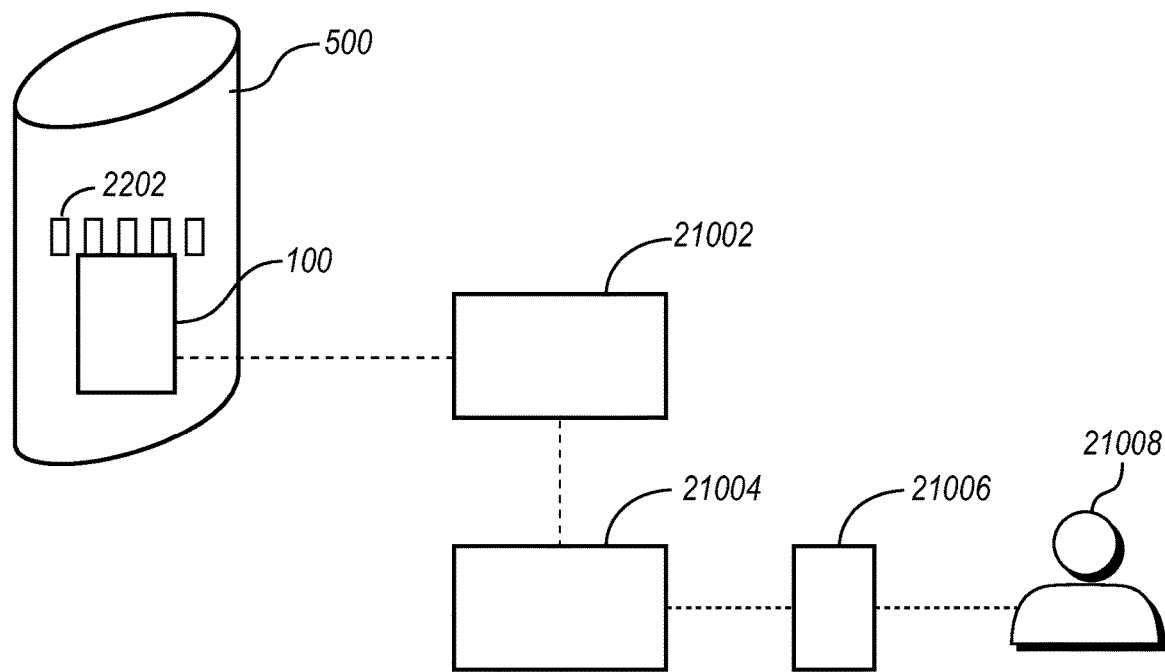
FIGS. 55-56 depict systems for providing real-time processed inspection data to a user.

The example of FIG. 55 further includes a robot configuration controller 20302. In the example, the robot configuration controller 20302 is communicatively coupled to the inspection robot 20314, a user interface 20316, and/or an operator interface 20318. The example robot configuration controller 20302 is depicted separately for clarity of the present description, but may be included, in whole or part, on other components of the system, such as the operator interface 20318 (and/or an operator associated computing device) and/or on the inspection robot 20314. Communicative coupling between the robot configuration controller 20302 and other components of the system may include a web based coupling, an internet based coupling, a LAN or WAN based coupling, a mobile device coupling, or the like. In certain embodiments, one or more aspects of the robot configuration controller 20302 are implemented as a web portal, a web page, an application and/or an application with an API, a mobile application, a proprietary or dedicated application, and/or combinations of these.

In the example of FIG. 55, a user 20320 is depicted interacting with the user interface 20316. The user interface 20316 may provide display outputs to the user 20320, such as inspection data, visualizations of inspection data, refined inspection data, or the like. The user interface 20316 may communicate user inputs to the robot configuration controller 20302 or other devices in the system. User inputs may be provided as interactions with an application, touch screen inputs, mouse inputs, voice command inputs, keyboard inputs, or the like. The user interface 20316 is depicted as a single device, but multiple user interfaces 20316 may be present, including multiple user interfaces 20316 for a single user (e.g., multiple physical devices such as a laptop, smart phone, desktop, terminal, etc.) and/or multiple back end interfaces accessible to the user (e.g., a web portal, web page, mobile application, etc.). In certain embodiments, a given user interface 20316 may be accessible to more than one user 20320.

In the example of FIG. 55, an operator 20322 is depicted interacting with the operator interface 20318 and/or the inspection robot 20314. As with the user 20320 and the user interface 20316, more than one operator 20322 and operator interface 20318 may be present, and further may be present in a many-to-many relationship. As utilized herein, and without limitation to any other aspect of the present disclosure, the operator 20322 participates in or interacts with inspection operations of the inspection robot 20314, and/or accesses the inspection robot 20314 to perform certain configuration operations, such as adding, removing, or switching hardware components, hardware controllers, or the like.

An example system includes an inspection robot 20314 having an inspection controller 20310 that operates the inspection robot utilizing a first command set. The operations utilizing the first command set may include high level operations, such as commanding sensors to interrogate the inspection surface, commanding the inspection robot 20314 to traverse the surface (e.g., position progressions or routing, movement speed, sensor sampling rates and/or inspection resolution/spacing on the inspection surface, etc.), and/or determining inspection state conditions such as beginning, ending, sensing, etc.

The example system further includes a hardware component 20304, 20308 operatively couplable to the inspection controller 20310, and a hardware controller 20306 that interfaces with the inspection controller 20310 in response to the first command set, and commands the hardware component 20304, 20308 in response to the first command set. For example, the inspection controller 20310 may provide a command such as a parameter instructing a drive actuator to move, instructing a sensor to begin sensing operations, or the like, and the hardware controller 20306 determines specific commands for the hardware component 20304, 20308 to perform operations consistent with the command from the inspection controller 20310. In another example, the inspection controller 20310 may request a data parameter (e.g., a wall thickness of the inspection surface), and the hardware controller interprets the hardware component 20304, 20308 sensed values that are responsive to the requested data parameter. In certain embodiments, the hardware controller 20306 utilizes a response map for the hardware component 20304, 20308 to control the component and/or understand data from the component, which may include A/D conversions, electrical signal ranges and/or reserved values, calibration data for sensors (e.g., return time assumptions, delay line data, electrical value to sensed value conversions, electrical value to actuator response conversions, etc.). It can be seen that the example arrangement utilizing the inspection controller 20310 and the hardware controller 20306 relieves the inspection controller 20310 from relying upon low-level hardware interaction data, and allows for a change of a hardware component 20304, 20308, even at a given interface to the inspection controller 20310 (e.g., connected to a connector pin, coupled to a payload, coupled to an arm, coupled to a sled, coupled to a power supply, and/or coupled to a fluid line), without requiring a change in the inspection controller 20310. Accordingly, a designer, configuration operator, and/or inspection operator, considering operations performed by the inspection controller 20310 and/or providing algorithms to the inspection controller 20310 can implement and/or update those operations or algorithms without having to consider the specific hardware components 20304, 20308 that will be present on a particular embodiment of the system. Embodiments described herein provide for rapid development of operational capabilities, upgrades, bug fixing, component changes or upgrades, rapid prototyping, and the like by separating control functions.

The example system includes a robot configuration controller 20302 that determines an inspection description value, determines an inspection robot configuration description in response to the inspection description value, and provides at least a portion of the inspection robot configuration description to a configuration interface (not shown) of the inspection robot 20314, to the operator interface 20318, or both, and may provide a first portion (or all) of the inspection robot configuration description to the configuration interface, and a second portion (or all) of the inspection robot configuration description to the operator interface 20318. In certain embodiments, the first portion and the second portion may include some overlap, and/or the superset of the first portion and second portion may not include all aspects of the inspection robot configuration description. In certain embodiments, the second portion may include the entire inspection robot configuration description and/or a summary of portions of the inspection robot configuration description—for example to allow the operator (and/or one or more of a number of operators) to save the configuration description (e.g., to be communicated with inspection data, and/or saved with the inspection data), and/or for verification (e.g., allowing an operator to determine that a configuration of the inspection robot is properly made, even for one or more aspects that are not implemented by the verifying operator). Further details of operations of the robot configuration controller 20302 that may be present in certain embodiments are set forth elsewhere in the disclosure.

In certain embodiments, the hardware controller 20306 determines a response map for the hardware component 20304, 20308 in response to the provided portion of the inspection robot configuration description.

In certain embodiments, the robot configuration controller 20302 interprets a user inspection request value, for example from the user interface 20316, and determines the inspection description value in response to the user inspection request value. For example, one or more users 20320 may provide inspection request values, such as an inspection type value (e.g., type of data to be taken, result types to be detected such as wall thickness, coating conformity, damage types, etc.), an inspection resolution value (e.g., a distance between inspection positions on the inspection surface, a position map for inspection positions, a largest un-inspected distance allowable, etc.), an inspected condition value (e.g., pass/fail criteria, categories of information to be labeled for the inspection surface, etc.), an inspection ancillary capability value (e.g., capability to repair, mark, and/or clean the surface, capability to provide a couplant flow rate, capability to manage a given temperature, capability to perform operations given a power source description, etc.), an inspection constraint value (e.g., a maximum time for the inspection, a defined time range for the inspection, a distance between an available base station location and the inspection surface, a couplant source amount or delivery rate constraint, etc.), an inspection sensor distribution description (e.g., a horizontal distance between sensors, a maximum horizontal extent corresponding to the inspection surface, etc.), an ancillary component description (e.g., a component that should be made available on the inspection robot, a description of a supporting component such as a power connector type, a couplant connector type, a facility network description, etc.), an inspection surface vertical extent description (e.g., a height of one or more portions of the inspection surface), a couplant management component description (e.g., a composition, temperature, pressure, etc. of a couplant supply to be utilized by the inspection robot during inspection operations), and/or a base station capability description (e.g., a size and/or position available for a base station, coupling parameters for a power source and/or couplant source, relationship between a base station position and power source and/or couplant source positions, network type and/or availability, etc.).

Example and non-limiting user inspection request values include an inspection type value, an inspection resolution value, an inspected condition value, and/or an inspection constraint value. Example and non-limiting inspection robot configuration description(s) include one or more of an inspection sensor type description (e.g., sensed values; sensor capabilities such as range, sensing resolution, sampling rates, accuracy values, precision values, temperature compatibility, etc.; and/or a sensor model number, part number, or other identifying description), an inspection sensor number description (e.g., a total number of sensors, a number of sensors per payload, a number of sensors per arm, a number of sensors per sled, etc.), an inspection sensor distribution description (e.g., horizontal distribution; vertical distribution; spacing variations; and/or combinations of these with sensor type, such as a differential lead/trailing sensor type or capability), an ancillary component description (e.g., a repair component, marking component, and/or cleaning component, including capabilities and/or constraints applicable for the ancillary component), a couplant management component description (e.g., pressure and/or pressure rise capability, reservoir capability, composition compatibility, heat rejection capability, etc.), and/or a base station capability description (e.g., computing power capability, power conversion capability, power storage and/or provision capability, network or other communication capability, etc.).

The term relative position (and similar terms) as utilized herein should be understood broadly. Without limitation to any other aspect or description of the present disclosure, relative position includes any point defined with reference to another position, either fixed or moving. The coordinates of such a point are usually bearing, true or relative, and distance from an identified reference point. The identified reference point to determine relative position may include another component of the apparatus or an external component, a point on a map, a point in a coordinate system, or the like. The term relative position (and similar terms) as utilized herein should be understood broadly. Without limitation to any other aspect or description of the present disclosure, relative position includes any point defined with reference to another position, either fixed or moving. The coordinates of such a point are usually bearing, true or relative, and distance from an identified reference point. The identified reference point to determine relative position may include another component of the apparatus or an external component, a point on a map, a point in a coordinate system, or the like.

The example inspection robot 100 includes any inspection robot having a number of sensors associated therewith and configured to inspect a selected area. Without limitation to any other aspect of the present disclosure, an inspection robot 100 as set forth throughout the present disclosure, including any features or characteristics thereof, is contemplated for the example system depicted in. In certain embodiments, the inspection robot 100 may have one or more payloads 2 (FIG. 1) and may include one or more sensors 2202 (FIG. 55) on each payload.

Operations of the inspection robot 100 provide the sensors 2202 in proximity to selected locations of the inspection surface 500 and collect associated data, thereby interrogating the inspection surface 500. Interrogating, as utilized herein, includes any operations to collect data associated with a given sensor, to perform data collection associated with a given sensor (e.g., commanding sensors, receiving data values from the sensors, or the like), and/or to determine data in response to information provided by a sensor (e.g., determining values, based on a model, from sensor data; converting sensor data to a value based on a calibration of the sensor reading to the corresponding data; and/or combining data from one or more sensors or other information to determine a value of interest). A sensor 2202 may be any type of sensor as set forth throughout the present disclosure, but includes at least a UT sensor, an EMI sensor (e.g., magnetic induction or the like), a temperature sensor, a pressure sensor, an optical sensor (e.g., infrared, visual spectrum, and/or ultra-violet), a visual sensor (e.g., a camera, pixel grid, or the like), or combinations of these.

The example system includes the inspection robot 100 and one or more obstacle sensors 16440, e.g., lasers, cameras, sonars, radars, a ferrous substrate detection sensor, contact sensors, etc., coupled to the inspection robot and/or otherwise disposed to detect obstacle in the path of the inspection robot 100 as it inspects an inspection surface 500.

The system further includes a controller 802 having a number of circuits configured to functionally perform operations of the controller 802. The example controller 802 has an obstacle sensory data circuit 16402, an obstacle processing circuit 16406, an obstacle notification circuit 16410, a user interface circuit 16414, and/or an obstacle configuration circuit 16424. The example controller 802 may additionally or alternatively include aspects of any controller, circuit, or similar device as described throughout the present disclosure. Aspects of example circuits may be embodied as one or more computing devices, computer-readable instructions configured to perform one or more operations of a circuit upon execution by a processor, one or more sensors, one or more actuators, and/or communications infrastructure (e.g., routers, servers, network infrastructure, or the like). Further details of the operations of certain circuits associated with the controller 802 are set forth, without limitation, elsewhere in the disclosure The example controller 802 is depicted schematically as a single device for clarity of description, but the controller 802 may be a single device, a distributed device, and/or may include portions at least partially positioned with other devices in the system (e.g., on the inspection robot 100). In certain embodiments, the controller 802 may be at least partially positioned on a computing device associated with an operator of the inspection (not shown), such as a local computer at a facility including the inspection surface 500, a laptop, and/or a mobile device. In certain embodiments, the controller 802 may alternatively or additionally be at least partially positioned on a computing device that is remote to the inspection operations, such as on a web-based computing device, a cloud computing device, a communicatively coupled device, or the like.

Figure 47:
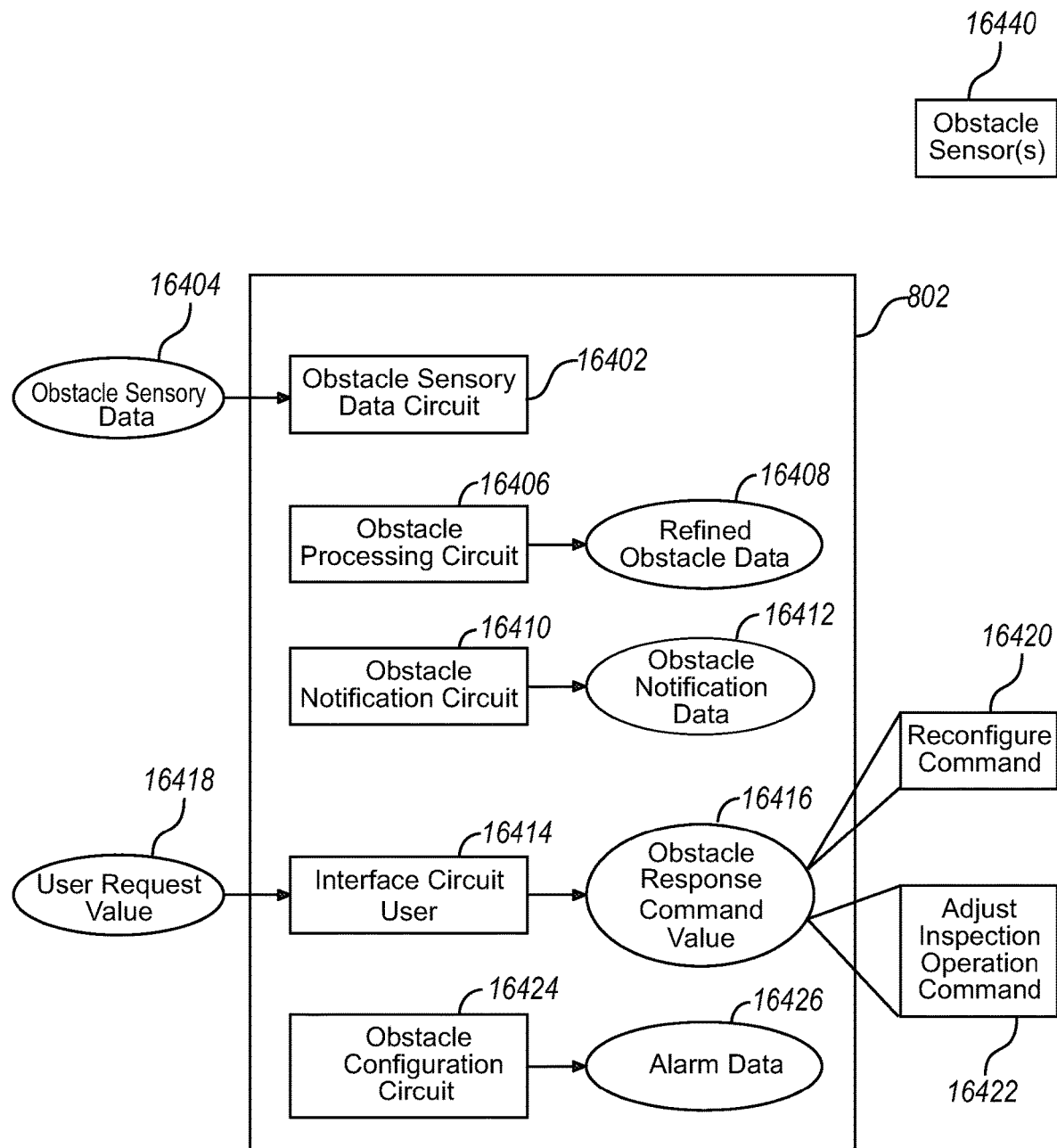
FIG. 47 is a schematic diagram of a system for traversing an obstacle with an inspection robot.

Accordingly, as illustrated in FIGS. 47, the obstacle sensory data circuit 16402 interprets obstacle sensory data 16404 comprising data provided by the obstacle sensors 16440. The obstacle sensory data may include the position, type, traversal difficulty rating, imagery and/or any other type of information suitable for identifying the obstacle and determining a plan to overcome/traverse the obstacle. In embodiments, the obstacle sensory data 16404 may include imaging data from an optical camera of the inspection robot. The imaging data may be related to at least one of: the body/structure of the obstacle, a position of the obstacle, a height of the obstacle, an inspection surface surrounding the obstacle, a horizontal extent of the obstacle, a vertical extent of the obstacle, or a slope of the obstacle.

The obstacle processing circuit 16406 determines refined obstacle data 16408 in response to the obstacle sensory data 16404. Refined obstacle data 16408 may include information distilled and/or derived from the obstacle sensory data 16404 and/or any other information that the controller 802 may have access to, e.g., pre-known and/or expected conditions of the inspection surface.

The obstacle notification circuit 16410 generates and provides obstacle notification data 16412 to a user interface device in response to the refined obstacle data 16408. The user interface circuit 16414 interprets a user request value 16418 from the user interface device, and determines an obstacle response command value 16416 in response to the user request value 16418. The user request value 16418 may correspond to a graphical user interface interactive event, e.g., menu selection, screen region selection, data input, etc.

The obstacle configuration circuit 16424 provides the obstacle response command value 16416 to the inspection robot 100 during the interrogating of the inspection surface 500. In embodiments, the obstacle response command value 16416 may correspond to a reconfigure command 16420 the inspection robot and/or to adjust 16422 an inspection operation of the inspection robot. For example, in embodiments, the adjust inspection operation command 16422 may include a command that instructions the inspection robot to go around the obstacle, lift one or more payloads, change a downforce applied to one or more payloads, change a with between payloads and/or the sensors on the payloads, traverse/slide one or more payloads to the left or to the right, change a speed at which the inspection robot traverses the inspection surface, to "test travel" the obstacle, e.g., to proceed slowly and observe, to mark (in reality or virtually) the obstacle, to alter the planned inspection route/path of the inspection robot across the inspection surface, and/or to remove a portion from an inspection map corresponding to the obstacle.

In embodiments, the obstacle response command value 16416 may include a command to employ a device for mitigating the likelihood that the inspection robot will top over. Such device may include stabilizers, such as rods, mounted to and extendable away from the inspection robot. In embodiments, the obstacle response command value 16416 may include a request to an operator to confirm the existence of the obstacle. Operator confirmation of the obstacle may be received as a user request value 16418.

In embodiments, the obstacle configuration circuit 16424 determines, based at least in part on the refined obstacle data 16408, whether the inspection robot 100 has traversed an obstacle in response to execution of a command corresponding to the obstacle response command value 16416 by the inspection robot 100. The obstacle configuration circuit 16424 may determine that the obstacle has been traversed by detecting that the obstacle is no longer present in the obstacle sensory data 16404 acquired by the obstacle sensors 16440. In embodiments, the obstacle processing circuit 16406 may be able to determine the location of the obstacle from the obstacle sensory data 16404 and the obstacle configuration circuit 16424 may determine that the obstacle has been traversed by comparing the location of the obstacle to the location of the inspection robot. In embodiments, determining that an obstacle has been successfully traversed may be based at least in part on detecting a change in a flow rate of couplant used to couple the inspection sensors to the inspection surface. For example, a decrease in the couplant flow rate may indicate that the payload has moved past the obstacle.

The obstacle configuration circuit 16424 may provide an obstacle alarm data value 16426 in response to determining that the inspection robot 100 has not traversed the obstacle. As will be appreciated, in embodiments, the obstacle configuration circuit 16424 may provide the obstacle alarm data value 16426 regardless of whether traversal of the obstacle was attempted by the inspection robot 100. For example, the obstacle configuration circuit 16424 may provide the obstacle alarm data value 16426 as a command responsive to the obstacle response command value 16416.

In embodiments, the obstacle processing circuit 16406 may determine the refined obstacle data 16408 as indicating the potential presence of an obstacle in response to comparing the obstacle data comprising an inspection surface depiction to a nominal inspection surface depiction. For example, the nominal inspection surface depiction may have been derived based in part on inspection data previously acquired from the inspection surface at a time the conditions of the inspection surface were known. In other words, the nominal inspection surface depiction may represent the normal and/or desired condition of the inspection surface 500. In embodiments, the presence of an obstacle may be determined based at least in part on an identified physical anomaly between obstacle sensory data 16404 and the nominal inspection surface data, e.g., a difference between acquired and expected image data, EMI readings, coating thickness, wall thickness, etc. For example, in embodiments, the obstacle processing circuit 16406 may determine the refined obstacle data 16408 as indicating the potential presence of an obstacle in response to comparing the refined obstacle data 16408, which may include an inspection surface depiction, to a predetermined obstacle inspection surface depiction. As another example, the inspection robot may identify a marker on the inspection surface and compare the location of the identified marker to an expected location of the marker, with differences between the two indicating a possible obstacle. In embodiments, the presence of an obstacle may be determined based on detecting a change in the flow rate of the couplant that couples the inspection sensors to the inspection surface. For example, an increase in the couplant flow rate may indicate that the payload has encountered an obstacle that is increasing the spacing between the inspection sensors and the inspection surface.

In embodiments, the obstacle notification circuit 16410 may provide the obstacle notification data 16412 as at least one of an operator alert communication and/or an inspection surface depiction of at least a portion of the inspection surface. The obstacle notification data 16412 may be presented to an operator in the form of a pop-up picture and/or pop-up inspection display. In embodiments, the obstacle notification data 16412 may depict a thin or non-ferrous portion of the inspection surface. In embodiments, information leading to the obstacle detection may be emphasized, e.g., circled, highlighted, etc. For example, portions of the inspection surface identified as being cracked may be circled while portions of the inspection surface covered in dust may be highlighted.

In embodiments, the obstacle processing circuit 16406 may determine the refined obstacle data 16408 as indicating the potential presence of an obstacle in response to determining a non-ferrous substrate detection of a portion of the inspection surface and/or a reduced magnetic interface detection of a portion of the inspection surface. Examples of reduced magnetic interface detection include portions of a substrate/inspection surface lacking sufficient ferrous material to support the inspection robot, lack of a coating, accumulation of debris and/or dust, and/or any other conditions that may reduce the ability of the magnetic wheel assemblies to couple the inspection robot to the inspection surface.

In embodiments, the obstacle notification circuit 16410 may provide a stop command to the inspection robot in response to the refined obstacle data 16408 indicating the potential presence of an obstacle.

In embodiments, the obstacle response command value 16416 may include a command to reconfigure an active obstacle avoidance system of the inspection robot 100. Such a command may be a command to: reconfigure a down force applied to one or more payloads coupled to the inspection robot; reposition a payload coupled to the inspection robot; lift a payload coupled to the inspection robot; lock a pivot of a sled, the sled housing and/or an inspection sensor of the inspection robot; unlock a pivot of a sled, the sled housing and/or an inspection sensor of the inspection robot; lock a pivot of an arm, the arm coupled to a payload of the inspection robot, and/or an inspection sensor coupled to the arm; unlock a pivot of an arm, the arm coupled to a payload of the inspection robot, and/or an inspection sensor coupled to the arm; rotate a chassis of the inspection robot relative to a drive module of the inspection robot; rotate a drive module of the inspection robot relative to a chassis of the inspection robot; deploy a stability assist device coupled to the inspection robot; reconfigure one or more payloads coupled to the inspection robot; and/or adjust a couplant flow rate of the inspection robot. In certain embodiments, adjusting the couplant flow rate is performed to ensure acoustic coupling between a sensor and the inspection surface, to perform a re-coupling operation between the sensor and the inspection surface, to compensate for couplant loss occurring during operations, and/or to cease or reduce couplant flow (e.g., if the sensor, an arm, and/or a payload is lifted from the surface, and/or if the sensor is not presently interrogating the surface). An example adjustment to the couplant flow includes adjusting the couplant flow in response to a reduction of the down force (e.g., planned or as a consequence of operating conditions), where the couplant flow may be increased (e.g., to preserve acoustic coupling) and/or decreased (e.g., to reduce couplant losses).

Figure 48:
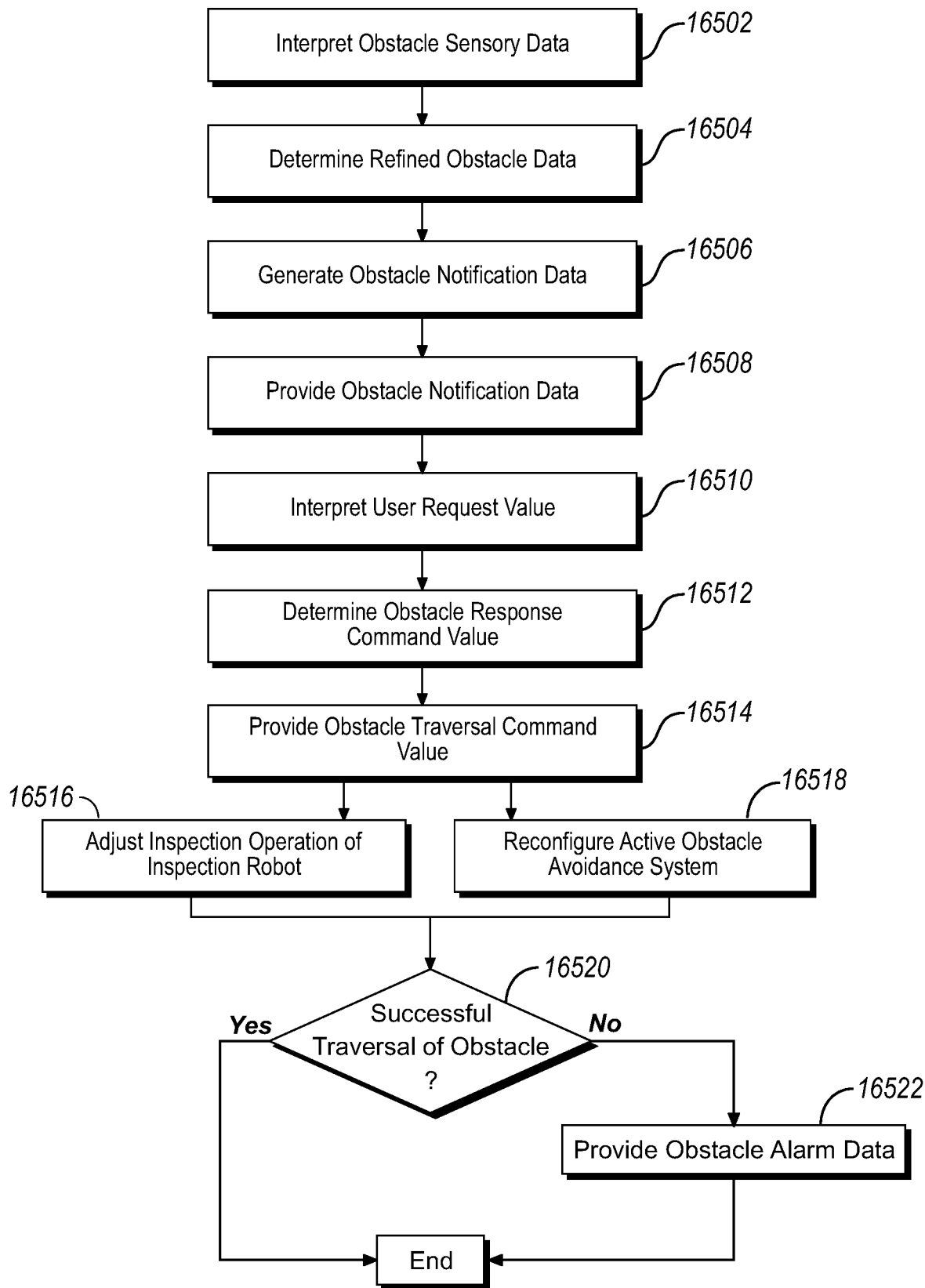
FIG. 48 is a flow chart depicting a method for traversing an obstacle with an inspection robot.

Turning now to FIG. 48, a method for traversing an obstacle with an inspection robot is shown. The method may include interpreting 16502 obstacle sensory data comprising data provided by an inspection robot, determining 16504 refined obstacle data in response to the obstacle sensory data; and generating 16506 an obstacle notification in response to the refined obstacle data. The method may further include providing 16508 the obstacle notification data to a user interface. The method may further include interpreting 16510 a user request value, determining 16512 an obstacle response command value in response to the user request value; and providing 16514 the obstacle command value to the inspection robot during an inspection run. In embodiments, the method may further include adjusting 16516 an inspection operation of the inspection robot in response to the obstacle response command value. In embodiments, adjusting 16516 the inspection operation may include stopping 16618 interrogation of the inspection surface. In embodiments, adjusting 16516 the inspection operation may include updating 16620 an inspection run plan. In embodiments, adjusting 16516 the inspection operation may include taking 16650 data in response to the obstacle. In embodiments, adjusting 16516 the inspection operation may include applying a virtual mark. In embodiments, adjusting 16516 the inspection operation may include updating 16654 an obstacle map. In embodiments, adjusting 16516 the inspection operation may include acquiring 16656 an image and/or video of the obstacle. In embodiments, adjusting 16516 the inspection operation may include confirming 16658 the obstacle.

The method may further include reconfiguring 16518 an active obstacle avoidance system. In embodiments, reconfiguring 16518 the active obstacle avoidance system may include adjusting 16624 a down force applied to one or more payloads coupled to the inspection robot. In embodiments, reconfiguring 16518 the active obstacle avoidance system may include reconfiguring 16626 one or more payloads coupled to the inspection robot. Reconfiguring 16626 the one or more payloads may include adjusting a width between the payloads and/or one or more sensors on the payloads. In embodiments, reconfiguring 16518 the active obstacle avoidance system may include adjusting 16628 a couplant flow rate. In embodiments, reconfiguring 16518 the active obstacle avoidance system may include lifting 16630 one or more payloads coupled to the inspection robot. In embodiments, reconfiguring 16518 the active obstacle avoidance system may include locking 16632 and/or unlocking 16634 the pivot of a sled of a payload coupled to the inspection robot. In embodiments, reconfiguring 16518 the active obstacle avoidance system may include locking 16636 and/or unlocking 16638 the pivot of an arm that couples a sled to a body of a payload or to the inspection robot chassis. In embodiments, reconfiguring 16518 the active obstacle avoidance system may include rotating 16640 the inspection robot chassis. In embodiments, reconfiguring 16518 the active obstacle avoidance system may include rotating 16646 a drive module coupled to the inspection robot. In embodiments, reconfiguring 16518 the active obstacle avoidance system may include repositioning 16644 a payload coupled to the inspection robot.

In embodiments, the method may further include determining 16520 whether the inspection robot traversed the obstacle. In embodiments, the method may further include providing 16522 a data alarm in response to determining 16520 that the inspection robot has not traversed the obstacle.

Any one or more of the specified times related to interactions between the entities may be defined by contractual terms related to the inspection operation, industry standard practices related to the inspection operation, an understanding developed between the entities related to the inspection operation, and/or the ongoing conduct of the entities for a number inspection operations related to the inspection operation, where the number of inspection operations may be inspection operations for related facilities, related inspection surfaces, and/or previous inspection operations for the inspection surface. One of skill in the art, having the benefit of the disclosure herein and information ordinarily available when contemplating a particular system and/or inspection robot, can readily determine validation operations and validation time periods that are rapid validations for the purposes of the particular system.

A response, as used herein, and without limitation to any other aspect of the present disclosure, includes an adjustment to at least one of: an inspection configuration for the inspection robot while on the surface (e.g., a change to sensor operations; couplant operations; robot traversal commands and/or pathing; payload configurations; and/or down force configuration for a payload, sled, sensor, etc.); a change to display operations of the inspection data; a change to inspection data processing operations, including determining raw sensor data, minimal processing operations, and/or processed data values (e.g., wall thickness, coating thickness, categorical descriptions, etc.); an inspection configuration for the inspection robot performed with the inspection robot removed from the inspection surface (e.g., changed wheel configurations, changed drive module configurations; adjusted and/or swapped payloads; changes to sensor configurations (e.g., switching out sensors and/or sensor positions); changes to hardware controllers (e.g., switching a hardware controller, changing firmware and/or calibrations for a hardware controller, etc.); and/or changing a tether coupled to the inspection robot. The described responses are non-limiting examples, and any other adjustments, changes, updates, or responses set forth throughout the present disclosure are contemplated herein for potential rapid response operations. Certain responses are described as performed while the inspection robot is on the inspection surface and other responses are described as performed with the inspection robot removed from the inspection surface, although any given response may be performed in the other condition, and the availability of a given response as on-surface or off-surface may further depend upon the features and configuration of a particular inspection robot, as set forth in the multiple embodiments described throughout the present disclosure. Additionally, or alternatively, certain responses may be available only during certain operating conditions while the inspection robot is on the inspection surface, for example when the inspection robot is in a location physically accessible to an operator, and/or when the inspection robot can pause physical movement and/or inspection operations such as data collection. One of skill in the art, having the benefit of the present disclosure and information ordinarily available when contemplating a particular system and/or inspection robot, can readily determine response operations available for the particular system and/or inspection robot.

A response that is rapid, as used herein, and without limitation to any other aspect of the present disclosure, includes a response capable of being performed in a time relevant to the considered downstream utilization of the response. For example, a response that can be performed during the inspection operation, and/or before the completion of the inspection operation, may be considered a rapid response in certain embodiments, allowing for the completion of the inspection operation utilizing the benefit of the rapid response. Certain further example rapid response times include: a response that can be performed at the location of the inspection surface (e.g., without requiring the inspection robot be returned to a service or dispatching facility for reconfiguration); a response that can be performed during a period of time wherein a downstream customer (e.g., an owner or operator of a facility including the inspection surface; an operator of the inspection robot performing the inspection operations; and/or a user related to the operator of the inspection robot, such as a supporting operator, supervisor, data verifier, etc.) of the inspection data is reviewing the inspection data and/or a visualization corresponding to the inspection data; and/or a response that can be performed within a specified period of time (e.g., before a second inspection operation of a second inspection surface at a same facility including both the inspection surface and the second inspection surface; within a specified calendar period such as a day, three days, a week, etc.). An example rapid response includes a response that can be performed within a specified time related to interactions between an entity related to the operator of the inspection robot and an entity related to a downstream customer. For example, the specified time may be a time related to an invoicing period for the inspection operation, a warranty period for the inspection operation, a review period for the inspection operation, and or a correction period for the inspection operation. Any one or more of the specified times related to interactions between the entities may be defined by contractual terms related to the inspection operation, industry standard practices related to the inspection operation, an understanding developed between the entities related to the inspection operation, and/or the ongoing conduct of the entities for a number inspection operations related to the inspection operation, where the number of inspection operations may be inspection operations for related facilities, related inspection surfaces, and/or previous inspection operations for the inspection surface. One of skill in the art, having the benefit of the disclosure herein and information ordinarily available when contemplating a particular system and/or inspection robot, can readily determine response operations and response time periods that are rapid responses for the purposes of the particular system.

Certain considerations for determining whether a response is a rapid response include, without limitation, one or more of: the purpose of the inspection operation, how the downstream customer will utilize the inspection data from the inspection operation, and/or time periods related to the utilization of the inspection data; entity interaction information such as time periods wherein inspection data can be updated, corrected, improved, and/or enhanced and still meet contractual obligations, customer expectations, and/or industry standard obligations related to the inspection data; source information related to the response, such as whether the response addresses an additional request for the inspection operation after the initial inspection operation was performed, whether the response addresses initial requirements for the inspection operation that were available before the inspection operation was commenced, whether the response addresses unexpected aspects of the inspection surface and/or facility that were found during the inspection operations, whether the response addresses an issue that is attributable to the downstream customer and/or facility owner or operator, such as: inspection surface has a different configuration than was indicated at the time the inspection operation was requested; the facility owner or operator has provided inspection conditions that are different than planned conditions, such as couplant availability, couplant composition, couplant temperature, distance from an available base station location to the inspection surface, coating composition or thickness related to the inspection surface, vertical extent of the inspection surface, geometry of the inspection surface such as pipe diameters and/or tank geometry, availability of network infrastructure at the facility, availability of position determination support infrastructure at the facility, operating conditions of the inspection surface (e.g., temperature, obstacles, etc.); additional inspected conditions are requested than were indicated at the time of the inspection operation was requested; and/or additional inspection robot capabilities such as marking, repair, and/or cleaning are requested than were indicated at the time the inspection operation was requested.

In a further example, the user observes the refined inspection data, such as in a display or visualization of the inspection data, and provides the user response command in response to the refined inspection data, for example requesting that additional data or data types be collected, requesting that additional conditions (e.g., anomalies, damage, condition and/or thickness of a coating, higher resolution determinations—either spatial resolution such as closer or more sparse data collection positions, or sensed data resolution such as higher or lower precision sensing values, etc.) be inspected, extending the inspection surface region to be inspected, and/or omitting inspection of regions of the inspection surface that were originally planned for inspection. In certain embodiments, the user response command allows the user to change inspection operations in response to the results of the inspection operations, for example where the inspection surface is found to be in a better or worse condition than expected, where an unexpected condition or data value is detected during the inspection, and/or where external considerations to the inspection occur (e.g., more or less time are available for the inspection, a system failure occurs related to the facility or an offset facility, or the like) and the user wants to make a change to the inspection operations in response to the external condition. In certain embodiments, the user response command allows for the user to change inspection operations in response to suspected invalid data (e.g., updating sensor calibrations, performing coupling operations to ensure acoustic coupling between a sensor and the inspection surface, and/or repeating inspection operations to ensure that the inspection data is repeatable for a region of the inspection surface), in response to a condition of the inspection surface such as an assumed value (e.g., wall thickness, coating thickness and/or composition, and/or presence of debris) that may affect processing the refined inspection data, allowing for corrections or updates to sensor settings, couplant flow rates, down force provisions, speed of the inspection robot, distribution of sensors, etc. responsive to the difference in the assumed value and the inspection determined condition of the inspection surface.

The example utilizes x-y coverage resolution to illustrate the inspection surface as a two-dimensional surface having a generally horizontal (or perpendicular to the travel direction of the inspection robot) and vertical (or parallel to the travel direction of the inspection robot) component of the two-dimensional surface. However, it is understood that the inspection surface may have a three-dimensional component, such as a region within a tank having a surface curvature with three dimensions, a region having a number of pipes or other features with a depth dimension, or the like. In certain embodiments, the x-y coverage resolution describes the surface of the inspection surface as traversed by the inspection robot, which may be two dimensional, conceptually two dimensional with aspects have a three dimensional component, and/or three dimensional. The description of horizontal and vertical as related to the direction of travel is a non-limiting example, and the inspection surface may have a first conceptualization of the surface (e.g., x-y in a direction unrelated to the traversal direction of the inspection robot), where the inspection robot traverses the inspection surface in a second conceptualization of the surface (e.g., x-y axes oriented in a different manner than the x-y directions of the first conceptualization), where the operations of the inspection robot such as movement paths and/or sensor inspection locations performed in the second conceptualization are transformed and tracked in the first conceptualization.

While the first conceptualization and the second conceptualization are described in relation to a two-dimensional description of the inspection surface for clarity of the present description, either or both of the first conceptualization and the second conceptualization may include three-dimensional components and/or may be three-dimensional descriptions of the inspection surface. In certain embodiments, the first conceptualization and the second conceptualization may be the same and/or overlay each other (e.g., where the traversal axes of the robot define the view of the inspection surface, and/or where the axes of the inspection surface view and the traversal axes of the robot coincide).

While the first conceptualization and the second conceptualization are described in terms of the inspection robot traversal and the user device interface, additional or alternative conceptualizations are possible, such as in terms of an operator view of the inspection surface, other users of the inspection surface, and/or analysis of the inspection surface (e.g., where aligning one axis with a true vertical of the inspection surface, aligning an axis with a temperature gradient of the inspection surface, or other arrangement may provide a desirable feature for the conceptualization for some purpose of the particular system).

In certain embodiments, the user may provide a desired conceptualization (e.g., orientation of x-y axes, etc.) as a user response command, and/or as any other user interaction as set forth throughout the present disclosure, allowing for the user to interface with depictions of the inspection surface in any desired manner. It can be seen that the utilization of one or more conceptualizations of the inspection surface provide for simplification of certain operations of aspects of systems, procedures, and/or controllers throughout the present disclosure (e.g., user interfaces, operator interfaces, inspection robot movement controls, etc.). It can be seen that the utilization of one or more conceptualizations of the inspection surface allow for combined conceptualizations that have distinct dimensionality, such as two-dimensional for a first conceptualization (e.g., traversal commands and/or sensor distributions for an inspection robot operating on a curved surface such as a tank interior, where the curved surface includes a related three-dimensional conceptualization; and/or where a first conceptualization eliminates the need for a dimension, such as by aligning an axis perpendicular to a cylindrical inspection surface), and a either three-dimensional or a non-simple transformation to a different two-dimensional for a second conceptualization (e.g., a conceptualization having an off-perpendicular axis for a cylindrical inspection surface, where a progression of that axis along the inspection surface would be helical, leading to either a three dimensional conceptualization, or a complex transformed two dimensional conceptualization).

Referencing FIG. 55, an example system for providing real-time processed inspection data to a user is depicted. The example system includes an inspection robot 100 positioned on an inspection surface 500. The example inspection robot 100 includes any inspection robot having a number of sensors associated therewith and configured to inspect a selected area. Without limitation to any other aspect of the present disclosure, an inspection robot 100 as set forth throughout the present disclosure, including any features or characteristics thereof, is contemplated for the example system depicted in FIG. 55. In certain embodiments, the inspection robot 100 may have one or more payloads, and may include one or more sensors on each payload.

The example system may include a controller 21002 having a number of circuits configured to functionally perform operations of the controller 21002. The example system includes the controller 21002 having an inspection data circuit that interprets inspection base data from the sensors 2202, an inspection processing circuit that determines refined inspection data in response to the inspection base data, and a user interface circuit that provides the refined inspection data to a user interface device 21006. The user interface circuit further communicates with the user interface device 21006, for example to interpret a user request value such as a request to change a display value, to change inspection parameters, and/or to perform marking, cleaning, and/or repair operations related to the inspection surface 500. The example controller 21002 may additionally or alternatively include aspects of any controller, circuit, or similar device as described throughout the present disclosure. Aspects of example circuits may be embodied as one or more computing devices, computer-readable instructions configured to perform one or more operations of a circuit upon execution by a processor, one or more sensors, one or more actuators, and/or communications infrastructure (e.g., routers, servers, network infrastructure, or the like).

The example controller 21002 is depicted schematically as a single device for clarity of description, but the controller 21002 may be a single device, a distributed device, and/or may include portions at least partially positioned with other devices in the system (e.g., on the inspection robot 100, or the user interface device 21006). In certain embodiments, the controller 21002 may be at least partially positioned on a computing device associated with an operator of the inspection (not shown), such as a local computer at a facility including the inspection surface 500, a laptop, and/or a mobile device. In certain embodiments, the controller 21002 may alternatively or additionally be at least partially positioned on a computing device that is remote to the inspection operations, such as on a web-based computing device, a cloud computing device, a communicatively coupled device, or the like.

Referring to FIG. 55, in certain embodiments, a controller 21002 may communicate to the user interface device 21006 using an intermediate structure 21004, such as a web portal, mobile application service, network connection, or the like. In certain embodiments, the intermediate structure 21004 may be varied by the controller 21002 and/or a user 21008, for example allowing the user 21008 to connect to the controller 21002 using a web portal at one time, and a mobile application at a different time. The controller 21002 may include operations such as performing an authentication operation, a login operation, or other confirmation that a user 21008 is authorized to interact with the controller 21002. In certain embodiments, the interactions of the user 21008 may be limited according to permissions related to the user 21008, the user interface device 21006, and/or any other considerations (e.g., a location of the user, an operating stage of an inspection, a limitation imposed by an operator of the inspection, etc.). In certain embodiments, and/or during certain operating conditions, the controller21002 communicates directly with the user interface device 21006, and/or the user 21008 may interface directly with a computing device having at least a portion of the controller 21002 positioned thereon.

Figure 56:
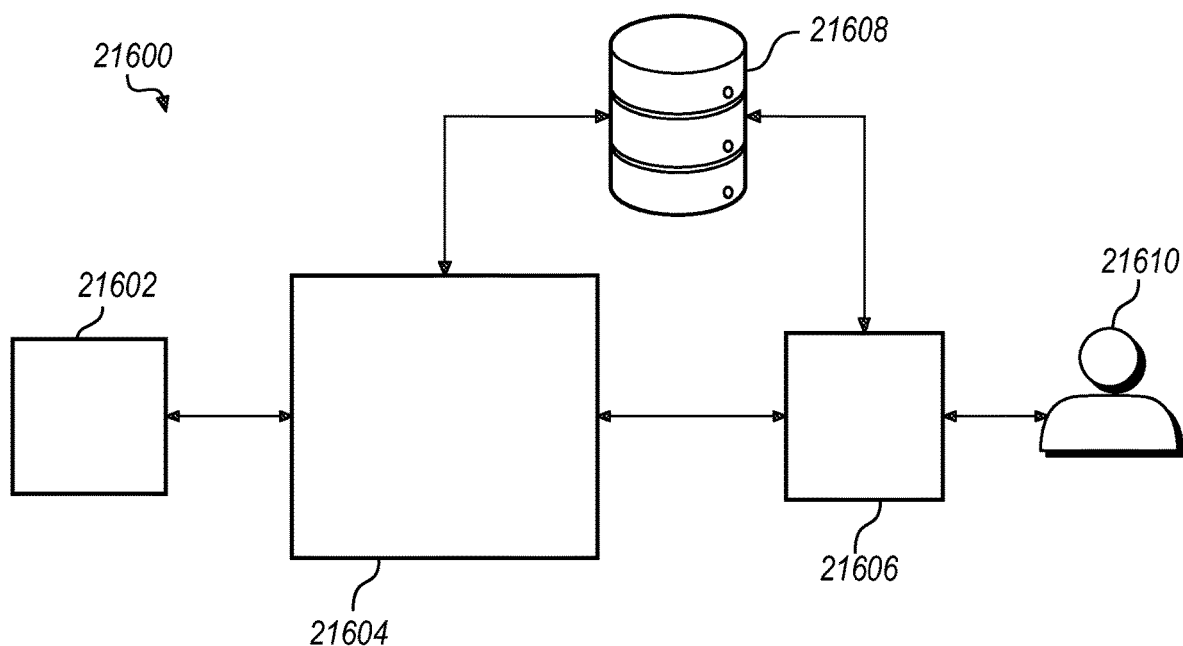

Referring to FIG. 56, an example system 21600 includes an inspection robot 21602 that interprets inspection base data including data provided by an inspection robot interrogating an inspection surface with a plurality of inspection sensors. The inspection robot 21602 may include an inspection robot configured according to any of the embodiments or aspects as set forth in the present disclosure.

The example system 21600 includes a controller 21604 configured to perform rapid inspection data validation operations. The controller 21604 includes a number of circuits configured to functionally execute operations of the controller 21604. An example controller 21604 includes an inspection data circuit that interprets inspection base data comprising data provided by the inspection robot interrogating the inspection surface with a number of inspection sensors, an inspection processing circuit that determines refined inspection data in response to the inspection base data, an inspection data validation circuit that determines an inspection data validity value in response to the refined inspection data, and a user communication circuit that provides a data validity description to a user device in response to the inspection data validity value. The example system 21600 further includes a user device 21606 that is communicatively coupled to the controller 21604. The user device 21606 is configured to provide a user interface for interacting operations of the controller 21604 with the user

21610, including providing information, alerts, and/or notifications to the user 21610, receiving user requests or inputs and communicating those to the controller 21604, and accessing a data store 21608, for example to provide access to data for the user 21610.

The example system further includes the inspection data circuit responsive to the user request value to adjust the interpreted inspection base data and/or the interrogation of the inspection surface. For example, and without limitation, the user request value may provide for a change to an inspection resolution (e.g., a horizontal distance between sensors 2202, a vertical distance at which sensor sampling is performed, selected positions of the inspection surface 500 to be interrogated, etc.), a change to sensor values (e.g., sensor resolution such as dedicated bits for digitization; sensor scaling; sensor communicated data parameters; sensor minimum or maximum values, etc.), a change to the planned location trajectory of the inspection robot (e.g., scheduling additional inspection passes, changing inspected areas, canceling planned inspection portions, adding inspection portions, etc.), and/or a change in sensor types (e.g., adding, removing, or replacing utilized sensors). In certain embodiments, the inspection data circuit responds to the user request value by performing an inspection operation that conforms with the user request value, by adjusting inspection operations to incrementally change the inspection scheme to be closer to the user request value (e.g., where the user request value cannot be met, where other constraints prevent the user request value from being met, and/or where permissions of the user 21008 allow only partial performance of the user request value). In certain embodiments, a difference between the user request value and the adjusted interpreted inspection base data and/or interrogation scheme may be determined, and/or may be communicated to the user, an operator, an administrator, another entity, and/or recorded in association with the data (e.g., as a data field, metadata, label for the data, etc.).

In certain embodiments, the inspection processing circuit is responsive to the user request value to adjust the determination of the refined inspection data. In certain embodiments, certain sensed values utilize a significant amount of post-processing to determine a data value. For example, a UT sensor may output a number of return times, which may be filtered, compared to thresholds, subjected to frequency analysis, or the like. In certain embodiments, the inspection base data includes information provided by the sensor 2202, and/or information provided by the inspection robot 100 (e.g., using processing capability on the inspection robot 100, hardware filters that act on the sensor 2202 raw data, de-bounced data, etc.). The inspection base data may be raw data—for example, the actual response provided by the sensor such as an electronic value (e.g., a voltage, frequency, or current output), but the inspection base data may also be processed data (e.g., return times, temperature, pressure, etc.). As utilized herein, the refined inspection data is data that is subjected to further processing, generally to yield data that provides a result value of interest (e.g., a thickness, or a state value such as "conforming" or "failed") or that provides a utilizable input for another model or virtual sensor (e.g., a corrected temperature, corrected flow rate, etc.). Accordingly, the inspection base data includes information from the sensor, and/or processed information from the sensor, while the refined inspection data includes information from the inspection base data that has been subjected to further processing. In certain embodiments, the computing time and/or memory required to determine the refined inspection data can be very significant. In certain embodiments, determination of the refined inspection data can be improved with the availability of significant additional data, such as data from offset and/or related inspections performed in similar systems, calibration options for sensors, and/or correction options for sensors (e.g., based on ambient conditions; available power for the sensor; materials of the inspection surface, coatings, or the like; etc.). Accordingly, in previously known systems, the availability of refined inspection data was dependent upon the meeting of the inspection base data with significant computing resources (including processing, memory, and access to databases), introducing significant delays (e.g., downloading data from the inspection robot 100 after an inspection is completed) and/or costs (e.g., highly capable computing devices on the inspection robot 100 and/or carried by an inspection operator) before the refined inspection data is available for analysis. Further, previously known systems do not allow for the utilization of refined inspection data during inspection operations (e.g., making an adjustment before the inspection operation is complete) and/or utilization by a customer of the data (e.g., a user 21008) that may have a better understanding of the commercial considerations of the inspection output than an inspection operator.

Example and non-limiting inspection adjustments include adjusting an inspection location trajectory of the inspection robot (e.g., the region of the inspection surface to be inspected, the inspection pathing on the inspection surface, and/or the spatial order of inspection of the inspection surface), adjusting a calibration value of one of the inspection sensors (e.g., A/D conversion values, UT calibrations and/or assumptions utilized to process signals, and/or other parameters utilized to operate sensors, interpret data, and/or post-process data from sensors), and/or a command to enable at least one additional inspection sensor (e.g., activating an additional sensor, receiving data provided by the sensor, and/or storing data provided by the sensor). In certain embodiments, the at least one additional inspection sensor is a sensor having a different type of sensing relative to a previously operating sensor, and/or a sensor having a different capability and/or different position on the inspection robot (e.g., positioned on a different payload, different sled, and/or at a different position on a sled). Example and non-limiting additional inspection operations include re-inspecting at least portion of the inspection surface, performing an inspection with a sensor having distinct capabilities, sensing type, and/or calibrations relative to a previously operating sensor, inspecting additional regions of the inspection surface beyond an initially planned region, changing an inspection resolution (e.g., a spacing between sensed locations), changing a traversal speed of the inspection robot during inspection operations, or the like.

In certain embodiments, a marking operation includes mitigation operations (e.g., to extend a service time, allow a facility to continue operations, and/or provide time to allow for additional inspections or subsequent service or repair to be performed), inspection operations (e.g., gathering more detailed information, confirming information, imaging information, etc. related to the marked region), and/or cleaning operations (e.g., to ensure that data collection is reliable, to ensure that a mark adheres and/or can be seen, and/or to enhance related imaging information) for the marked region of the inspection surface and/or adjacent regions.

Example alternate embodiments for sleds, arms, payloads, and sensor interfaces, including sensor mounting and/or sensor electronic coupling, are described herein. Variations may be included in embodiments of inspection robots, payloads, arms, sleds, and arrangements of these as described throughout the present disclosure. Variations may include features that provide for, without limitation, ease of integration, simplified coupling, and/or increased options to achieve selected horizontal positioning of sensors, selected horizontal sensor spacing, increased numbers of sensors on a payload and/or inspection robot, and/or increased numbers of sensor types available within a given geometric space for an inspection robot.

Figure 50:
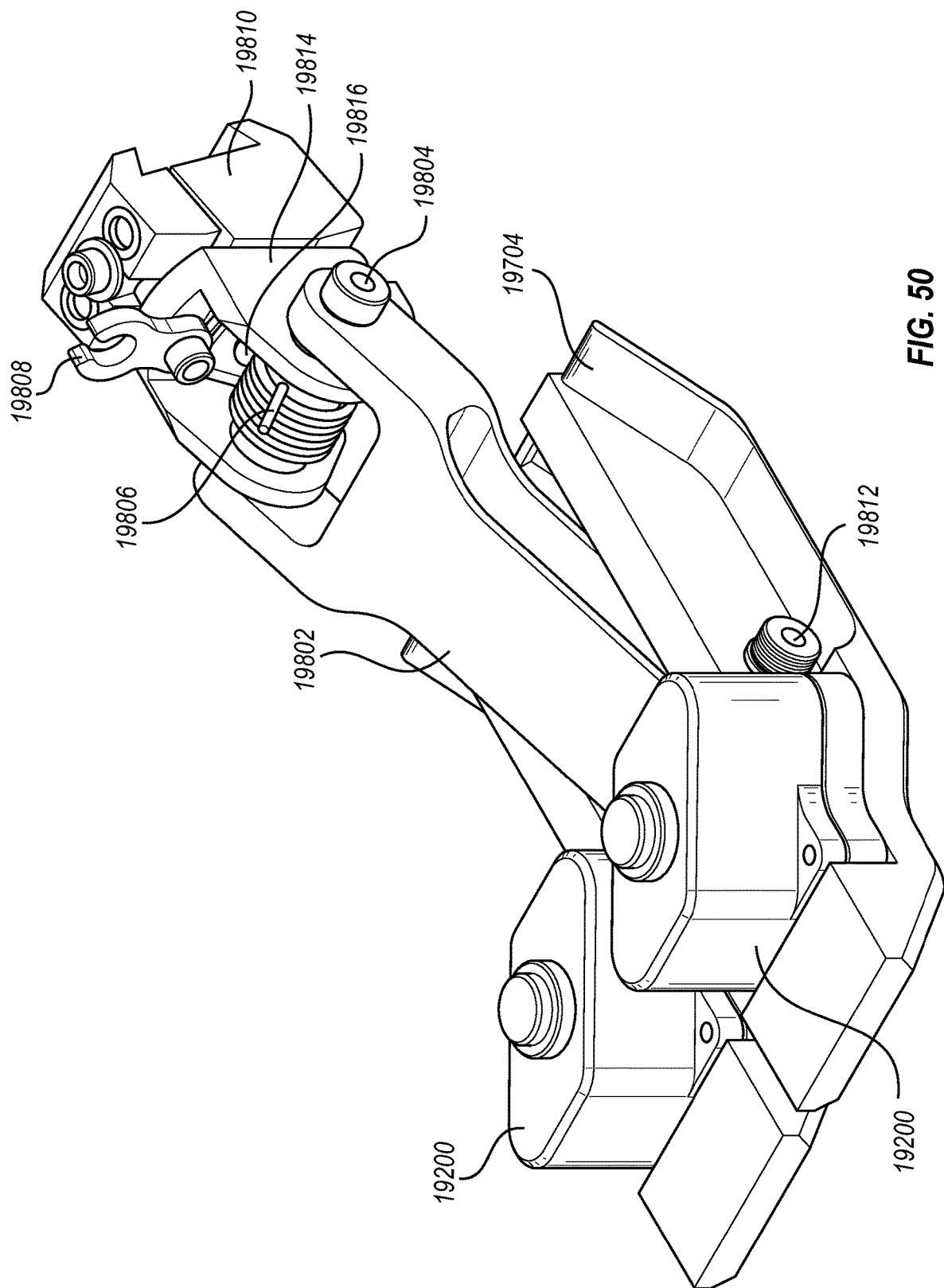
FIG. 50 depicts an example payload having an arm and two sleds mounted thereto.
Figure 51:
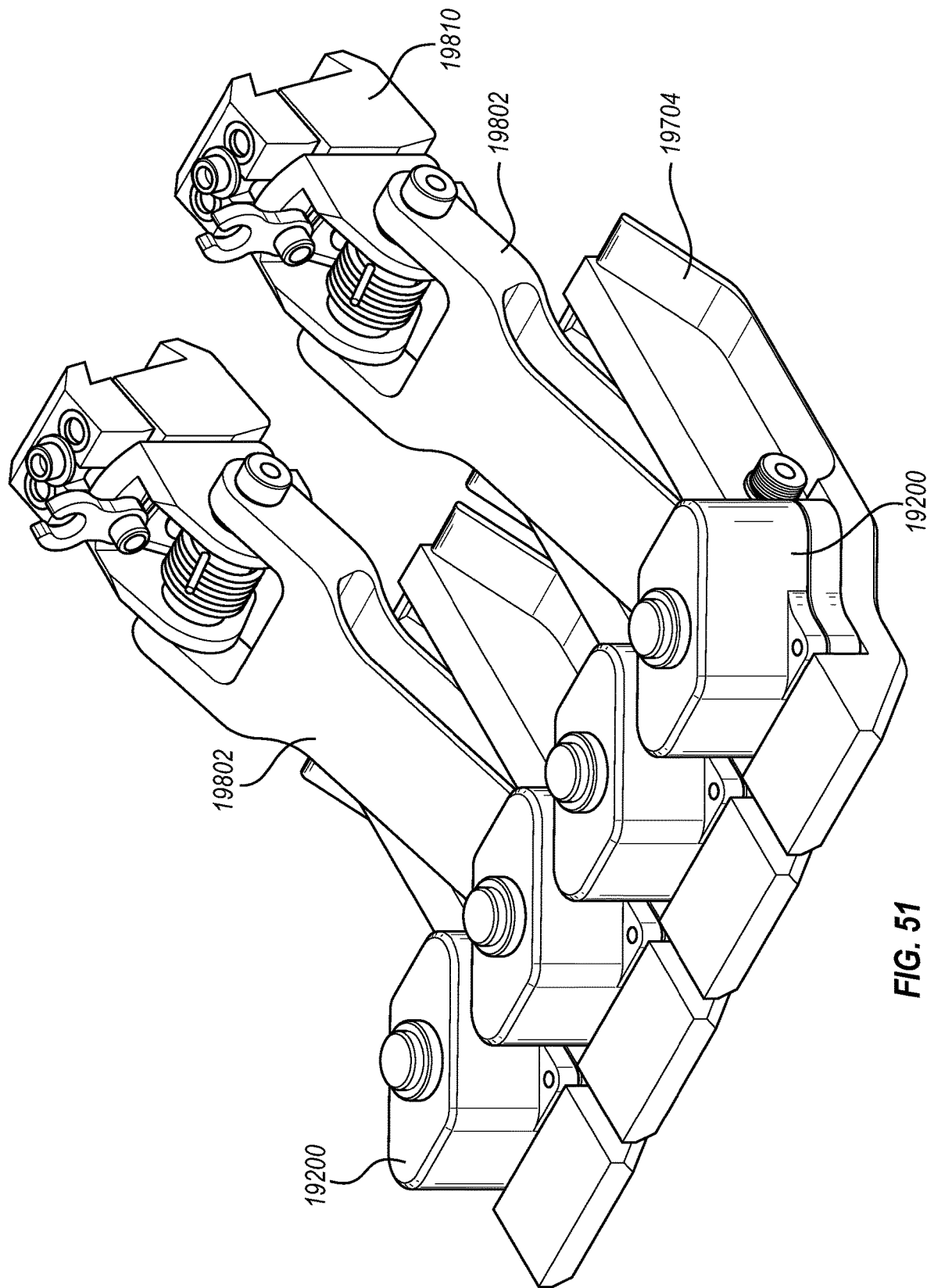
FIG. 51 depicts an example payload having two arms and four sleds mounted thereto.
Figure 52:
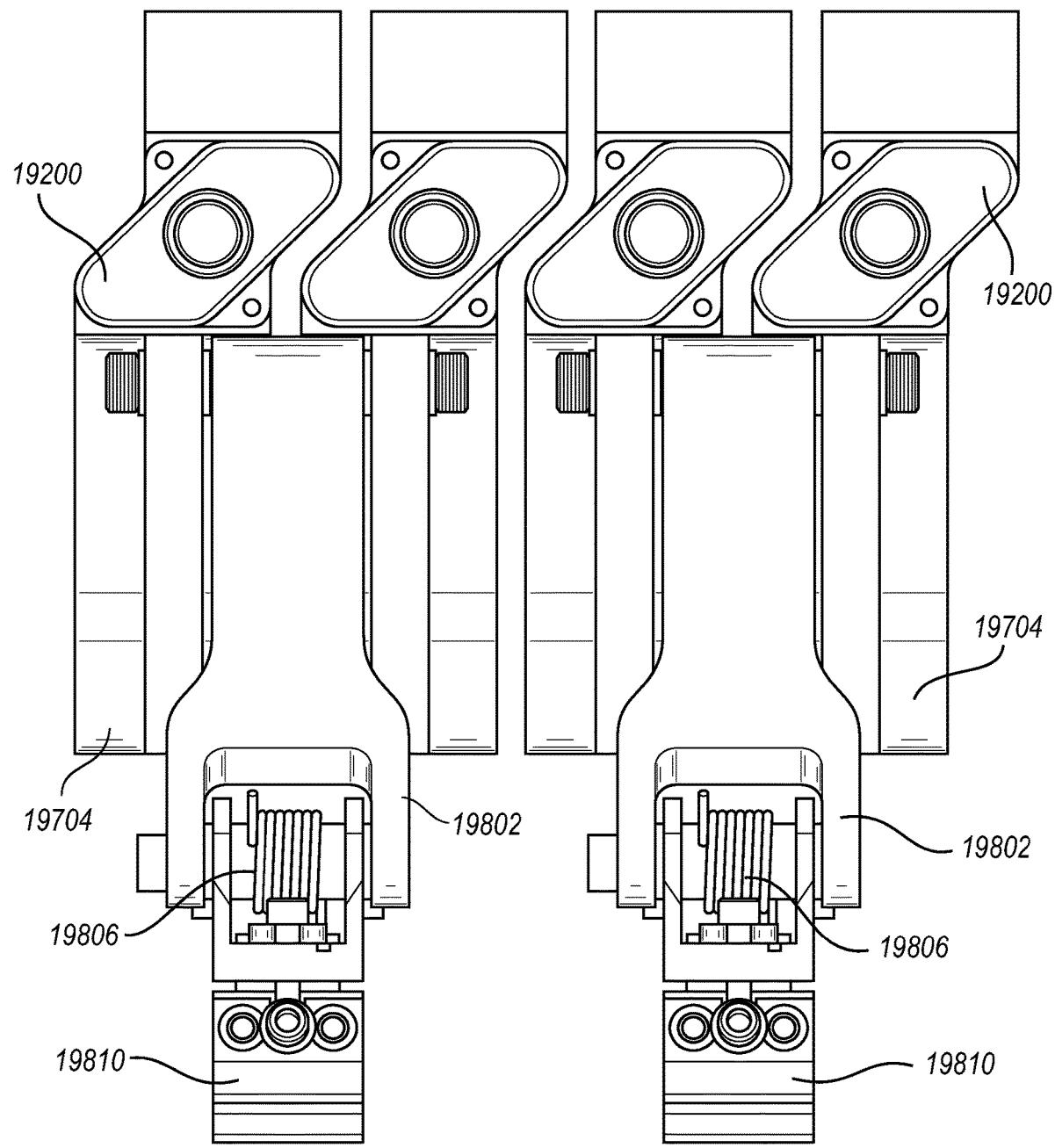
FIG. 52 depicts a top view of the example payload of FIG. 52.

Referencing FIG. 51, an example payload having an arm and two sleds mounted thereto is depicted. In certain embodiments, the arrangement of FIG. 51 forms a portion of a payload, for example as an arm coupled to a payload at a selected horizontal position. In certain embodiments, the arrangement of FIG. 51 forms a payload, for example coupled at a selected horizontal position to a rail or other coupling feature of an inspection robot chassis, thereby forming a payload having a number of inspection sensors mounted thereon. The example of FIG. 51 includes sleds and sensor group housings that are consistent with embodiments elsewhere herein. The example of FIG. 51 includes an arm 19802 coupling the sled to a payload coupling 19810 (and/or chassis coupling 19810). The arm 19802 defines a passage therethrough, wherein a couplant connection may pass through the passage, or may progress above the arm to couple with the sensor lower body portion. The arrangement of FIG. 51 provides multiple degrees of freedom for movement of the sled, any one or more of which may be present in certain embodiments. For example, the pivot coupling 19812 of the arm 19802 to the sled allows for pivoting of the sled relative to the arm 19802, and each sled of the pair of sleds depicted may additionally or alternatively pivot separately or be coupled to pivot together (e.g., pivot coupling 19812 may be a single axle, or separate axles coupled to each sled). The arm coupling 19804 provides for pivoting of the arm 19802 relative to the inspection surface (e.g., raising or lowering), and a second arm coupling 19816 provides for rotation of the arm 19802 (and coupling joint 19814) along a second perpendicular axis relative to arm coupling 19804. Accordingly, couplings 19804, 19816 operate together to in a two-axis gimbal arrangement, allowing for rotation in one axis, and pivoting in the other axis. The selected pivoting and/or rotational degrees of freedom are selectable, and one or more of the pivoting or rotational degrees of freedom may be omitted, limited in available range of motion, and/or be associated with a biasing member that urges the movement in a selected direction and/or urges movement back toward a selected position. In the example of FIG. 52, a biasing spring 19806 urges the pivot coupling 19812 to move the arm 19802 toward the inspection surface, thereby contributing to a selected downforce on the sled. Any one or more of the biasing members may be passive (e.g., having a constant arrangement during inspection operations) and/or active (e.g., having an actuator that adjusts the arrangement, for example changing a force of the urging, changing a direction of the urging, and/or changing the selected position of the urging. The example of FIG. 51 depicts selected ramps 19704 defined by the sled, and sensor group housing 19200 elements positioned on each sled and coupling the sensors to the sled and/or the inspection surface. The example of FIG. 50 further includes a coupling line retainer 19808 that provides for routing of couplant lines and/or electrical communication away from rotating, pivoting, or moving elements, and provides for consistent positioning of the couplant lines and/or electrical communication for ease of interfacing the arrangement of FIG. 51 with a payload and/or inspection chassis upon which the arrangement is mounted. The example payload coupling 19810 includes a clamp having a moving portion and a stationary portion, and may be operable with a screw, a quick connect element (e.g., a wing nut and/or cam lever arrangement), or the like. The example payload coupling 19810 is a non-limiting arrangement, and the payload/chassis coupling may include any arrangement, including, without limitation, a clamp, a coupling pin, an R-clip (and/or a pin), a quick connect element, or combinations among these elements.

Figure 53:
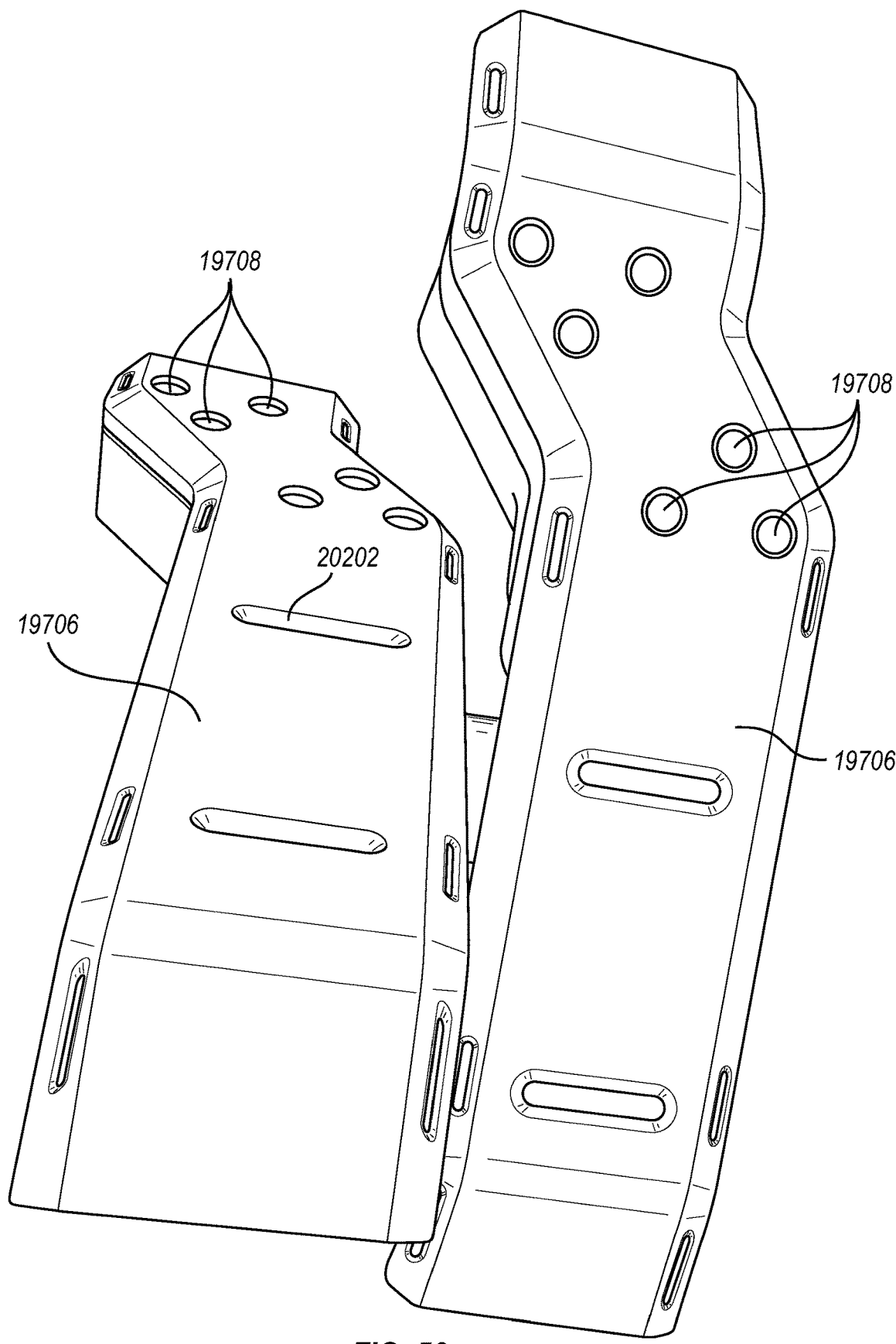
FIG. 53 depicts a bottom view of two sleds in a pivoted position.

Referencing FIG. 53, an example arrangement is depicted. The example of FIG. 53 may form a payload or a portion of a payload (e.g., with the arms coupled to the corresponding payload), and/or the example of FIG. 53 may depict two payloads (e.g., with the arms coupled to a feature of the inspection robot chassis). The arrangement of FIG. 53 is consistent with the arrangement of FIG. 51, and depicts two arm assemblies in an example side-by-side arrangement. In an example embodiment wherein each sensor group housing 19200 includes six sensors mounted therein, the example of FIG. 51 illustrates how an arrangement of 24 sensors can be readily positioned on an inspection surface, with each of the sensors having a separate and configurable horizontal position on the inspection surface, allowing for rapid inspection of the inspection surface and/or high resolution (e.g., horizontal distance between adjacent sensors) inspection of the inspection surface. An example embodiment includes each arm having an independent couplant and/or electrical interface, allowing for a switch of 12 sensors at a time with a single couplant and/or electrical connection to be operated. An example embodiment includes the arms having a shared couplant interface (e.g., reference FIG. 34) allowing for a switch of 24 sensors at a time with a single couplant connection to be operated. The pivotal and rotational couplings and/or degrees of freedom available may be varied between the arms, for example to allow for greater movement in one arm versus another (e.g., to allow an arm that is more likely to impact an obstacle, such as an outer one of the arms, to have more capability to deflect away from and/or around the obstacle).

Referencing FIG. 52, an example arrangement is depicted as a top view, consistent with the arrangement of FIG. 51. It can be seen that the sensor group housings 19200 can readily be configured to provide for selected horizontal distribution of the inspection sensors. The horizontal distribution can be adjusted by replacing the arms with arms having a different sensor group housing 19200 and sensor arrangement within the sensor group housing 19200, by displacing the arms along a payload and/or along the inspection robot chassis, and/or displacing a payload (where the arms are mounted to the payload) along the inspection robot chassis.

FIG. 53 depicts a bottom view of two sled body lower portions 19706 in a pivoted position. The example of FIG. 53 is a schematic depiction of sled body lower portions, with the sled bottom surface omitted. In certain embodiments, the inspection robot may be operated with the sled lower body portions 19706 in contact with the inspection surface, and accordingly the sled bottom surface may be omitted. Additionally, the depiction of FIG. 53 with the sled bottom surface portion omitted allows for depiction of certain features of the example sled body lower portions 19706. The example of FIG. 53 includes sled body lower portions 19706 having coupling slots 20202 engageable with matching coupling tabs of the sled bottom surface. The number and position of the slots 20202 and/or tabs is a non-limiting example, and a sled body lower portion 19706 may include slots 20202 that are not utilized by a particular sled bottom surface, for example to maintain compatibility with a number of sled bottom surface components. In certain embodiments, the slots 20202 positioned on the sled body lower portions 19706 rather than on the sled bottom surface portions allow for the sleds to be operated without the sled bottom surface. In certain embodiments, the slots 20202 may be present on the sled bottom surface, and the tabs may be present on the sled body lower portions 19706, and/or the slots 20202 and tabs may be mixed between the sled bottom surface, and the tabs may be present on the sled body lower portions 19706. The sled lower portions 19706 may include openings 19708 to allow sensors to engage with an inspection surface.

In certain embodiments, an inspection robot and/or payload arrangement may be configured to engage a flat inspection surface, for example at FIG. 51. The depiction of FIG. 51 engageable to a flat inspection surface is a non-limiting example, and an arrangement otherwise consisting with FIG. 51 may be matched, utilizing sled bottom surfaces, overall sled engagement positions, or freedom of relative movement of sleds and/or arms to engage a curved surface, a concave surface, a convex surface, and/or combinations of these (e.g., a number of parallel pipes having undulations, varying pipe diameters, etc.). An inspection robot and/or payload arrangement as set forth herein may be configured to provide a number of inspection sensors distributed horizontally and operationally engaged with the inspection surface, where movement on the inspection surface by the inspection robot moves the inspection sensors along the inspection surface. In certain embodiments, the arrangement is configurable to ensure the inspection sensors remain operationally engaged with a flat inspection surface, with a concave inspection surface, and/or with a convex inspection surface. Additionally, the arrangement is configurable, for example utilizing pivotal and/or rotation arrangements of the arms and/or payloads, to maintain operational contact between the inspection sensors and an inspection surface having a variable curvature. For example, an inspection robot positioned within a large concave surface such as a pipe or a cylindrical tank, where the inspection robot moves through a vertical orientation (from the inspection robot perspective) is not either parallel to or perpendicular to a longitudinal axis of the pipe, will experience a varying concave curvature with respect to the horizontal orientation (from the inspection robot perspective), even where the pipe has a constant curvature (from the perspective of the pipe). In another example, an inspection robot traversing an inspection surface having variable curvature, such as a tank having an ellipsoid geometry, or a cylindrical tank having caps with a distinct curvature relative to the cylindrical body of the tank.

Figure 57:
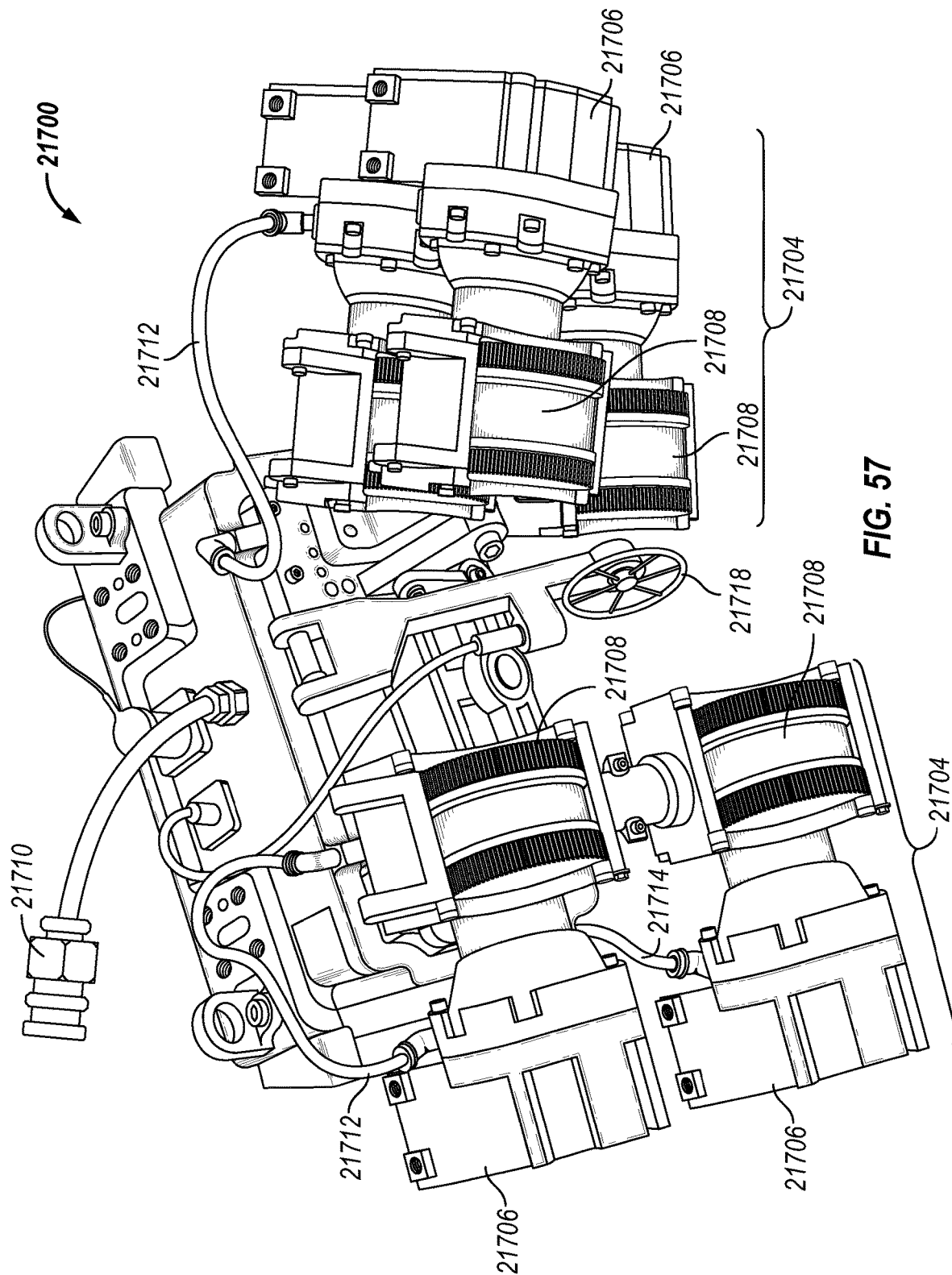
FIG. 57 depicts an example inspection robot.

Referring to FIG. 57 depicts an example inspection robot 21700. The inspection robot 21700 includes a number of aspects, components, assemblies, and the like arranged to illustrate aspects of the present disclosure. Aspects of the inspection robot 21700 may be combined, in whole or part, with other embodiments depicted throughout the present disclosure. Aspects of other embodiments may be included with and/or combined, in whole or part, the inspection robot 21700 and/or aspects thereof. The inspection robot 21700 may include a housing 21702 and one or more drive modules 21704. The drive modules 21704 include a motor 21706 and a wheel 21708. Coolant hoses 21712, 21714 enable the flow of coolant throughout the inspection robot 21700. The coolant may additionally be utilized as a couplant, and/or may be referenced as a couplant in embodiments of the present disclosure. Coolant may flow through coolant hose 21712 from a housing 21702 to a drive module 21704. Coolant may flow through coolant hose 21714 between drive modules 21704. A tether 21710 may connect the inspection robot 21700 to an external device. A center encoder 21718 may be attached to the center of the housing 21702.

As seen in FIG. 57, drive modules may rotate 21720 independently around an axis approximately parallel to the direction of travel. In certain embodiments, each drive module on a side (e.g., where one side includes more than one drive module) may rotate independently, for example on an axis parallel to the direction of travel, perpendicular to the direction of travel, and/or in any other rotational degree of freedom that is desired. The independent rotation of the drive modules allows for improved traversal of obstacles, navigating irregular or highly curved surfaces, navigation of the inspection robot (e.g., for turning, reversing direction, including on curved surfaces), or the like.

Figure 58:
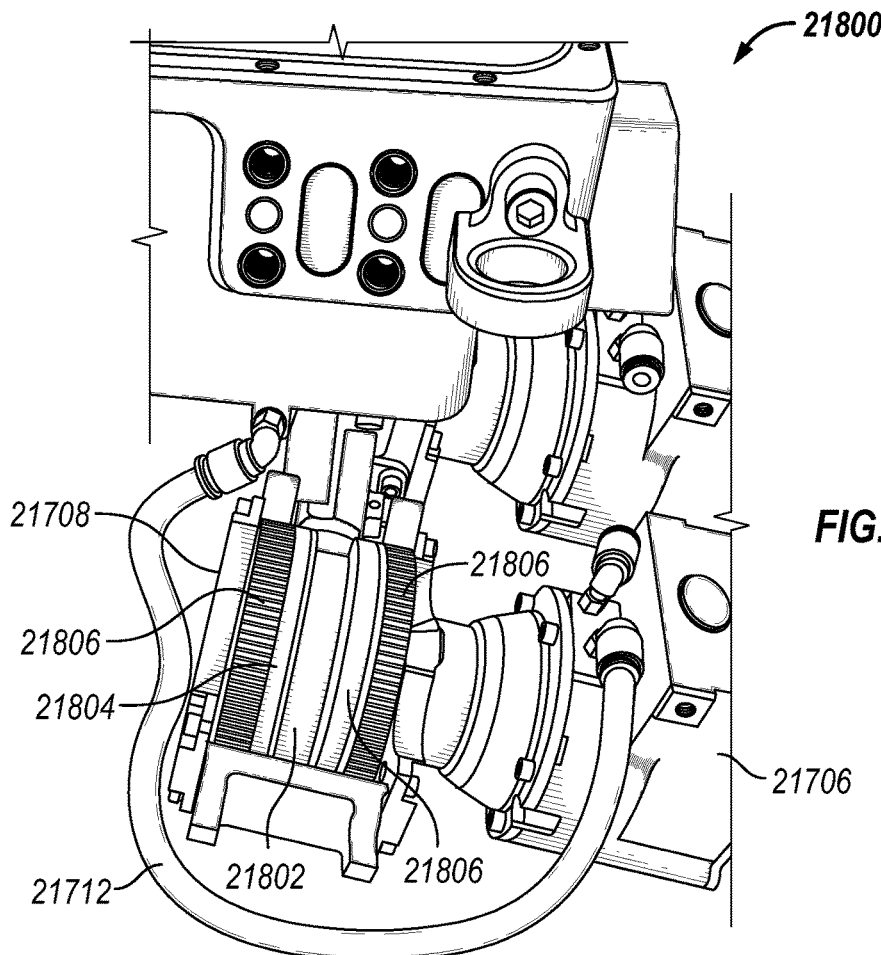
FIG. 58 is a perspective view of a corner of an example inspection robot.
Figure 59:
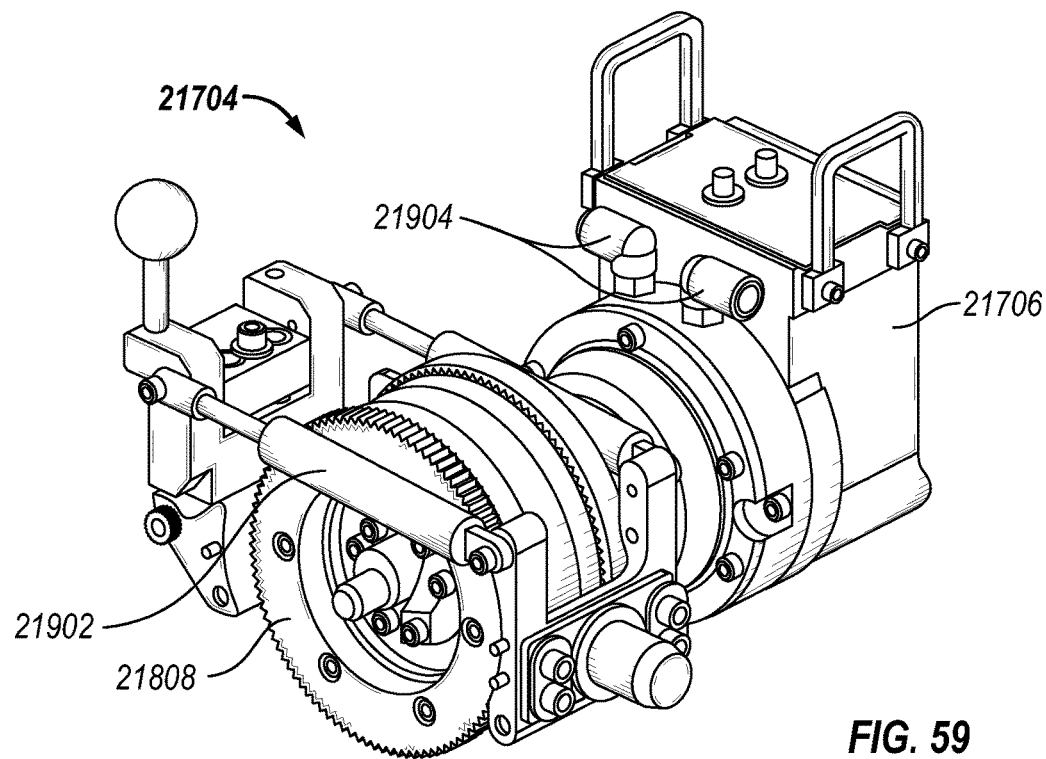
FIGS. 59-61 depict various drive module configurations.

The embodiments of FIGS. 58-59 are consistent with certain aspects of the inspection robot 21700, and may be included in whole or part, with the inspection robot 21700 or other embodiments depicted throughout the present disclosure. Referring to FIG. 58, partial view 21800 of an inspection robot is shown. A wheel 21708 may include a rare earth magnet 21802, magnetic shielding 21804 and serrated tires 21806.

Referring to FIG. 59, a drive module 21704 may be seen. A drive module may include coolant ports 21904 for connecting to coolant hoses 21712, 21714. An actuator 21902 may act to regulate an engagement of a payload to an inspection surface. The drive module 21704 includes a motor 21706 and wheel 21808.

Figure 60:
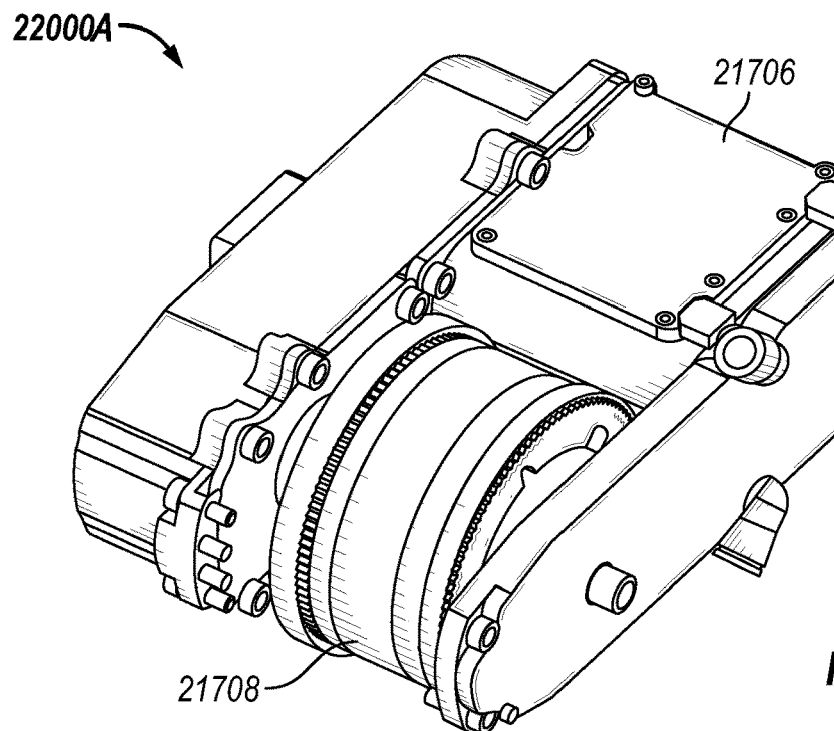
Figure 61:
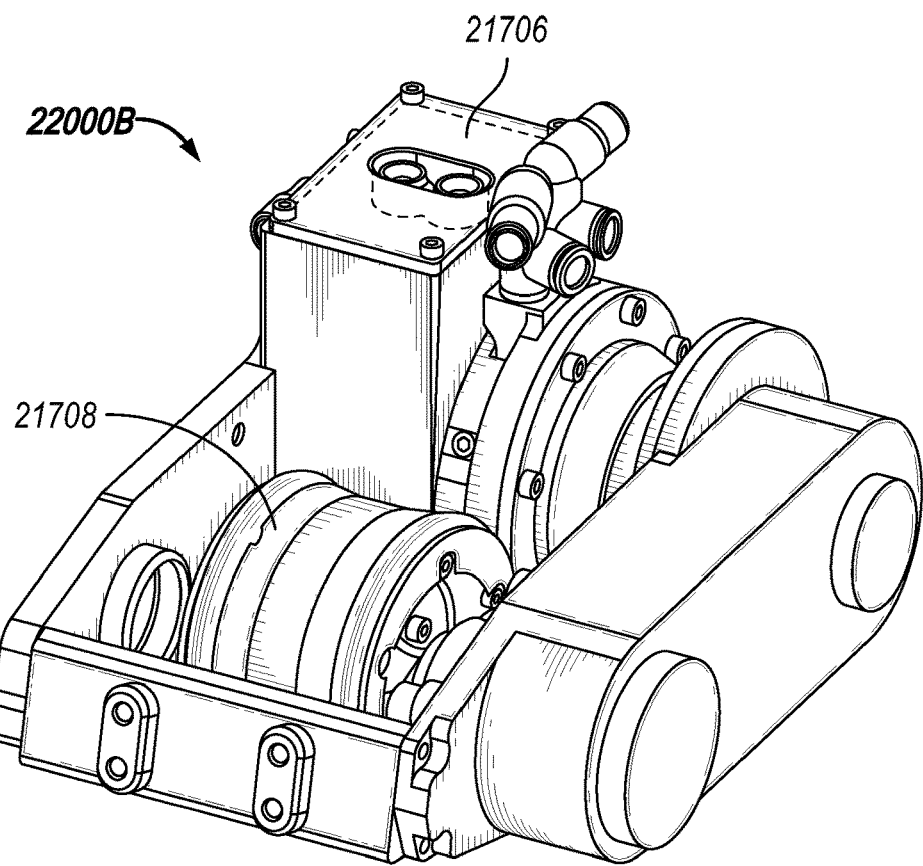

Referring to FIGS. 60-61, alternate indirect drive modules 22000A, 22000B are depicted. Drive module 22000A shows a motor 21706 positioned in front or behind the wheel 21708. Drive module 22000B shows a motor 21706 positioned above a wheel 21708. The example indirect drive modules 22000A, 22000B may be included with embodiments of the inspection robot 21700 or other embodiments herein, and a given embodiment may include more than one type of drive module (e.g., reference FIGS. 21-25, 28, 30-31, 57-61, 81, 108-111, 114-115 for some drive module examples) on a same inspection robot. The presence of more than one type of drive module on an inspection robot may be at the same time—e.g., with a first drive module of a first type and a second drive module of a second type both mounted on the inspection robot body—or at distinct times, for example with an inspection robot utilizing a first type of drive module in a first configuration, and utilizing a second type of drive module in a second configuration. Distinct drive modules may be utilized to support distinct inspection packages (e.g., distinct payloads, sensor types, and/or support differences such as electrical coupling, coolant and/or couplant provision, communication coupling, etc.), distinct inspection surfaces (e.g., inspection surface material, geometry, orientation, etc.), distinct power ratings, distinct inspection surface attachment forces, or the like. The utilization of modular drives (e.g., using the drive modules) allows for rapid replacement and/or service of drive modules, rapid configuration of the inspection robot including changing of drive modules having different drive, interface, and inspection support characteristics, and convenient distribution and isolation of inspection robot capabilities, allowing for separate development and support of aspects of the inspection robot (e.g., drive modules, inspection robot such as internal electrical, control, and/or coolant management within the inspection robot housing, and/or payloads—including sleds, payload support and attachment, and/or sensor configurations) with consistent and/or mutually configurable interfaces between the aspects of the inspection robot that allow the separately developed and/or supported aspects of the inspection robot to be readily combined with zero or minimal design effort utilized to ensure that the separately developed and/or supported aspects will function properly.

Without limitation to any other aspect of the present disclosure, example configuration operations for aspects of the inspection robot include operations such as: updating computer readable instructions stored on a control board of the inspection robot; replacing a control board of the inspection robot; swapping out a sled of a payload; swapping out a sensor of a payload; swapping out a first payload for a second payload; adjusting a coolant flow path through the inspection robot, a drive module, or other component; swapping out a drive module; changing a removeable interface plate; changing a calibration of a control board of the inspection robot; changing a data acquisition board of the inspection robot; and/or adjusting a configuration (e.g., shape, mounting position, mounted sleds thereon, and/or mounted sensors thereon) of a payload. The described configuration adjustments are non-limiting examples, are not mutually exclusive, and in some embodiments one or more of the separately listed operations may be the same operation (e.g., swapping a sensor of a payload, changing a control board that is the data acquisition board, etc.).

Without limitation to any other aspect of the present disclosure, example mutually configurable interfaces between aspects of the inspection robot include: an interface between a drive module and a control board (e.g., a peripheral board) of the inspection robot; an interface between a payload and a drive module and/or between a payload and a control board of the inspection robot; and/or an interface between a peripheral device (e.g., a camera, a sensor positioned separately from a payload, and/or another device such as a data collector, actuator, encoder, or the like) and a control board of the inspection robot. Example and non-limiting interfaces include one or more of: a mechanical coupling interface, an electrical coupling interface, a communications coupling interface, and/or a coolant coupling interface. In certain embodiments, a removeable interface plate forms at least a portion of the interface and is configurable (e.g., having sufficient I/O capacity to support multiple device arrangements, and/or changeable between distinct plates to support multiple device arrangements) to support the mutually configurable interfaces.

Figure 62:
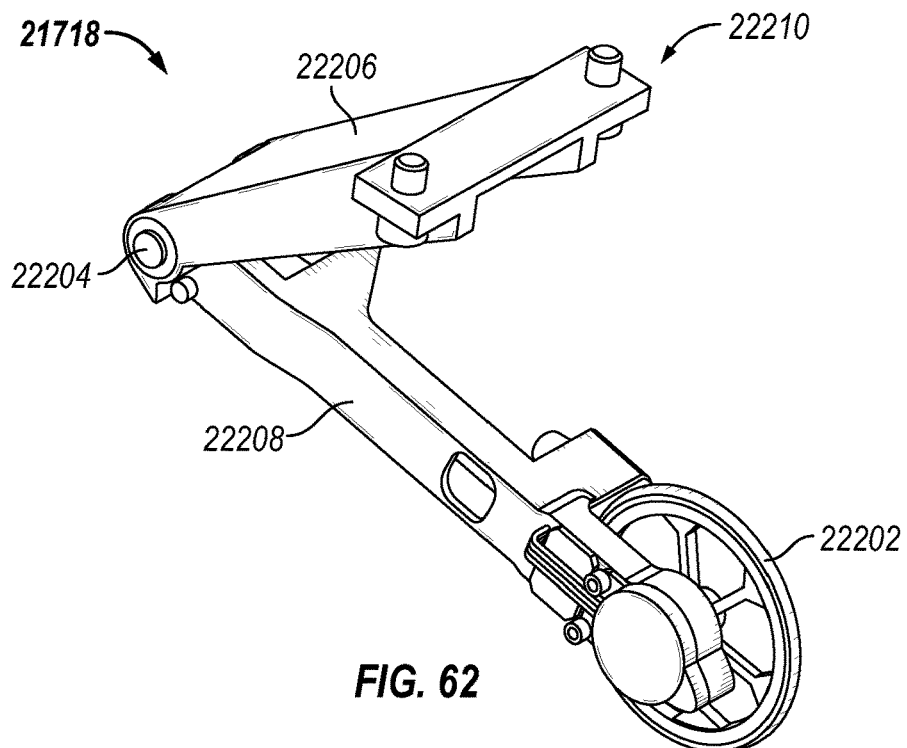
FIGS. 62-63 depict examples of a center encoder.
Figure 63:
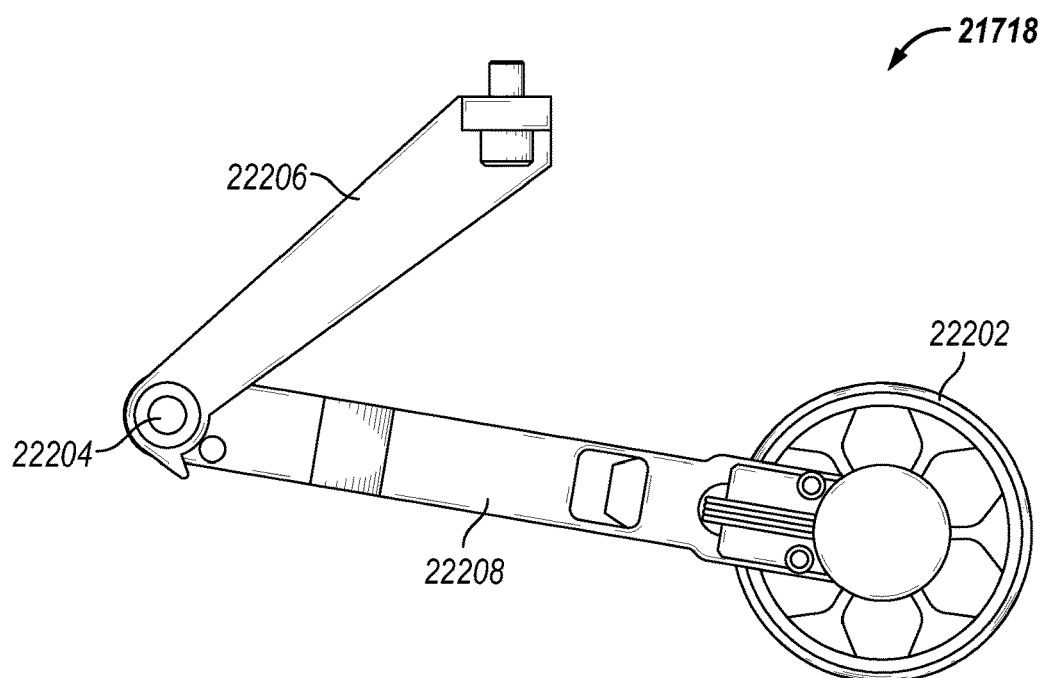

Referring to FIGS. 62-63, a center encoder 21718 is depicted. The center encoder 21718 has a wheel 22202, an upper encoder limb 22206, and a lower encoder limb 22208, the upper and lower encoder limbs 22206, 22208 connected by an encoder joint 22204. The center encoder 21718 may be attached to the housing 21702 with an encoder connector 22210. The encoder 21718 may be of any type as set forth throughout the present disclosure, including at least a contact encoder or a contactless encoder, and may be optical, electromagnetic, mechanical, or any other type of encoder.

Figure 64:
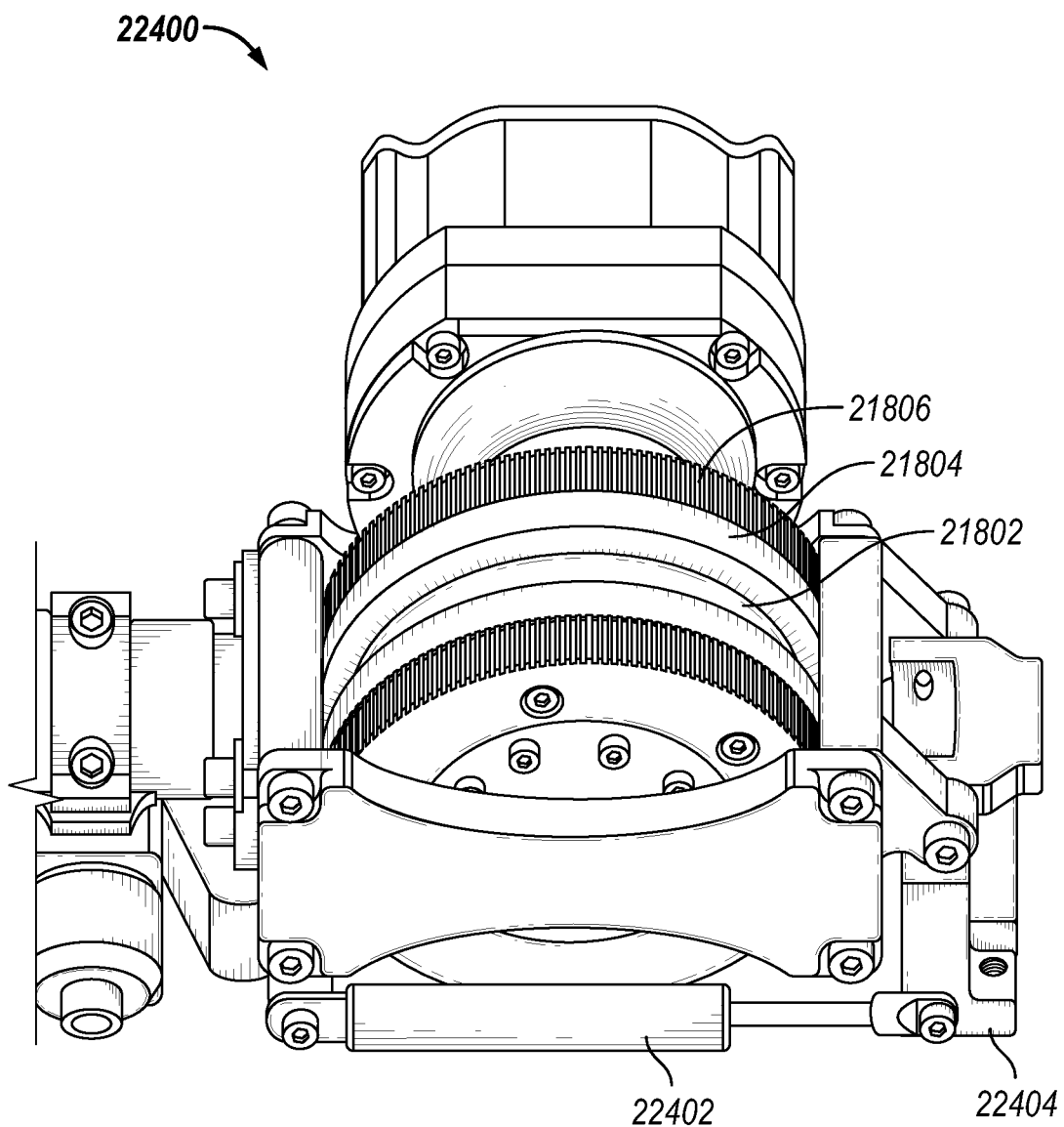
FIG. 64 depicts an example wheel and drive module.

Referring to FIG. 64, a drive module 22400 and details of wheel 21708 are shown. The example drive module 22400 includes a gas spring 22402 actuator and a mounted payload 22404. The example drive module 22400 may be utilized, in whole or part, in embodiments throughout the present disclosure, and may include the mounted payload 22404 in addition to, or as an alternative to, a payload 22404 mounted directly on the robot housing. In certain embodiments, the mounted payload 22404 may be positioned forward of the robot, behind the robot, or an inspection robot may include payload(s) both forward and behind the robot.

Figure 65:
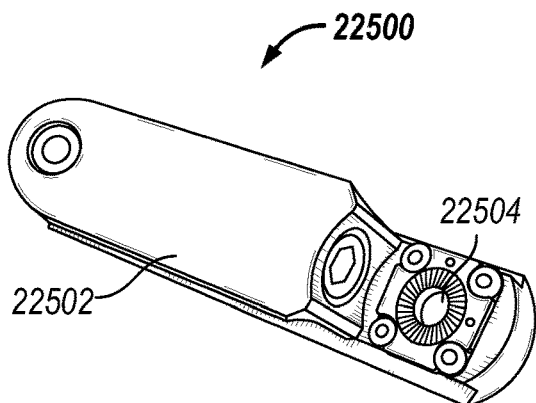
FIGS. 65-66 depicts example rail components.
Figure 66:
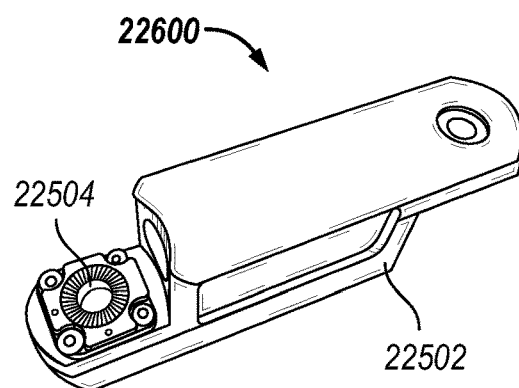

Referring to FIGS. 65-68, rail components 22500, 22600 of a modular payload rail are shown including rail components 22502 and connection joints 22504. FIG. 66 shows the rail components 22500, 22600, combined to form a straight payload rail 22700. FIG. 66 shows the rail components 22500, 22600, combined to form a non-linear or curved payload rail 22800. The example in FIGS. 65-68 depicts the rail having a number of joints that are coupled with a Hirth joint. The utilization of a Hirth joint allows for rapid reconfiguration of the coupling between joints at a number of discrete angles, where the resolution between discrete positions is selectable according to the number and arrangement of teeth on the Hirth joint. Accordingly, the geometric configuration of the payload is rapidly adjustable to meet the needs of the system, for example to follow the geometry of the inspection surface. Further, the Hirth joint provides for a securing force to maintain the selected configuration of the payload that the utilization of a Hirth joint is optional and non-limiting, and any other payload arrangement and/or coupling mechanism is contemplated herein.

Figure 71:
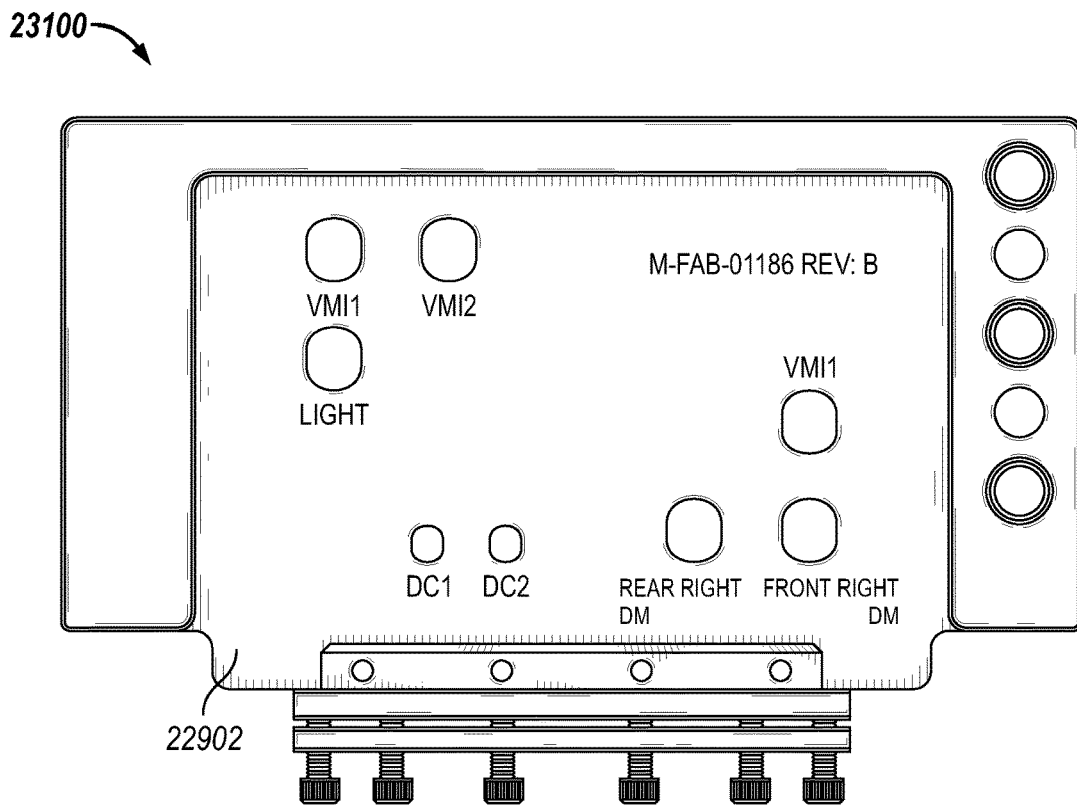
FIG. 71 depicts an example removeable interface plate.

Referring to FIGS. 69-71 show various aspects and exampled of a removeable interface plate. FIG. 69 shows a partial view 22900 of an inspection robot with a removable interface plate 22902 attached to the housing 21702. An example removable interface plate 22902 for changing payload/sensor configurations may have multiple connections 22904 in various configurations. FIGS. 70A-70B show gaskets 23000A, 23000B for supporting different connection configurations. FIG. 71 shows an example removeable interface plate 23100, 22902 for supporting different drive module configurations. The utilization of a removeable interface plate 22902, where present, allows for rapid reconfiguration of the inspection robot, including a changing of I/O to support payloads, drive modules, communications, tether coupling, or the like. In certain embodiments, a removeable interface plate 22902 coordinates with other features to enhance the configurability of the inspection robot. Without limitation to any other aspect of the present disclosure, example features to support rapid configurability include: swappable payloads; adjustable payload arrangements; swappable control cards (e.g., reference FIGS. 95-97); swappable drive modules; adjustable coolant flow configurations (including at design time and/or at run time); and/or modularized control elements including: control of inspection operations, drive modules, motive operations, software/firmware updates, and/or communication controllers and/or data collection operations. Without limitation to any other aspect of the present disclosure, features herein to support configurability provide for reduced inspection operation times, better configuration of the inspection robot hardware and controls to the inspection environment, greater confidence that an inspection operation can be completed successfully, reduction in dedicated resources to complete inspections for off-nominal conditions (e.g., reducing the number of parts, spares, and/or additional inspection robots that need to be brought to a location, the ability to service and/or change parts of the inspection robot on a location, and/or reduction of hotshot runs to get replacement parts and/or alternative versions of parts such as alternate drive modules and/or payloads having different configurations), and/or a greater ability to respond to on-site conditions that are found to be different relative to estimated conditions (e.g., inspection surface shape, inspection surface temperature, geometry and/or position of obstacles, etc.). In certain embodiments, inspection costs are significantly reduced, for example due to expensive components (e.g., the inspection robot body and related components) being adaptable for multiple environments, allowing for servicing of multiple surfaces with just a few more affordable components (e.g., maintaining a few versions of the drive modules, rather than a few separately configured inspection robots), reducing on-site time for service and/or configuration of the inspection robot, and/or reducing expensive trips to a service and/or manufacturing facility at the time of inspection operations. Overall, embodiments herein improve the inspection operations, including without limitation: ensuring that the inspection robot is configured correctly; adjusting the configuration of the inspection robot on-site, with limited tools and/or service facilities; rapid replacement of parts, sensors, payloads, drive modules, etc.; and/or rapid on-site response to unexpected conditions or events.

Figure 72:
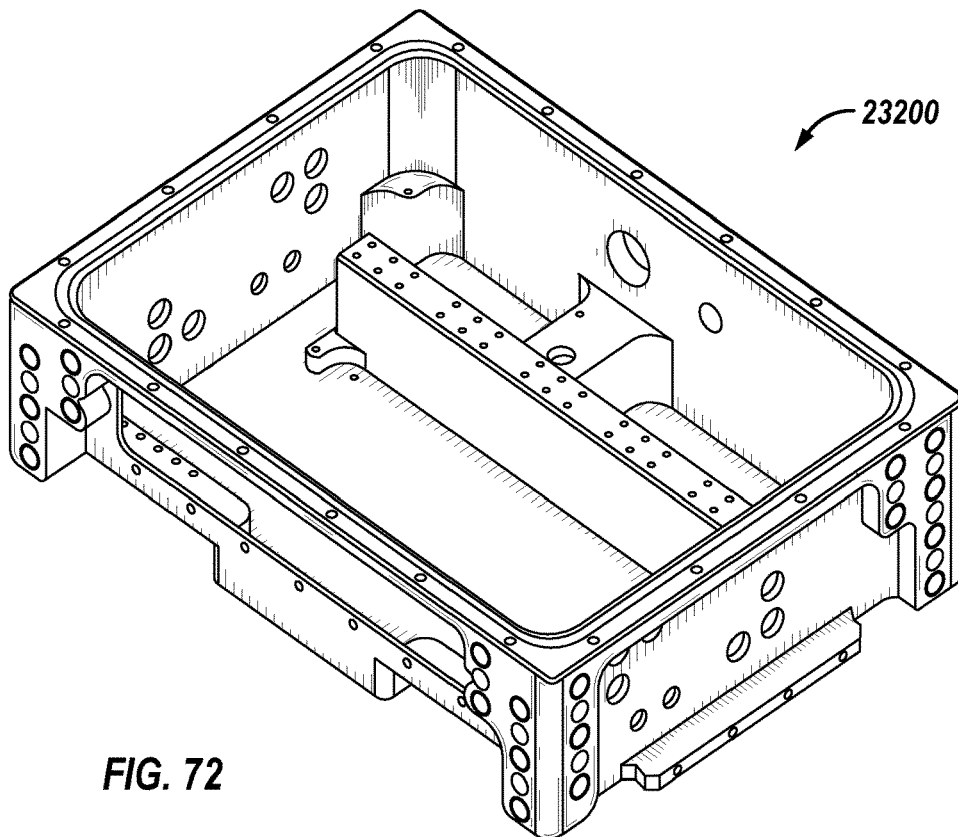
FIG. 72 depicts an example interior of a housing.
Figure 73:
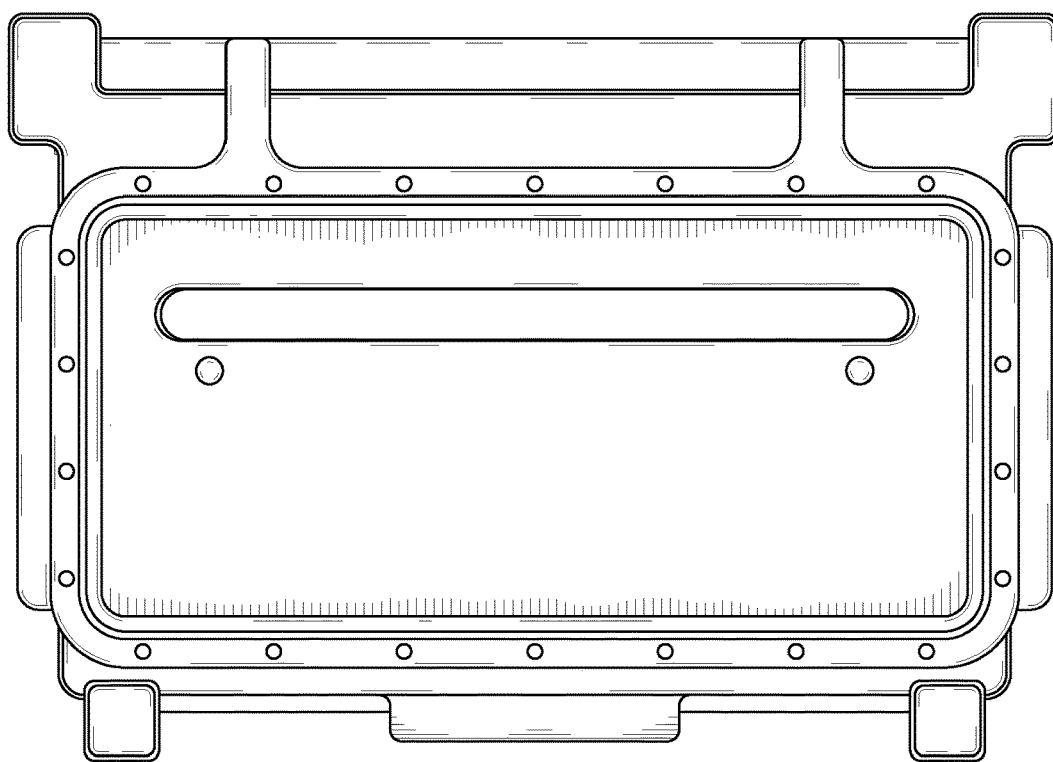
FIGS. 73-74 depict the top and bottom of a housing.
Figure 74:
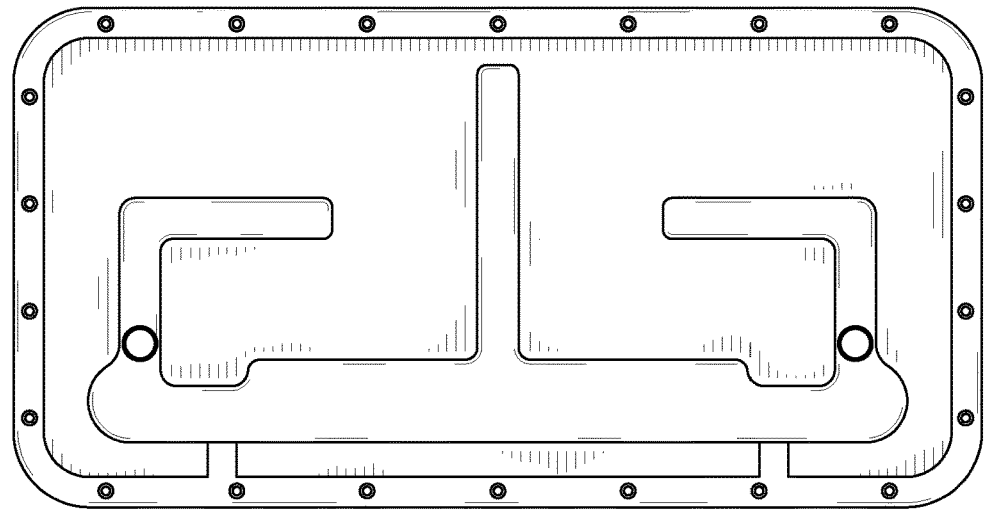

Referring to FIGS. 72-74, different aspects of the housing 21702 are shown. FIG. 72 depicts an interior view 23200 of the housing 21702. The example of FIG. 72 depicts interfaces for cooling, mounting of external hardware and/or internal components, and/or interfaces for payloads, tether, removeable interface plates, or the like. FIGS. 73-74 show a top housing component 23300 and a bottom housing component 23400. The example top housing component 23300 covers the inspection robot interior, protecting from debris, impacts, intrusion of water, or the like. In certain embodiments, the top housing component 23300 may be a transparent material, for example allowing visual verification of proper installation of components within, and/or visibility to lights or indicators, for example provided on one or more control cards within the inspection robot. In certain embodiments, the top housing component 23300 includes light(s), a readable screen, or other component thereon allowing the inspection robot to display information (e.g., status, direction of travel, speed of travel, inspection state or stage, etc.) that is visible to the operator. The example bottom housing component 23400 includes a configured bottom that provides a reservoir to retain selected cooling fluid (e.g., couplant emitted by UT sensors, that flows down the inspection surface into the reservoir) and provides thermal contact to selected portions of the inspection robot body. The example bottom housing component 23400 thereby provides for cooling of selected internal components, using direct thermal contact with those components, and/or thermal contact with a high conductivity path (e.g., a heat sink or conduit that is thermally coupled to components within the inspection robot). In the example of FIG. 74, the reservoir is formed when the inspection robot is positioned on the inspection surface, with the reservoir defined between the inspection surface and the inspection robot body, with raised ridges—which may be attached to the bottom housing component 23400 and/or formed integrally therewith—defining the shape and depth of the reservoir, as well as the contact locations on the bottom of the inspection robot. The configuration of the reservoir, where present, may cooperate with the position of internal components (e.g., heat sinks, conductive paths, temperature generating components, etc.) of the inspection robot for thermal management.

Figure 75:
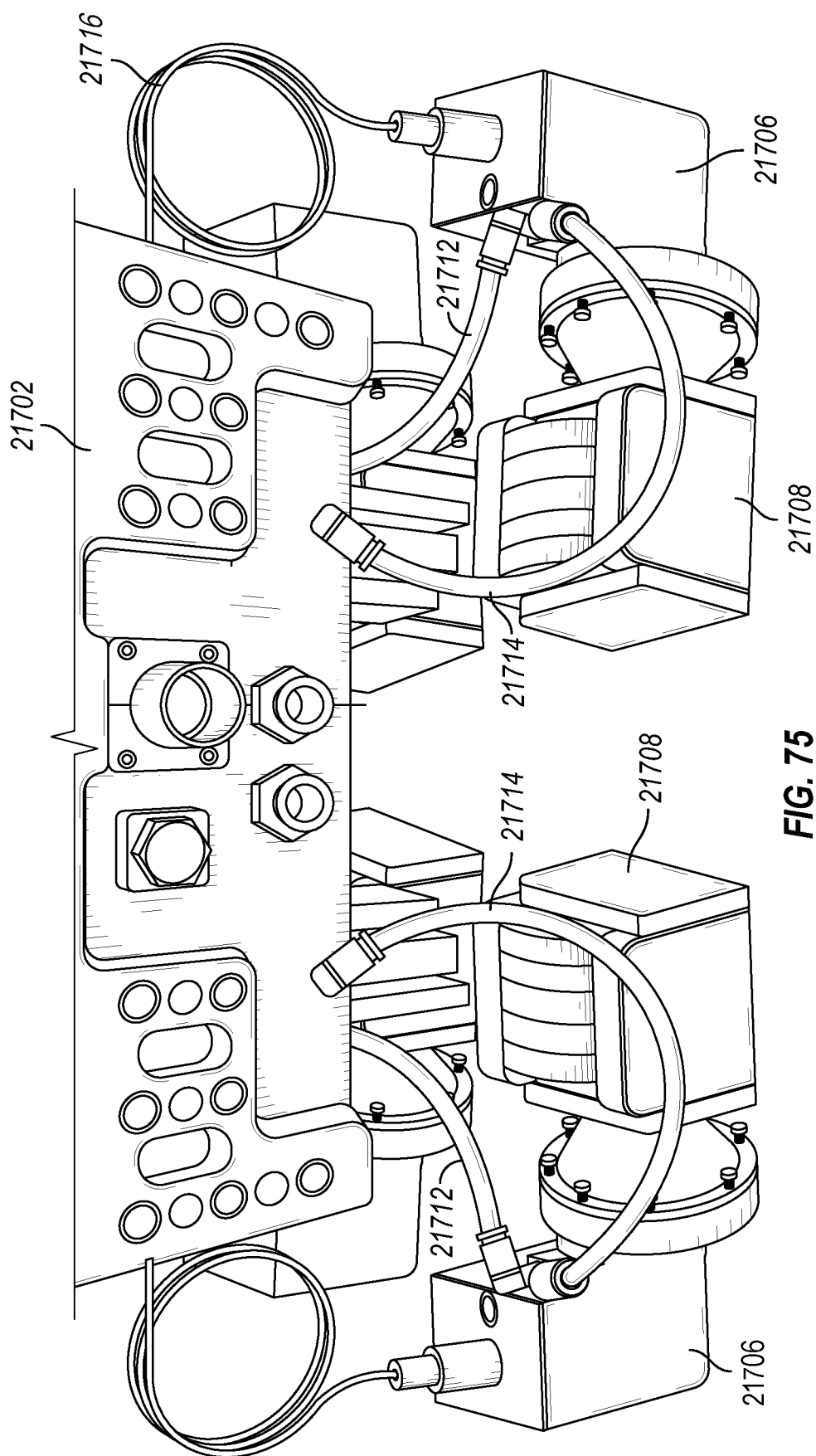
FIG. 75 depicts a rear view of an example inspection robot.
Figure 76:
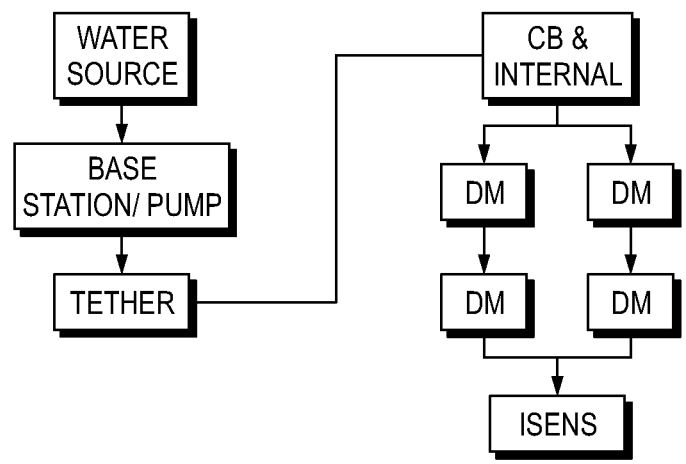
FIG. 76 is a schematic flow depiction of an example coolant flow path.

Referring to FIG. 75, a rear perspective view of an inspection robot 21700 is shown. The example of FIG. 75 depicts a number of aspects described throughout the present disclosure in an example arrangement for illustration. The example of FIG. 75 depicts drive modules having wheels positioned under the body of the inspection robot, reducing the width of the inspection robot assembly. The example of FIG. 75 depicts direct data and power connections 21716 (cables as shown) between each drive module and the body of the inspection robot. The example of FIG. 75 further depicts coolant/couplant flowing through the drive modules and then to the payloads. The example of FIG. 76 depicts the coolant flowing from a water source (e.g., industrial water supply, municipal water supply, dedicated stored water for the inspection, etc.) to a base station—for example, a pump and/or water storage coupled to the inspection robot (e.g., through the tether) and operable to provide couplant/coolant to the inspection robot during inspection operations. The example of FIG. 76 further includes the coolant flowing through the inspection robot body, which may be configured to thermally couple the coolant with a control board of the inspection robot (e.g., a modular/removeable board, a main control board, and/or a data acquisition board). In the example of FIG. 76, the coolant flows through the drive module(s) on each side, and then to the payload and/or sensor. In certain embodiments, the coolant further progresses to the inspection surface, and is collected, at least in part and for a residence period, into a reservoir formed between the inspection robot and the inspection surface, promoting further heat transfer from selected components through thermal contact with the reservoir. The order, arrangement, and selection of components for thermal contact with the coolant as depicted in FIG. 76 is a non-limiting arrangement, and components in the flow path may be omitted or rearranged, and other components not shown in FIG. 76 may be positioned in the flow path.

Referring to FIG. 76, a flow chart schematic 23600 depicts an example coolant flow path for an inspection robot 21700. The example of FIG. 76 depicts the coolant flowing from a water source (e.g., industrial water supply, municipal water supply, dedicated stored water for the inspection, etc.) to a base station—for example, a pump and/or water storage coupled to the inspection robot (e.g., through the tether) and operable to provide couplant/coolant to the inspection robot during inspection operations. The example of FIG. 76 further includes the coolant flowing through the inspection robot body, which may be configured to thermally couple the coolant with a control board of the inspection robot (e.g., a modular/removeable board, a main control board, and/or a data acquisition board). In the example of FIG. 76, the coolant flows through the drive module(s) on each side, and then to the payload and/or sensor. In certain embodiments, the coolant further progresses to the inspection surface, and is collected, at least in part and for a residence period, into a reservoir formed between the inspection robot and the inspection surface, promoting further heat transfer from selected components through thermal contact with the reservoir. The order, arrangement, and selection of components for thermal contact with the coolant as depicted in FIG. 76 is a non-limiting arrangement, and components in the flow path may be omitted or rearranged, and other components not shown in FIG. 76 may be positioned in the flow path.

Figure 77:
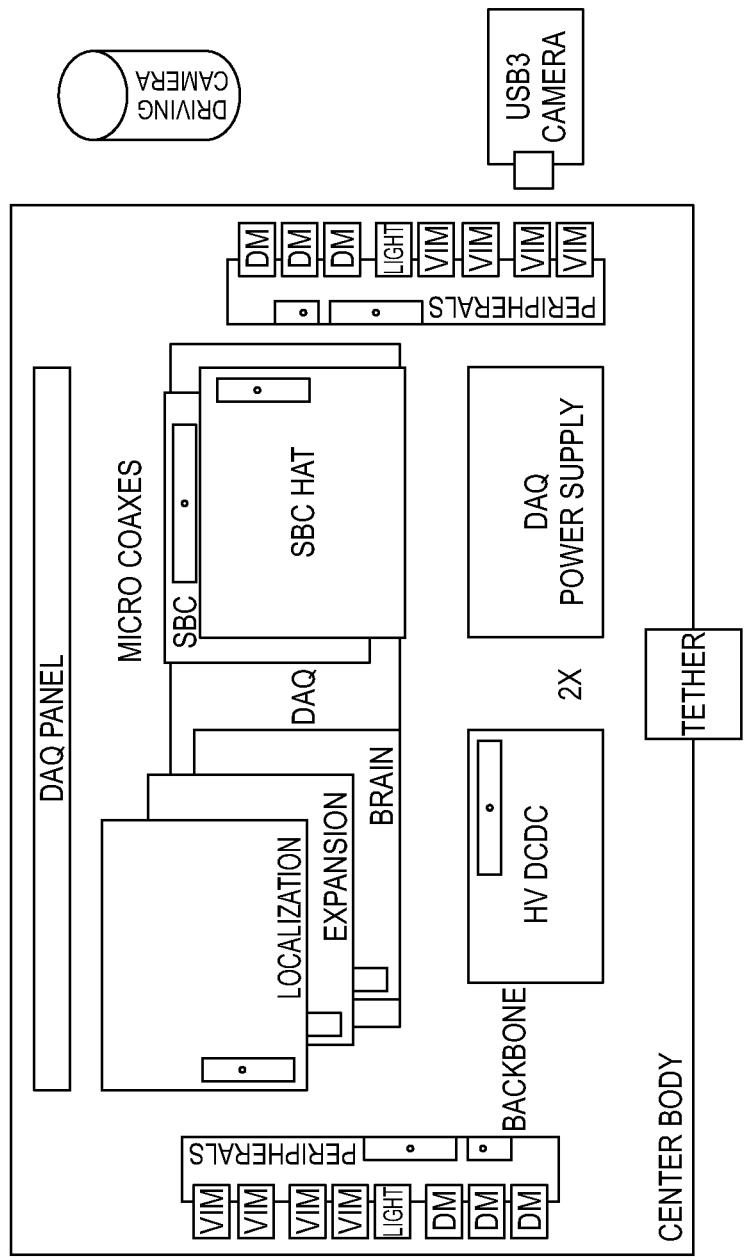
FIG. 77 is a schematic of an example inspection robot.

Referring to FIG. 77, a control schematic 23700 is shown. The example arrangement of FIG. 77 schematically depicts control components distributed within and/or around the inspection robot. In certain embodiments, control boards (e.g., LOCALIZATION, EXPANSION, BRAIN, etc.) may be replaceable, for example by removing a top cover and swapping out a plugged in printed circuit board (PCB). The swapping availability allows for rapid reconfiguration of the inspection robot, for example to manage distinct payloads, peripherals (e.g., cameras), perform a rapid update of control algorithms, and/or to replace a failed or faulted board. In the example of FIG. 77, each drive module includes a separate control board for the drive module, which may communicate status and/or respond to commands to the drive module to control operations of the drive module and/or attached devices (e.g., an encoder, mounted payload, etc.). In certain embodiments, the payload is mounted on a drive module, but is electrically coupled to the inspection robot body separately from the drive module. In certain embodiments, a peripherals board is provided that interfaces with attached peripherals and/or the drive module, isolating control operations for the peripherals and allowing for a change in peripherals to have control support isolated to the peripherals board, allowing for support of any given peripheral device and/or drive module to be limited to swapping or updating the peripherals board. While the peripherals board allows for rapid swapping of support for the peripherals, a given peripherals board may support more than one type of peripheral device and/or drive module, allowing for the change of peripheral devices to be made without swapping the peripherals board for at least certain devices.

Figure 78:
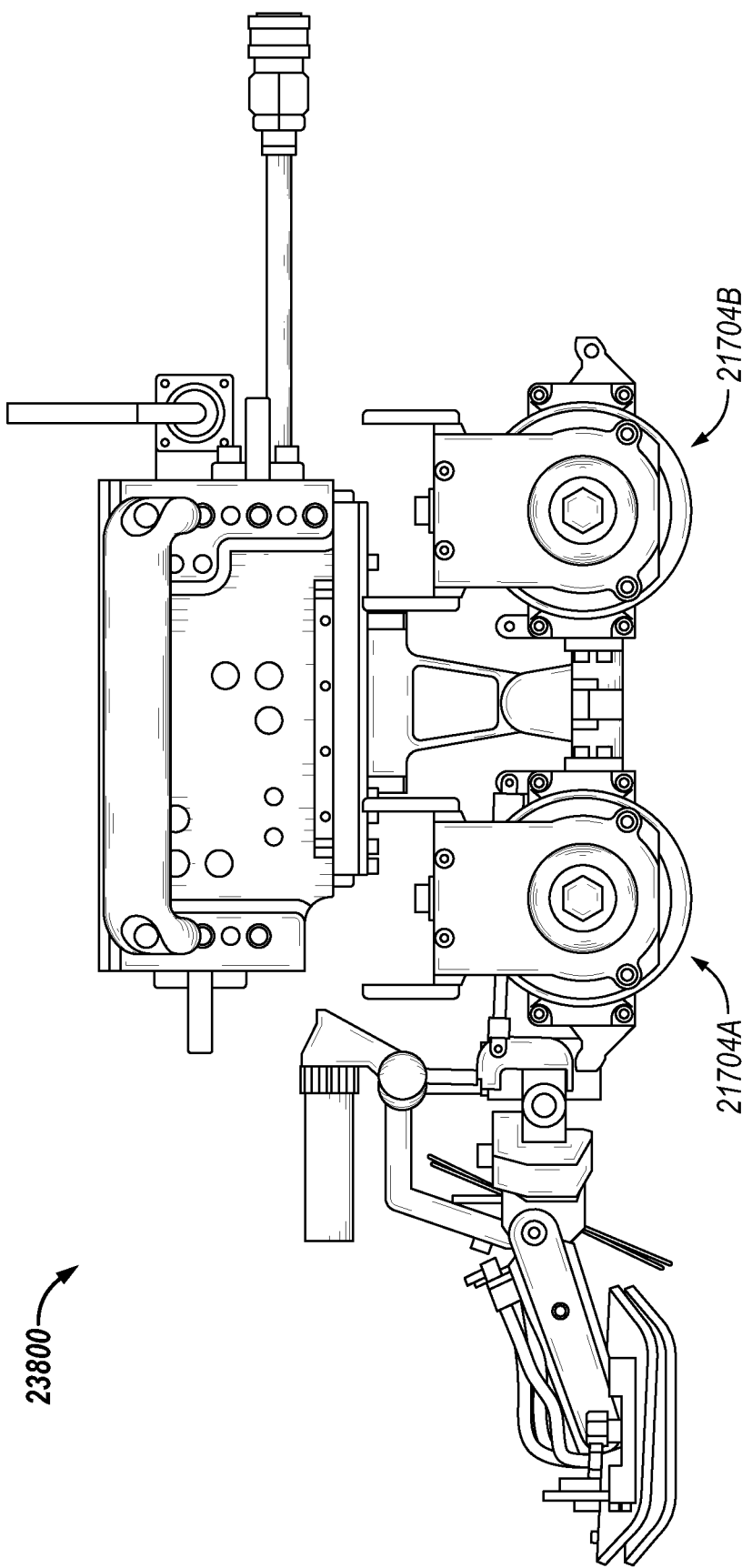
FIG. 78 is a side view of an example inspection robot.

Referring to FIG. 78, a side view 23800 of an inspection robot 21700 is shown. The drive modules 21704A, 21704B, on a common side of the housing 21702 are operative linked such that they can pivot relative to one another around an axis at an angle relative to the direction of travel. The linkage between drive modules allows for the articulation of the drive module wheels in a controlled manner, enhancing the ability of the inspection robot to traverse obstacles and/or minor surface features while maintaining contact with the inspection surface. The views depicted in FIGS. 78-81 are consistent with an example arrangement of the inspection robot, and depict a mutually consistent embodiment of the inspection robot.

Figure 79:
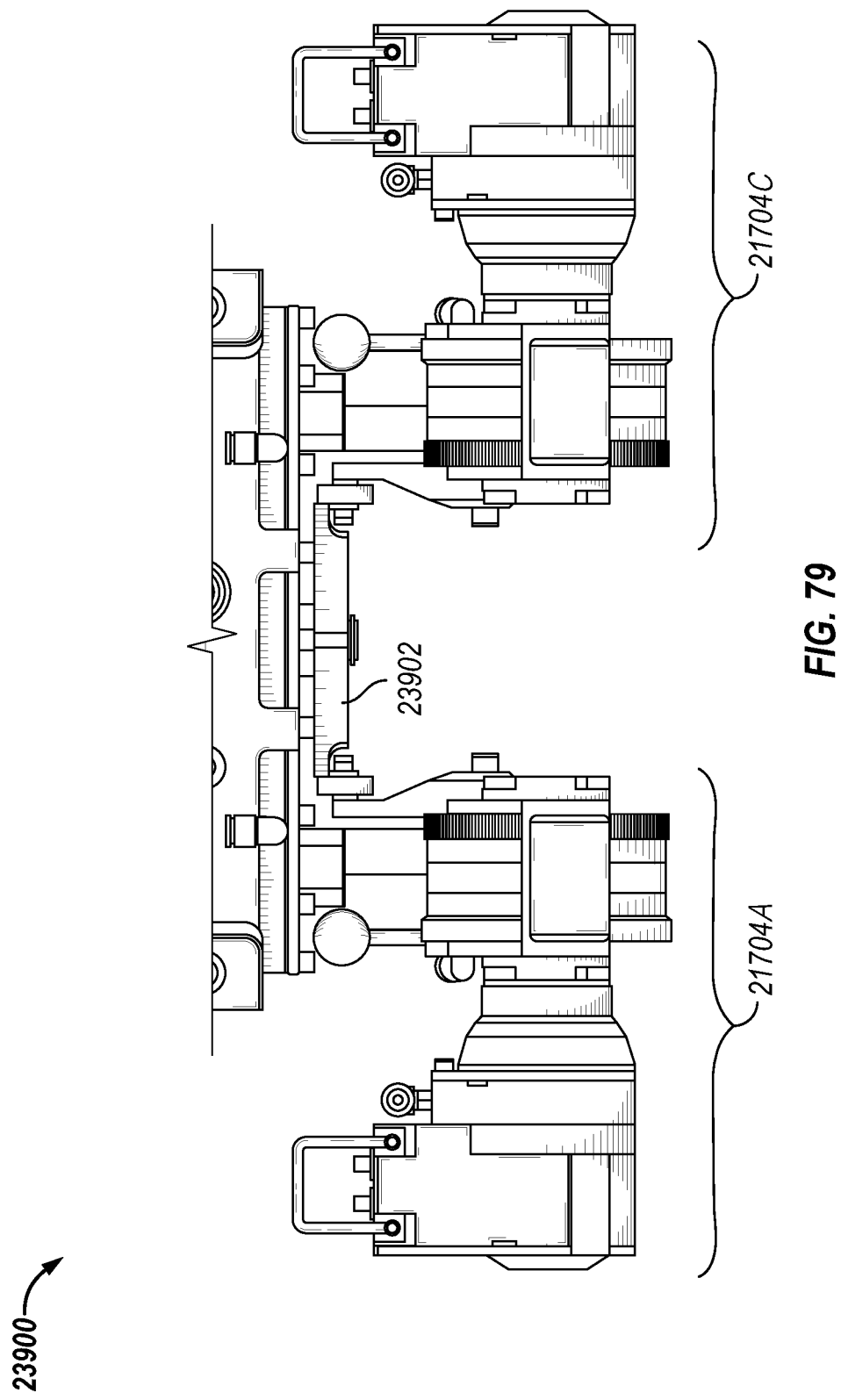
FIG. 79 is a front view of an example inspection robot.

Referring to FIG. 79, a partial front view 23900 of an inspection robot may be seen. There may be a drive module linking suspension 23902 that can operationally link drive modules 21704A, 21704C on different sides of the housing 21702.

Figure 80:
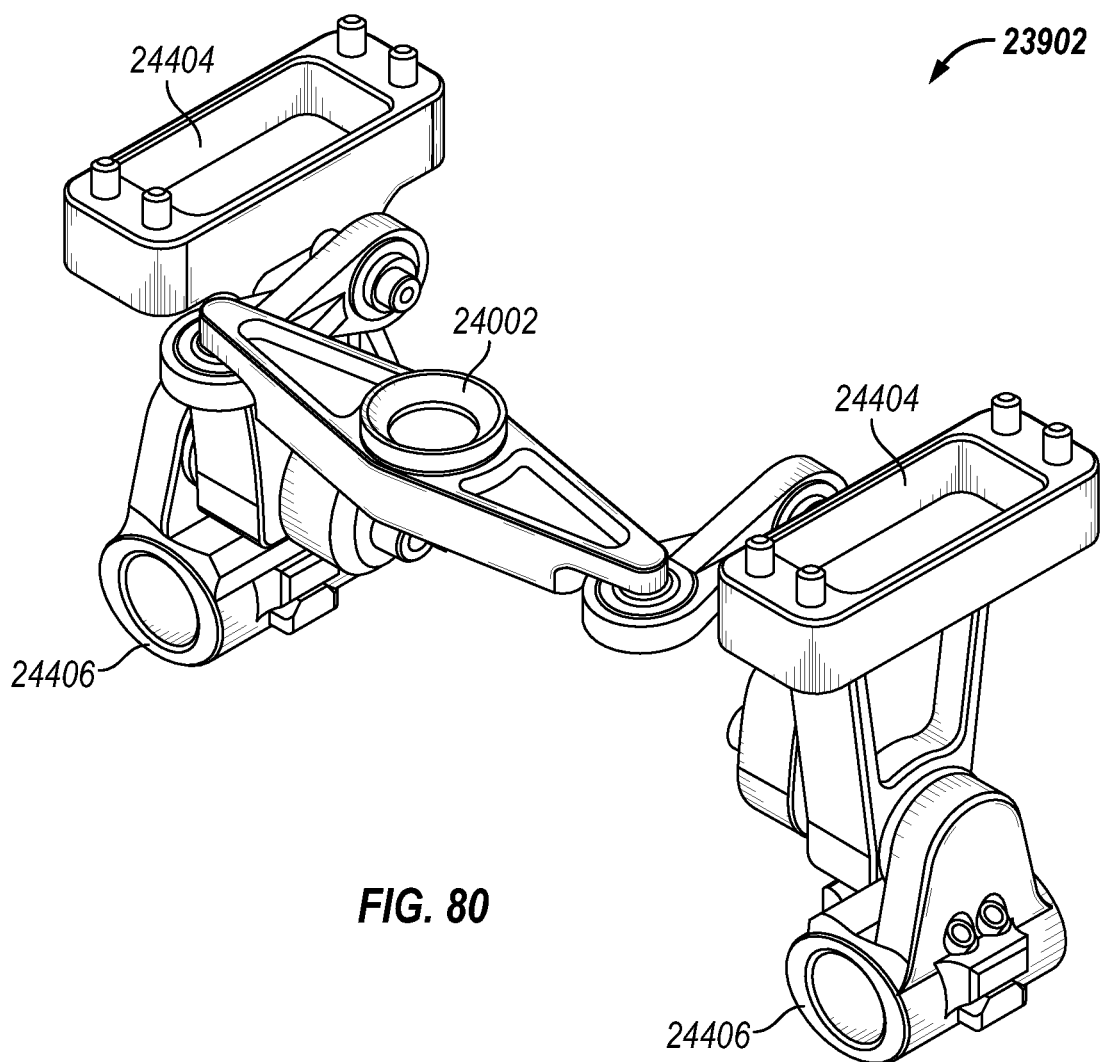
FIG. 80 depicts a drive module linkage.

Referring to FIG. 80, a drive module linking suspension 23902 is depicted. There may be a central pivot 24002 enabling drive modules 21704 on opposing sides of the housing 21702 to move up and down relative to one another. The drive module linking suspension includes a housing attachment mechanism 24404 and a drive module attachment mechanism 24406.

Figure 81:
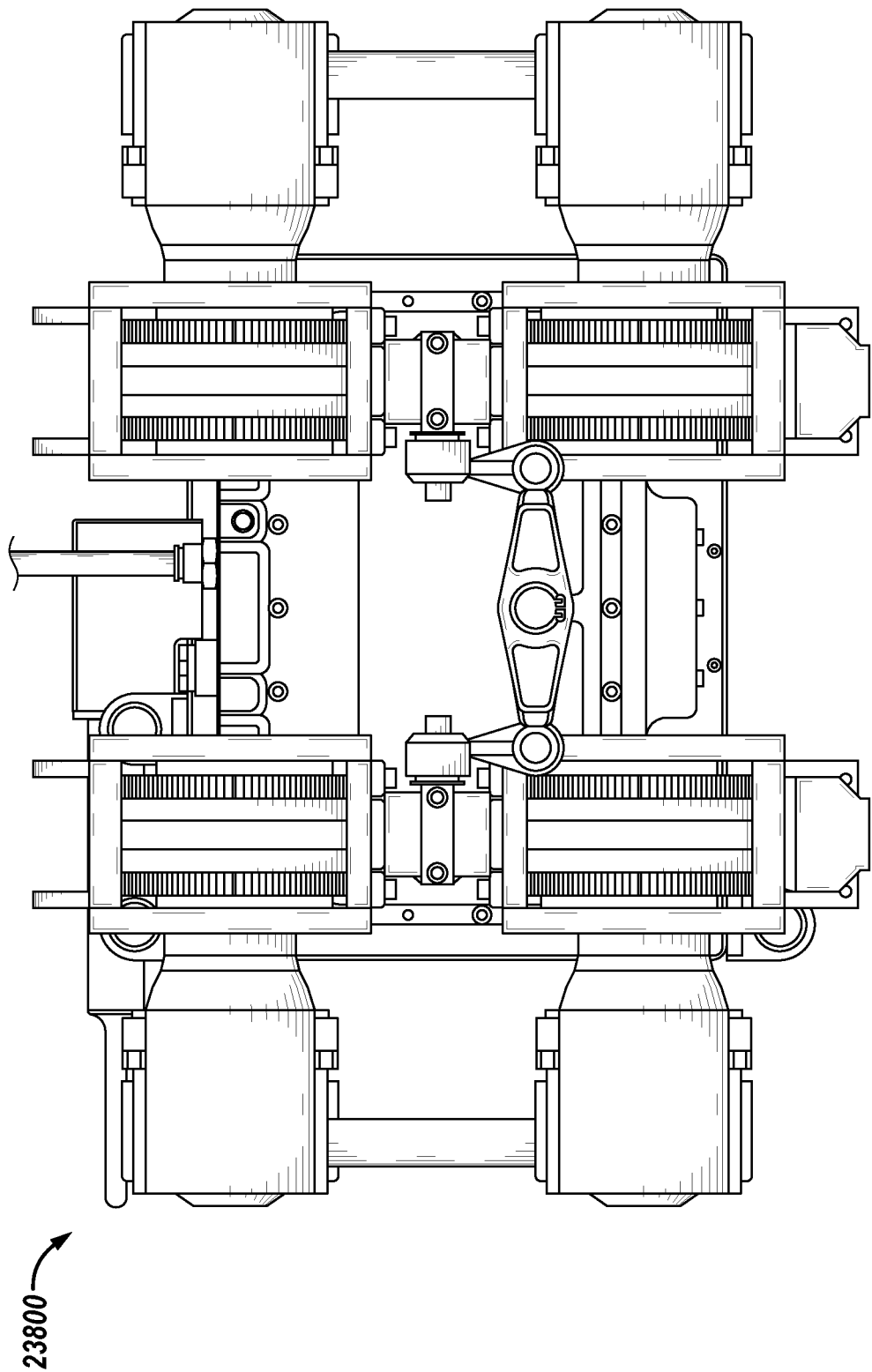
FIG. 81 depicts an example inspection robot.

Referring to FIG. 81, a bottom view of the inspection robot 21700 may be seen with the module linking suspension 23902.

Figure 82:
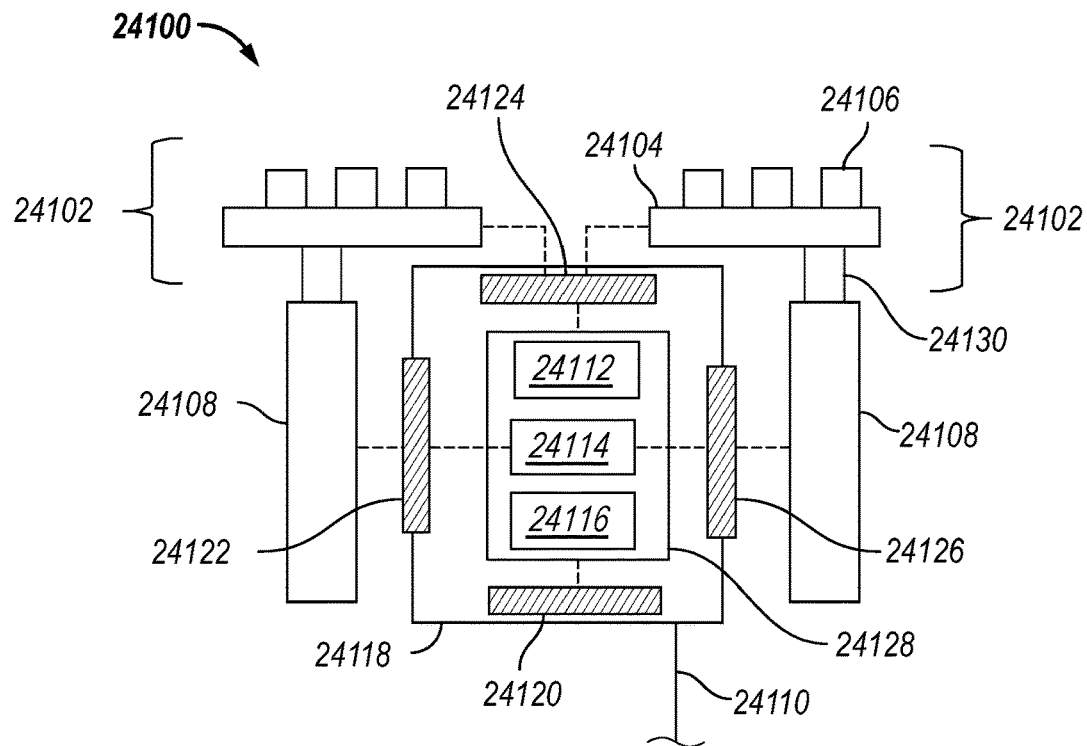
FIG. 82 depicts a schematic example electronic board.

Referencing FIG. 82, an example inspection robot 24100 is depicted schematically. The configuration of the example robot 24100, including arrangements of payloads, components, sensors, electronic boards, and the like, is a non-limiting example provided to illustrate certain arrangements and capabilities of an inspection robot 24100. Any other arrangements, components, or the like as set forth throughout the present disclosure may be utilized, in whole or part, with an inspection robot 24100, either in addition to, or as a full or partial replacement for, aspects depicted in FIG. 82. The example inspection robot 24100 includes a payload 24102 mounted to a housing 24118 of the inspection robot 24100. The example of FIG. 82 depicts the payload(s) 24102 mounted directly to drive modules 24108, which are mechanically coupled to the inspection robot 24100. In certain embodiments, the payload(s) 24102 may be mounted directly to the housing 24118, such as on a forward rail attached the housing 24118. Alternatively, as depicted in FIG. 82, the payload(s) 24102 may be mounted to the housing 24118 indirectly, such as via the drive module(s) 24108. In certain embodiments, one or more payloads may be mounted directly to the housing, and one or more other payloads may be indirectly mounted to the housing—for example with forward payloads mounted to the drive modules, and rearward payloads (not shown) mounted to a rail, mount point, or other configuration directly to the housing.

The example inspection robot 24100 includes the housing 24118 having removeable interface plate(s), for example with a forward removeable interface plate 24124, a rearward removeable interface plate 24120, and side removeable interface plates 24122, 24126. The example removeable interface plates 24120, 24122, 24124, 24126 are a non-limiting example of the number and positions of removeable interface plates that may be present. The example removeable interface plates 24120, 24122, 24124, 24126 are coupled to a target component on a first side of the removeable interface plate (e.g., to the drive module 24108 and/or payload 24102 in the example of FIG. 82), and coupled to an electronic board 24112, 24114, 24116 on a second side of the removeable interface plate. The example of FIG. 77 includes a first electronic board 24112 coupled to the removeable interface plate 24124 and the payloads 24102, a second electronic board 24114 coupled to the removeable interface plates 24122, 24126 and the drive modules 24108, and a third electronic board 24114 coupled to the removeable interface plate 24120, which is unused in the example of FIG. 82. The number and arrangement of electronic boards coupled to removeable interface plates is a non-limiting illustration. The electronic boards include an electrical communication configuration that is compatible with the coupled component(s), for example the payload(s) and/or drive module(s). Accordingly, the selection of the electronic board(s) may depend upon the electrical requirements of the coupled components (e.g., grounding, A/D processing, voltages, sensing requirements such as current sensing, etc.), the number and type of electrical interfaces (e.g., the number of I/O pins and/or the types of these), processing requirements to manage component communications (e.g., post-processing of sensor data, communication rates, etc.) and the available resources for a given electronic board (e.g., processing resources, communication resources, and/or memory resources). Accordingly, a given electronic board may support multiple components and be coupled to more than one interface (e.g., electronic board 24114 coupled to both removeable interface plates 24122, 24126) and/or components (e.g., electronic board 24114 coupled to both drive modules 24108, and/or electronic board 24112 coupled to both payloads 24102). In certain embodiments, for example relating to a payload 24102 having numerous high demand sensors 24106, more than one electronic board 24112, 24114, 24116 may be provided to support a given removeable interface plate 24120, 24122, 24124, 24126 and/or component of the inspection robot 24100. In the example of FIG. 82, the sensors 24106 are mounted on a rail 24104 of the payload 24102, and may further be mounted on sleds (not shown) or other devices configured to position the sensors 24106 to engage an inspection surface when the inspection robot 24100 is positioned on the inspection surface. Any configuration of a sensor 24106, rail 24104 or other sensor mounting mechanism, and/or payload 24102 as set forth in the present disclosure is contemplated herein. The electronic boards 24112, 24114, 24116, 24128 may each include, be formed of, and/or be positioned on a printed circuit board (PCB).

The payload(s) 24102 may have sensors 24106 mounted thereon, for example in any arrangement as set forth throughout the present disclosure. The sensors 24106 may be of any type, for example an ultrasonic (UT) sensor, an electromagnetic sensor of any type, a temperature sensor, a densitometer, a vibration sensor, an imaging sensor (e.g., a camera) which may be responsive in the visual spectrum or beyond the visual spectrum, and/or a pressure sensor. The sensor examples are non-limiting for purposes of illustration.

In certain embodiments, the components (e.g., payloads 24102 and/or drive modules 24108) are coupled through the removeable interface plates 24120, 24122, 24124, 24126, but may have additional coupling and/or support through other interfaces. For example and without limitation, mechanical coupling of the drive modules 24108 may be separate from the electrical coupling through the removeable interface plates 24120, 24122, 24124, 24126, or the electrical and/or mechanical coupling may be combined with the electrical coupling. In another example, couplant connections may be provided separately from the removeable interface plates 24120, 24122, 24124, 24126. For example, a couplant connection between the housing 24118 and the drive modules 24108 may be separate from the electrical and/or mechanical connections, such as depicted elsewhere in the present disclosure. Where the payloads 24102 includes sensors 24106 utilizing a couplant (e.g., as a part of the sensing operations, such as in a UT sensor, and/or for another reason such as providing cooling operations for the sensor 24106), the couplant may be provided to the payload 24102 from the housing (separate from the removeable interface plate), from the housing via the removeable interface plate, and/or from another component such as the drive module 24108.

The removable interface plates 24120, 24122, 24124, 24126 include an electrical coupling interface compatible with the component (e.g., payload 24102 and/or drive module 24108), including at least a number and type of connections, connector types, supporting electrical characteristics (e.g., component specifications of the removeable interface plate materials and connections, isolation, ground, EMI response, voltage rating, current rating, etc.), and/or supporting physical configuration (e.g., compatible material types; materials having appropriate resistance to vibration, temperature, and/or chemicals in the target environment; appropriate spacing and headroom for connectors, cable routing, etc.). An example removeable interface plate 24120, 24122, 24124, 24126 includes a high temperature plastic, for example as set forth throughout the present disclosure. An example removeable interface plate 24120, 24122, 24124, 24126 is coupled to the housing using a quick connect coupling, for example a coupling configured for operation without tools (e.g., a levered coupling, a screw with an enhanced diameter capable of operation without tools, etc.), and/or for operation with simple readily available tools (e.g., a hex wrench, screwdriver, etc.).

The utilization of removeable interface plates 24120, 24122, 24124, 24126 provides for a highly flexible configuration of the inspection robot, for example allowing an operator to readily swap payloads having a different sensing package and/or physical geometry of sensors, swapping drive modules having distinct characteristics (e.g., power capability, magnetic coupling force, mount types and/or mount positions, geometry arrangements of a motor and/or wheel), and/or replacing components that are degraded and/or failed. Additionally, the utilization of removeable interface plates 24120, 24122, 24124, 24126 allows for responsiveness in challenging environments, for example environments having high heat, vibration, enclosed spaces, and/or chemical exposure, where the conditions promote higher failure rates of components, and the inspection environments tend to be distant from available service facilities. Further, the challenges of the environments, for example with challenging conditions promoting degradation of facilities (e.g., a pipe wall that is a part of the inspection surface), combined with high uncertainty prior to inspection (e.g., with significant time passing between inspections, first-time inspections of a surface, and/or inspection of a surface that is in a low visibility area), provide challenges due to the likelihood that inspection conditions of the inspection surface are different from the estimated conditions when the inspection was planned. The high flexibility provided by the removable interface plates 24120, 24122, 24124, 24126, as well as other aspects of the present disclosure, greatly enhance the ability to manage these challenges, allowing the operator to rapidly configure the inspection robot 24100 for the actual conditions, and to respond to unexpected conditions found during the inspection.

An example electronic board 24112 includes an electrical processing configuration compatible with the payload 24102. For example, the electronic board 24112 may include communication resources sufficient to sample data from the sensor(s) 24106 at scheduled data rates, to perform low level processing such as A/D processing, filtering, de-bouncing, or the like, and/or processing and/or memory resources to perform planned processing of the sensor data, for example performing primary and/or secondary mode analysis of UT sensor data. In certain embodiments, the electronic board 24112 passes raw data to another component of the system, such as a data acquisition circuit, an external device, or the like. In certain embodiments, the electronic board 24112 provides some level of processing to the sensor data, and passes the processed data to another component of the system. In certain embodiments, the electronic board 24112 does a combination of these, for example processing data (e.g., for preliminary analysis, confirmation of inspection operations, confirmation that calibration settings are correct, etc.) while passing along the raw data (e.g., to allow deeper analysis on a more capable system, post-processing analysis, etc.), and/or a combination of these (e.g., processing some or all of the data, and passing along some or all of the raw data).

An example electronic board 24112 includes a dedicated board having a payload specific configuration, for example having an A/D processing configuration, a selected communication definition (e.g., sampling rates, data types, bit depth, etc.), a selected pre-processing definition (e.g., operations and/or characteristics of processing operations to be performed before data is passed along to another component), a selected payload identification definition (e.g., payload types supported, payload versions supported, including hardware versions, sensor versions, software versions related to the payload, and/or a unique identifier for the payload—for example allowing the electronic board to ensure that the coupled payload is compatible with the board, including electrically compatible, algorithmically compatible, and/or physically compatible), and/or a selected payload diagnostic definition (e.g., confirming that planned or required diagnostics are available, that specific diagnostic algorithms are being performed, that a diagnostic version is up-to-date or sufficient, and/or ensuring that a diagnostic is available for specified components). The example electronic board 24112 is further releasably mounted to a main board 24128 positioned within the housing. Releasably mounted to the main board 24128 includes direct mounting to the main board 24128, for example engaging a slot of the main board, a dedicated interface built onto the main board to engage the electronic board 24112, or the like. Additionally, or alternatively, mounted to the main board 24128 can include interfacing through an intermediate board, bus, or the like (not shown), for example coupling to an intermediate board that is coupled to the main board 24128, where the intermediate board supports a range of available electronic boards 24112.

The utilization of a dedicated electronic board 24112 allows for the support of highly complex payloads 24102 and/or drive modules 24108, which can require significant customization to support a high number of sensors that provide specialized and high rate data, while maintaining the flexibility of the inspection robot 24100 by providing a convenient package of support that can be removed or replaced without interfering with the rest of the inspection robot 24100 system. In certain embodiments, a dedicated electronic board 24112 is one that supports a specific component (e.g., a single, unique payload) and/or a class of components (e.g., a group of equivalent or similar payloads, such as with matching sensor arrangements and/or software, with closely related sensor arrangements and/or software, etc.).

In certain embodiments, swapping a payload and/or drive module ("component swap") herein includes performing the component swap without changing the removeable interface plate and/or electronic board, where the removeable interface plate and/or electronic board are compatible with the swapped component. In certain embodiments, performing the component swap includes changing the removeable interface plate without changing the electronic board. In certain embodiments, performing the component swap includes changing the electronic board without changing the removeable interface plate. In certain embodiments, performing the component swap includes changing the electronic board and the removeable interface plate. In certain embodiments, a change to the electronic board includes performing one or more of: changing a calibration on the electronic board (e.g., writeable parameters to configure operations of the electronic board, which are generally below the level of a version update to control operations); changing an algorithm version on the electronic board (e.g., updating instructions stored in a computer readable medium on the controller, for example as a version update and/or alternate algorithm according to the characteristics of the swapped component); and/or physically swapping out the electronic board (e.g., disengaging the electronic board from the main board, and inserting a different electronic board, such as a dedicated board for the swapped component).

The example inspection robot 24100 includes a tether 24110, for example providing power, communications, couplant, etc. from a base station (not shown), for example attended by an operator performing inspection operations. The presence of the tether 24110, and the composition of the tether 24110, are a non-limiting example for purposes of illustration. The tether 24110 may have any characteristics as set forth throughout the present disclosure.

Figure 86:
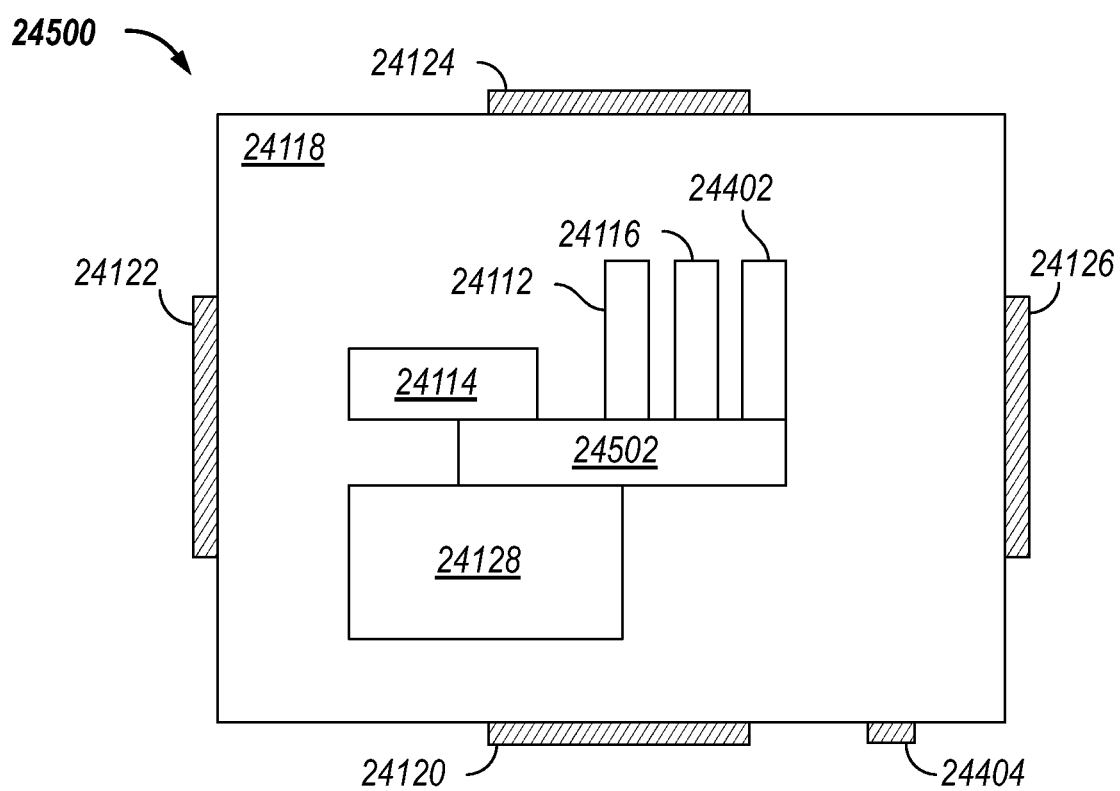
FIG. 86 depicts a controller schematic.

Referencing FIG. 82, an example electronic board 24112 is depicted, having a number of circuits configured to functionally execute operations of the electronic board 24112. The electronic board 24112 is depicted for illustration, but the example of FIG. 86 is applicable to any electronic board (e.g., 24112, 24114, 24116, and/or main board 24128), controller, circuit, etc. as set forth herein. The example electronic board 24112 includes a payload interface circuit 24202 that interprets payload signals 24210 from the payload—for example from sensors of the payload and/or other active components of the payload, and further in response to the payload specific configuration 24212 (e.g., specifying information about how the payload signals 24210 are to be processed, interpreted, sampled, etc.). The example electronic board 24112 further includes a data distribution circuit 24204 that communicates data values 24214 representative of data collected from the sensor(s) 24106 to an external device 24208 in response to the payload signals 24210. The data values 24214 may include one or more of: raw data (e.g., direct information supplied by the sensor 24106, such as voltages, current values, temperatures, etc.); sensor-processed data (e.g., low level determinations made by the sensor, such as a temperature, indicated wall thickness, response time value, etc.); diagnostic and/or fault code data; and/or status data (e.g., ON/OFF, operational state, etc.). An external device 24208, as used herein, references any one or more of: a device external to the inspection robot 24100, and/or a device external to a system including the inspection robot 24100, a device external to the electronic board 24112. Example and non-limiting external devices 24208 include one or more of: the tether 24110 (e.g., communicatively coupled to a further device, such as a base station computer); a computing device communicatively coupled to the inspection robot 24100 (e.g., a base station computer; a facility computer such as one associated with an industrial system including the inspection surface; a mobile device such as an operator's mobile phone or tablet; a wirelessly connected device; a cloud server and/or computing device; a web portal; and/or a cloud application). In certain embodiments, the communications of the data distribution circuit 24204 are responsive to the payload specific configuration 24212, for example defining processing to be performed to determine the data values 24214, communication rates, buffering information, etc.

An example electronic board 24112 further includes a payload status circuit 24206 that provides a payload identification value 24216 in response to the payload specific configuration 24212 and/or in response to the payload signals 24210. The payload identification value 24216 provides for a determination of which payload is presently on the inspection robot 24100, which sensors are mounted thereon, which versions of control algorithms are installed, which versions of diagnostic algorithms are installed, and the like. In certain embodiments, the payload identification value 24216 identifies the payload uniquely—for example, the specific hardware component that is installed. In certain embodiments, the payload identification value 24216 identifies the payload by functional equivalence, for example sensors and/or supporting algorithms that provide a given capability, and that define processing, diagnostics, data labeling, data formatting, and the like. In certain embodiments, the payload identification value 24216 identifies the payload at a high level, for example a payload having imaging capability, UT sensing, EMI sensing, laser profiling, or the like. The content of the payload identification value 24216 may vary with the purpose of the identification, including for example: where the identification is used for informal operator support (e.g., ensuring the correct configuration of the inspection robot 24100); to meet an inspection certification requirement (e.g., providing object evidence that the inspection was performed properly, with proper algorithm versions, diagnostic versions, sensor versions, calibration versions, etc.); to support iterative improvement operations (e.g., supporting post-analysis to determine which sensor configurations have provided superior inspection results, to diagnose problems determined later in the data and/or from practical experience following inspections, etc.); and/or to track utilization of specific components (e.g., total operating time for a particular sensor, linking incidents to specific components such as components that have experienced a high temperature, collision with an obstacle, etc.). In certain embodiments, a payload identification value 24216 includes one or more of: a unique payload identifier, a payload calibration value, and/or a payload type value. In certain embodiments, a component identification value includes one or more of: a unique component identifier, a component calibration value, and/or a component type value. In certain embodiments, for example where the component is a sensor, an example component identification value includes one or more of: a unique sensor identifier, a sensor calibration value, and/or a sensor type value.

Figure 83:
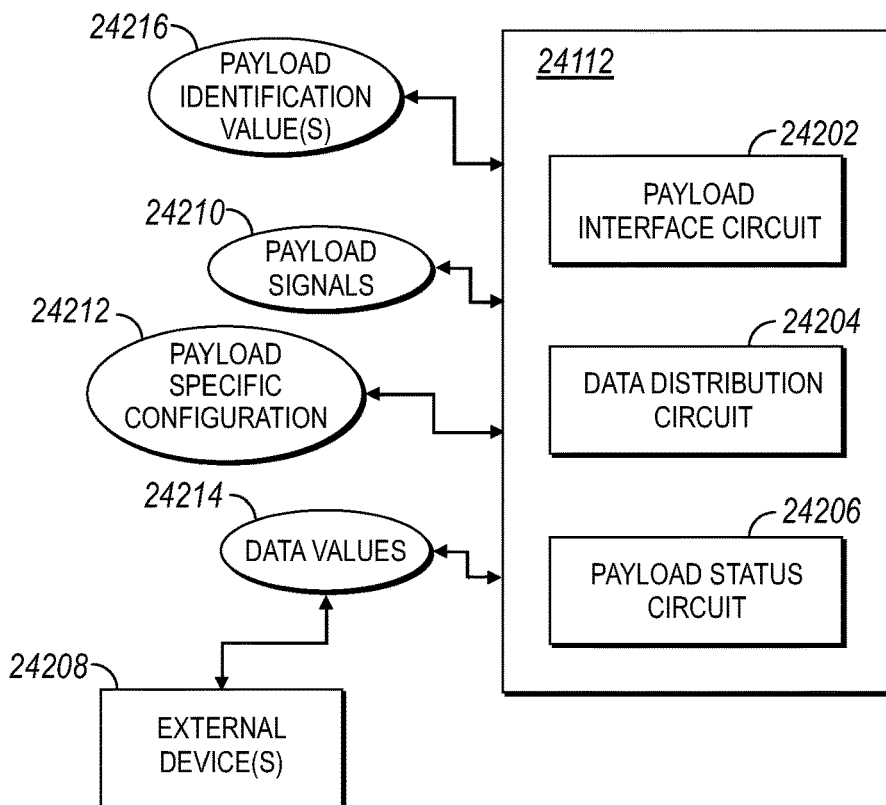
FIG. 83 depicts example electronic board

The example of FIG. 83 is provided in the context of a payload identification value 24216 for clarity of illustration. Additionally, or alternatively, any component of the inspection robot may be identified, including unique, functional equivalence, and/or high level identification. In certain embodiments, a payload identification value 24216 may be referenced herein as a component identification value. Example and non-limiting components where an identification value may be determined include at least one or more of, without limitation: a drive module identification value; a drive motor identification value; a sensor associated with any other component (e.g., a drive module, encoder, housing, couplant flow path, payload hardware, electrical connectors, actuators, the tether, a data acquisition circuit, an electronic board, a sled of the payload, and/or a wheel of the drive module, etc.). The identification operations of the electronic board 24112 may be performed by any circuit, controller, board, or the like as described throughout the present disclosure, and may be performed in relation to any component of an inspection robot 24100 and/or system including an inspection robot 24100.

With further reference to FIG. 82, an example inspection robot 24100 includes a housing 24118, defining an interface opening (e.g., where removeable interface plate 24124 is engaged), the housing including a mount (and/or a drive module coupled to the housing including the mount 24130). The example system includes a first payload 24102 having a sensor 24106 mounted thereon, where the first payload is configured to selectively couple to the mount 24130. The example system includes a second payload 24102 having a sensor 24106 mounted thereon, where the second payload is configured to selectively couple to the mount 24130. The first and second payloads may be payloads with different sensor packages, arrangements of the sensors on the payloads, and/or payloads with distinct characteristics (e.g., sled shapes, sled materials, shaped for different inspection surface shapes, etc.). In certain embodiments, the first and second payloads are functionally equivalent, for example with one of the payloads serving as a backup payload, for example in the event of a failure of the first payload. The example system includes a first removeable interface plate 24124 configured to mount over the interface opening of the housing 24118, the first removeable interface plate 24124 having an I/O interface (e.g., connections, pin arrangements and/or pin types, grounding, isolation, etc. as set forth throughout the present disclosure) compatible with the first payload on a first side, and a first electrical interface on a second side (e.g., compatible to couple with an electronic board 24112). The example system includes a second removeable interface plate 24124 configured to mount over the interface opening of the housing 24118, the second removeable interface plate 24124 having an I/O interface compatible with the second payload on a first side, and a second electrical interface on a second side (e.g., compatible to couple with an electronic board 24112). The first electrical interface and the second electrical interface may be the same or distinct (e.g., a single board 24112 that is compatible with, and/or configurable to be compatible with, both the first payload and the second payload, where the payloads can be swapped without changing the physical board, and/or where separate boards 24112 are used for corresponding payloads). An example system includes an electronic board 24112 compatible with both of the first electrical interface and the second electrical interface. An example system includes the electronic board 24112 (or boards) configured to mount on a payload support location of the main board 24128—for example at a location associated with the opening dedicated for payload support, at a location of the main board dedicated for payload support, on a slot provided for a payload board, etc.).

An example electronic board 24112 includes a payload interface circuit 24202 that interprets signals from the first payload in response to a first payload specific configuration, and that interprets signals from the second payload in response to a second payload specific configuration. In certain embodiments, multiple payload specific configurations are stored on the board 24112 (and/or otherwise accessible to the payload interface circuit 24202), and the payload interface circuit 24202 utilizes an identification of the payload to determine which payload specific configuration to utilize for interpreting signals from the payload. In certain embodiments, the payload specific configuration for the payload is installed on the board (or other accessible area to the payload interface circuit 24202) when the payload is swapped, and the payload interface circuit 24202 either utilizes the installed payload specific configuration, and/or utilizes an identification of the payload to confirm that an installed payload specific configuration is a correct one.

Figure 84:
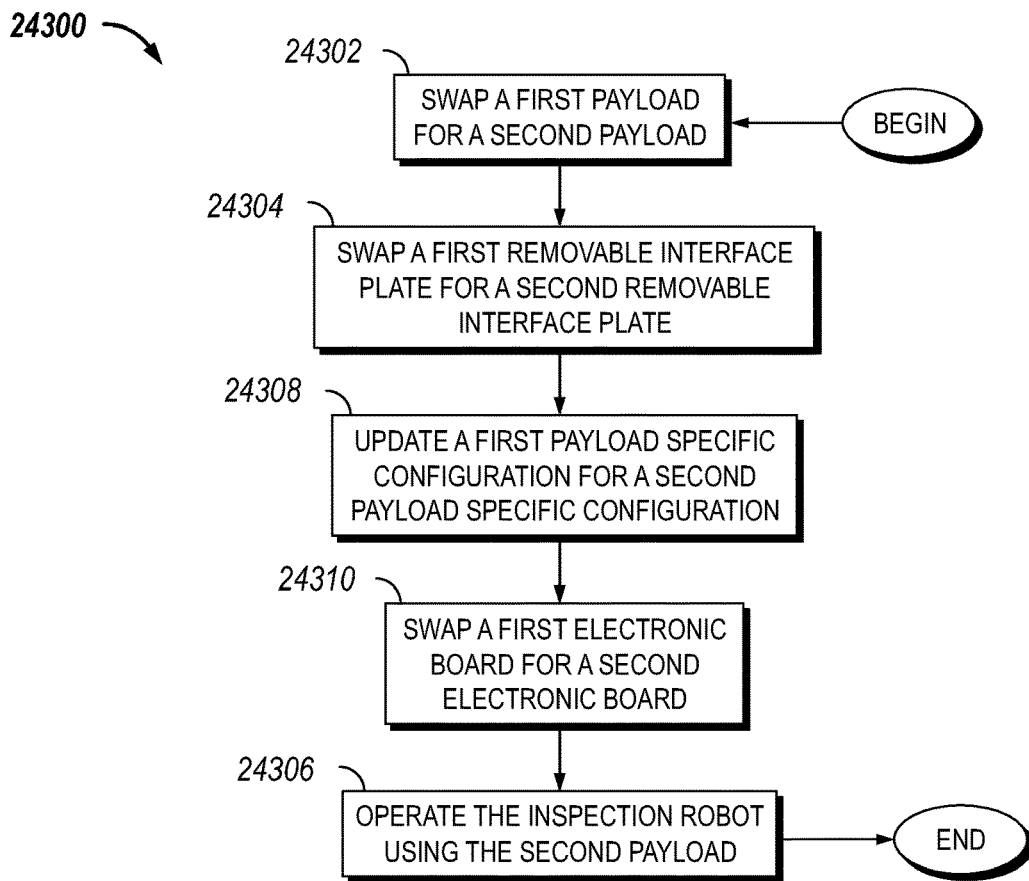
FIG. 84 depicts a schematic of an inspection robot.

Referencing FIG. 84, an example procedure 24300 for rapid configuration of an inspection robot is schematically depicted. The example procedure 24300 includes an operation 24302 to swap a first payload of an inspection robot to a second payload of the inspection robot. The first payload includes a first sensor package, and the second payload includes a second sensor package that is distinct in some aspect from the first sensor package. Example distinctions include one or more of: different sensor types; a different sensor count; a different electrical interface to the sensors; a different couplant requirement for the sensors; and/or a different calibration value for the sensors. The example procedure 24300 further includes an operation 24304 to swap a first removeable interface plate mounted on a housing of the inspection robot over an opening, to a second removeable interface plate mounted on the housing of the inspection robot over the opening. The first removeable interface plate includes an I/O interface compatible with the first payload, and the second removeable interface plate includes an I/O interface compatible with the second payload. In the example procedure, the removeable interface plate is swapped, providing for a rapid change between payloads having different electrical interface requirements (e.g., number of cables, type of connectors, different electrical characteristics for the electrical coupling, etc.). In certain embodiments, the removeable interface plate is not swapped, for example where a single interface plate is compatible with both payloads. In certain embodiments, the payloads are functionally identical—for example having the same number of sensors, sensory types, and/or sensor calibrations. In certain embodiments, the swap may be performed in response to a fault condition for a sensor, a mechanical failure to a payload (e.g., a failed sled, coupling arm, damaged component, etc.), to confirm that inspection data is correct (e.g., testing at last a section of the inspection surface with another similar sensor package), and/or to manage wear of components (e.g., to limit utilization of a payload, and/or to even out utilization between payloads).

An example procedure 24300 further includes an operation 24308 to update a first payload specific configuration of a payload interface circuit to a second payload specific configuration, for example where the first and second payloads utilize distinct payload specific configurations. The payload specific configurations, without limitation to any other aspect of the present disclosure, include an electrical interface description for each corresponding payload. An example procedure 24300 further includes an operation 24310 to swap a first electronic board, compatible with a first electrical interface of the first payload, to a second electronic board, compatible with a second electrical interface of the second payload. The example procedure 24300 further includes an operation 24306 to operate the inspection robot to interrogate at least a portion of the inspection surface with the second payload.

Figure 85:
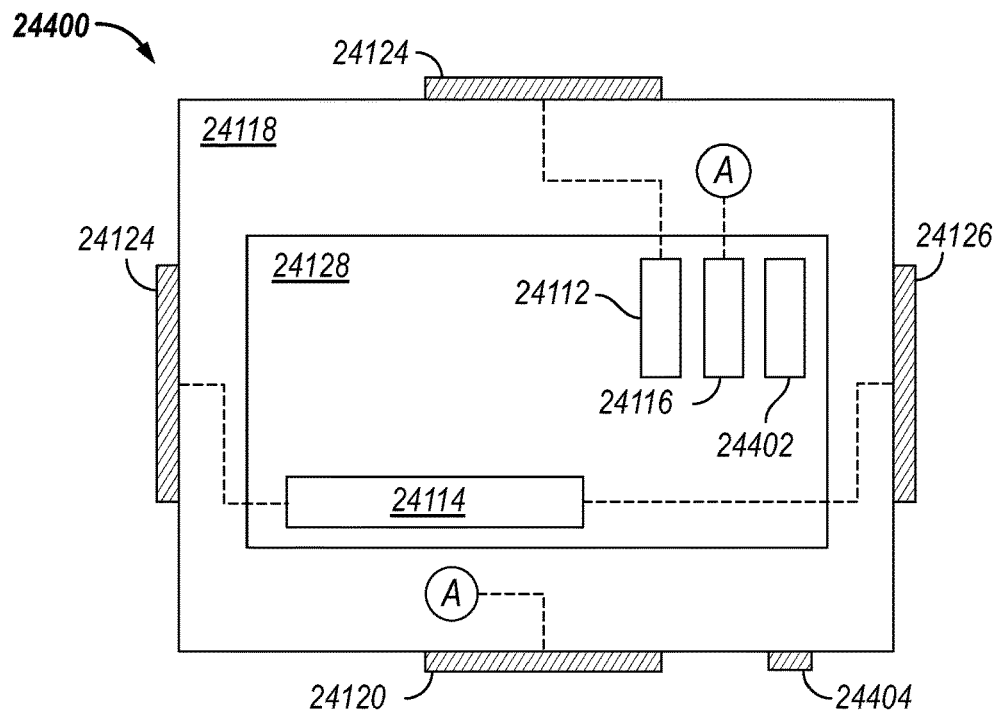
FIG. 85 depicts a schematic of an inspection robot.

Referencing FIG. 85, an example inspection robot 24400 includes a housing 24118, a payload interface (e.g., openings and/or removeable interface plates 24124, 24120), a tether interface 24405, and a drive module interface (e.g., openings and/or removeable interface plates 24122, 24126). The example of FIG. 85 describes certain openings and/or removeable interface plates as associated with the payload, tether, and/or drive modules for clarity of the description. However, in certain embodiments any opening and/or removeable interface plate can be utilized for any one of the components of the inspection robot 24400. The payload interface, tether interface, and/or drive module interface may be defined upon installation of the appropriate components, and/or defined within the housing—for example coupling a payload electronic board to the removeable interface plate where the payload is electrically coupled, and/or coupling a drive module electronic board to the removeable interface plate where the drive module is electrically coupled. In the example of FIG. 85, electronic board 24112 services the payload interface, electronic board 24116 services the rearward removeable interface plate (e.g., where a second payload and/or payloads may be mounted), and the electronic board 24114 services two drive modules, one on each side of the inspection robot 24400 in the example (e.g., reference FIG. 81). In the example of FIG. 85, the electronic board 24402 may be an open slot, for example to be utilized when the configuration of the inspection robot 24400 requires an additional board, a board dedicated to servicing the tether interface 24405, or an extra board utilized to allow the utilization of additional payload(s) without installing a board—for example where the electronic board 24112 is configured to service a first type of payload, and the additional board 24402 is configured to service a second type of payload. The coupling between boards 24112, 24114, 24116 is a non-limiting example. In a given embodiment, any board 24112, 24114, 24116 may service any electrical interface, and in certain embodiments the electrical coupling between boards 24112, 24114, 24116 and interfaces may be configurable (e.g., utilizing solid state switches or any other re-configuration arrangement). In certain embodiments, the tether interface 24405 is serviced by a main board 24128, or another board (not shown) that may be removeable or not.

In certain embodiments, a first electronic board (e.g., board 24402, the main board 24128, a tether dedicated board, or a board wirelessly connected to a base station and/or a computing device remote from the robot) includes a primary functionality circuit communicatively coupled to a base station through either a tether interface 24405 or coupled wirelessly to the base station or computing device remote from the robot. The example primary functionality circuit performs operations such as: communication operations with the base station; receives and configures (and/or instructs the configuration) power from the base station (e.g., providing a selected voltage to components of the inspection robot, converting power between AC/DC, and/or confirming that power coupling is properly connected), if the board is connected by tether to the base station; sends data to the base station; receives instructions from the base station; and/or provides couplant related communications (e.g., requesting flow rates, turning on or off couplant flow, and/or receiving couplant information such as temperature, composition, etc.). In certain embodiments, the primary functionality circuit performs operations to update calibrations, algorithms (e.g., control and/or diagnostic algorithms), firmware, or the like for various boards, circuits, sensors, and/or actuators throughout the inspection robot 24400. The described operations of the primary functionality circuit are a non-limiting example.

In certain embodiments, a second electronic board (e.g., board 24112) is operationally coupled to the payload interface, where the second electronic board includes a payload functionality circuit that is communicatively coupled to a selected payload through the payload interface. Example operations of the payload functionality circuit include operations such as: confirming the presence and/or identification of the payload; providing commands to the payload; receiving data from the payload; and/or configuring and/or processing electrical signals from the payload. The described operations of the payload functionality circuit are a non-limiting example.

In certain embodiments, a third electronic board (e.g., board 24114) includes a drive module functionality circuit communicatively coupled to a selected drive module through the drive module interface. In the example of FIG. 85, a single board 24114 is capable to operate both drive modules. In certain embodiments, each drive module may be controlled by a single board, but additionally or alternatively a board may be configured to operate any number of drive modules. Example operations of the drive module functionality circuit include operations such as: providing drive commands to the drive module(s); receiving status information from the drive module(s) (e.g., diagnostics, status values, rotational counts of a motor, temperature feedback, position feedback, etc.); providing couplant flow commands to the drive module(s) (e.g., where couplant is passed through the drive module as a part of a cooling circuit, where flow rates and/or flow paths are controllable at least in part through actuators such as valves, controllable restrictions, or the like); and/or providing any other commands or receiving any other data from the drive module(s). The described operations of the drive module functionality circuit are a non-limiting example.

In the example of FIG. 85, the boards 24112, 24116, 24402, 24114 are coupled to the main board 24128 through a slot coupling, allowing for a quick connect and disconnect from the main board 24128. Referencing FIG. 86, additionally or alternatively one or more of the boards 24112, 24116, 24402, 24114 are coupled to the main board 24128 through an intermediate coupling PCB 24502. The utilization of an intermediate coupling PCB 24502 allows for quick connection of the boards 24112, 24116, 24402, 24114 with a lower likelihood of disturbing the main board 24128, and further allows for the intermediate coupling PCB 24502 to have mechanical support dedicated to improve the robustness of the intermediate coupling PCB 24502 to the forces introduced with coupling and decoupling the boards 24112,

24116, 24402, 24114, improving the reliability of the inspection robot 24400 where board changes are performed in less than ideal conditions, such as those which may be experienced in the field at a facility having the inspection surface. In certain embodiments, some boards 24112, 24116, 24402, 24114 may be coupled directly to the main board 24128, while other boards 24112, 24116, 24402, 24114 may be coupled to an intermediate coupling PCB 24502. For example, boards that are more likely to be frequently changed out (e.g., payload boards) may be coupled to an intermediate coupling PCB 24502, while other boards that are more likely to be retained for extended periods (e.g., a drive module board and/or a tether board) may be coupled to the main board 24128. The connection of the boards 24112, 24116, 24402, 24114 to the interfaces (e.g., payload, drive module, tether, etc.) are omitted in FIG. 86 for clarity of the depiction.

An example inspection robot 24400 includes a payload board (e.g., 24112) having a first payload interface circuit, and another board (e.g., a separate board associated with a second payload) having a second payload interface circuit, where the inspection robot 24400 utilizes a first payload in response to the first payload interface circuit mounted in the housing (e.g., where board 24112 is mounted in the housing), and utilizes a second payload in response to the second payload interface circuit mounted in the housing (e.g., where the separate board associated with the second payload). The example configuration allows for automatically changing inspection operations in response to a payload swap, for example where the boards are swapped with the payload. Additionally, or alternatively, the example configuration allows for switching which payload is utilized, for example where both payloads are mounted on the inspection robot, where a swap of the boards (e.g., from the payload board to the separate board) automatically changes inspection operations from the other payload. In the example, the second payload interface circuit is described on a separate board. In certain embodiments, the second payload interface circuit may be embodied, at least in part, as computer readable instructions stored on a computer readable medium, where positioning the second payload interface circuit on the inspection robot may be performed by adding or replacing instructions on the payload board, for example by adding or over-writing instructions positioned on the payload board with instructions implementing the second payload interface circuit.

An example inspection robot 24400, 24500 includes a generalized payload coupling circuit, for example where slots of the main board 24128 and/or the intermediate coupling PCB 24502 are configured for receiving a payload board. For example, boards to support payloads may have distinct characteristics (e.g., I/O requirements, power regulation, types of I/O such as frequency inputs, current inputs, voltage inputs, etc.) relative to other board types (e.g., drive boards and/or drive module boards, tether boards, etc.). The utilization of generalized slots of particular types, including payload types, may provide for greater efficiency (e.g., lower overall board support component requirements, reduced algorithmic support for I/O flexibility, etc.), and/or allow for greater flexibility (e g, limiting support for certain slots to payload types may allow for accommodating a greater range of payload types relative to a slot configured to accept any type of board coupled to the slot). In certain embodiments, one or more slots may be a generalized drive module coupling circuit, for example where slots of the main board 24128 and/or the intermediate coupling PCB 24502 are configured for receiving a drive module board.

An example inspection robot 24400, 24500 utilizes a first payload calibration set in response to the first payload interface circuit mounted in the housing, and to utilize a second payload calibration set in response to the second payload interface circuit mounted in the housing. An example inspection robot 24400, 24500 utilizes a first payload instruction set in response to the first payload interface circuit mounted in the housing, and to utilize a second payload instruction set in response to the second payload interface circuit mounted in the housing. An example inspection robot 24400, 24500 utilizes a first drive module calibration set in response to a first drive module interface circuit being positioned in the housing, an utilizes a second drive module calibration set in response to a second drive module interface circuit being positioned in the housing. An example inspection robot 24400, 24500 utilizes a first drive module instruction set in response to a first drive module interface circuit being positioned in the housing, and utilizes a second drive module instruction set in response to a second drive module interface circuit being positioned in the housing.

In certain embodiments, one or more boards 24112, 24116, 24402, 24114 include indicator light(s), for example which may be visible through a transparent portion of the housing (e.g., a transparent top cover), whereby changing a board changes the available indicator lights. In certain embodiments, one or more indicator lights may be positioned on the housing, and electrically coupled to a board and/or the main board 24128. The indicator lights allow the inspection robot to display information visually available to an operator, for example a status of the inspection robot, an indication that inspection operations are being performed, and indication of the movement and/or direction of movement of the inspection robot, diagnostic information, or the like. In certain embodiments, indicator information may be provided to a base station, allowing the operator to confirm proper operations of the inspection robot using a computing device such as a laptop on the location. The addition of physical indicator lights on the inspection robot allows for the operator to confirm operations while in visual range of the inspection robot, for example when away from the base station. In certain embodiments, the first payload interface circuit includes a first indicator light configuration (e.g., configured for the payload associated with the first payload interface circuit), and the second payload interface circuit includes a second indicator light configuration (e.g., configured for the payload associated with the second payload interface circuit). In certain embodiments, the first drive module interface circuit includes a first indicator light configuration (e.g., configured for the drive module associated with the first drive module interface circuit), and a second drive module interface circuit includes a second indicator light configuration (e.g., configured for the drive module associated with the second drive module interface circuit). The inclusion of the indicator lights directly on a given board allows for the customization of the lights for the particular board, and reduces the complexity of electrically coupling the lights and/or providing communications through an intermediate device such as the main board. The inclusion of the indicator lights on the housing of the inspection robot allows for a consistent depiction interface, allows for a more robust configuration of the lights (e.g., more expensive and/or higher powered lights), and/or improves the visibility of the indicator lights by being positioned at a selected location on the outside of the housing.

An example inspection robot includes a payload board having a payload interface circuit and configured to operate the payload interface in response to a payload configuration value. Example and non-limiting payload configuration values include one or more of a payload calibration set (e.g., sensor calibrations to be utilized with the payload, for example UT cutoff times, sensor scaling values, sensor operating ranges, sensor diagnostic ranges, payload downforce values to be applied, etc.), an electrical interface description (e.g., A/D processing, voltage ranges, current ranges, bitmap values, reserved electrical diagnostic ranges, PWM parameters, etc.), and/or a payload instruction set (e.g., operating instructions, communication values or descriptions, system responses to obstacles, detected features, diagnostic or other feature enable or disable instructions, etc.). An example inspection robot includes a board (e.g., the main board and/or a tether board) having an inspection robot configuration circuit that updates the payload configuration value in response to communications received at the tether interface (e.g., instructions received from the base station) and/or communications received at a wireless communication interface (e.g., instructions received via WiFi, Bluetooth, cellular, or other wireless communication procedure). For example, an operator at the location and/or a remote operator may provide updates to the payload configuration value, which can be implemented without swapping a board, payload, or other device on the inspection robot.

An example inspection robot includes a drive board having a drive module interface circuit configured to operate the drive module interface in response to a drive module configuration value. Example and non-limiting drive module configuration values include one or more of: a drive module calibration set; an electrical interface description, and/or a drive module instruction set. An example inspection robot includes a board (e.g., the main board and/or a tether board) that updates the drive module configuration value in response to communications received at the tether interface and/or communications received at a wireless communication interface. For example, an operator at the location and/or a remote operator may provide updates to the drive module configuration value, which can be implemented without swapping a board, drive module, or other device on the inspection robot.

Figure 87:
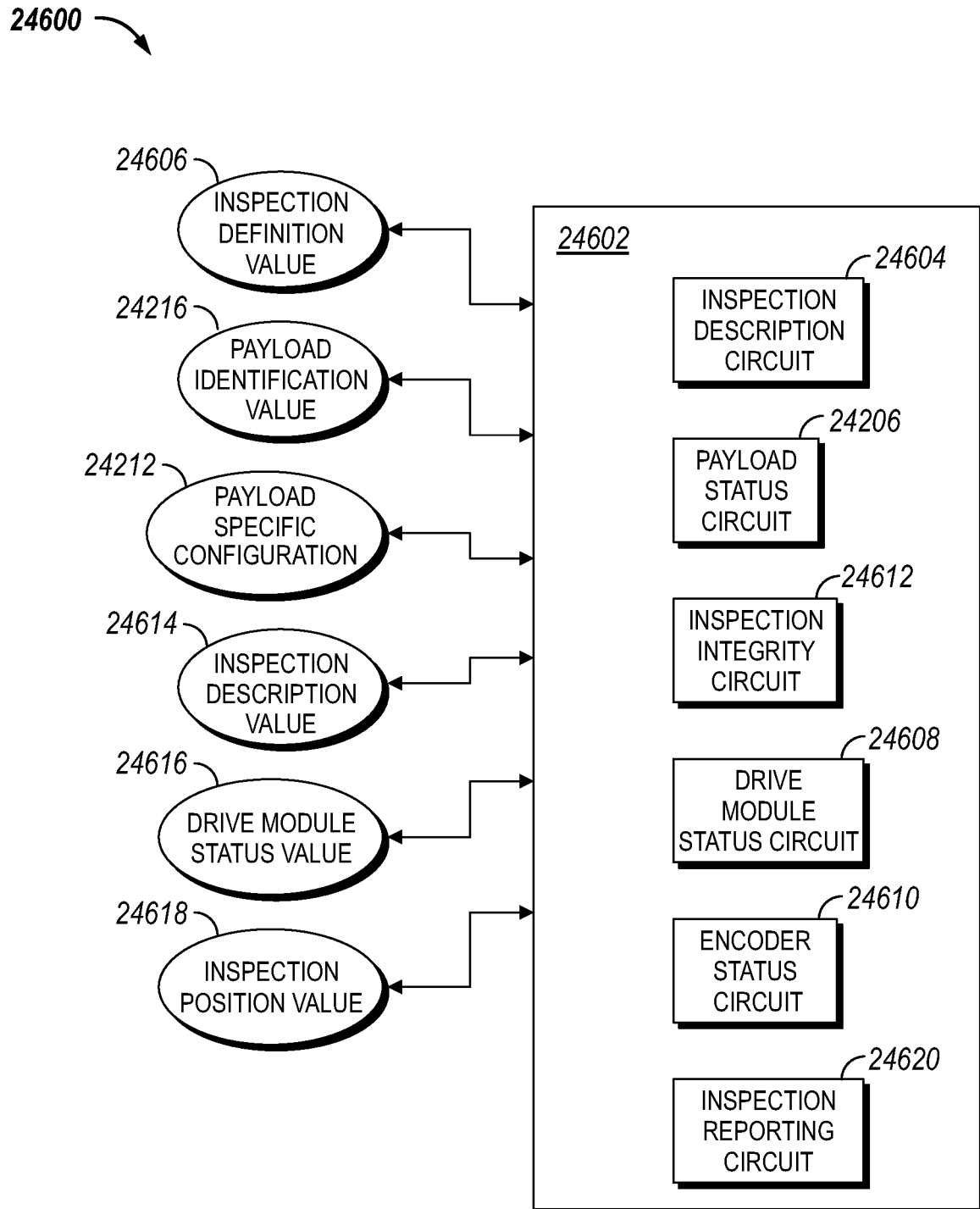
FIG. 87 depicts a schematic of a procedure for rapid configuration of an inspection robot.

Referencing FIG. 87, an example apparatus 24600 for performing confirmation operations associated with inspection operations is depicted schematically. The example apparatus 24600 includes a controller 24602 having a number of circuits configured to functionally execute operations of the controller 24602. The example controller 24602 includes an inspection description circuit 24604 that interprets and inspection definition value 24606, a payload status circuit 24206 that provides a payload identification value 24216 in response to a payload specific configuration 24212 and/or signals from a payload, an inspection integrity circuit 24612 that determines an inspection description value 24614 in response to the inspection definition value 24606 and the payload identification value 24216, and an inspection reporting circuit 24620 that communicates the inspection description value 24614 to an external device 24208. The controller 24602 may be included, in whole or part, on a board of the inspection robot, for example on a main board, the tether board, a payload board, and/or a drive board. In certain embodiments, the controller 24602 may be included on a separate board, such as a fiduciary implementation board. In certain embodiments, the controller 24602, including any circuits, memory values, computer readable instructions related thereto, or the like, may be updated via communications through the tether interface and/or wireless communication interface, and/or the controller 24602 may be updated through a swap of a related board and/or the fiduciary implementation board.

An example inspection definition value 24606 includes one or more of: a sensor type value (e.g., the sensor types and/or number of sensors to be used in the inspection operations, including potentially capability ranges, accuracy, precision, etc.); a sensor identifier (e.g., identifying specific sensors, sensor make and/or model, sensor hardware and/or software versions, part numbers, etc. to be used in the inspection operations); a sensor calibration value (e.g., actual calibration values, calibration ranges, calibration versions, etc. that are to be used in inspection operations); a sensor processing description (e.g., specific processing operations, requirements, criteria, etc. to be utilized in the inspection operations); an inspection resolution value (e.g., spacing on the inspection surface between interrogation points of the sensors or the like); and/or a sensor diagnostic value (e.g., diagnostic operations, diagnostic types, sensors to be diagnosed, etc., that are to be used in the inspection operations). The inspection definition value 24606 allows for a definition of inspection operations, configuration of the payload, areas of the inspection surface to be inspected and criteria for the inspection, and the like. The inspection definition value 24606 may be provided by a responsible party for the inspection surface (e.g., an owner or operator of a facility including the inspection surface), according to an industry standard, according to a regulatory requirement, according to a risk assessment, or the like. In certain embodiments, the inspection definition value 24606 sets forth the inspection criteria to be performed for the inspection to be considered to be properly executed.

An example controller 24602 includes a drive module status circuit 24608 that provides a drive module status value 24616 (e.g., providing position information for the inspection robot, inspection speeds, and/or confirmation that the drive module(s) are operating properly and/or providing reliable information), for example where the inspection definition value 24606 includes one or more of an inspection surface coverage value (e.g., defining regions of the inspection surface that are to be inspected, including inspection criteria for sub-regions of the inspection surface, positions of interest on the inspection surface, and/or confirming that inspection information is properly associated with position information on the inspection surface, etc.) and/or an inspection execution value (e.g., defining speed values of the inspection robot for regions of the inspection surface, for example to ensure that sufficient inspection resolution, proper interrogation of the surface by sensors of the payload, etc. are performed) related to the motive operation of the inspection robot. In a further example, the inspection integrity circuit 24612 further determines the inspection description value 24614 in response to the drive module status value 24616.

An example controller 24602 includes an encoder status circuit 24610 that provides an inspection position value 24618 (e.g., providing position information for the inspection robot, confirming inspection speeds and/or locations, and/or confirmation that the encoder is operating properly and/or providing reliable information). In certain embodiments, the encoder status circuit 24610 may further provide an encoder status value (not shown), for example confirming that the encoder is operating properly, is in contact with the inspection surface, does not have faults or errors that degrade the position information, or the like. In a further example, the inspection integrity circuit 24612 further determines the inspection description value 24614 in response to the inspection position value 24618 and/or the encoder status value.

In certain embodiments, the inspection definition value 24606 includes one or more of: an inspection certification value (e.g., criteria that are to be monitored and/or confirmed before, during, or after inspection operations; and/or an identifier for a certification to be completed, for example allowing the inspection description circuit 24604 to reference related information to determine a monitoring scheme to meet the certification); an inspection data integrity value (e.g., listing data to be monitored and/or confirmed, including related data providing evidence that primary inspection data is reliable, such as imaging data, active fault codes, diagnostic algorithm outputs, contact determinations for the encoder and/or payload, slip determinations for the inspection robot and/or wheels, or the like); a sensor diagnostic value (e.g., a fault code, diagnostic result, and/or output of a diagnostic algorithm for one or more sensors); a drive module diagnostic value; and/or an encoder diagnostic value. In certain embodiments, the inspection definition value 24606 includes one or more of: a calibration version value (e.g., versions of a calibration for a sensor, drive module, encoder, electronic board, or other component); a processing algorithm version value (e.g., a version of a processing algorithm utilized by a sensor, electronic board, or external device performing processing operations for sensor data); a diagnostic version value; and/or a control algorithm version value (e.g., for a control algorithm associated with the inspection operation, the inspection robot, a drive module, the encoder, a sensor, the payload, or other component). In certain embodiments, the inspection definition value 24606 includes one or more of: a sensing execution description (e.g., confirming that sensors are operational and/or collecting data; confirming that the inspection robot positioning was properly made including positions and/or speeds; and/or confirming that couplant delivery was properly performed); a motive operation execution description (e.g., confirming that motive operations were performed according to a schedule and/or sufficient to provide acceptable inspection operations, which may include a position map with the inspection data, maximum speeds, stop locations, or other supporting information); a data communication execution description (e.g., confirming that data communications were available and sufficient during operations, confirming that any buffered data was properly stored and recovered if data communications were interrupted, and/or confirming that communicated messages were properly received); a diagnostic execution description (e.g., confirming that required diagnostics were performed and active, and/or confirming that diagnostic algorithm results were acceptable); and/or a couplant delivery execution description (e.g., confirming that couplant was available and delivered acceptably to the sensors, and/or that couplant parameters such as temperature and composition were within acceptable parameters).

In certain embodiments, data responsive to the inspection definition value 24606 may be included as data, for example the inspection data and any supporting data as indicated by operations of the controller 24602. In certain embodiments, data responsive to the inspection definition value 24606 may be included as metadata with the inspection data, in a header or other associated information with the inspection data, in an inspection report prepared and responsive to the confirmation operations and/or certification of the inspection.

Without limitation to any other aspect of the present disclosure, example external devices 24208 for communication by the inspection integrity circuit 24612 include one or more of: a base station computing device; a facility computing device; a computing device communicatively coupled to the inspection robot; a data acquisition circuit positioned within the housing of the inspection robot; a data acquisition circuit communicatively coupled to the inspection robot; and/or a cloud based computing device communicatively coupled to the inspection robot.

Figure 88:
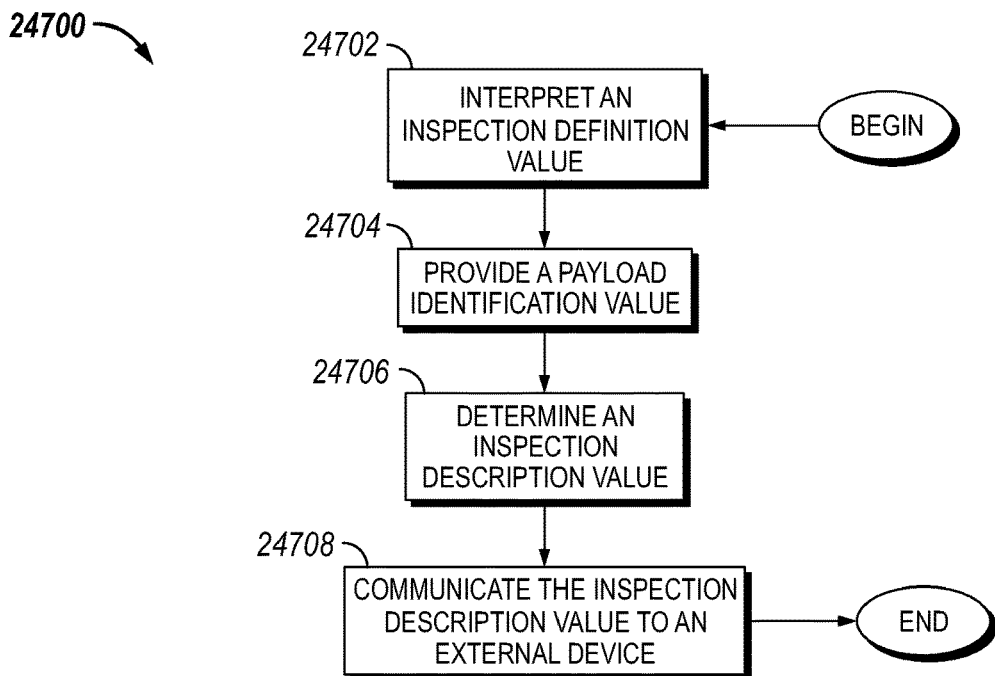
FIG. 88 depicts a schematic of a procedure for confirming operations associated with inspection operations.

Referencing FIG. 88, an example procedure 24700 for confirming operations associated with inspection operations is schematically depicted. The example procedure 24700 includes an operation 24702 to interpret an inspection definition value, and an operation 24704 to provide a payload identification value in response to at least one of a payload specific configuration or signals from a payload. An example operation 24704 includes determining an identity of the payload and/or sensors of the payload, for example using a specific identifier, part numbers, header information from messages from the payload, or the like. In certain embodiments, operation 24704 includes identifying the payload and/or sensor information (e.g., sensor precision, information type provided, etc.) from signals provided by the payload (e.g., using a heuristic, expert system, and/or comparing sensor messages to expected messaging formats, estimated values, etc.). The example procedure 24700 includes an operation 24706 to determine an inspection description value (e.g., values confirming that the inspection definition value has been met, and/or areas where inspection operations did not meet the inspection definition value) in response to the inspection definition value and the payload identification value, and an operation 24708 to communicate the inspection description value to an external device.

Figure 89:
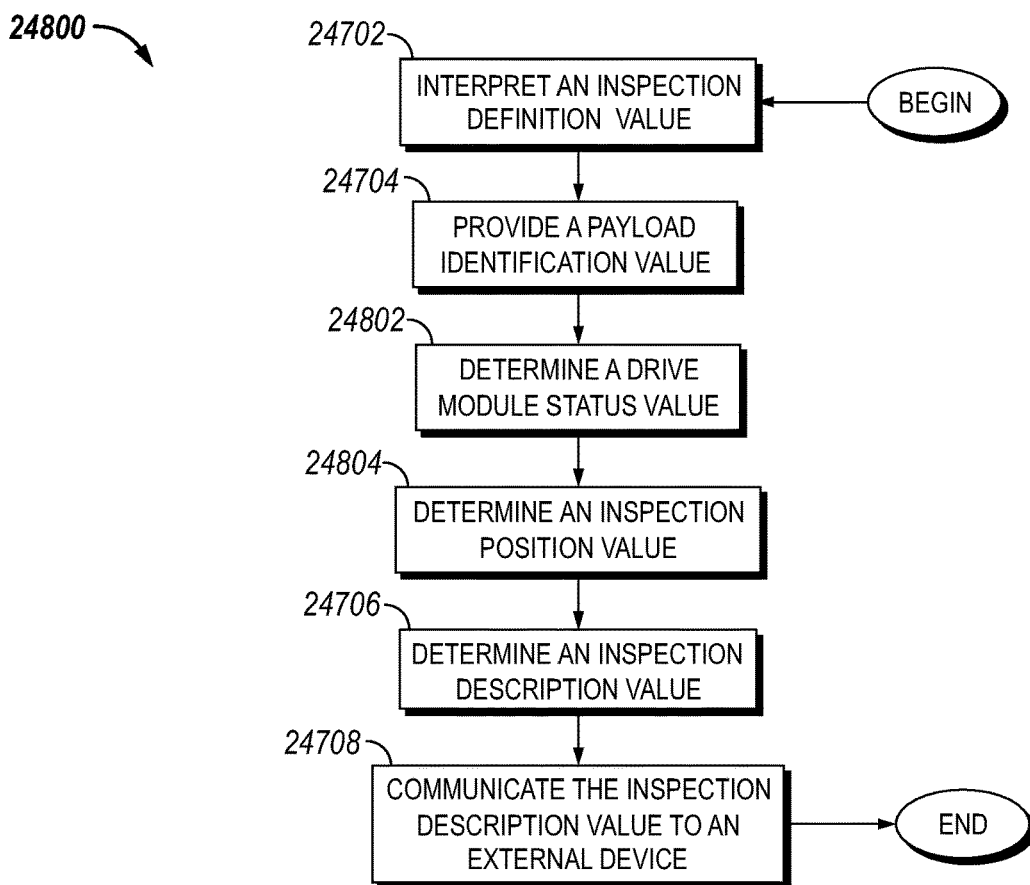
FIG. 89 depicts a schematic of a procedure for confirming operations associated with inspection operations.

Referencing FIG. 89, an example procedure 24800 for confirming operations associated with inspection operations is schematically depicted. The example procedure 24800 is similar to procedure 24700, but includes further operations, any one or more of which may be present in certain embodiments. The example procedure 24800 includes an operation 24802 to determine a drive module status value in response to an inspection surface coverage value and/or an inspection execution value, and the operation 24706 further determining the inspection description value in response to the drive module status value. The example procedure 24800 includes an operation 24804 to determine an encoder status value and/or an inspection position value in response to an inspection surface coverage value and/or an inspection execution value, and the operation 24706 further determining the inspection description value in response to the encoder status value and/or the inspection position value.

Figure 90:
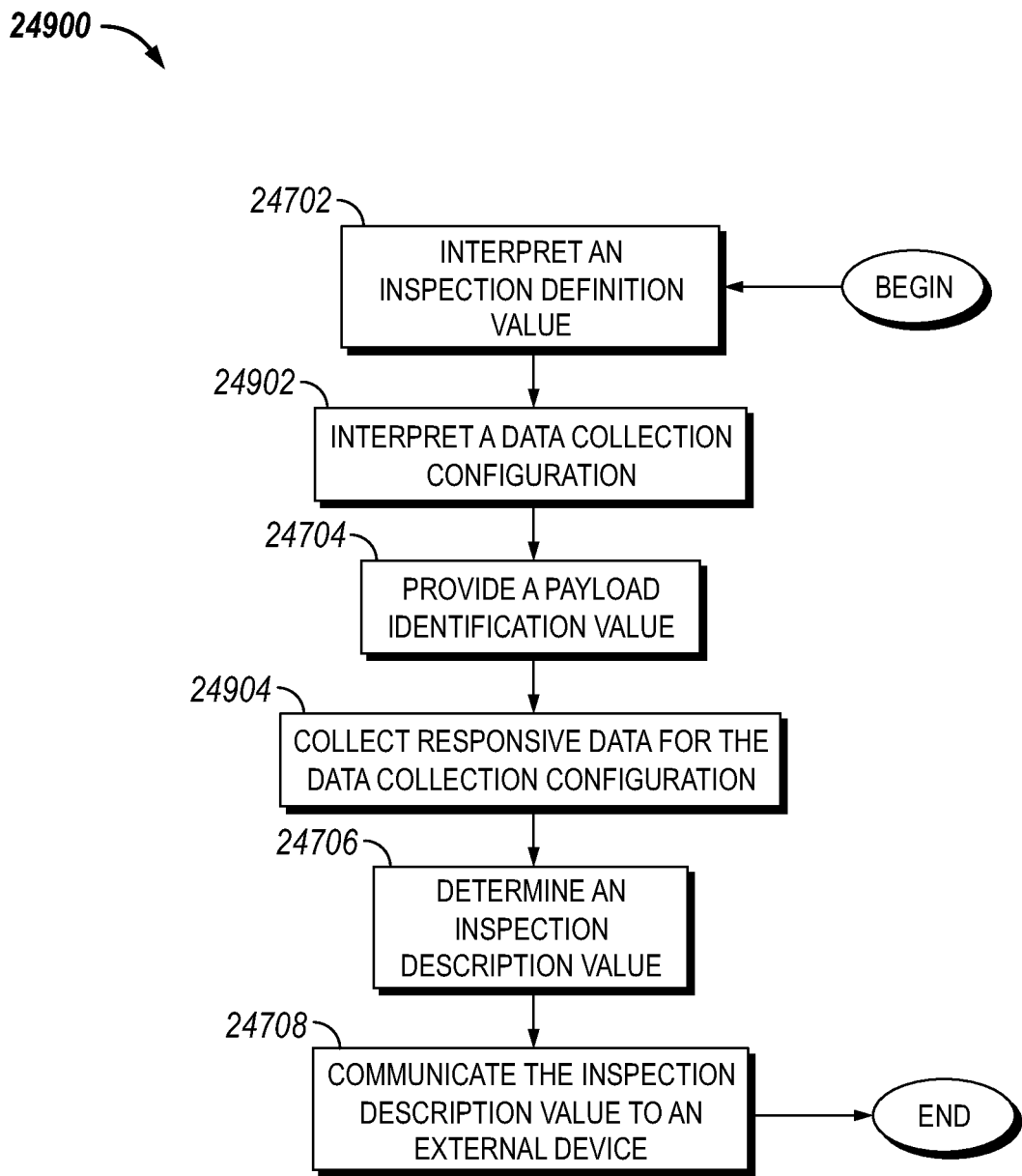
FIG. 90 depicts a schematic of an inspection robot.

Referencing FIG. 90, an example procedure 24900 for confirming operations associated with inspection operations is schematically depicted. The example procedure 24900 is similar to procedure 24700, but includes further operations, any one or more of which may be present in certain embodiments. The example procedure 24900 includes an operation 24902 to interpret a data collection configuration in response to the inspection definition value, an operation 24904 to collect responsive data for the data collection configuration during an inspection operation, and operation 24706 further includes determining the inspection description value in response to the responsive data for the data collection configuration. Example operations 24904 include one or more operations such as: collecting a component identification value collecting a component type value, collecting a component status value, collecting a component calibration version value, collecting a diagnostic version value, collecting a component processing algorithm value, and/or collecting a component control algorithm version value.

An example inspection definition value 24606 may include one or more of: a sensor calibration value, a sensor identifier, a sensor type value, a drive module identifier (e.g., identifying specific drive module, drive module make and/or model, drive module hardware and/or software versions, part numbers, etc. to be used in the inspection operations); a drive module calibration value (e.g., actual calibration values, calibration ranges, calibration versions, etc. that are to be used in inspection operations); a drive module type value (e.g., the drive module type to be used in the inspection operations, including potentially capability ranges, accuracy, precision, etc.); a control board identifier (e.g., identifying specific control board, control board make and/or model, control board hardware and/or software versions, part numbers, etc. to be used in the inspection operations), or a control board type value (e.g., the control board type to be used in the inspection operations, including potentially capability ranges, etc.).

An example inspection definition value 24606 may include one or more of a sensor usage value (e.g. a usage time period, collected data by the inspection robot during usage, an event occurring during usage, etc.), a control board usage value; (e.g. a usage time period, collected data by the inspection robot during usage, an event occurring during usage, etc.); or a drive module usage value (e.g. a usage time period, collected data by the inspection robot during usage, an event occurring during usage, etc.).

In certain embodiments, inspection robot 24100 and external device 24208 are configured to verify a component of the inspection robot 24100 is correctly included in the inspection robot, is properly calibrated, and includes the capabilities to perform inspection operations on an inspection surface.

In certain embodiments, inspection robot 24100 receives an identification verification value (e.g., component correctly included) in response to communicating the inspection description value to external device 24208. In certain embodiments, inspection robot 24100 receives a calibration verification value (e.g., proper calibration for a component) in response to communicating the inspection description value to the external device. In certain embodiments, inspection robot 24100 receives a type of value verification value (proper capabilities for a component) in response to communicating the inspection description value to the external device.

An example inspection definition value 24606 may include one or more of: a sensor calibration value, a sensor identifier, a sensor type value, a drive module identifier (e.g., identifying specific drive module, drive module make and/or model, drive module hardware and/or software versions, part numbers, etc. to be used in the inspection operations); a drive module calibration value (e.g., actual calibration values, calibration ranges, calibration versions, etc. that are to be used in inspection operations); a drive module type value (e.g., the drive module type to be used in the inspection operations, including potentially capability ranges, accuracy, precision, etc.); a control board identifier (e.g., identifying specific control board, control board make and/or model, control board hardware and/or software versions, part numbers, etc. to be used in the inspection operations), or a control board type value (e.g., the control board type to be used in the inspection operations, including potentially capability ranges, etc.).

An example inspection definition value 24606 may include one or more of a sensor usage value (e.g. a usage time period, collected data by the inspection robot during usage, an event occurring during usage, etc.), a control board usage value; (e.g. a usage time period, collected data by the inspection robot during usage, an event occurring during usage, etc.); or a drive module usage value (e.g. a usage time period, collected data by the inspection robot during usage, an event occurring during usage, etc.).

In certain embodiments, inspection robot 24100 and external device 24208 are configured to verify a component of the inspection robot 24100 is correctly included in the inspection robot, is properly calibrated, and includes the capabilities to perform inspection operations on an inspection surface.

In certain embodiments, inspection robot 24100 receives an identification verification value (e.g., component correctly included) in response to communicating the inspection description value to external device 24208. In certain embodiments, inspection robot 24100 receives a calibration verification value (e.g., proper calibration for a component) in response to communicating the inspection description value to the external device. In certain embodiments, inspection robot 24100 receives a type value verification value (proper capabilities for a component) in response to communicating the inspection description value to the external device.

External device 24208 may determine at least one of an identification verification value, calibration verification value, or type value verification value in response to communicating the inspection description value to the external device. External device 24208 may also notify a user in response to determining the at least one of the identification verification value, calibration verification value, or type value verification value. The user may be notified by transmitting a notification to a user device or tagging the data stored by external device associated with a component with the determined value.

In certain embodiments, external device 24208 may update or modify a component data log including a component historical usage value in response to receiving the inspection description value. The updating or modifying may include storing the at least one of the sensor usage value, the control board usage value, or the drive module usage value. In certain embodiments, external device 24208 may use the component historical usage value to predict a failure of the component of inspection robot 24100. In certain embodiments, external device 24208 receives inspection description values from a fleet of inspection robots including inspection robot 24100, and uses the inspection description values to determine at least one of: a command for inspection robot 24100, a component fault of inspection robot 24100, an incorrect calibration of one of the components of inspection robot 24100, or an estimated remaining life for a component of inspection robot 24100, to name but a few examples.

Figure 91:
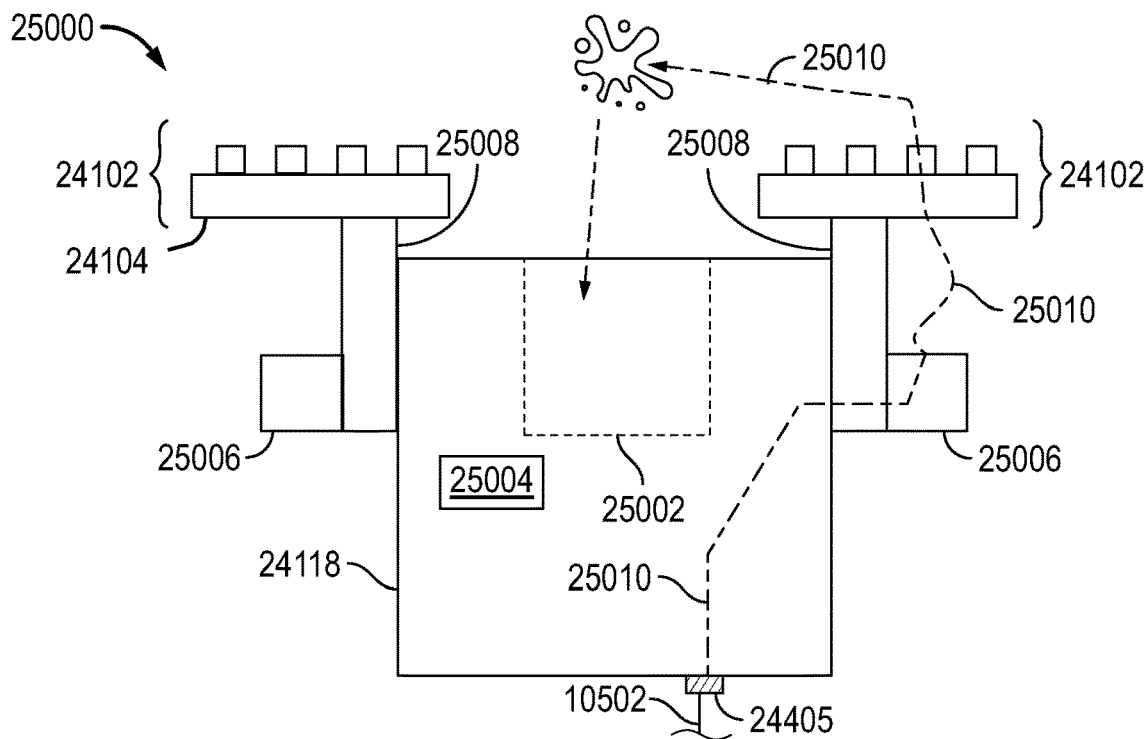
FIG. 91 depicts an example bottom view of an inspection robot with a portion of the couplant retaining chamber formed by the housing.

Referencing FIG. 91, an example inspection robot 25000 is schematically depicted. The example inspection robot 25000 includes a housing 24118, where the housing 24118 includes at least a portion of a couplant retaining chamber 25002. In the example of FIG. 91, the couplant retaining chamber 25002 is formed between a bottom surface of the housing 24118 and an inspection surface. For example, referencing FIG. 92, an example bottom view of an inspection robot 25000 is depicted, with a portion of the couplant retaining chamber 25002 formed by the housing 24118 depicted. The couplant retaining chamber 25002, where present, provides for a mechanism for providing thermal coupling between the couplant flowing through the inspection robot 25000 and components of the inspection robot 25000, for example to provide cooling and/or heat management for the relevant components. In certain embodiments, the couplant retaining chamber 25002 may additionally or alternatively be provided within the housing 24118, including with the couplant retaining chamber 25002 formed at least in part utilizing the housing 24118 (e.g., an interior surface of the housing 24118), and/or formed completely within the housing 24118, for example as a dedicated fluid retaining chamber.

The example inspection robot 25000 further includes an electronic board 25004 that is at least selectively thermally coupled to the couplant retaining chamber 25002. The electronic board 25004 may be any board, PCB, controller, portions thereof, and/or combinations thereof (in whole or part) as set forth throughout the present disclosure. Without limitation to any other aspect of the present disclosure, an example electronic board 25004 includes one or more of: a main board, a payload board, a drive board, a tether board, a data acquisition circuit, a modular board, and/or a stackable board. In certain embodiments, the thermal coupling includes thermal coupling to a shared wall or separator (e.g., a wall of the housing 24118), thermal coupling to a conductive path to the retaining chamber (e.g., a heat pipe, conductive material forming a thermal path, or the like), and/or variable thermal coupling implemented with a variable heat transfer rate (e.g., modulating a contact exposure area between the electronic board 25004 and the couplant retaining chamber 25002, changing a flow rate of couplant in the couplant retaining chamber 25002, or the like).

The example inspection robot 25000 includes a couplant input port, for example present as a portion of the tether interface 24405, where the couplant input port is fluidly coupled to a couplant source on a first side (e.g., via the tether 10502 in the example of FIG. 91), and fluidly coupled to a couplant flow path 25010 on a second side. The example inspection robot 25000 further includes a drive module (e.g., depicted as a wheel 25008 and drive motor 25006, in the example of FIG. 91). The example drive module includes a drive motor 25006 operatively coupled to at least one wheel 25008, and may be embodied in whole or part according to any drive module set forth throughout the present disclosure. The example drive module includes the wheel(s) 25008 positioned such that the wheel(s) 250008 engage the inspection surface when the inspection robot 25000 is positioned on the inspection surface, thereby allowing the drive module to move the inspection robot 25000 along the inspection surface. The example inspection robot 25000 includes two drive modules, one positioned on each side, allowing for the inspection robot 25000 to be steered (e.g., using steerable wheels, opposing motion of the wheels on each drive module, and/or combined motion such as a slowed or stopped wheel on one side and a faster moving wheel on the other side).

The example inspection robot 25000 further includes a payload 24102 including at least one sensor mounted thereon, where the payload 24102 is coupled to the housing 24118 such that the sensor(s) selectively engage the inspection surface when the inspection robot is positioned on the inspection surface. In the example, selective engagement of the sensors with the inspection surface includes the capability of the payload 24102 to lift the sensor(s) off the surface, the capability to turn the sensor(s) on or off, or any other selective engagement as set forth throughout the present disclosure. In certain embodiments, the sensors are configured to be engaged with the inspection surface in response to the inspection robot 24100 being positioned on the inspection surface. The payload(s) 24102 may be coupled directly to the housing 24118 (e.g., engaging a mount or rail of the housing 24118) and/or to a mount of one or more drive module(s) that are coupled to the housing.

Figure 92:
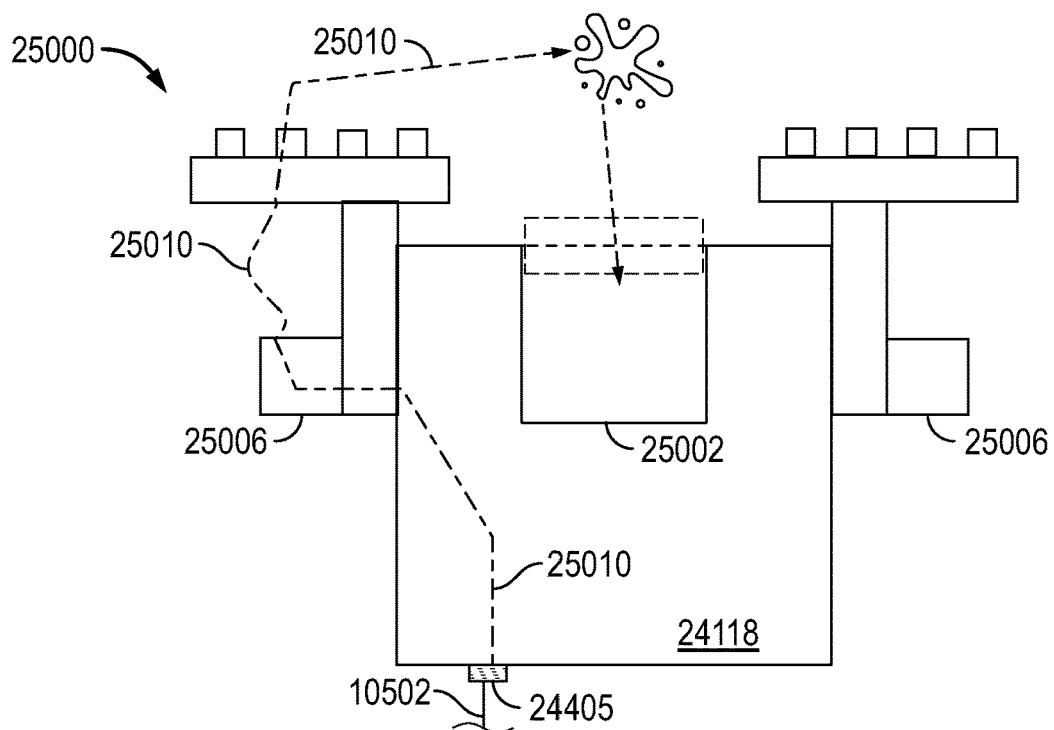
FIG. 92 depicts a schematic of an inspection robot in a side view.
Figure 93:
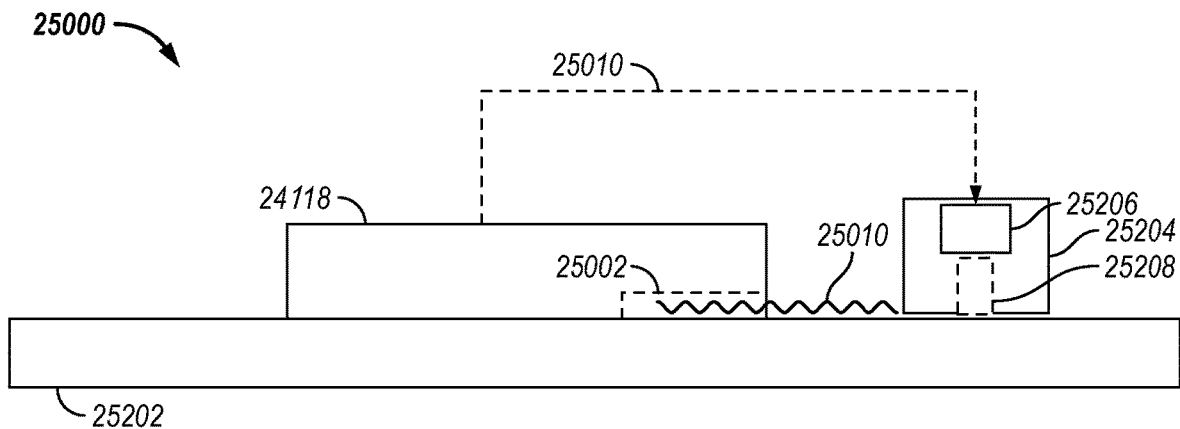
FIG. 93 depicts a schematic of a drive module is formed from a wheel section and a drive motor section.

The example inspection robot 25000 further includes a couplant flow path 25010 that fluidly couples the couplant input port portion of the tether interface 24405 to the couplant retaining chamber 25002. In the example of FIG. 91, the couplant flow path 25010 is depicted schematically for clarity of illustration of the relationship of components of the inspection robot 25000 with the couplant flow path 25010. The couplant flow path 25010 may be embodied in any form using hardware compatible with the couplant fluid, for example using tubes, hoses, fluid paths formed in a housing of a component, connectors, or the like. In certain embodiments, the couplant flow path 25010 may include valves (including but not limited to certain valve configurations depicted in the present disclosure) and/or pumps (including but not limited to certain pump configurations depicted in the present disclosure). In the example of FIG. 91, a single couplant flow path 25010 is depicted, flowing through the housing 24118, the drive module, the payload 24102, a sensor (e.g., provided to a delay line provided to give a consistent acoustic environment for a sensor acoustically coupled to the inspection surface during operations of the inspection robot 25000), and finally to the couplant retaining chamber 25002. In the example of FIG. 92, the couplant flow path 25010 includes couplant that is emitted from the sensors (and/or sled, delay line, etc.) during operations, which flows over the inspection surface and into the couplant retaining chamber 25002. In certain embodiments, a second couplant flow path (not shown) is provided, for example flowing through the drive module, payload, and/or sensor(s) on the other side of the inspection robot 25000. Referencing FIG. 93, an example inspection robot 25000 is depicted schematically in a side view. In certain embodiments, the embodiment of FIG. 93 is consistent with the embodiment of FIG. 91, with components removed and simplified to illustrate aspects of the present disclosure. In the example of FIG. 93, the couplant retaining chamber 25002 is formed between a shaped bottom surface of the housing 24118 and the inspection surface 25202. In the example of FIG. 93, the sensor is embodied as a sensing element 25206 (e.g., an inducer of a UT sensor), a delay line chamber 25208, and a sensor housing 25204. In certain embodiments, the sensor housing 25204 and/or delay line chamber 25208 may be formed by, and/or included as a part of, the payload 24102 and/or a sled mounted on the payload. In the example of FIG. 93, the couplant flow path 25010 includes a portion flowing from the sensor to the couplant retaining chamber 25002.

The example couplant retaining chamber 25002 formed between the housing 24118 and the inspection surface depicts the couplant flowing into the couplant retaining chamber 25002 from the sensors. In certain embodiments, the couplant retaining chamber 25002 may additionally or alternatively be charged with couplant through a direct path from the housing 24118, for example utilizing a hole in the housing to the couplant retaining chamber, which may be controlled, for example utilizing a valve, diaphragm, iris, or the like. In certain embodiments, control elements, boards, circuits, or the like that are configured to control the couplant flow path 25010 configuration may be configured to control couplant flow through the hole (where present) to the couplant retaining chamber 25002. An example couplant flow path fluidly couples, in order, the couplant input port, the drive module, the payload, and then the couplant retaining chamber.

Figure 94:
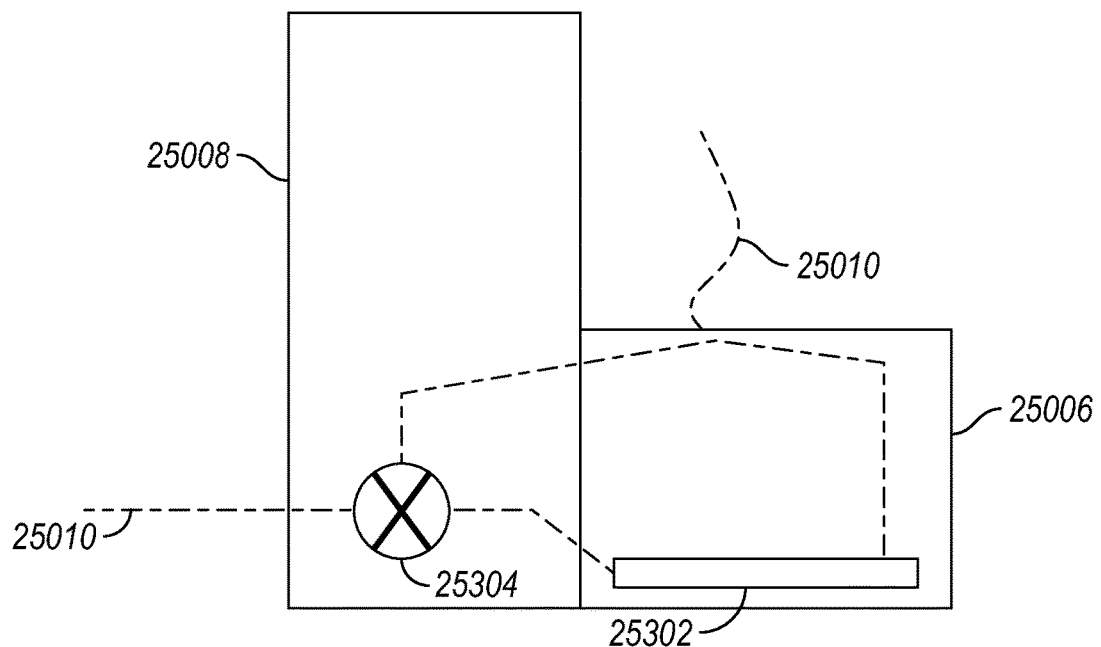
FIG. 94 depicts a schematic of an example inspection robot illustrating an internal couplant retaining chamber and certain control features for the couplant flow path.

Referencing FIG. 94, an example drive module is schematically depicted, the drive module formed from a wheel 25008 and a drive motor 25006. The example of FIG. 94 includes a heat exchanger 25302 positioned on the drive module, where the heat exchanger 25302 thermally couples the couplant flow path 25010 to the drive motor 25006. The example heat exchanger 25302 is depicted schematically, but may be embodied as a heat transfer device of any type, for example a shell-and-tube heat exchanger, a conductive contact surface facilitating heat transfer between the couplant flow path 25010 and the drive motor 25006, and/or a coolant jacket of the drive motor 25006. The example of FIG. 94 includes a routing valve 25304 configured to control thermal coupling of the couplant flow path 25010 and the drive motor 25006, for example controlling flow through the heat exchanger 25302 relative to flow around the heat exchanger 25302, where in the example flow around the heat exchanger 25302 does not have significant thermal coupling with the drive motor 25006, and/or does not flow through the drive motor 25006 at all (not shown). In the example of FIG. 94, the routing valve 25304 may be a three-way valve (e.g., allowing for flow in both paths, including at controlled flow rates), a switching valve (e.g., allowing for flow in either path), or any other flow control arrangement, whether utilizing a valve or otherwise.

Figure 95:
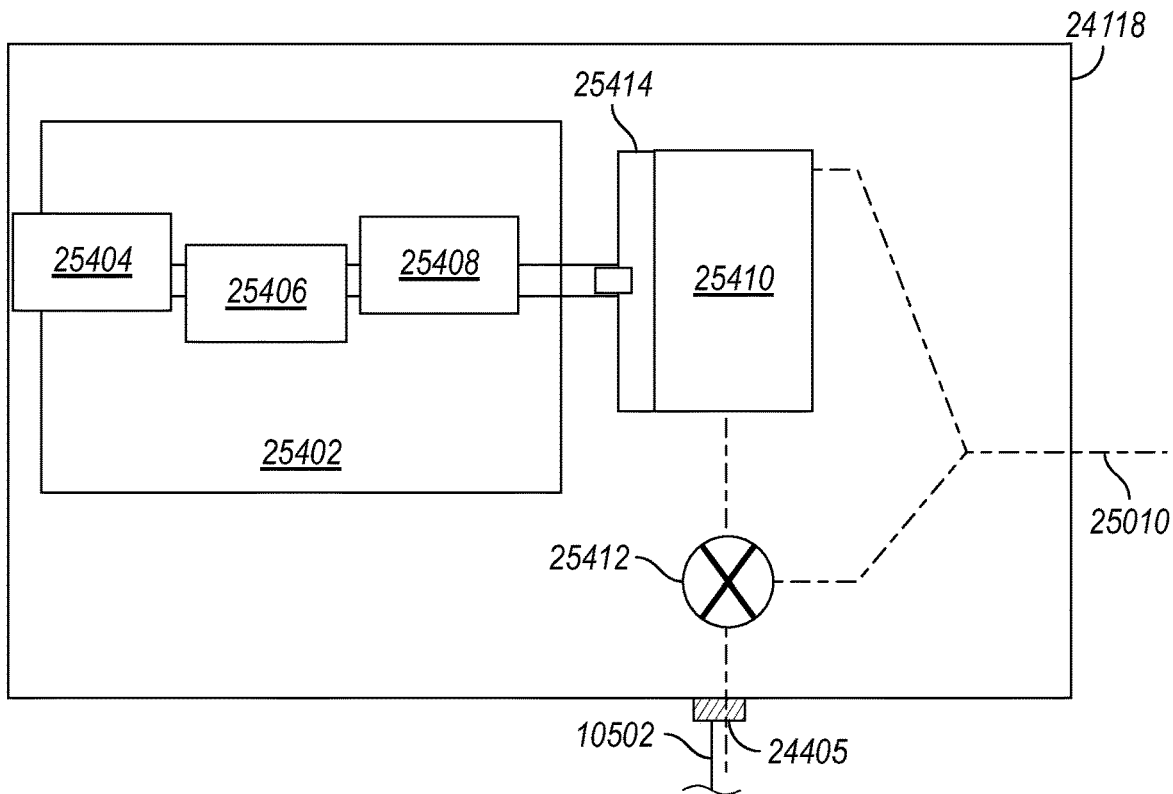
FIG. 95 depicts a schematic an example inspection robot configured in a similar arrangement to the example of FIG. 94.
Figure 96:
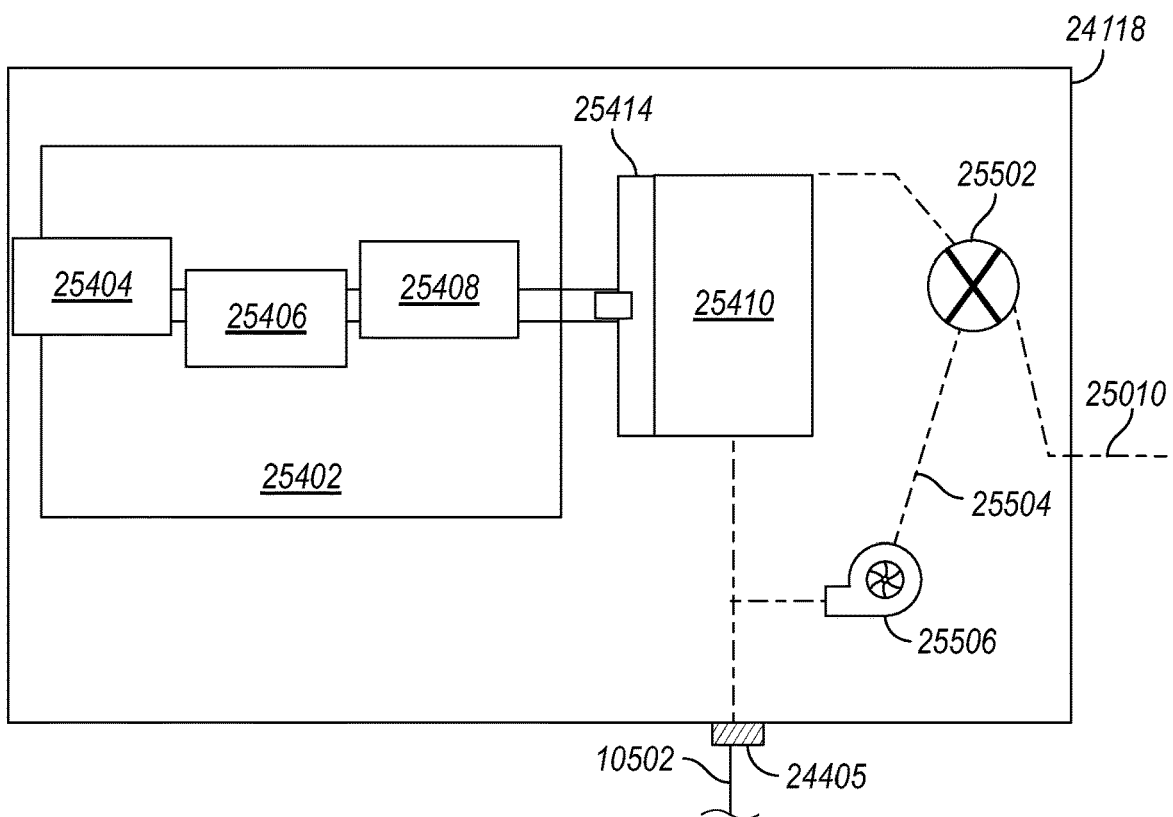
FIG. 96 depicts a schematic an example inspection robot illustrating example heat generating components that may be present in certain embodiments.

Referencing FIG. 95, an example inspection robot is schematically depicted illustrating an internal couplant retaining chamber and certain control features for the couplant flow path 25010. In the example of FIG. 95, certain components are not depicted for clarity of the present description. The example of FIG. 95 includes a couplant retaining chamber 25410 positioned within the housing 24118. The example of FIG. 95 includes a routing valve 25412 configured to selectively bypass the couplant flow path 25010 past the couplant retaining chamber 25410. For example, the routing valve 25412 in a first position provides for the couplant to flow directly through the housing 24118, where the routing valve 25412 in a second position provides for the couplant to flow through the couplant retaining chamber 25410. In certain embodiments, the routing valve 25412 can adjust the couplant flow between both paths, with a portion of the couplant flowing directly through the housing 24118 and the remaining couplant flowing through the couplant retaining chamber 25410. The routing valve 25412 allows for balancing cooling operations and/or couplant first exposure (e.g., where the couplant temperature is relatively lower before thermal contact with components) to selected components, such as between a board (e.g., the main board, a diagnostic execution circuit, etc.) and a drive motor. The example of FIG. 96 includes a heat pipe 25414 that thermally couples the board(s) to the couplant retaining chamber 25410. In the example of FIG. 96, the boards include a main board 25402, and several additional boards 25404, 25406, 25408. In the example, the additional boards 25404, 25406, 25408 may be modular boards (e.g., interchangeable between slots of at least some other boards), dedicated boards (e.g., a payload board, drive board, data acquisition circuit, and/or tether board), and/or stackable boards (e.g., boards having a shared spacing in a given frame of reference, such as vertically stacked, horizontally stacked, or the like). In the example of FIG. 94, the main board 25402 is depicted below the heat pipe 25414, and the additional boards 25404, 25406, 25408 are depicted above the heat pipe 25414, for example to provide thermal contact between each board and the heat pipe 25414. Any arrangement may be utilized, and may be selected based on the expected heat to be generated in given boards, the temperature limits of given boards, or the like. In certain embodiments, the heat pipe 25414 may be thermally coupled to any heat generating component of the inspection robot, for example a main board, payload board, drive board, modular electronic board, a power converter (e.g., configuring power received through the tether for provision to components of the inspection robot), and/or a data acquisition circuit. A data acquisition circuit may be formed as a part of another board (e.g., a payload board), a dedicated data acquisition circuit (e.g., configured to gather data and communicate the data to an external device), and/or a circuit configured to manage selected data elements, such as imaging data, video data, or the like. In certain embodiments, the data acquisition circuit generates significant heat, such as during high data rate operations.

An example inspection robot includes a couplant flow path that fluidly couples, in order, the couplant input port, the payload (and/or a sensor), and the couplant retaining chamber. In certain embodiments, such as depicted in FIG. 96, the couplant flow path includes a bypass couplant path fluidly coupling the couplant input port to the couplant retaining chamber, and/or a routing valve 25412 configured to modulate a couplant flow through the bypass couplant path.

Referencing FIG. 96, an example inspection robot is schematically depicted, configured in a similar arrangement to the example of FIG. 95. The example inspection robot includes a housing recirculation path 25504, depicted in the example as controllable by a routing valve 25502 that controls flow exiting the couplant retaining chamber 25410 between the main couplant flow path 25010 leaving the housing 24118 (in the example) and the housing recirculation path 25504. In certain embodiments, control of the routing valve 25502 can be utilized to increase the flow rate of couplant through the couplant retaining chamber 25410, thereby increasing a heat transfer rate (at least during transient operation, until the couplant temperature rises sufficiently to reduce the effective heat transfer rate) between the couplant retaining chamber 25410 and the heat pipe 25414 and/or other cooled components. In the example of FIG. 55, the bypass flow path for the couplant retaining chamber 25410 is omitted, but may be present in addition to the housing recirculation path 25504 for certain embodiments. The example of FIG. 96 further includes a recirculation pump 25506, for example to enhance a recirculating fluid flow rate. In certain embodiment, other flow control elements such as a check valve (e.g., to protect the tether and/or couplant source from pressure generated by the recirculation pump 25506) may be provided.

The example couplant flow arrangements and/or flow control elements of the embodiments depicted in FIGS. 91-96 may be utilized, in whole or part, with any inspection robots, systems, assemblies, or other embodiments as set forth throughout the present disclosure. In certain embodiments, valves, pumps, bypass flow paths, recirculating flow paths, or the like, may be controlled by any controller, circuit, board, or similar component as set forth herein, and/or may be utilized during operations of any procedures, methods, algorithms, or other operational descriptions as set forth herein.

Figure 97:
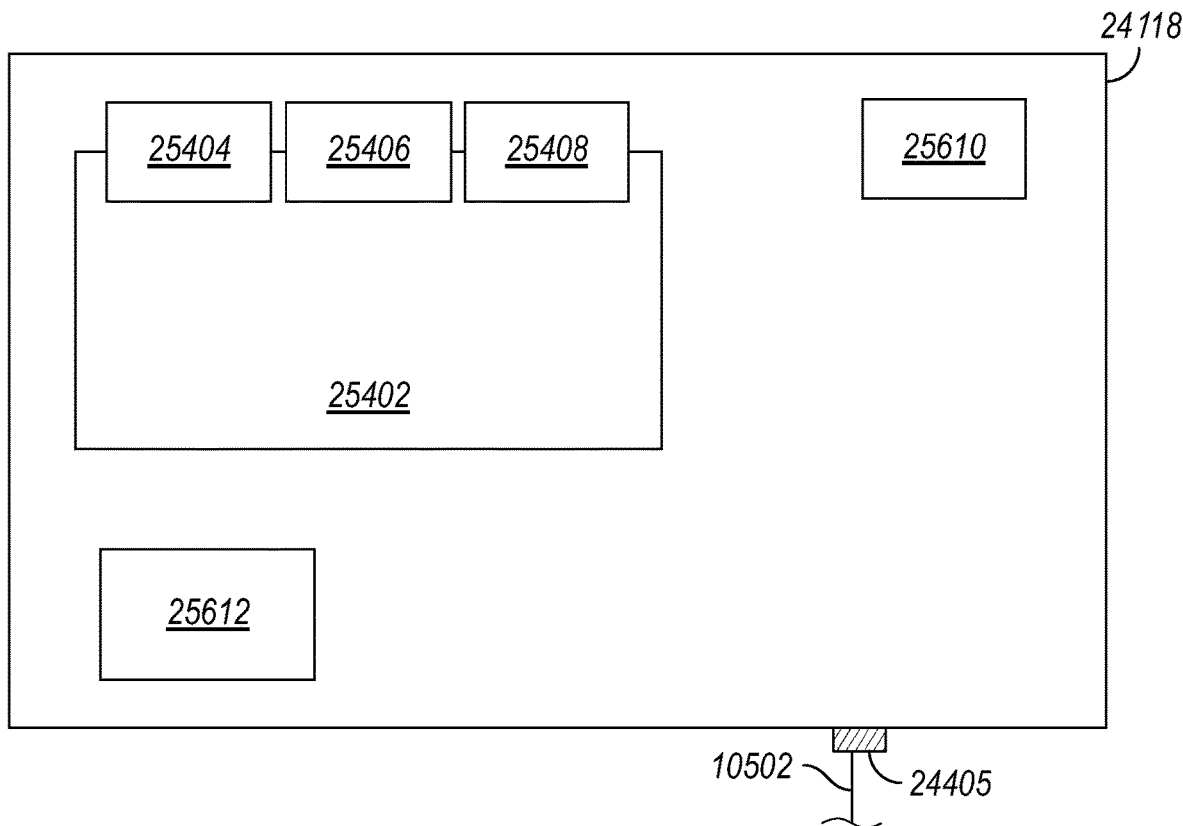
FIG. 97 depicts a schematic of an example procedure for cooling one or more components of an inspection robot.

Referencing FIG. 97, an example inspection robot is schematically depicted, illustrating example heat generating components that may be present in certain embodiments. In the example of FIG. 97, the couplant flow path(s) and/or couplant retaining chamber(s) are omitted for clarity of the illustration. In the example of FIG. 97, a main board 25402, modular boards 25404, 25406, 25408, a data acquisition circuit 25610 (e.g., dedicated to an imaging and/or video sensor, and/or further configured to collect and communicate payload data), and a power converter 25612. Any one or more of the components may be thermally coupled to a couplant flow path, including any selected order of contact with the couplant flow path, and/or including providing thermal contact with a heat pipe and/or conductive path, and/or a couplant retaining chamber.

Figure 98:
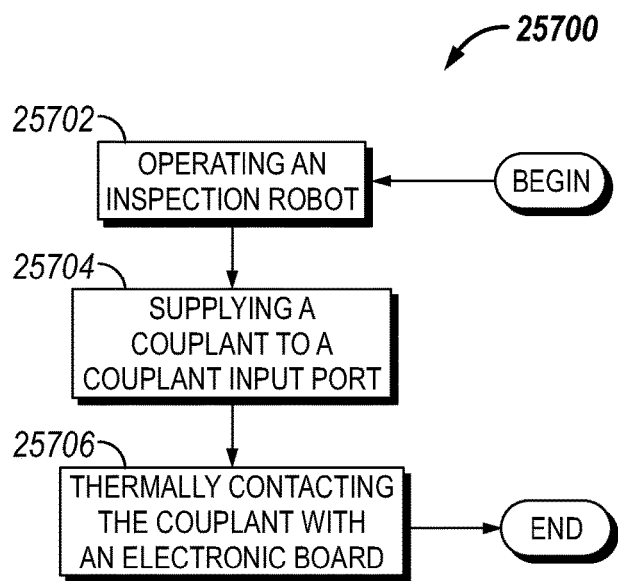
FIG. 98 depicts a schematic of an example procedure which may be utilized in conjunction with and/or as a part of procedure for cooling one or more components of an inspection robot.
Figure 99:
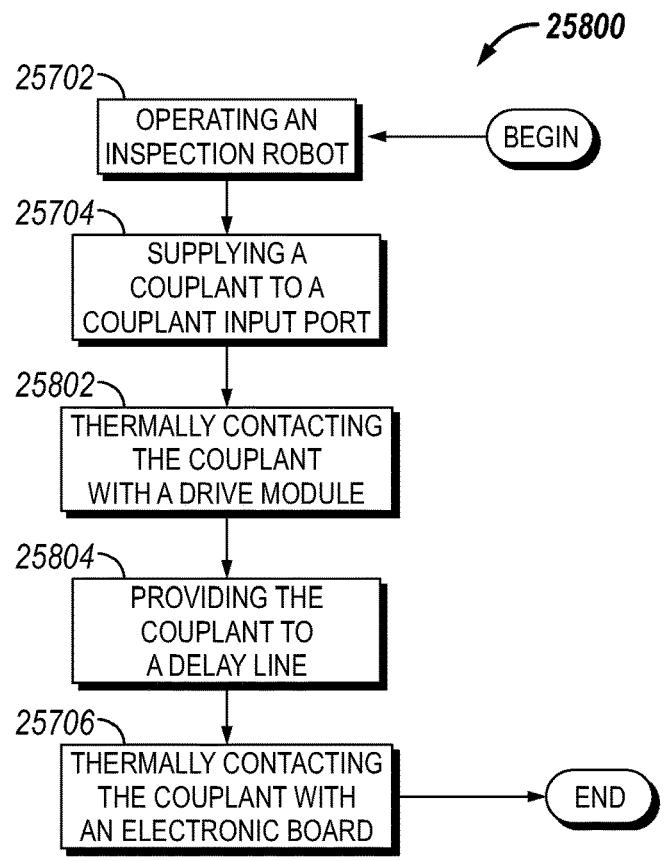
FIG. 99 depicts a schematic of an example apparatus for performing thermal management of an inspection robot and/or components of an inspection robot.

Referencing FIG. 98, an example procedure 25700 for cooling one or more components of an inspection robot is schematically depicted. The example procedure 25700 includes an operation 25702 to operate an inspection robot to interrogate an inspection surface with at least one sensor mounted on the inspection robot, an operation 25704 to supply a couplant to a couplant input port of the inspection robot, and an operation 25706 to thermally contact the couplant with an electronic board of the inspection robot. Referencing FIG. 99, an example procedure 25800 is depicted, which may be utilized in conjunction with and/or as a part of procedure 25700. The example procedure 25800 includes an operation 25802 to thermally contact the couplant with a drive module of the inspection robot before the thermally contacting the couplant with the electronic board (e.g., by passing the couplant to the drive module, and then back into the housing; and/or by passing the couplant to the drive module, then to an external couplant retaining chamber, such as through the payload). The example procedure 25800 further includes an operation 25804 to provide the couplant to a delay line chamber of a sensor(s) before thermally contacting the couplant with the electronic board. In certain embodiments, an operation to thermally contact the couplant with the electronic board includes thermally contacting the couplant with a heat pipe thermally coupled to the electronic board. In certain embodiments, thermally contacting the couplant with the heat pipe further includes contacting the couplant with at least one additional heat generating component of the inspection robot (e.g., providing thermal contact to the electronic board and at least one additional heat generating component). In certain embodiments, a procedure includes, in order, thermally contacting the couplant with a drive motor, providing the couplant to a delay line chamber associated with the sensor(s), and then performing the thermal contact of the couplant with the electronic board. An example procedure includes an operation (not shown) to recirculate at least a portion of the couplant within a housing of the inspection robot.

Figure 100:
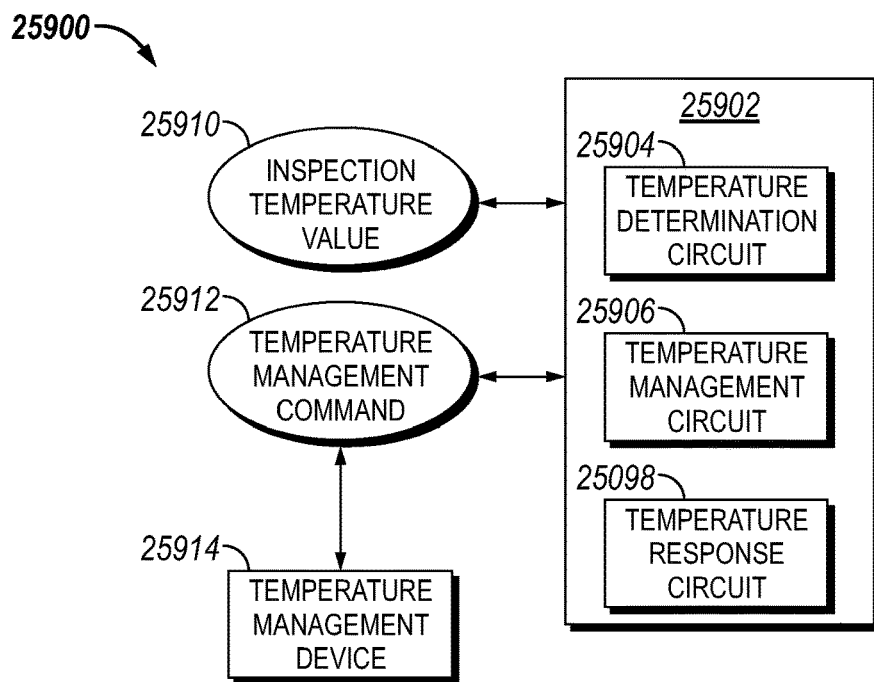
FIG. 100 depicts a schematic of an example procedure for performing thermal management of an inspection robot and/or components of an inspection robot.

Referencing FIG. 100, an example apparatus 25900 is depicted for performing thermal management of an inspection robot and/or components of an inspection robot. The example apparatus may be utilized, in whole or part, with any inspection robot, system, assembly, or other embodiment set forth herein. The example apparatus 25900 may be embodied, in whole or part, on any board, controller, circuit, or the like as set forth herein. In certain embodiments, the example apparatus may be utilized, in whole or part, to perform all or a portion of any procedure, method, and/or operation described herein. The example apparatus 25900 include a controller 25902 which may include a temperature determination circuit 25904 structured to interpret an inspection temperature value 25910, and a temperature management circuit 25906 structured to determine a temperature management command 25912 in response to the inspection temperature value 25910. The example apparatus 25900 further includes a temperature response circuit 25098 that provides the temperature management command 25912 to a temperature management device 25914 associated with an inspection robot.

Example and non-limiting inspection temperature value(s) 25910 include one or more of: a temperature of a component of the inspection robot (e.g., a board, circuit, drive motor, etc.); an ambient temperature value; a temperature of a couplant provided to the inspection robot (e.g., a temperature of the couplant at the couplant inlet port, and/or at any position throughout the couplant flow path); and/or a temperature of an inspection surface. In certain embodiments, the inspection temperature value 25910 allows for the determination that a component is over a temperature limit, approaching a temperature limit, gaining net heat (e.g., having a rising temperature), losing net heat (e.g., having a falling temperature), the effectiveness of thermal exchange between the couplant and the component, or the like.

An example temperature management command 25912 includes a recirculation valve command, and where the temperature management device 25914 includes a recirculation valve configured to modulate a recirculation rate of couplant within a housing of the inspection robot (e.g., recirculating through an internal couplant retaining chamber), where the recirculation valve is responsive to the recirculation valve command. An example temperature management command 25912 includes a data acquisition adjustment value, where the temperature management device includes a data acquisition circuit responsive to the data acquisition adjustment value to adjust a rate of data collection from a payload of the inspection robot. For example, a data collection rate of the data acquisition circuit may be reduced to protect the data acquisition circuit, to reduce temperature generated by the data acquisition circuit, or the like. An example temperature management command 25912 includes a routing valve command, where the temperature management device includes a routing valve configured to adjust a couplant flow routing through the inspection robot, for example in response to the routing valve command. An example routing valve command includes a first couplant flow regime or a second couplant flow regime, where the position of the routing valve command selects a flow regime and/or modulates between the two flow regimes. An example first couplant flow regime includes, in order, providing the couplant in thermal contact with a drive motor and then with an electronic board positioned within a housing of the inspection robot. An example second couplant flow regime includes providing the couplant in thermal contact with an electronic board positioned within the housing of the inspection robot. Another example second flow regime includes, in order, providing the couplant in thermal contact with the electronic board, then in thermal contact with the drive motor, and then in a second thermal contact with the electronic board.

An example temperature management command 25912 includes a couplant flow rate command, where the temperature management device includes a recirculation valve and/or a recirculation pump, thereby controlling the recirculation flow rate responsive to the couplant flow rate command. An example temperature management device includes a pump and/or a valve associated with a couplant source (e.g., associated with a base station, a couplant reservoir, etc.) that provides couplant to the inspection robot, where the pump and/or valve is responsive to the couplant flow rate command.

An example temperature management command 25912 includes a couplant temperature command, where the temperature management device includes a couplant source configured to provide couplant to the inspection robot, and where the couplant source is responsive to the couplant temperature command. For example, couplant source may have refrigeration or other cooling capabilities for the couplant fluid, and/or the couplant source may include more than one fluid source or reservoir at distinct temperatures, utilizing a selected ratio, and/or switching between fluid sources, responsive to the couplant temperature command. For example, a warmer source (or uncooled source) may be utilized during an early inspection phase, inspection operations having a lower ambient temperature and/or inspection surface temperature (e.g., where the temperature may increase throughout the inspection, such as when the inspection robot climbs a pipe, proceeds more deeply into a piece of equipment, etc.), utilizing a cooler source (or actively cooled source) during a later inspection phase, and/or inspection operations having a higher ambient temperature and/or inspection surface temperature.

An example temperature management command 25912 includes an inspection position command, where the temperature management device includes a drive module responsive to the inspection position command In certain embodiments, the inspection position command may be utilized to move the inspection robot more quickly over high temperature regions, to slow down during high temperature operations (e.g., to reduce power consumption and/or heat generation during higher temperature operations), and/or to modulate the speed and/or position of the inspection robot to keep one or more components within temperature limits In certain embodiments, the inspection position command may be utilized to inspect high temperature regions in parts, for example moving the inspection robot into and out of a high temperature area until inspection operations are completed.

An example temperature management command 25912 includes an operational limit command, where the temperature management device includes at least one heat generating component of the inspection robot, where the heating component(s) are responsive to the operational limit command. The operational limit command may be utilized to limit heat generation (e.g., reducing power consumption or other heat generating operations of the component), and/or limiting operations to protect the component due to the temperature (e.g., reducing a power throughput, operating speed, or the like for a component due to temperature vulnerability). The example heat generating component includes any heat generating component set forth herein, any component utilizing power herein, and/or any one or more of: a main board, a payload board, a drive module board, a modular electronic board, a power converter, and/or a data acquisition circuit.

Figure 101:
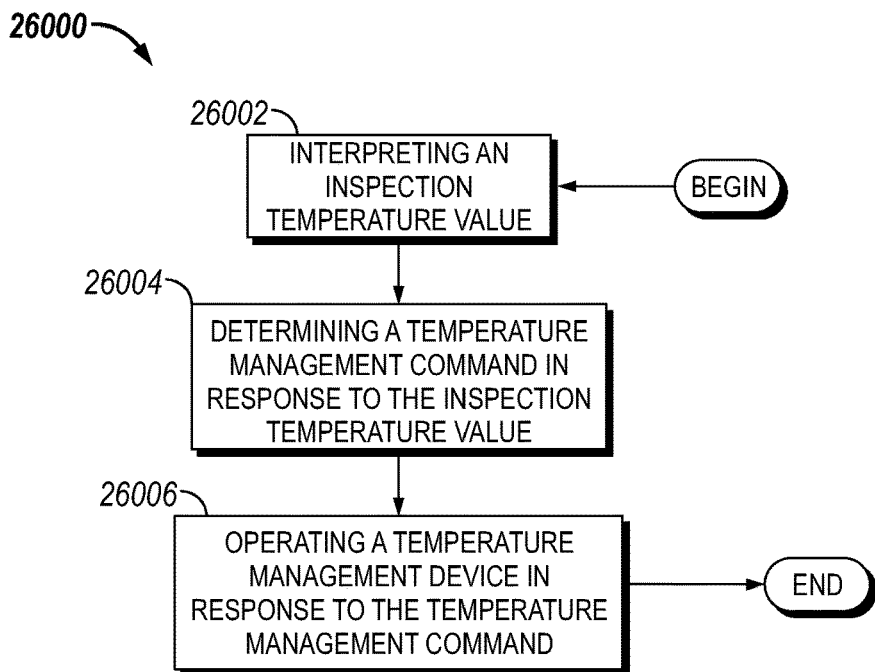
FIG. 101 depicts a schematic of an example controller for flexible configuration and/or operation of a drive module.

Referencing FIG. 101, an example procedure 26000 for performing thermal management of an inspection robot and/or components of an inspection robot is schematically depicted. The example procedure 26000 includes an operation 26002 to interpret an inspection temperature value, an operation 26004 to determine a temperature management command in response to the inspection temperature value, and an operation 26006 to operate a temperature management device associated with an inspection robot in response to the temperature management command.

Figure 102:
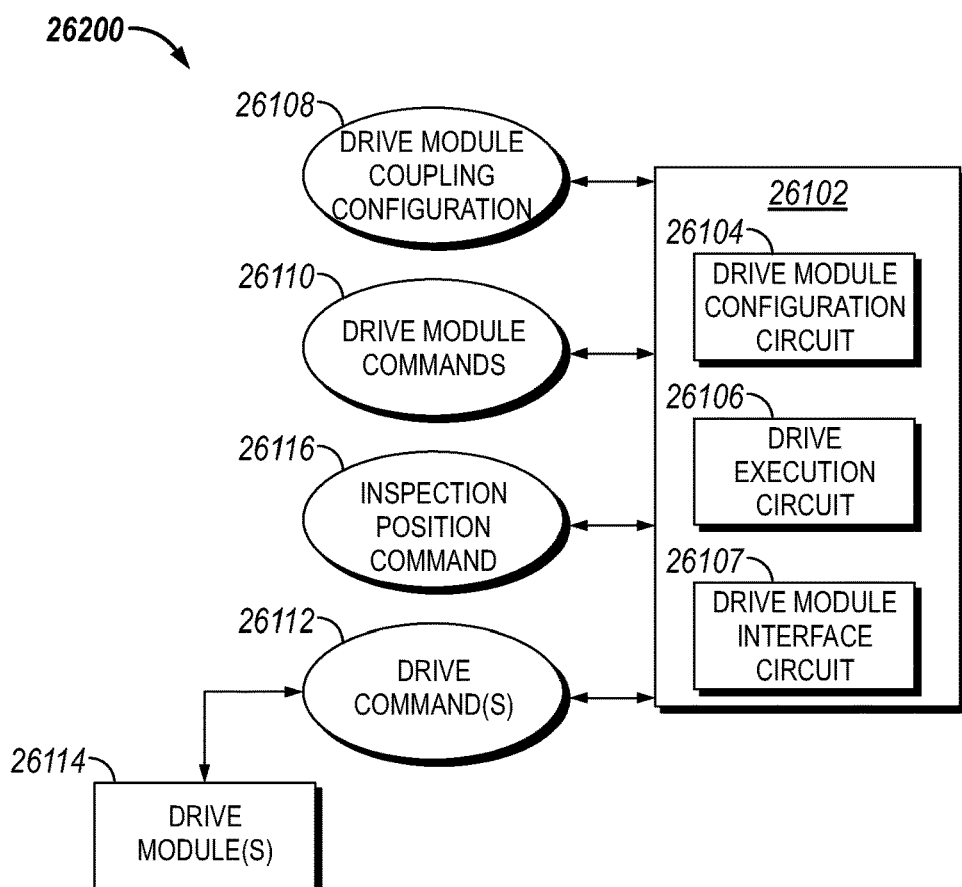
FIG. 102 depicts a schematic of an example procedure for configuring an inspection robot and/or swapping drive modules of an inspection robot.

Referencing FIG. 102, an example controller 26102 for flexible configuration and/or operation of a drive module is schematically depicted. The example controller 26102 may be included with any system, apparatus, controller, circuit, and/or board as set forth herein. An example controller 26102 is provided on a drive board (and/or drive module board). The example controller 26102 includes a drive module configuration circuit 26104 that determines a drive module coupling configuration 26108, for example including one or more of a drive module identification value, a drive module coupling position value (e.g., which interface plate, electronic board, and/or which side of the housing where the drive module is coupled), and/or a drive module electrical description. The example controller 26102 further includes a drive execution circuit 26106 that determines drive module commands 26110 in response to the drive module coupling configuration 26108 (e.g., providing instructions, protocols, and/or electrical characteristics to control the drive module) and an inspection position command 26116 (e.g., a requested and/or commanded position and/or velocity of the inspection robot, a temperature management determined position command, or the like). The example controller 26102 includes a drive module interface circuit 26107 that provides drive commands 26112 to the first drive module and/or second drive module (where present) in response to the drive module commands 26110. The operations of the controller 26102 allows for dynamic replacement and/or swapping of drive modules 26114, for example to change between drive modules having varying capability, to replace a failed and/or faulted drive module, and/or to manage utilization of drive modules. In certain embodiments, operations of the controller 26102 allow for swapping drive modules between sides (e.g., reversing a movement logic for a drive module moving from a right side to a left side, etc.), and/or to respond to varying gear ratios between drive modules. In certain embodiments, a swapped drive module includes a same component description (e.g., same part number, interface description, command values, electrical characteristics, etc.). In certain embodiments, drive modules may be handed (e.g., one set of drive modules configured to mount on a left side of the inspection robot, and another set of drive modules configured to mount on a right side of the inspection robot). In certain embodiments, drive modules may have mounting positions on a same side (e.g., a forward position, a rearward position, both positions, and/or a position that is forward for the drive module mounted on a first side and rearward for the drive module mounted on a second side).

Figure 103:
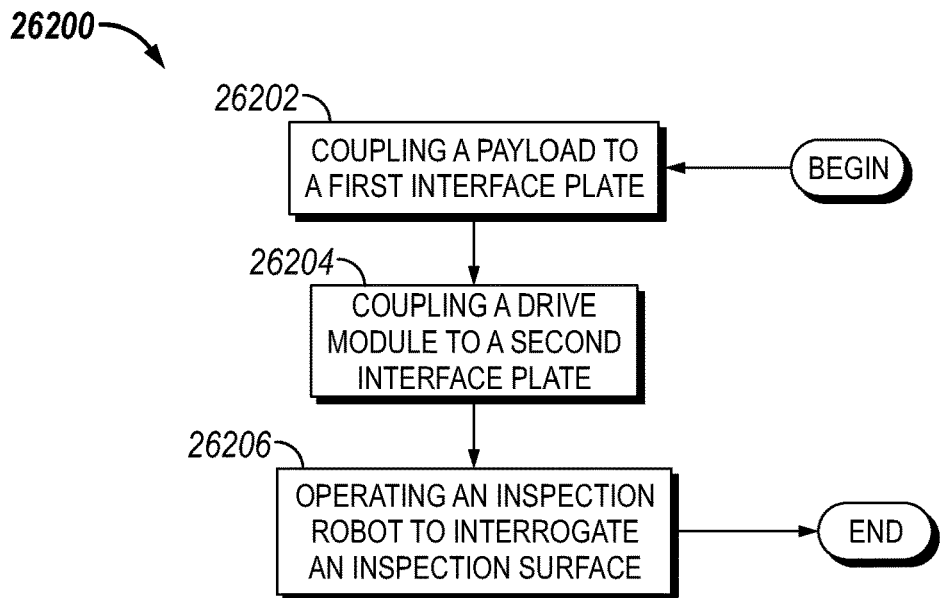
FIG. 103 depicts a schematic of an example procedure.
Figure 104:
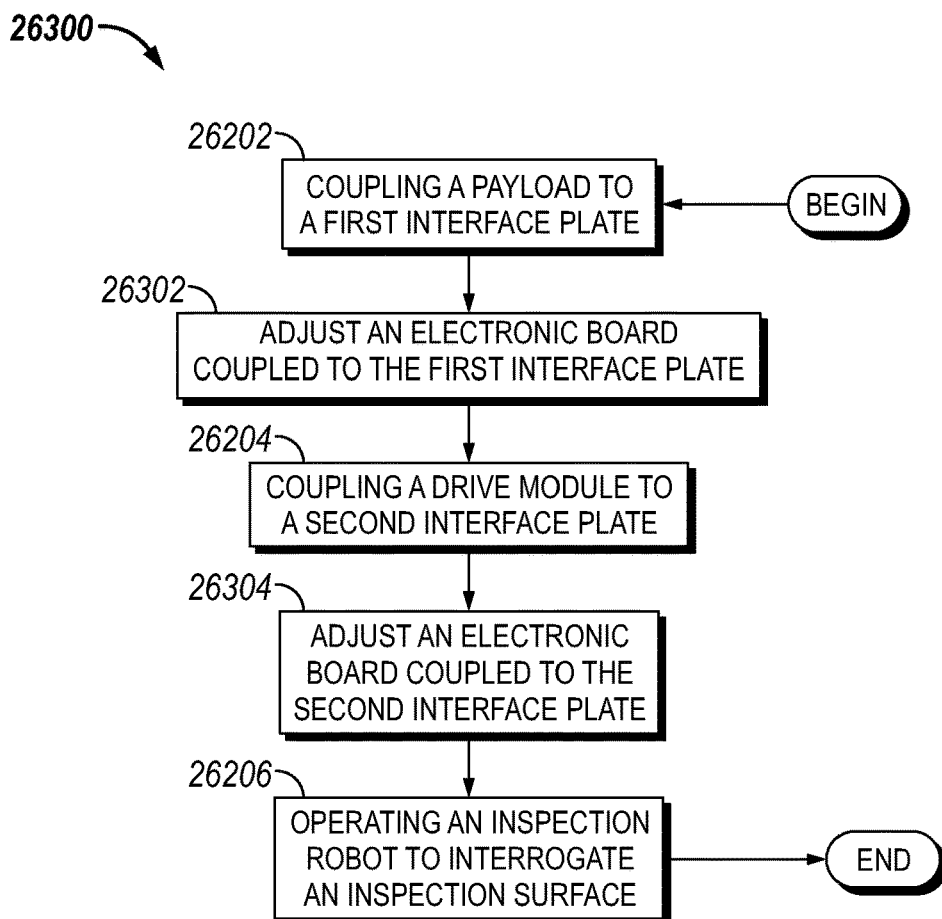
FIG. 104 depicts a schematic of an example procedure to swap a drive module and/or a payload of an inspection robot.

Referencing FIG. 103, an example procedure 26200 for configuring an inspection robot and/or swapping drive modules of an inspection robot is schematically depicted. The example procedure 26200 includes an operation 26202 to couple a payload to a first removeable interface plate of an inspection robot, an operation 26204 to couple a drive module to a second removeable interface plate, and an operation 26206 to operate the inspection robot to interrogate at least a portion of an inspection surface with the payload. Referencing FIG. 104, an example procedure 26300 further includes an operation 26302 to adjust an electronic board coupled to the first removeable interface plate, and an operation 26304 to adjust an electronic board coupled to the second removeable interface plate. Example operations 26302, 26304 to adjust each board include operations such as: configuring an electrical interface of the electronic board, configuring a calibration positioned on an interface circuit of the electronic board, or configuring a control algorithm embodied as instructions stored on a computer readable medium and positioned on the board.

Figure 105:
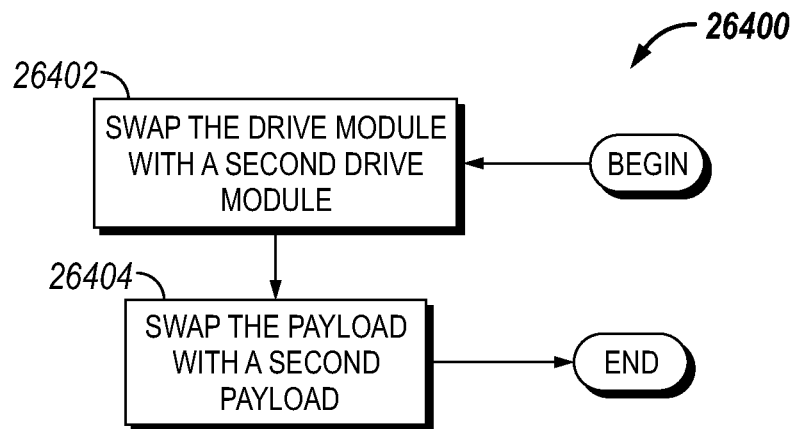
FIG. 105 depicts a schematic of an example procedure to configure an inspection robot utilizing a second payload.
Figure 106:
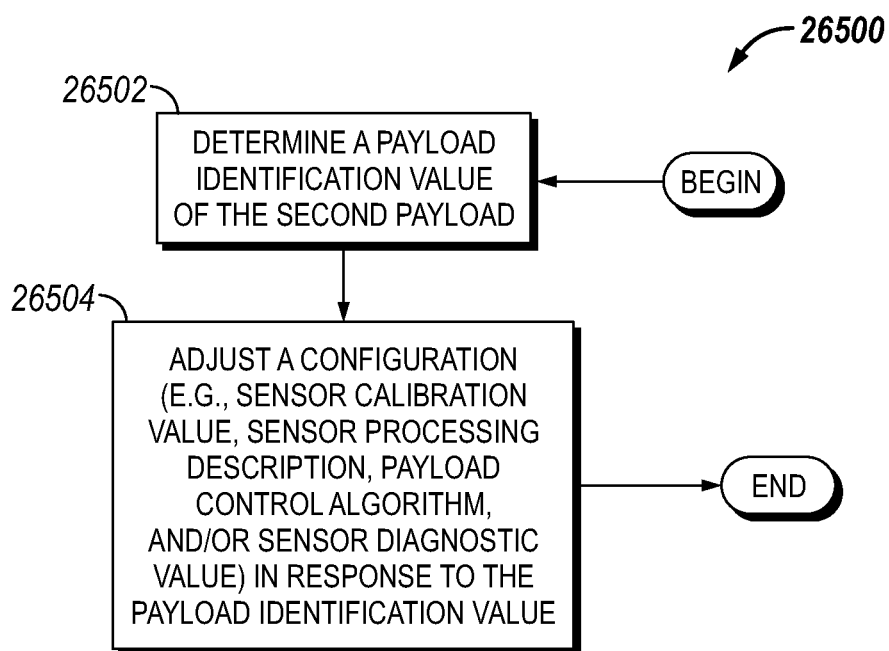
FIG. 106 depicts a schematic of an example procedure including an operation to request a configuration update in response to the payload identification value.
Figure 107:
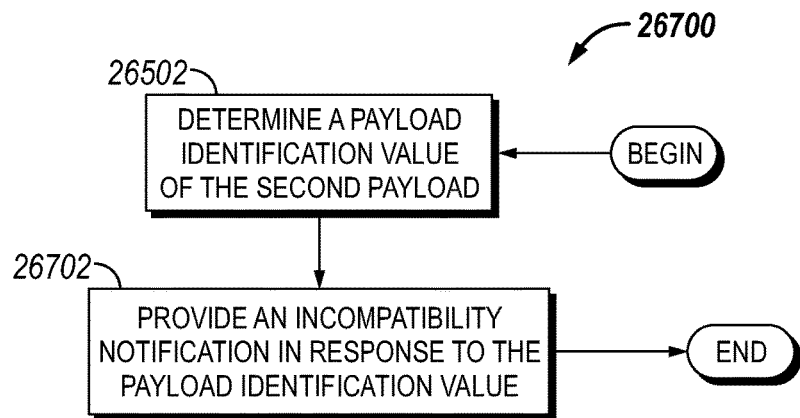
FIG. 107 depicts a schematic of an example procedure including an operation to provide an incompatibility notification.

Referencing FIG. 105, an example procedure 26400 to swap a drive module and/or a payload of an inspection robot is schematically depicted. The example procedure 26400 may be performed, in whole or part, in combination with procedure 26200, 26300, and/or portions thereof. The example procedure 26400 includes an operation 26402 to swap the drive module with a second drive module, and/or an operation 26404 to swap the payload with a second payload. In certain embodiments, operations 26402 and/or 26404 includes swapping a removeable interface plate, and/or an electronic board, with the swap of the drive module and/or the payload. Referencing FIG. 106, an example procedure 26500 to configure an inspection robot utilizing a second payload are schematically depicted. The example procedure 26500 includes an operation 26502 to determine a payload identification value of the second payload, and an operation 26504 to adjust a configuration in response to the payload identification value. Example and non-limiting operations 26504 include one or more of: requesting a sensor calibration value update, requesting a sensor processing description update, a requesting a payload control algorithm update, requesting a sensor diagnostic value update, adjusting a sensor calibration value, adjusting a sensor processing description, adjusting a payload control algorithm, and/or adjusting a sensor diagnostic value. Referencing FIG. 107, the example procedure 26700 includes an operation 26702 to provide an incompatibility notification—for example indicating that a calibration, sensor processing description, payload control algorithm, and/or sensor diagnostic value, is not compatible with a physically coupled payload, sensor, and/or drive module. An example operation 26702 includes an operation to provide an indicator light warning configuration. An example operation 26702 includes an operation to provide an incompatibility communication to an external device.

Figure 108:
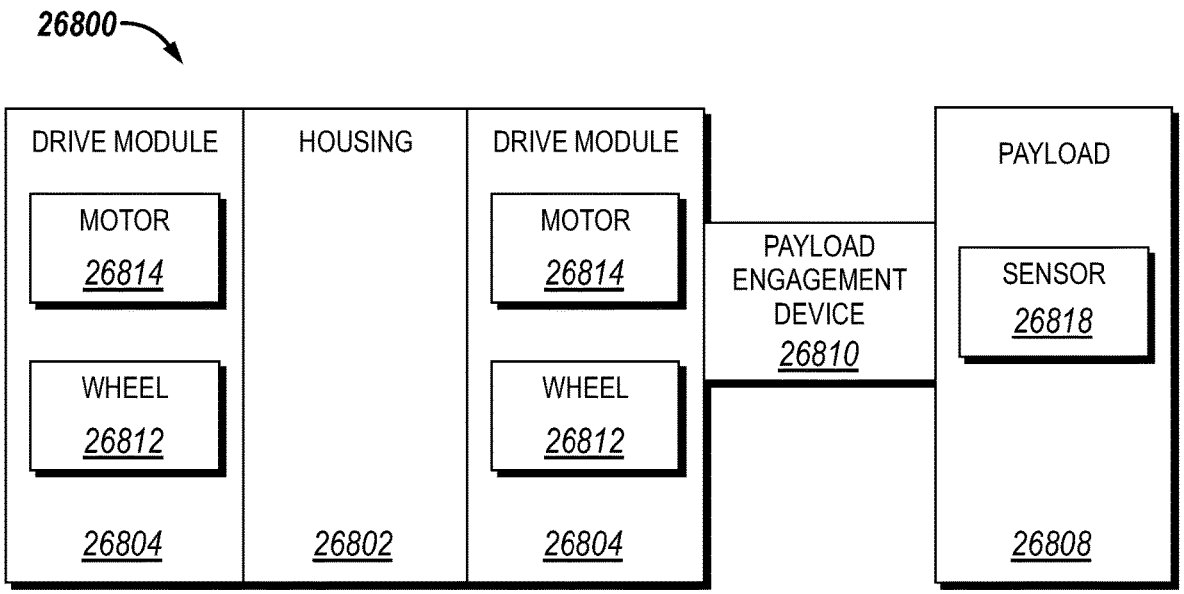
FIG. 108 represents an embodiment of an inspection robot.

Referring to FIG. 108, an inspection robot 26800, may include a housing 26802, a drive module 26804, a payload 26808, and a payload engagement device 26810. The drive module 26804 may include at least one wheel 26812, and a motor 26814. The drive module 26804 is operationally coupled to the housing 26802. The payload engagement device 26810 operationally couples the payload 26808 to the drive module 26804. The payload 26808 may include at least one sensor 26818 mounted to the payload 26808. In embodiments there may be multiple drive modules or drive modules with multiple wheels and motors.

The payload engagement device 26810 may be active or passive and may include a gas spring, an actuator, an electrically controlled spring, or the like. The payload engagement device 26810 may be adjustable with respect to loading on a spring (passive or active), angle at which the payload engagement device 26810 engages with the payload 26808, where the payload engagement device 26810 is coupled to the drive module, between defined positions such as a position in which the sensor engages an inspection surface, a position in which the payload is lifted away from the surface, a resting position, and the like.

Figure 109:
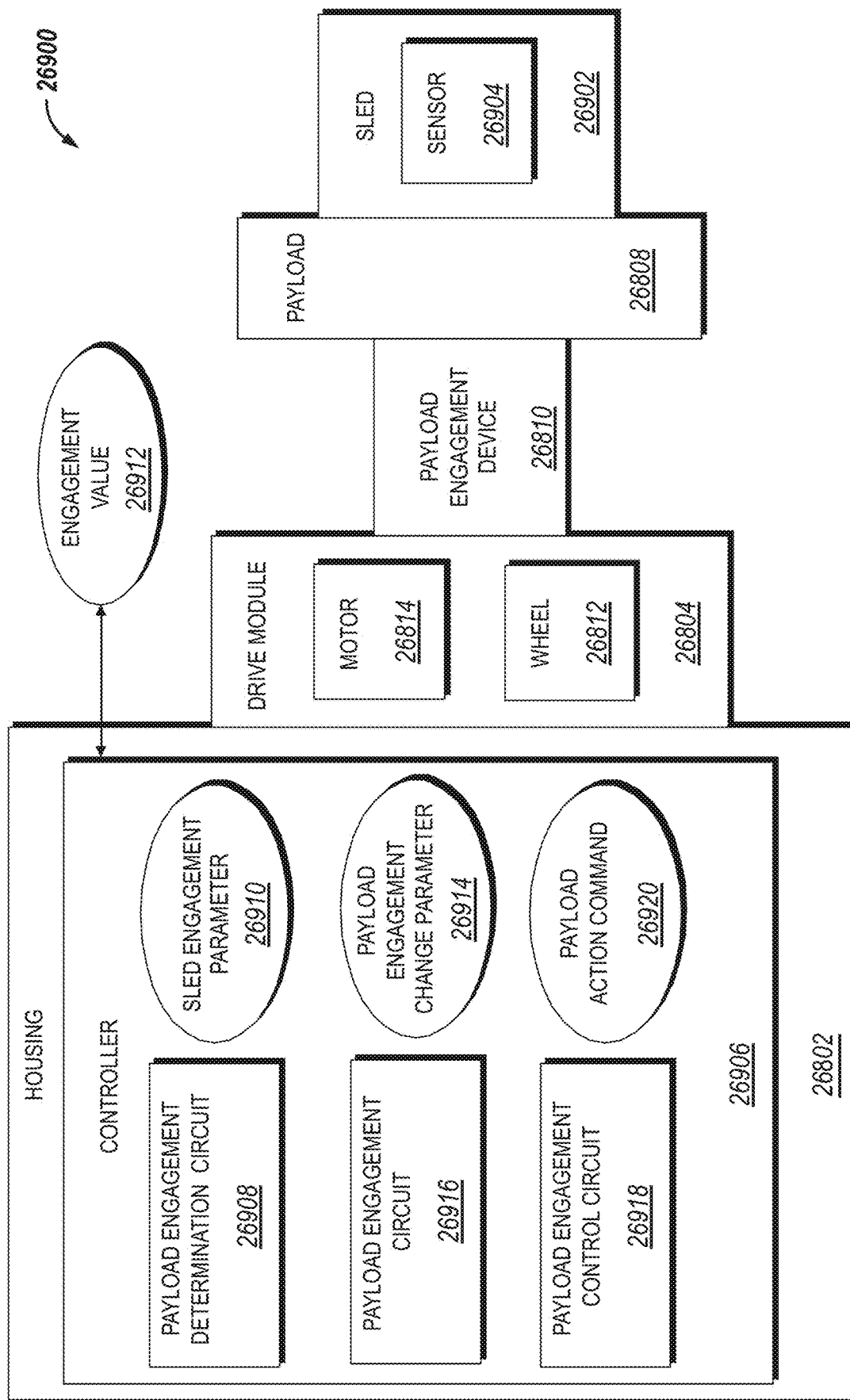
FIG. 109 represents an embodiment of an inspection robot.

Referring to FIG. 109, an inspection robot 26900, may include a housing 26802, at least one drive module 26804, a payload 26808, and a payload engagement device 26810. The drive module 26804 may include at least one wheel 26812, and a motor 26814. The drive module 26804 is operationally coupled to the housing 26802. The inspection robot 26900 may further include a sled 26902 including a sensor 26904. a controller 26906. The sled 26902 is operationally coupled to the payload 26808. The payload engagement device 26810 operationally couples the payload 26808 to the drive module 26804 and is structured to regulate an engagement of the sled 26902 with an inspection surface.

The inspection robot may further include a controller 26906. The controller is shown in the housing 26802, but this representation is only for illustrative purposes and is not meant to limit the location of the controller 26906. The controller 26906 may include a payload engagement determination circuit 26908, structured to determine a sled engagement parameter 26910 in response to an engagement value 26912 which is representative an interactive force between the sled 26902 and the inspection surface. The engagement value 26912 may be determined by the sled 26902 or the payload engagement device 26810 and then provided to the payload engagement determination circuit 26908. The controller 26906 may further include a payload engagement circuit 26916 to determine a payload engagement change parameter 26914 (whether there needs to be a change in engagement between the sled and the inspection surface and it so what kind of change) based, at least partially, on the sled engagement parameter 26910. A payload engagement control circuit 26918 may provide a payload action command 26920, in response, at least part on the payload engagement change parameter 26914. Payload action commands 26920 may include adjust payload height, raise payload, lower payload, set payload height, adjust payload angle, adjust angle of force applied to payload, move to defined position (e.g. a first position where the sensor engages the inspection surface, a second position where the payload is lifted away from the inspection surface, a third position for when the robot is not in use, and the like), adjust a payload pressure, set a spring compression, and the like.

Figure 110:
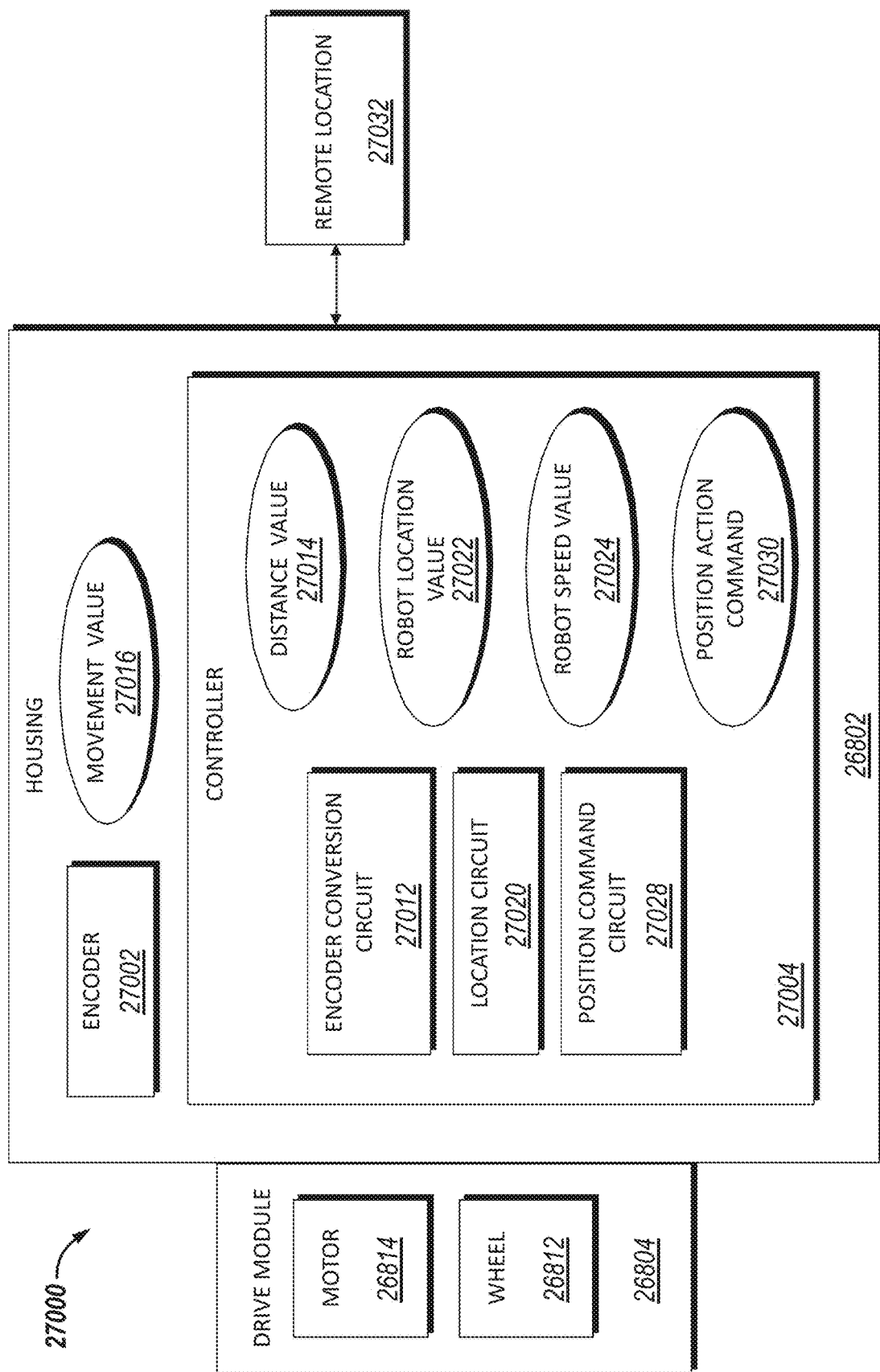
FIG. 110 depicts a schematic of an inspection robot with an encoder.

Referring to FIG. 110, an inspection robot 27000, may include a housing 26802, a drive module 26804 (at least one and possibly multiple), a controller 27004, and an encoder 27002 positioned within the footprint of the housing. The footprint of the housing (or housing footprint) refers to the space between the housing 26802 and the inspection surface when viewed from above the housing 26802. Positioning the encoder 27002 closer to a horizontal center of the housing footprint may result more accurate determinations of the robot's position. In an illustrative example, an encoder positioned in a center of a housing footprint and an encoder position on a drive module beyond the housing footprint would provide different distances travelled when the robot turned with the encoder positioned on the drive module travelling significantly further.

The drive module 26804 includes a wheel 26812 and a motor 26814. The drive module is operatively coupled to the housing 26802 and enables movement of the inspection robot 27000 along an inspection surface. The encoder 27002 may include an encoder wheel 22202, and an encoder connector 22210 to couple the encoder 27002 to the housing 26802. The controller 27004 may include an encoder conversion circuit 27012 to calculate a distance value 27014 representative of how far the robot has traveled in an interval based on a movement value 27016 received from the encoder 27002. The controller 27004 may further include a location circuit 27020 to determine a robot location value 27022 or a robot speed value 27024 based on the distance value 27014. A position command circuit 27028 may provide a position action command 27030 in response, at least in part, to the robot location value 27022 or the robot speed value 27024. The drive module 26804 may be responsive to the position action command 27030.

Position action commands 27030 may include: a command to integrate the robot location value 27022 with any data obtained at that location, a command to communicate the robot location value 27022 or the robot speed value 27024 to a remote location 27032, a halt command, a set speed command, a change speed command, a change direction command, a return home command, and the like.

The encoder 27002 may be positioned in a center of the housing footprint. The encoder 27002 may be a contact or non-contact encoder. The encoder 27002 shown in FIGS. 62-63 is for illustrative purposes and not meant to limit the type of encoder. The encoder wheel 22202 may include a non-slip surface or may include a tire with a non-slip to surface to help ensure engagement with the inspection surface and increase accuracy of the encoder measurements (no false readings due to slipping of the encoder wheel). The encoder limbs 22206, 22208 may be joined by a flexible joint 22204 to enable the encoder wheel 22202 to move vertically in response to an obstacle on the inspection surface. The encoder connector 22210 may be designed to break-away from the housing in response to an obstacle on the inspection surface, an opposing force, and the like. Breaking away reduces the chance that the encoder 21718 can act like a lever to peel the inspection robot 21700 off an inspection surface if a large obstacle was encountered.

In embodiments, the encoder 21718, 27002 may include a hall effect sensor and the movement value 27016 may be representative of changes in magnetic flux. In embodiments, the encoder may include a visual mark on the wheel, a visual sensor. The movement value 27016 may then be reflective of a stream of optical data, a wheel count, of the like.

The encoder 21718 may be active or passive. In embodiments, the encoder connector 22210 may include a spring structured to provide a downward force on the encoder 21718 while still allowing a limited amount of vertical freedom for traversing small obstacles or irregularities in the inspection surface. The encoder connector 22210 may include an actuator to actively adjust a position, force, or angle of the encoder 21718 relative to the inspection surface. The actuator may provide a downward force on the encoder 21718 to ensure good contact with the inspection surface, the actuator may raise the encoder 21718 up, such as to avoid an obstacle on the inspection surface, the actuator may move the encoder 21718 to a storage position, and the like.

Figure 111:
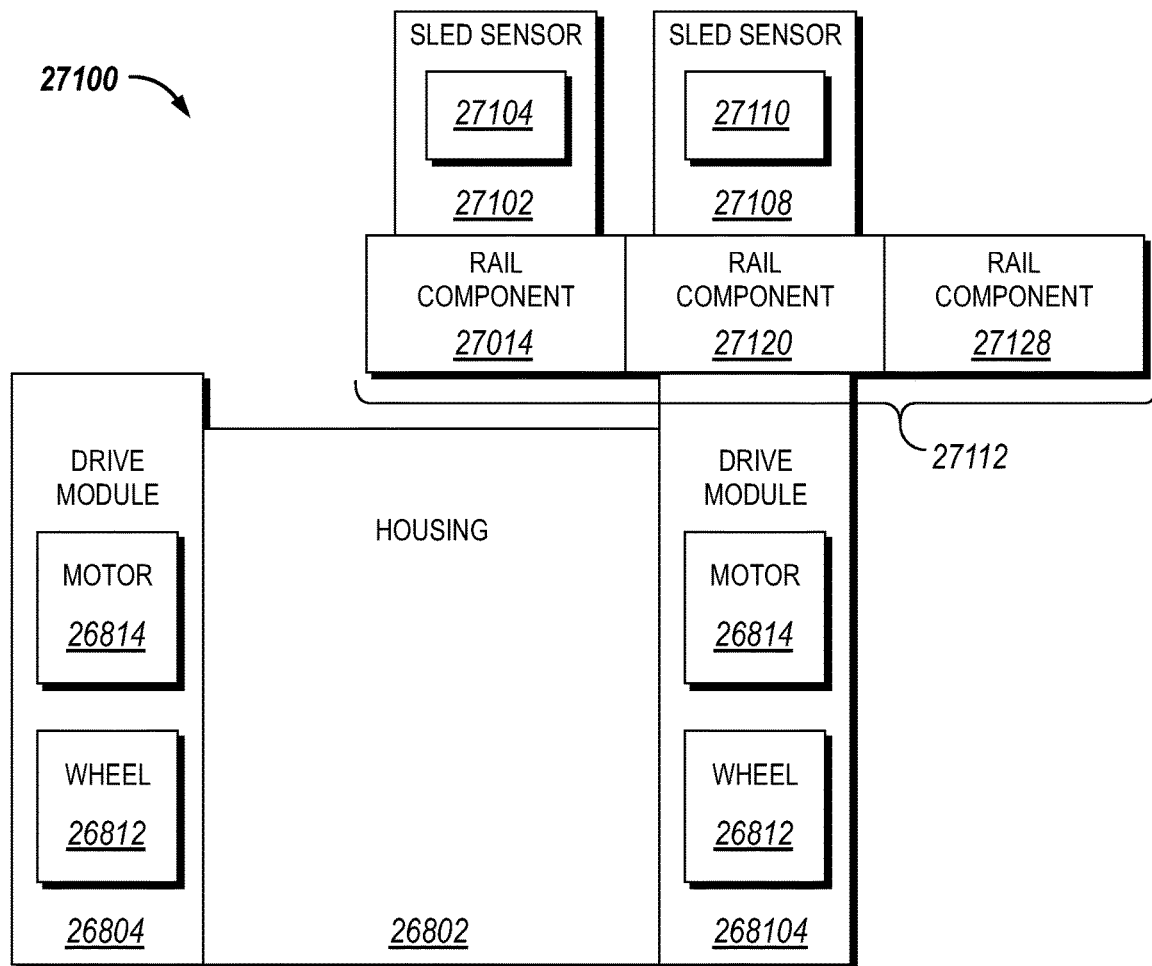
FIG. 111 depicts a schematic of an inspection robot.
Figure 112:
FIG. 112 depicts multiple rail components.

Referring to FIGS. 111-112, an inspection robot 27100, may include a housing 26802, and at least one drive module 26804 operatively linked to the house, where the drive module 26804 comprises at least one wheel 26812 and a motor 26814. The inspection robot 27100 may also include a first sled 27102 with a first sensor 27104 and a second sled 27108 with a second sensor 27110. The inspection robot 27100 may include a payload 27112 made up of a first rail component 27114 with at least a first connector 27118 and a second rail component 27120 with at a second connector 27122. The connectors 27118, 27122 are each a portion of Hirth joint, allowing the first and second rail components 27114, 27120 to be connected at a discrete engagement position or angle where the engagement position or angle may be selected based on the geometry or contours of the inspection surface. The first and second sleds 27102, 27108 include quick release connectors shaped to easily attach to the rail components 27114, 27120. In some embodiments there may be a locking feature such as a bolt, screw, pin, or the like which may be designed to pass through the center of the Hirth joint and hold the first and second rail components 27114, 27120 together.

In embodiments the first and second rail components 27114, 27120 may have more than a single connector 27132. Rail components may be variable in length. In an illustrative example, the second rail component 27120 may have a third connector 27124. There may be a third rail component 27128 with a fourth connector 27130. The second rail component may be joined to the first rail component 27114 and the third rail component. Thus, a payload may be made of a variable number of rail components of varying length with each connection between two rail components may be set to a unique, discrete engagement position or angle. The selection of the engagement positions may be based on features of the inspection surface.

Figure 67:
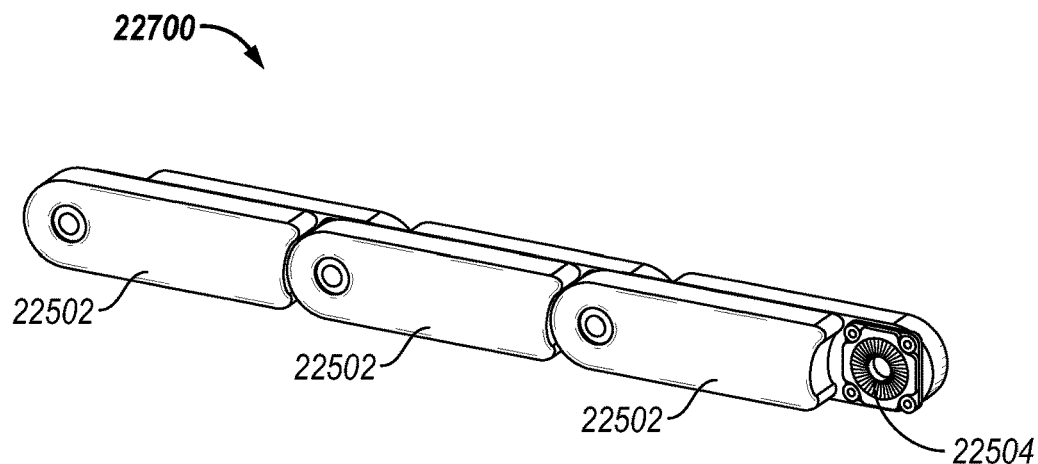
FIG. 67-68 depict example rail configurations.
Figure 68:
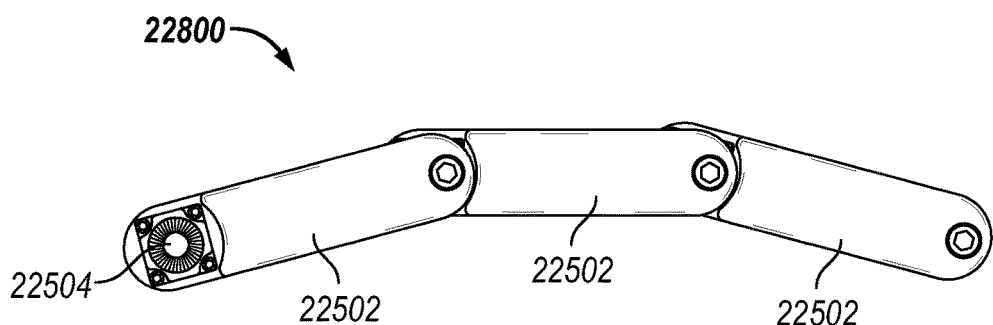

Referring to FIGS. 65-68 shows examples 22500, 22600, 22700, 22800 rails. FIGS. 65-66 show examples of rail components 22502 and connectors 22504. The connectors shown are Hirth joints although others are contemplated. FIG. 67 shows three rail components 22502 connected linearly to form a straight payload rail 22700. FIG. 68 shows three rail components 22502 connected at angle relative to each other to form a curved payload 22800.

Figure 113:
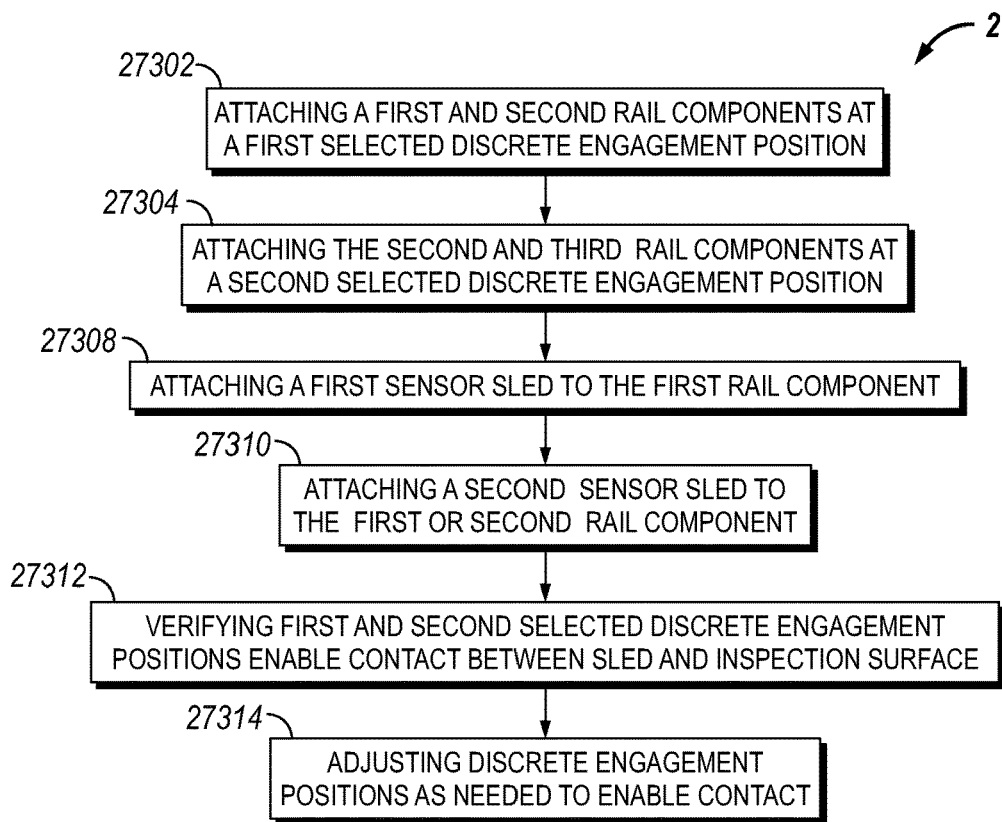
FIG. 113 depicts a method of provisioning an inspection robot.

Referring to FIG. 113, a flowchart for a method 27300 for provisioning an inspection robot is shown. The method 27300 includes attaching a first rail component to a second rail component at selected one of a plurality of discrete engagement positions (Step 27302) and attaching the second rail component to a third rail component at a second selected one of a plurality of discrete engagement positions (Step 27304). Once the payload 27112 is assembled, attaching a first sensor sled to the first rail component (Step 27308), and attaching a second sensor sled to a second or third rail component (Step 27310) are done. The method 27300 may then include verifying that the first and second selected discrete engagement positions enable contact between each sled and the inspection surface (Step 27312) and adjusting the discrete engagement positions (angles between rail components) as needed to enable contact (Step 27314).

Figure 114:
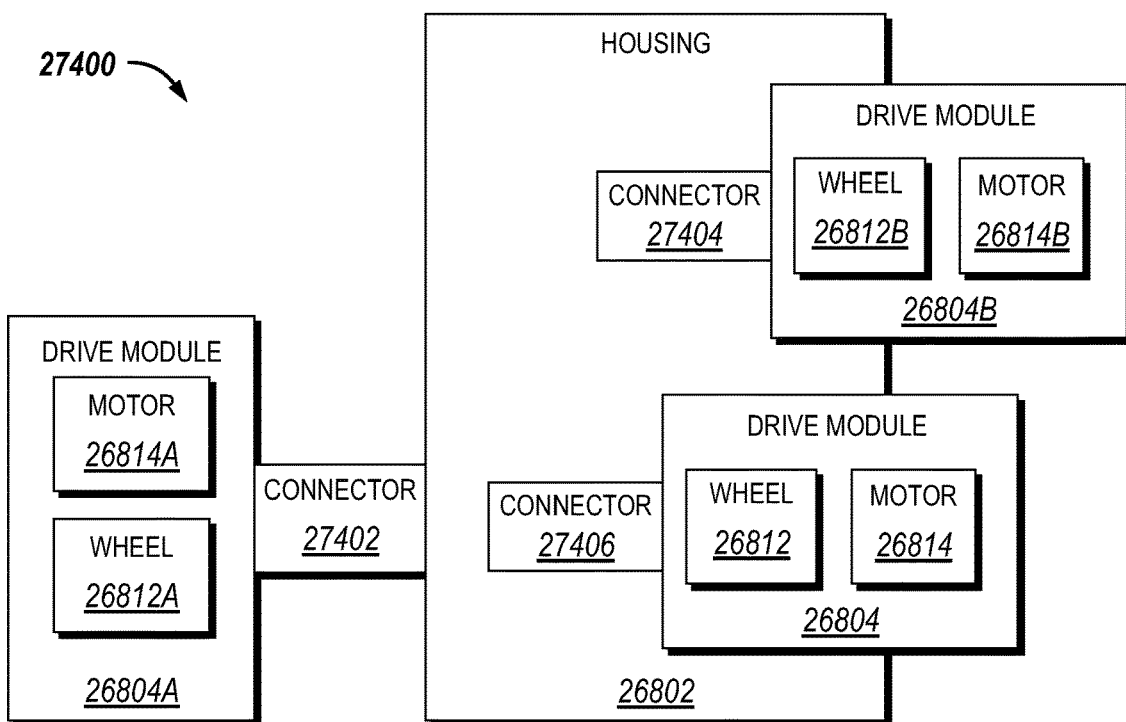
FIG. 114 depicts an inspection robot.

Referring to FIG. 114, an inspection robot 27400, may include a housing 102 having a first connector 27402 on a first side of the housing 102 and a second connector 27404 on a second side of the housing, a first drive module 26804A may include at least one wheel 26812A and a first motor 26814A and a second drive module 26804B may include at least one wheel 26812B and a second motor 26814B.

In some embodiments, a drive module 26804 may include the wheel 26812 interposed between the housing 26802 and the motor 26814. A wheel 26812 may be a steerable wheel designed to allow the inspection robot to be maneuvered on the inspection surface. A wheel 26812 may be a driven wheel where a motor 26814 causes the wheel 26812 to turn and propel the inspection robot 27400 over the inspection surface. In embodiments, a wheel 26812 may be a steerable, driven wheel.

In embodiments, a motor 26814 may be directly coupled to a wheel 26812 such as the motor being in line with the wheel such that the rotation of the motor 26814 rotates an axel or hub of the wheel 26812. In embodiments, a wheel 26812 may be interposed between the housing 26802 and a motor 26814. This may mean that the wheel 26812 is closer to the housing 26802 than the motor 26814 when both wheel 26812 and motor 26814 are outside a footprint of the housing. Note, the term footprint, footprint of the housing 26802, housing footprint, and similar such terms refer to a projection of the housing 26802 onto the inspection surface and the corresponding space between the housing 26802 and the inspection surface including the projection. When either a wheel 26812, or a wheel 26812 and corresponding motor 26814 are partially or wholly within the housing footprint, the wheel 26812 being interposed between the motor 26814 and the housing 26802 means that it is closer to a horizontal center of the housing 26802 relative to the motor 26814. This positioning of the wheel closer to the center of the inspection robot 27400 may provide a smaller wheel footprint (i.e., a tighter wheelbase) which may improve the maneuverability of the inspection robot 27400 in confined areas or when inspecting high curvature assets such as pipes.

In embodiments, a motor 26814 may be indirectly coupled to a wheel 26812 and drives the wheel via gears, belts, and the like. A motor 26814 may be positioned in front, above, or behind a wheel 26812 relative to a direction of travel (see FIGS. 59-61). Drive modules are swappable so the relative position of a motor 26814 and wheel 26812 may vary between drive modules 26804 connected to a common housing 26802. In embodiments, motors 26814 may have a common position relative to a wheel 26812, e.g., all motors 26814 may be positioned in front of their corresponding wheels 26812, all motors 26814 may be positioned behind their corresponding wheels 26812, or all motors 26814A may be positioned on top of their corresponding wheels 26812A. In embodiments, motors 26814 may each have a unique position relative to their corresponding wheels 26812 on a common inspection robot 27400, For example, on an inspection robot 27400, a motor 26814A may be in front of a wheel 26812A in a first attached drive module 26804 and, for a second attached drive module 26804, a motor 26814B may be positioned behind or above the corresponding wheel(s) 26812B.

In embodiments, the location of wheels 26812 and motors 26814 relative to the housing 26802 may be unique. For one drive module 26804, the wheel 26812 may be fully in the housing footprint while the motor 26814 was positioned partially or fully outside the housing footprint. For another drive module 26804 attached to the housing 26802, both the wheel 26812 and motor 26814 may be fully in the housing footprint or fully outside the footprint. The drive modules may be selected for the relative positions of the wheels 26812 and motors 26814 in order to best accommodate an inspection surface, for example to inspect as closely as possible to a wall bordering one side of the inspection surface.

Figure 115:
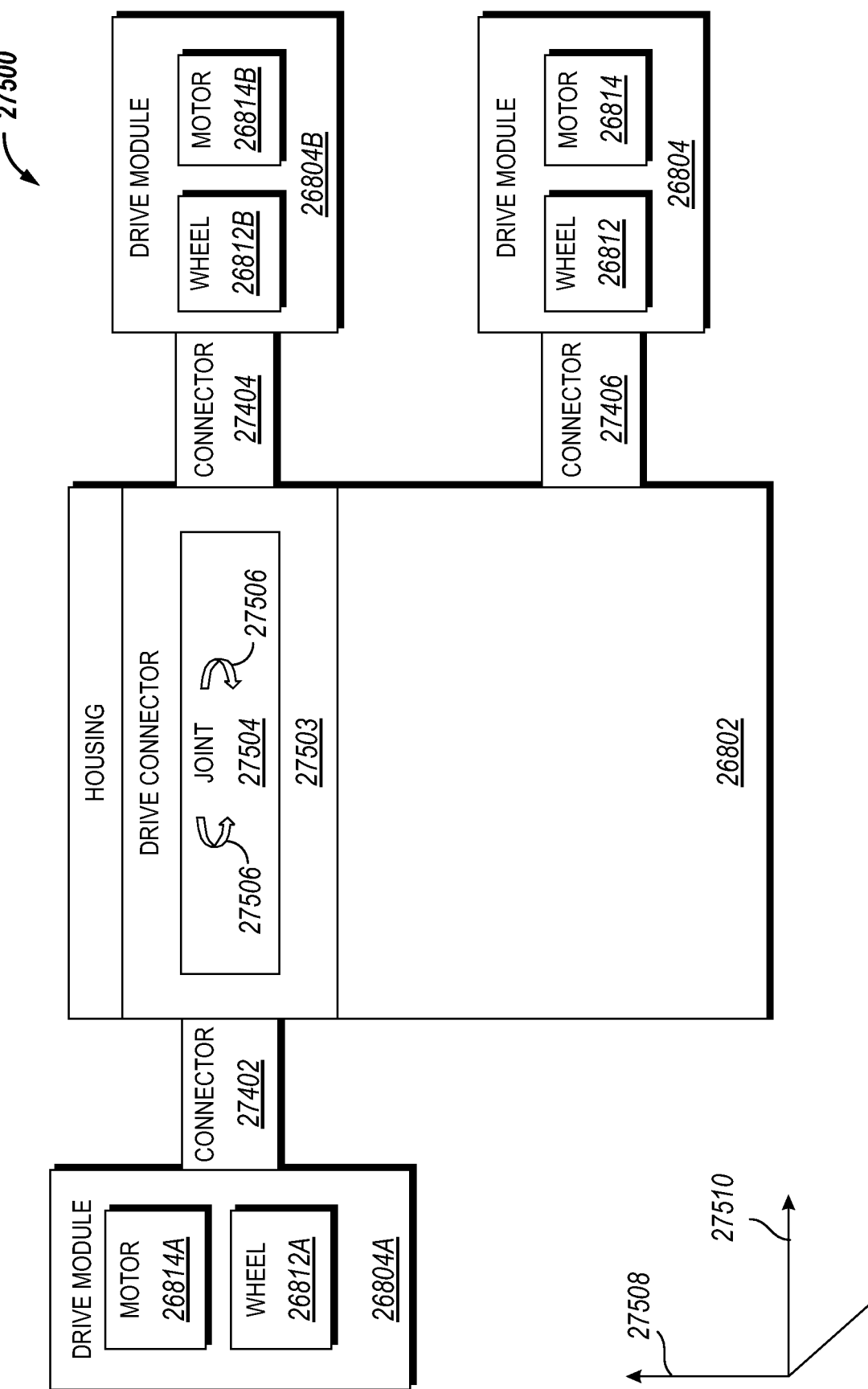
FIG. 115 depicts an inspection robot.

Referring to FIG. 115, an inspection robot 27500 may include a housing 26802 having a first connector 27402 and a second connector 27404. The connectors 27402, 27404 may be located on the same side of the housing or on different or opposite sides of the housing 26802. A first drive module 26804A including a first wheel 26812A and a first motor 26814A may be operatively coupled to the first connector 27402 and a second drive module 26804B, including a second wheel 26812B and a second motor 26814B, may be operatively coupled to the second connector 27404. A drive connector 27503 may couple the first and second drive modules 26804A, 26804B. A drive connector 27503 may include a joint 27504 which allows the first and second drive modules 26804A, 26804B to rotate relative to one another (rotation 27506) around a first axis 27510 which is at a first angle relative to the direction of travel 27508. The first axis 27510 may be perpendicular to the direction of travel 27508. Additional drive modules 26804 may also be connected to the housing 26802 via an additional connector 27406.

With reference to FIG. 125, there is illustrated an example wheel 27200. It shall be appreciated that wheel 27200 may be incorporated into any of the drive modules, inspection robots, systems, assemblies, or other embodiments described herein.

Wheel 27200 includes plurality of layers structured to form a wheel when an axle is inserted through the plurality of layers. The plurality of layers includes wheel enclosures 27201 and 27203, inter-covers 27205 and 27207, diffusion barriers 27213 and 27215, and a magnetic hub 27209.

Wheel enclosure 27201 and 27203 are structured to contact an inspection surface 27217 while an inspection robot is positioned on inspection surface 27217. Wheel enclosures 27201 and 27203 may be non-ferrous and include non-ferrous material. The non-ferrous material may include a metallic material, such as aluminum, zinc, or bronze, to name but a few examples. The non-ferrous material may include a plastic, such as Viton, Poly Urethane (PU), or ethylene propylene diene terpolymer (EPDM), to name but a few examples. In certain embodiments, wheel enclosures 27201 and 27203 may be any material having a hardness less than the hardness of inspection surface 27217 in order to prevent marring. Because the non-ferrous wheel enclosures are not magnetically coupled to magnetic hub 27209, the wheel enclosures are more readily replaced due to wear, damage, or to accommodate the inspection surface material.

On the outer surface of each wheel enclosure 27201 and 27203, there is a serration texture 27211. In the illustrated embodiment, serration texture 27211 includes a plurality of horizontal serrations across a width of each wheel enclosure. Serration texture 27211 may include tooth-like projections arranged lengthwise in parallel. The serrations include a serration pitch which may be selected to increase traction between the wheel enclosure and the inspection surface or to prevent marring of the inspection surface, to name but a few examples. For high temperature inspection surfaces, a serration texture may be used instead of tires fitted over a wheel enclosure given the higher temperature threshold of the wheel enclosure compared to the tires. For example, the serration texture may be used for inspection surface temperatures greater than 300 degrees Fahrenheit.

Inter-covers 27205 and 27207 are interposed between the wheel enclosures 27201, 27203 and magnetic hub 27209 and may be structured to guide a magnetic field of magnetic hub 27209. For example, inter-covers 27205 and 27207 may be structured to guide the magnetic field in order to prevent damage to electronic components of the inspection robot into which wheel 27200 is incorporated, or to increase the holding power of magnetic hub 27209 to inspection surface 27217. The magnetic field may be guided by shaping the magnetic field lines produced by the magnet of magnetic hub 27209. Inter-covers 27205 and 27207 may include a ferromagnetic material, such as carbon steel, to name but one example. In certain embodiments, a carbon steel plate of inter-covers 27205 and 27207 is coated with an anti-corrosion coating, such as a zinc coating, to name but one example. In certain embodiments, wheel 27200 does not include one or both of inter-covers 27205 and 27207.

Magnetic hub 27209 is interposed between inter-covers 27205 and 27207. Hub 27209 includes a magnet structured to generate a magnetic field in order to magnetically couple wheel 27200 to inspection surface 27217. As the environment of the inspection surface 27217 varies, the magnetic field of a given magnet may weaken to the extent the magnet produces a magnet field with insufficient holding power to magnetically couple wheel 27200 to inspection surface 27217. In certain embodiments, magnetic hub includes a high temperature magnet having a high temperature threshold, such as a threshold greater than 300 degrees Fahrenheit, to name but one example. The high temperature threshold may correspond to the temperature at which the intensity of the magnetic field begins to decrease due to temperature or at which the intensity of the magnetic field is insufficient to generate the holding power to magnetically couple wheel 27200 to inspection surface 27217. The high temperature magnet may be comprised of a rare earth metal. In certain embodiments, the high temperature magnet may be comprised of neodymium, samarium cobalt (SmCo), ceramic, or alnico (Al, Ni, Co), to name but a few examples.

Diffusion barriers 27213 and 27215 are structured to prevent damage caused by two other dissimilar layers of wheel 27200 (e.g., distinct metals) being in contact with each other. Diffusion barriers 27213 and 27215 may include at least one of a coating, a surface hardening, or a non-metallic cover. In certain embodiments, diffusion barriers 27213 and 27215 are incorporated into one of the wheel enclosures, the inter-covers, or the magnetic hub of wheel 27200.

Diffusion barriers 27213 and 27215 are interposed between magnetic hub 27209 and one of the inter-covers 27205 and 27207. In certain embodiments where wheel 27200 does not include inter-covers 27205 and 27207, diffusion barriers 27213 and 27215 are interposed between magnetic hub 27209 and non-ferrous wheel enclosures 27201 and 27203. In certain embodiments, wheel 27200 includes a diffusion barrier interposed between a wheel enclosure and an inter-cover. For example, wheel 27200 may include a diffusion barrier between a non-ferrous wheel enclosure 27201 and inter-cover 27205. In certain embodiments, wheel 27200 does not include inter-covers but includes a diffusion barrier between magnetic hub 27209 and one, but not both, wheel enclosures 27201 and 27203. In certain embodiments, wheel 27200 includes fewer diffusion barriers or no diffusion barriers.

In certain embodiments, wheel 27200 may be formed by a user based on inspection surface characteristics and operating characteristics of a plurality of different wheel enclosures. The user may form wheel 27200 using a kit including the plurality of different wheel enclosures which include different characteristics, such as different hardnesses or different temperature thresholds. The kit may also include a plurality of magnets with different temperature thresholds and different inter-covers. For example, for a high temperature inspection surface, the user may select aluminum wheel enclosures with serration texture on the outer surfaces, carbon steel plate inter-covers, and a high temperature magnet.

With reference to FIG. 126, there is illustrated an example process 28800 for inspecting an inspection surface. Process 28800 may be implemented in whole or in part in one or more of the inspection robots disclosed herein. It shall be further appreciated that variations of and modifications to process 28800 are contemplated including, for example, the omission of one or more aspects of process 28800, the addition of further conditionals and operations, or the reorganization or separation of operations and conditionals into separate processes.

Process 28800 begins at operation 28801 including determining at least one inspection surface characteristic. The inspection surface characteristic may include a temperature of the inspection surface and/or a hardness of the inspection surface, to name but a few examples.

Process 28800 proceeds to operation 28803 including selecting a first wheel enclosure having a serration texture from a plurality of wheel enclosures in response to the at least one inspection surface characteristic.

Process 28800 proceeds to operation 28805 including selecting a second wheel enclosure having the serration texture from the plurality of wheel enclosures in response to the at least one inspection surface characteristic.

In certain embodiments, selecting the one or more wheel enclosures includes determining the hardness of the at least one inspection surface characteristic is greater than a hardness of the non-ferrous material. By selecting a wheel enclosure with a hardness less than a hardness of the inspection surface, the wheel enclosure is structured to contact the inspection surface without marring the inspection surface.

In certain embodiments, determining the temperature of the at least one inspection surface characteristic is less than a temperature threshold of the first wheel enclosure. In this way, the selected wheel enclosures are structured to withstand the temperature of the inspection surface without being damaged.

Process 28800 proceeds to operation 28807 including assembling a wheel of an inspection robot, the wheel including an axle inserted through the first wheel enclosure, a magnetic hub, and a second wheel enclosure. In certain embodiments, the wheel enclosures each comprise a non-ferrous material so as not to be magnetically coupled to the magnetic in order to more easily swap wheel enclosures, assemble the wheel, and disassemble the wheel.

Process 28800 proceeds to operation 28809 including moving the inspection robot on an inspection surface such that the first wheel enclosure and the second wheel enclosure each directly contact the inspection surface.

It shall be appreciated that any or all of the foregoing features of example process 28800 may also be present in the other processes disclosed herein, such as the process illustrated in FIG. 127, to name but one example.

With reference to FIG. 127 there is illustrated an example inspection process 28900 for inspecting an inspection surface. Process 28900 may be implemented in whole or in part in one or more of the inspection robots disclosed herein. It shall be further appreciated that variations of and modifications to process 28900 are contemplated including, for example, the omission of one or more aspects of process 28900, the addition of further conditionals and operations, or the reorganization or separation of operations and conditionals into separate processes.

Process 28900 begins at operation 28901 including operating an inspection robot including a wheel including a magnetic hub including a magnet having a first temperature threshold and a plurality of wheel enclosures having a second temperature threshold. The components of the wheel may have different temperature thresholds due to being composed of different materials. The temperature threshold for the magnetic hub may be based on the temperature at which a magnetic field of the magnetic hub begins to reduce or is reduced to a level insufficient to magnetically couple the wheel to the inspection surface during an inspection.

Process 28900 proceeds to operation 28903 including determining an inspection surface temperature exceeds at least one of the first temperature threshold or the second temperature threshold. For example, the wheel enclosure may include tires that are damaged by an inspection surface temperature above 300 degrees Fahrenheit, to name but one example.

Process 28900 proceeds to operation 28905 including reconfiguring the wheel in response to determining the inspection surface temperature exceeds the at least one of the first temperature threshold or the second temperature threshold. Where the inspection surface temperature exceeds the temperature threshold for the wheel enclosures but not the temperature threshold for the magnetic hub, reconfiguring the wheel includes replacing the wheel enclosures with other wheel enclosures having a third temperature threshold greater than the inspection surface temperature. In certain embodiments, reconfiguring the wheel includes selecting the second plurality of wheel enclosures based on the third temperature threshold and a hardness of the new wheel enclosures relative to an inspection surface hardness. Where the inspection surface temperature exceeds the temperature threshold for the magnetic hub, reconfiguring the wheel includes replacing the first magnet with a high temperature magnet having a temperature threshold greater than the inspection surface temperature. To give but one example, the temperature threshold for the high temperature magnet or the replacement wheel enclosures may be equal to or greater than 300 degrees Fahrenheit.

It shall be appreciated that any or all of the foregoing features of example process 28800 may also be present in the other processes disclosed herein, such as the process illustrated in FIG. 127, to name but one example.

Figure 128A:
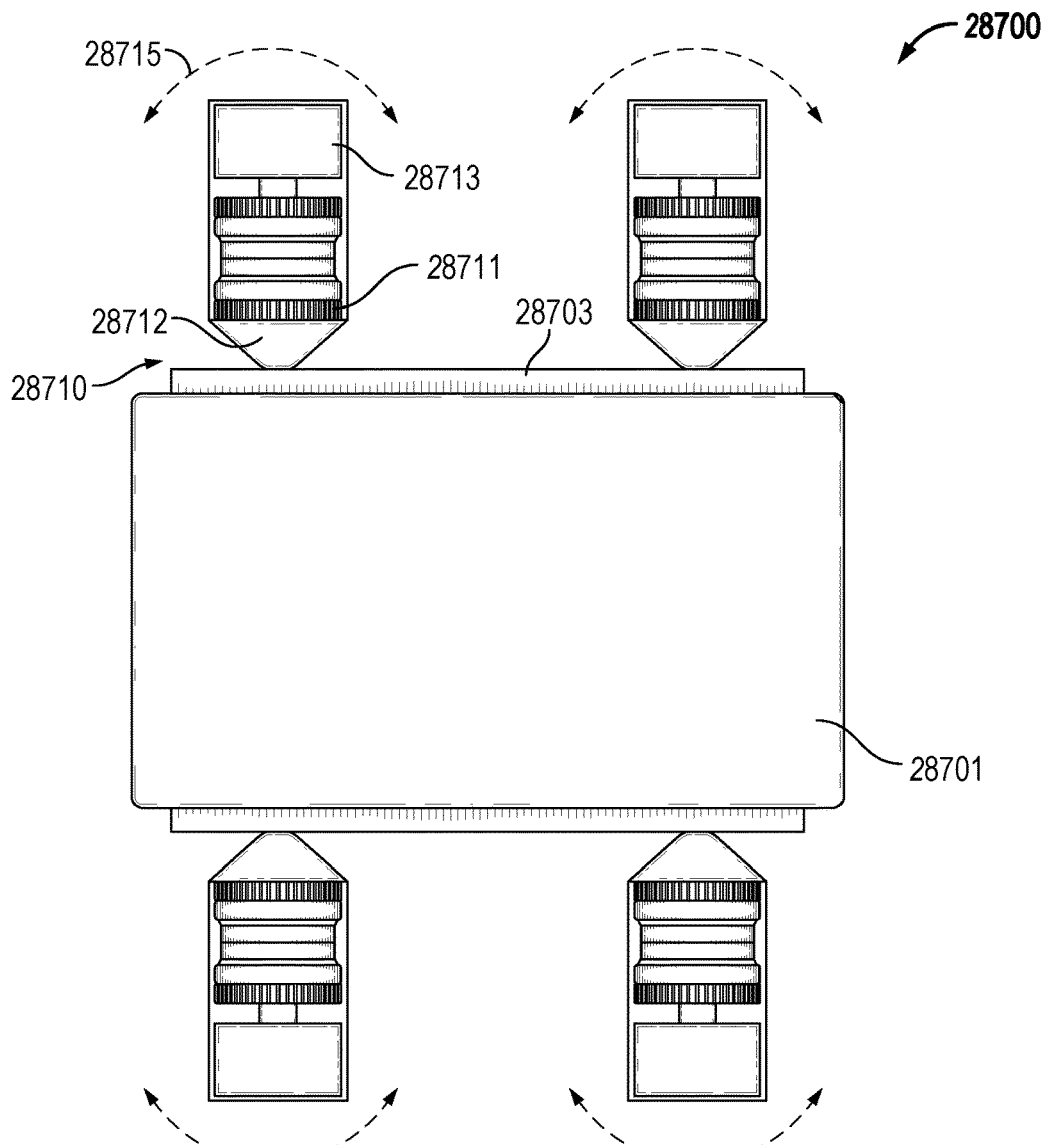
FIG. 128A is a top view of an example inspection robot including an independent drive module suspension system.
Figure 128B:
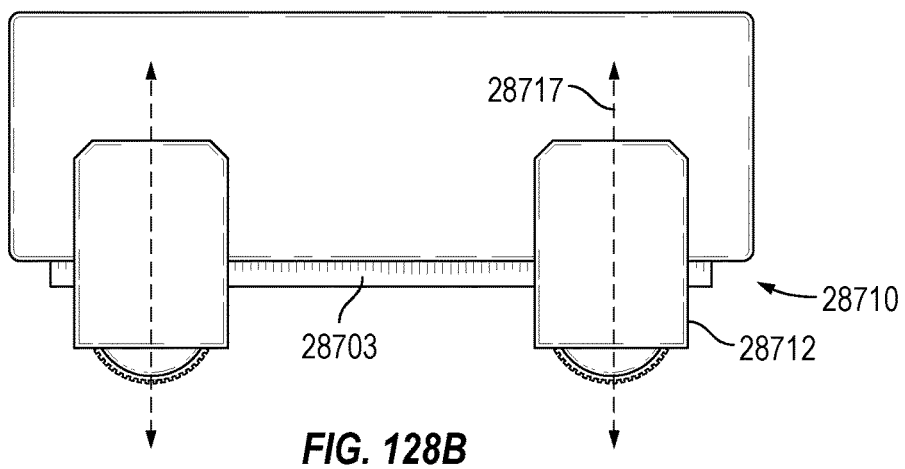
FIG. 128B is a side view of the example inspection robot of FIG. 128A.

With reference to FIGS. 128A and 128B, there is illustrated an example inspection robot 28700 structured to move across an inspection surface while the wheels of the inspection robot maintain contact with the inspection surface. In certain embodiments, the inspection surface comprises a pipe, a plurality of pipes, or another type of uneven surface. In certain embodiments, the inspection robot must perform tight turns while inspecting the inspection surface.

Inspection robot 28700 includes a center body 28701 and a suspension system 28703 coupled to center body 28701. A plurality of drive modules 28710, including drive module 28712, are coupled to suspension system 28703. Each of the plurality of drive modules 28710 includes a wheel and a motor, such as wheel 28711 and motor 28713 of drive module 28712. The wheel of each drive module is positioned between center body 28701 and the motor of the drive module such that center body 28701 is located on a first side of the side and the corresponding motor is positioned on the opposite side of the wheel.

Suspension system 28703 is structured to allow each of the plurality of drive modules 28710 to rotate independently of the rotation of the other drive modules. In certain embodiments, suspension system 28703 is structured to allow a vertical rotation 28715 of each drive module independent of the other drive modules. In certain embodiments, suspension system 28703 is structured to allow a horizontal rotation 28717 of each drive module independent of the other drive modules.

By allowing independent rotation of each of the plurality of drive modules 28710, each wheel of the inspection robot maintains contact with the inspection surface while the inspection robot traverses uneven inspection surfaces. By positioning the motors on the outside of the drive modules and the wheels on the inside, inspection robot 28700 is structured to negotiate a tighter turn compared to an inspection robot with drive modules having a wheel position on the outside of the drive module.

It shall be appreciated that any or all of the foregoing features of inspection robot 28700 may also be present in the other inspection robots disclosed herein.

Figure 129:
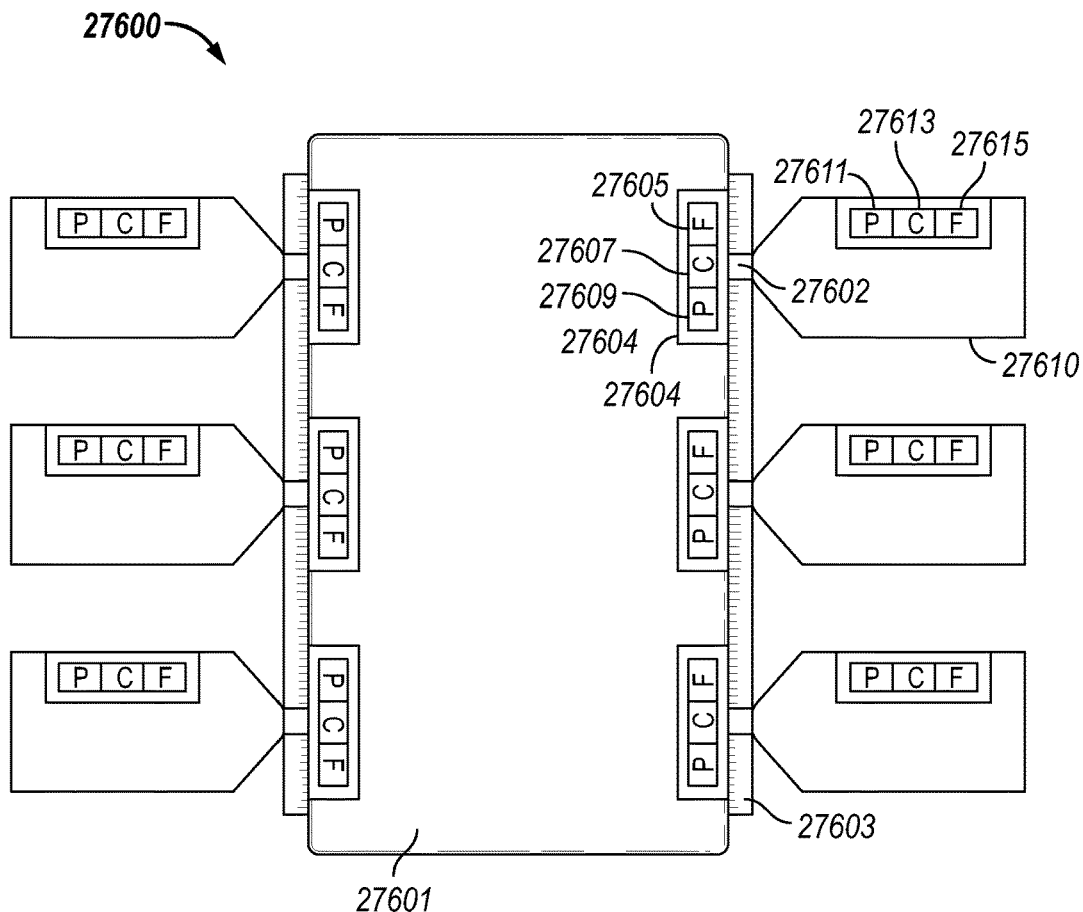
FIGS. 129-130 are box diagrams of example inspection robots.

With reference to FIG. 129, there is illustrated an example inspection robot 27600. Robot 27600 includes a center body 27601 coupled to a suspension system 27603. Inspection robot 27600 also includes a plurality of drive modules, such as drive module 27610, structured to be coupled to suspension system 27603 at a plurality of connection points, such as connection point 27602. In certain embodiments, each drive module of the plurality of drive modules is swappable with another drive module of inspection robot 27600.

Each drive module of inspection robot 27600 is structured to receive power from center body 27601, communicate with center body 27601, and receive cooling fluid from center body 27601. Center body 27601 includes separate power, communication, and cooling fluid interfaces for each drive module. For example, center body 27601 includes power interface 27609, communication interface 27607, and cooling fluid interface 27605 corresponding to drive module 27610. In the illustrated embodiment, center body 27601 includes a distinct interface plate, such as interface plate 27604, for each drive module connection point. In other embodiments, center body 27601 may include a different arrangement of interface plates, such as an interface plate for multiple drive modules, an interface plate for one type of interface for multiple modules, or an interface plate for two types of interfaces for multiple modules. In certain embodiments, the interface plate or plates of center body 27601 are removeable and may be replaced based on the number of drive modules coupled to center body 27601. In certain embodiments, one or more of the interfaces of center body 27601 are not coupled to removeable interface plates.

Each drive module includes interfaces structured to be coupled to the corresponding interfaces of center body 27601. For example, drive module 27610 includes a power interface 27611, a communication interface 27613, and a cooling fluid interface 27615. Center body 27601 may be configured to operate the interfaces corresponding to each drive module independently from the operation of the other drive modules. For example, center body 27601 may transmit a power value to drive module 27610 by way of power interface 27609 while transmitting a different power value to another drive module of inspection robot 27600. In another example, center body 27601 may transmit a command to drive module 27610 while transmitting a different command or no command to another drive module of inspection robot 27600. In still another example, center body 27601 may transmit cooling fluid to drive module 27610 by way of cooling fluid interface 27605 at a rate while transmitting cooling fluid at a different rate to another drive module.

In the illustrated embodiment of FIG. 128A, inspection robot 28700 includes four drive modules. In certain embodiments, additional drive modules may be coupled to the unused connection points of suspension system 27603. For example, inspection robot 27600 may be reconfigured to include six drive modules. In other embodiments, inspection robot 27600 may include three drive modules instead of four drive modules.

It shall be appreciated that any or all of the foregoing features of inspection robot 27600 may also be present in the other inspection robots disclosed herein.

Figure 116:
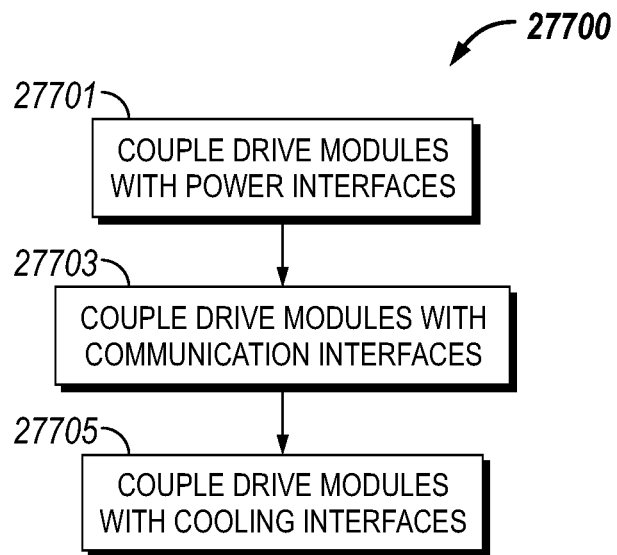

With reference to FIG. 116, there is illustrated an example process 27700 for assembling an inspection robot. Process 27700 may be implemented in whole or in part in one or more of the inspection robots or robot controllers disclosed herein. It shall be further appreciated that variations of and modifications to process 27700 are contemplated including, for example, the omission of one or more aspects of process 27700, the addition of further conditionals and operations, or the reorganization or separation of operations and conditionals into separate processes.

Process 27700 begins at operation 27701 including coupling a plurality of drive modules to a center body of the inspection robot by way of a plurality of power interfaces of the center body.

Process 27700 proceeds to operation 27703 including coupling the plurality of drive modules to the center body by way of a plurality of communication interfaces of the center body.

Process 27700 proceeds to operation 27705 including coupling the plurality of drive modules to the center body by way of a plurality of cooling fluid interfaces of the center body.

It shall be appreciated that any or all of the foregoing features of example process 27700 may also be present in the other processes disclosed herein, such as the processes illustrated in FIGS. 117-121, to name but a few examples.

Figure 117:
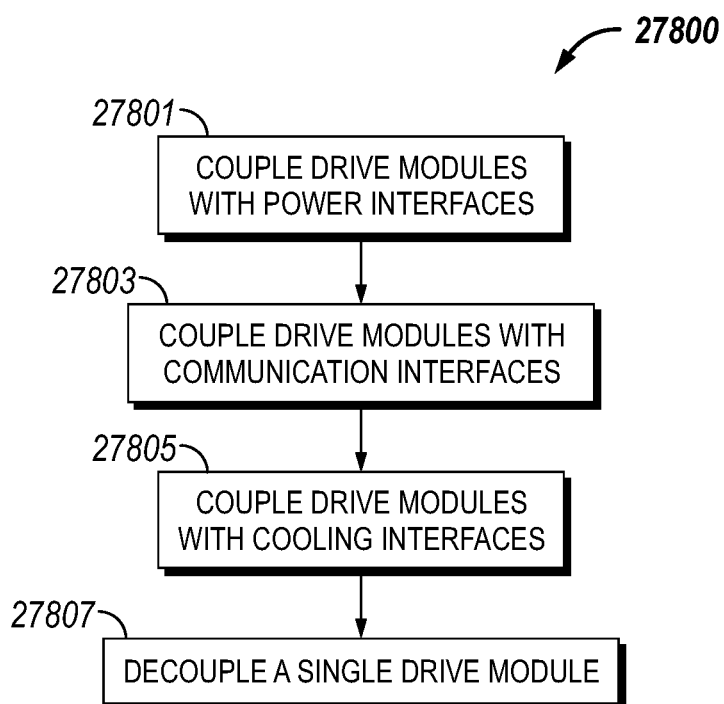

With reference to FIG. 117, there is illustrated an example process 27800 for assembling an inspection robot. Process 27800 may be implemented in whole or in part in one or more of the inspection robots or robot controllers disclosed herein. It shall be further appreciated that variations of and modifications to process 27800 are contemplated including, for example, the omission of one or more aspects of process 27800, the addition of further conditionals and operations, or the reorganization or separation of operations and conditionals into separate processes.

Process 27800 begins at operation 27801 including coupling a plurality of drive modules to a center body of the inspection robot by way of a plurality of power interfaces of the center body.

Process 27800 proceeds to operation 27803 including coupling the plurality of drive modules to the center body by way of a plurality of communication interfaces of the center body.

Process 27800 proceeds to operation 27805 including coupling the plurality of drive modules to the center body by way of a plurality of cooling fluid interfaces of the center body.

Process 27800 proceeds to operation 27807 including decoupling a first drive module of the plurality of drive modules from the center body without decoupling other drive modules of the plurality of drive modules. By individually coupling each drive module to dedicated power, communication, and cooling fluid interfaces on the center body, a drive module may be removed without altering the coupling of other drive modules.

It shall be appreciated that any or all of the foregoing features of example process 27800 may also be present in the other processes disclosed herein, such as the processes illustrated in FIGS. 117 and 117-121, to name but a few examples.

With reference to FIG. 118, there is illustrated an example process 27900 for assembling an inspection robot. Process 27900 may be implemented in whole or in part in one or more of the inspection robots or robot controllers disclosed herein. It shall be further appreciated that variations of and modifications to process 27900 are contemplated including, for example, the omission of one or more aspects of process 27900, the addition of further conditionals and operations, or the reorganization or separation of operations and conditionals into separate processes.

Process 27900 begins at operation 27901 including coupling a plurality of drive modules to a center body of the inspection robot by way of a plurality of power interfaces of the center body.

Process 27900 proceeds to operation 27903 including coupling the plurality of drive modules to the center body by way of a plurality of communication interfaces of the center body; and Process 27900 proceeds to operation 27905 including coupling the plurality of drive modules to the center body by way of a plurality of cooling fluid interfaces of the center body.

Process 27900 proceeds to operation 27907 including decoupling a first drive module of the plurality of drive modules from the corresponding power interface, communication interface, and cooling fluid interface.

Process 27900 proceeds to operation 27909 including decoupling a second drive module of the plurality of drive modules from the center body.

Process 27900 proceeds to operation 27911 including coupling the second drive module to the power interface, communication interface, and cooling fluid interface previously corresponding to the first drive module. The drive modules of the inspection robot may be swappable, in that each drive module is structured to connect to any drive module connection point of the inspection robot and to connect with the interfaces corresponding to the connection point.

It shall be appreciated that any or all of the foregoing features of example process 27900 may also be present in the other processes disclosed herein, such as the processes illustrated in FIGS. 117-118 and 119-126, to name but a few examples.

With reference to FIG. 119, there is illustrated an example process 28000 for assembling an inspection robot. Process 28000 may be implemented in whole or in part in one or more of the inspection robots or robot controllers disclosed herein. It shall be further appreciated that variations of and modifications to process 28000 are contemplated including, for example, the omission of one or more aspects of process 28000, the addition of further conditionals and operations, or the reorganization or separation of operations and conditionals into separate processes.

Process 28000 proceeds to operation 28001 including determining a number of the plurality of drive modules to couple to the center body. In certain embodiments, the number of drive modules coupled to the center body may be based on a required aggregate holding power to the inspection surface, or based on an aggregate motor power requirement, to name but a few examples.

Process 28000 proceeds to operation 28003 including selecting an interface plate of the center body in response to determining the number of the plurality of drive modules to couple to the center body. The interface plate may be selected such that the number of interfaces on the interface plate is equal to or greater than the number of interfaces required for the determined number of drive modules.

Process 28000 proceeds to operation 28005 including coupling the selected interface plate to the center body.

Process 28000 proceeds to operation 28007 including coupling a plurality of drive modules to a center body of the inspection robot by way of a plurality of power interfaces of the center body.

Process 28000 proceeds to operation 28009 including coupling the plurality of drive modules to the center body by way of a plurality of communication interfaces of the center body; and Process 28000 proceeds to operation 28011 including coupling the plurality of drive modules to the center body by way of a plurality of cooling fluid interfaces of the center body.

It shall be appreciated that any or all of the foregoing features of example process 28000 may also be present in the other processes disclosed herein, such as the processes illustrated in FIGS. 116-118 and 120-121, to name but a few examples.

With reference to FIG. 120, there is illustrated an example process 28100 for assembling an inspection robot. Process 28100 may be implemented in whole or in part in one or more of the inspection robots or robot controllers disclosed herein. It shall be further appreciated that variations of and modifications to process 28100 are contemplated including, for example, the omission of one or more aspects of process

28100, the addition of further conditionals and operations, or the reorganization or separation of operations and conditionals into separate processes.

Process 28100 begins at operation 28101 including coupling a plurality of drive modules to a center body of the inspection robot by way of a plurality of power interfaces of the center body.

Process 28100 proceeds to operation 28103 including coupling the plurality of drive modules to the center body by way of a plurality of communication interfaces of the center body; and Process 28100 proceeds to operation 28105 including coupling the plurality of drive modules to the center body by way of a plurality of cooling fluid interfaces of the center body.

Process 28100 proceeds to operation 28107 including determining an aggregate power requirement of the plurality of drive modules. In certain embodiments, the aggregate power requirement includes a torque requirement or a horsepower requirement.

Process 28100 proceeds to operation 28109 including coupling an additional drive module to the center body in response to determining the aggregate power requirement of the plurality of drive modules.

It shall be appreciated that any or all of the foregoing features of example process 28100 may also be present in the other processes disclosed herein, such as the processes illustrated in FIGS. 116-119 and 121, to name but a few examples.

With reference to FIG. 121, there is illustrated an example process 28200 for assembling an inspection robot. Process 28200 may be implemented in whole or in part in one or more of the inspection robots or robot controllers disclosed herein. It shall be further appreciated that variations of and modifications to process 28200 are contemplated including, for example, the omission of one or more aspects of process 28500, the addition of further conditionals and operations, or the reorganization or separation of operations and conditionals into separate processes.

Process 28200 begins at operation 28201 including coupling a plurality of drive modules to a center body of the inspection robot by way of a plurality of power interfaces of the center body.

Process 28200 proceeds to operation 28203 including coupling the plurality of drive modules to the center body by way of a plurality of communication interfaces of the center body; and Process 28200 proceeds to operation 28205 including coupling the plurality of drive modules to the center body by way of a plurality of cooling fluid interfaces of the center body.

Process 28200 proceeds to operation 28207 including determining an aggregate holding power of the plurality of drive modules to an inspection surface.

Process 28200 proceeds to operation 28209 including coupling an additional drive module to the center body in response to determining the aggregate holding power of the plurality of drive modules. For example, the aggregate holding power may be insufficient to magnetically couple the inspection robot to an inspection surface, and an additional drive module is added to the inspection robot in order to increase the aggregate holding power.

It shall be appreciated that any or all of the foregoing features of example process 28200 may also be present in the other processes disclosed herein, such as the processes illustrated in FIGS. 116-120-124, to name but a few examples.

Figure 130:
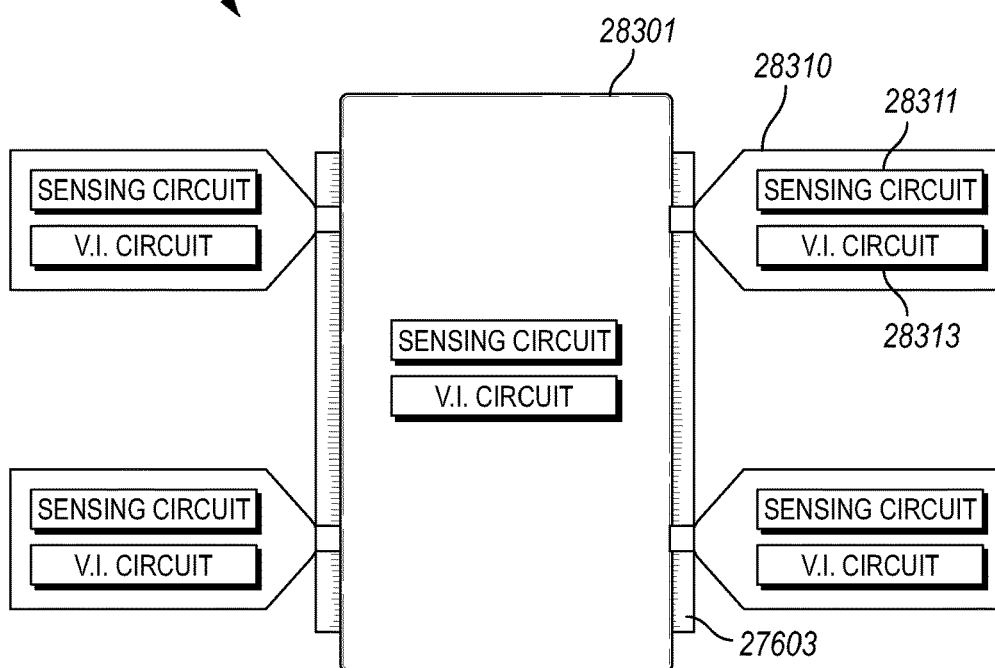

With reference to FIG. 130, there is a box diagram illustrating an example inspection robot 28300. Robot 28300 includes a center body 28301 and a plurality of drive modules coupled to center body 28301, such as drive module 28310. Each drive module includes a sensing circuit and a visual indicator circuit, such as sensing circuit 28311 and visual indicator circuit 28313 of drive module 28310.

Sensing circuit 28311 is structured to measure a drive module operating characteristic of drive module 28310. In certain embodiments, sensing circuit 28311 includes a temperature sensing device. The drive module operating characteristic may include a power electronics temperature, a cooling fluid temperature, or an ambient temperature. In certain embodiments, the drive module operating characteristic may include a voltage, a current, a vibration, or a humidity, to name but a few examples. In certain embodiments, sensing circuit 28311 includes a current sensing device structured to measure an electric current of the drive module, such as a motor drive current, to name but one example.

Visual indicator circuit 28313 is structured to output a visual indicator corresponding to the drive module operating characteristic. Visual indicator circuit 28313 may coordinate with the other visual indicator circuit so as to simultaneously output visual indicators corresponding to the same type of drive module operating characteristic. The visual indicator circuits of the plurality of drive modules are positioned to be simultaneously visible at a point of view. The point of view may be the point of view of a user or the point of view of sensing device, such as a camera or light sensor, to name but a few examples.

In certain embodiments, the visual indicator for each drive module is based on a gradient of the drive module operating characteristic. In certain embodiments, the visual indicator corresponds to a temperature or a temperature gradient of drive module 28310. In certain embodiments, the visual indicator corresponds to a current of drive module 28310.

In certain embodiments, visual indicator circuit 28313 includes a light source structured to output the visual indicator. The light source may include a light bulb, a light emitting diode, or a graphic display, to name but a few examples.

In the illustrated embodiment, center body 28301 also includes a sensing circuit and a visual indicator circuit structured to output a visual indicator based on a robot operating characteristic.

It shall be appreciated that any or all of the foregoing features of circuits 28311 and 28313 may also be present in the other sensing circuit and visual indicator circuits of inspection robot 28300.

In certain embodiments, a camera of an inspection robot controller is located at the point of view, and inspection robot 28300 is structured to receive a command from the inspection robot controller in response to the visual indicators for the plurality of drive modules.

It shall be appreciated that any or all of the foregoing features of inspection robot 28300 may also be present in the other inspection robots disclosed herein.

Figure 122:
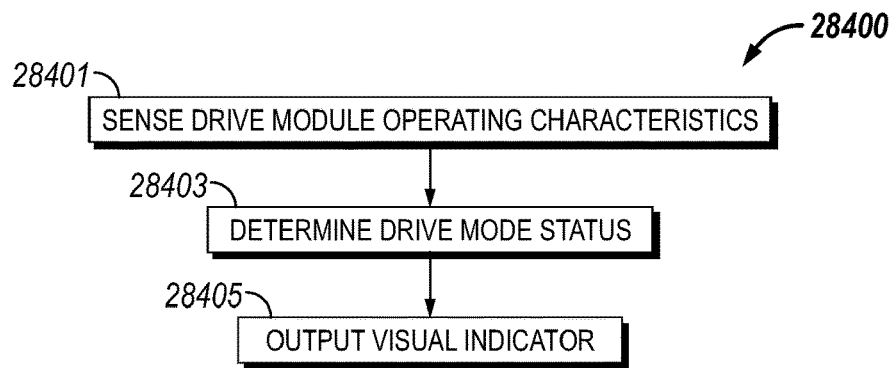

With reference to FIG. 122, there is illustrated an example process 28400 for visualizing inspection robot statuses. Process 28400 may be implemented in whole or in part in one or more of the inspection robots disclosed herein. It shall be further appreciated that variations of and modifications to process 28400 are contemplated including, for example, the omission of one or more aspects of process 28400, the addition of further conditionals and operations, or the reorganization or separation of operations and conditionals into separate processes.

Process 28400 begins at operation 28401 including sensing a plurality of drive module operating characteristics, each of the plurality of drive module operating characteristics corresponding to a drive module of a plurality of drive modules of an inspection robot. In certain embodiments, the plurality of drive module operating characteristics includes an electric current or a temperature for each of the plurality of drive modules.

Process 28400 proceeds to operation 28403 including determining a drive module status for each drive module of the plurality of drive modules in response to the plurality of drive module operating characteristics. In certain embodiments, the drive module status for each drive module of the plurality of drive modules includes a direction of movement, a temperature gradient, a temperature, a current gradient, a current magnitude, a fault condition, or a predictive fault condition.

Process 28400 proceeds to operation 28405 including outputting a visual indicator from each drive module of the plurality of drive modules, the visual indicator corresponding to the drive module status for the corresponding drive module.

In certain embodiments, outputting the visual indicator from each drive module of the plurality of drive modules includes outputting the visual indicator for a first drive module corresponding to a predictive fault condition of the first drive module.

In certain embodiments, outputting the visual indicator from each drive module of the plurality of drive modules includes simultaneously outputting the visual indicator from each drive module of the plurality of drive modules. In certain embodiments, the visual indicator from each drive module of the plurality of drive modules corresponds to a current gradient or a temperature gradient of the corresponding drive module.

Figure 123:
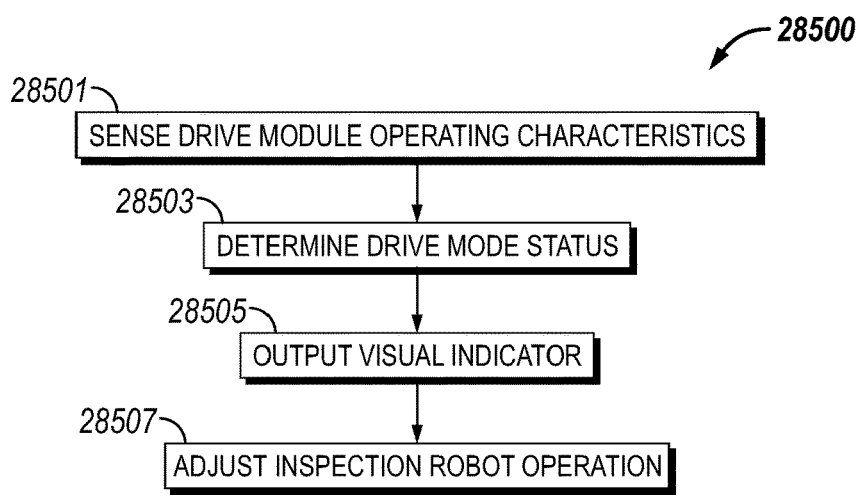
Figure 124:
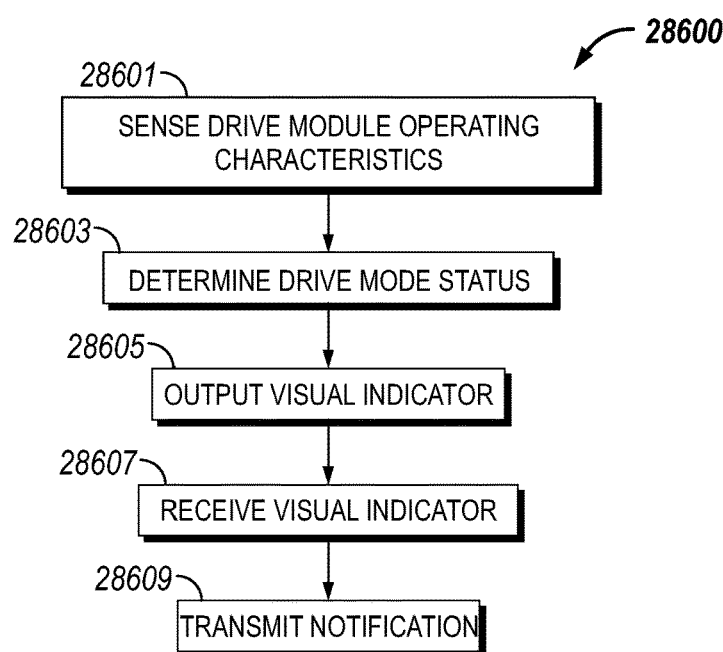

It shall be appreciated that any or all of the foregoing features of example process 28400 may also be present in the other processes disclosed herein, such as the processes illustrated in FIGS. 123-124, to name but a few examples.

With reference to FIG. 123, there is illustrated an example process 28500 for visualizing inspection robot statuses. Process 28500 may be implemented in whole or in part in one or more of the inspection robots disclosed herein. It shall be further appreciated that variations of and modifications to process 28500 are contemplated including, for example, the omission of one or more aspects of process 28500, the addition of further conditionals and operations, or the reorganization or separation of operations and conditionals into separate processes.

Process 28500 begins at operation 28501 including sensing a plurality of drive module operating characteristics, each of the plurality of drive module operating characteristics corresponding to a drive module of a plurality of drive modules of an inspection robot.

Process 28500 proceeds to operation 28503 including determining a drive module status for each drive module of the plurality of drive modules in response to the plurality of drive module operating characteristics.

Process 28500 proceeds to operation 28505 including outputting a visual indicator from each drive module of the plurality of drive modules, the visual indicator corresponding to the drive module status for the corresponding drive module.

Process 28500 proceeds to operation 28507 including adjusting an inspection robot operation in response to the outputting the visual indicator from each drive module of the plurality of drive modules. In certain embodiments, adjusting the inspection robot operation includes adjusting a coolant flow rate, adjusting a motor speed of at least one of the plurality of drive modules, or adjusting a direction of movement for at least one of the plurality of drive modules.

It shall be appreciated that any or all of the foregoing features of example process 28500 may also be present in the other processes disclosed herein, such as the processes illustrated in FIGS. 121 and 124, to name but a few examples.

With reference to FIG. 124, there is illustrated an example process 28600 for visualizing inspection robot statuses. Process 28600 may be implemented in whole or in part in one or more of the inspection robots disclosed herein. It shall be further appreciated that variations of and modifications to process 28600 are contemplated including, for example, the omission of one or more aspects of process 28600, the addition of further conditionals and operations, or the reorganization or separation of operations and conditionals into separate processes.

Process 28600 begins at operation 28601 including sensing a plurality of drive module operating characteristics, each of the plurality of drive module operating characteristics corresponding to a drive module of a plurality of drive modules of an inspection robot.

Process 28600 proceeds to operation 28603 including determining a drive module status for each drive module of the plurality of drive modules in response to the plurality of drive module operating characteristics.

Process 28600 proceeds to operation 28605 including outputting a visual indicator from each drive module of the plurality of drive modules, the visual indicator corresponding to the drive module status for the corresponding drive module.

Process 28600 proceeds to operation 28607 including receiving the visual indicator from each drive module of the plurality of drive modules.

Process 28600 proceeds to operation 28609 including transmitting a notification in response to receiving the visual indicator from each drive module of the plurality of drive modules.

It shall be appreciated that any or all of the foregoing features of example process 28600 may also be present in the other processes disclosed herein, such as the processes illustrated in FIGS. 122-124, to name but a few examples.

Any one or more of the terms computer, computing device, processor, circuit, controller, and/or server include a computer of any type, capable to access instructions stored in communication thereto such as upon a non-transient computer readable medium, whereupon the computer performs operations of systems or methods described herein upon executing the instructions. In certain embodiments, such instructions themselves comprise a computer, computing device, processor, circuit, controller, and/or server. Additionally or alternatively, a computer, computing device, processor, circuit, controller, and/or server may be a separate hardware device, one or more computing resources distributed across hardware devices, and/or may include such aspects as logical circuits, embedded circuits, sensors, actuators, input and/or output devices, network and/or communication resources, memory resources of any type, processing resources of any type, and/or hardware devices configured to be responsive to determined conditions to functionally execute one or more operations of systems and methods herein.

Elements of the present disclosure are described in a particular arrangement and context for clarity of the present description. For example, controllers and/or circuits are depicted as a single component positioned within a given system. However, any components may be distributed in whole or part, for example a circuit positioned on more than one controller, electronic board, or the like. In certain embodiments, the distributed elements cooperate to perform selected operations of the circuit and/or controller, and accordingly the circuit and/or controller is embodied in the group of distributed elements for such embodiments. In certain embodiments, for example based upon specific operating conditions, the presence of a fault and/or component failure, alternative elements may be utilized to perform one or more operations of the circuit and/or controller (e.g., using a drive motor monitor of a drive module where an encoder is not present, and/or where the encoder is not operational), and accordingly the circuit and/or controller may be further embodied in the alternative elements, and/or embodied in primary elements at a first time, and embodied (at least in part) in alternative elements at a second time.

Certain operations described herein include interpreting, receiving, and/or determining one or more values, parameters, inputs, data, or other information. Operations including interpreting, receiving, and/or determining any value parameter, input, data, and/or other information include, without limitation: receiving data via a user input; receiving data over a network of any type; reading a data value from a memory location in communication with the receiving device; utilizing a default value as a received data value; estimating, calculating, or deriving a data value based on other information available to the receiving device; and/or updating any of these in response to a later received data value. In certain embodiments, a data value may be received by a first operation, and later updated by a second operation, as part of the receiving a data value. For example, when communications are down, intermittent, or interrupted, a first operation to interpret, receive, and/or determine a data value may be performed, and when communications are restored an updated operation to interpret, receive, and/or determine the data value may be performed.

Certain logical groupings of operations herein, for example methods or procedures of the current disclosure, are provided to illustrate aspects of the present disclosure. Operations described herein are schematically described and/or depicted, and operations may be combined, divided, re-ordered, added, or removed in a manner consistent with the disclosure herein. It is understood that the context of an operational description may require an ordering for one or more operations, and/or an order for one or more operations may be explicitly disclosed, but the order of operations should be understood broadly, where any equivalent grouping of operations to provide an equivalent outcome of operations is specifically contemplated herein. For example, if a value is used in one operational step, the determining of the value may be required before that operational step in certain contexts (e.g., where the time delay of data for an operation to achieve a certain effect is important), but may not be required before that operation step in other contexts (e.g., where usage of the value from a previous execution cycle of the operations would be sufficient for those purposes). Accordingly, in certain embodiments an order of operations and grouping of operations as described is explicitly contemplated herein, and in certain embodiments re-ordering, subdivision, and/or different grouping of operations is explicitly contemplated herein.

Numerous embodiments described throughout the present disclosure are well suited to successfully execute inspections of inspection surfaces having flat and/or varying curvature geometries. For example, payload arrangements described herein allow for freedom of movement of sensor sleds to maintain operational contact with the inspection surface over the entire inspection surface space. Additionally, control of the inspection robot movement with positional interaction, including tracking inspection surface positions that have been inspected, determining the position of the inspection robot using dead reckoning, encoders, and/or absolute position detection, allows for assurance that the entire inspection surface is inspected according to a plan, and that progression across the surface can be performed without excessive repetition of movement. Additionally, the ability of the inspection robot to determine which positions have been inspected, to utilize transformed conceptualizations of the inspection surface, and the ability of the inspection robot to reconfigure (e.g., payload arrangements, physical sensor arrangements, down force applied, and/or to raise payloads), enable and/or disable sensors and/or data collection, allows for assurance that the entire inspection surface is inspected without excessive data collection and/or utilization of couplant. Additionally, the ability of the inspection robot to traverse between distinct surface orientations, for example by lifting the payloads and/or utilizing a stability support device, allows the inspection robot to traverse distinct surfaces, such as surfaces within a tank interior, surfaces in a pipe bend, or the like. Additionally, embodiments set forth herein allow for an inspection robot to traverse a pipe or tank interior or exterior in a helical path, allowing for an inspection having a selected inspection resolution of the inspection surface within a single pass (e.g., where representative points are inspected, and/or wherein the helical path is selected such that the horizontal width of the sensors overlaps and/or is acceptably adjacent on subsequent spirals of the helical path).

It can be seen that various embodiments herein provide for an inspection robot capable to inspect a surface such as an interior of a pipe and/or an interior of a tank. Additionally, embodiments of an inspection robot herein are operable at elevated temperatures relative to acceptable temperatures for personnel, and operable in composition environments (e.g., presence of $CO_2$, low oxygen, etc.) that are not acceptable to personnel. Additionally, in certain embodiments, entrance of an inspection robot into certain spaces may be a trivial operation, where entrance of a person into the space may require exposure to risk, and/or require extensive preparation and verification (e.g., lock-out/tag-out procedures, confined space procedures, exposure to height procedures, etc.). Accordingly, embodiments throughout the present disclosure provide for improved cost, safety, capability, and/or completion time of inspections relative to previously known systems or procedures.

The methods and systems described herein may be deployed in part or in whole through a machine having a computer, computing device, processor, circuit, and/or server that executes computer readable instructions, program codes, instructions, and/or includes hardware configured to functionally execute one or more operations of the methods and systems disclosed herein. The terms computer, computing device, processor, circuit, and/or server, as utilized herein, should be understood broadly.

Any one or more of the terms computer, computing device, processor, circuit, and/or server include a computer of any type, capable to access instructions stored in communication thereto such as upon a non-transient computer readable medium, whereupon the computer performs operations of systems or methods described herein upon executing the instructions. In certain embodiments, such instructions themselves comprise a computer, computing device, processor, circuit, and/or server. Additionally or alternatively, a computer, computing device, processor, circuit, and/or server may be a separate hardware device, one or more computing resources distributed across hardware devices, and/or may include such aspects as logical circuits, embedded circuits, sensors, actuators, input and/or output devices, network and/or communication resources, memory resources of any type, processing resources of any type, and/or hardware devices configured to be responsive to determined conditions to functionally execute one or more operations of systems and methods herein.

Network and/or communication resources include, without limitation, local area network, wide area network, wireless, internet, or any other known communication resources and protocols. Example and non-limiting hardware, computers, computing devices, processors, circuits, and/or servers include, without limitation, a general purpose computer, a server, an embedded computer, a mobile device, a virtual machine, and/or an emulated version of one or more of these. Example and non-limiting hardware, computers, computing devices, processors, circuits, and/or servers may be physical, logical, or virtual. A computer, computing device, processor, circuit, and/or server may be: a distributed resource included as an aspect of several devices; and/or included as an interoperable set of resources to perform described functions of the computer, computing device, processor, circuit, and/or server, such that the distributed resources function together to perform the operations of the computer, computing device, processor, circuit, and/or server. In certain embodiments, each computer, computing device, processor, circuit, and/or server may be on separate hardware, and/or one or more hardware devices may include aspects of more than one computer, computing device, processor, circuit, and/or server, for example as separately executable instructions stored on the hardware device, and/or as logically partitioned aspects of a set of executable instructions, with some aspects of the hardware device comprising a part of a first computer, computing device, processor, circuit, and/or server, and some aspects of the hardware device comprising a part of a second computer, computing device, processor, circuit, and/or server.

A computer, computing device, processor, circuit, and/or server may be part of a server, client, network infrastructure, mobile computing platform, stationary computing platform, or other computing platform. A processor may be any kind of computational or processing device capable of executing program instructions, codes, binary instructions and the like. The processor may be or include a signal processor, digital processor, embedded processor, microprocessor, or any variant such as a co-processor (math co-processor, graphic co-processor, communication co-processor and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more threads. The thread may spawn other threads that may have assigned priorities associated with them; the processor may execute these threads based on priority or any other order based on instructions provided in the program code. The processor may include memory that stores methods, codes, instructions, and programs as described herein and elsewhere. The processor may access a storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache, and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer readable instructions on a server, client, firewall, gateway, hub, router, or other such computer and/or networking hardware. The computer readable instructions may be associated with a server that may include a file server, print server, domain server, internet server, intranet server and other variants such as secondary server, host server, distributed server, and the like. The server may include one or more of memories, processors, computer readable transitory and/or non-transitory media, storage media, ports (physical and virtual), communication devices, and interfaces capable of accessing other servers, clients, machines, and devices through a wired or a wireless medium, and the like. The methods, programs, or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers, and the like. Additionally, this coupling and/or connection may facilitate remote execution of instructions across the network. The networking of some or all of these devices may facilitate parallel processing of program code, instructions, and/or programs at one or more locations without deviating from the scope of the disclosure. In addition, all the devices attached to the server through an interface may include at least one storage medium capable of storing methods, program code, instructions, and/or programs. A central repository may provide program instructions to be executed on different devices. In this implementation, the remote repository may act as a storage medium for methods, program code, instructions, and/or programs.

The methods, program code, instructions, and/or programs may be associated with a client that may include a file client, print client, domain client, internet client, intranet client and other variants such as secondary client, host client, distributed client, and the like. The client may include one or more of memories, processors, computer readable transitory and/or non-transitory media, storage media, ports (physical and virtual), communication devices, and interfaces capable of accessing other clients, servers, machines, and devices through a wired or a wireless medium, and the like. The methods, program code, instructions, and/or programs as described herein and elsewhere may be executed by the client. In addition, other devices utilized for execution of methods as described in this application may be considered as a part of the infrastructure associated with the client.

The client may provide an interface to other devices including, without limitation, servers, other clients, printers, database servers, print servers, file servers, communication servers, distributed servers, and the like. Additionally, this coupling and/or connection may facilitate remote execution of methods, program code, instructions, and/or programs across the network. The networking of some or all of these devices may facilitate parallel processing of methods, program code, instructions, and/or programs at one or more locations without deviating from the scope of the disclosure. In addition, all the devices attached to the client through an interface may include at least one storage medium capable of storing methods, program code, instructions, and/or programs. A central repository may provide program instructions to be executed on different devices. In this implementation, the remote repository may act as a storage medium for methods, program code, instructions, and/or programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules, and/or components as known in the art. The computing and/or non-computing device(s) associated with the network infrastructure may include, apart from other components, a storage medium such as flash memory, buffer, stack, RAM, ROM, and the like. The methods, program code, instructions, and/or programs described herein and elsewhere may be executed by one or more of the network infrastructural elements.

The methods, program code, instructions, and/or programs described herein and elsewhere may be implemented on a cellular network having multiple cells. The cellular network may either be frequency division multiple access (FDMA) network or code division multiple access (CDMA) network. The cellular network may include mobile devices, cell sites, base stations, repeaters, antennas, towers, and the like.

The methods, program code, instructions, and/or programs described herein and elsewhere may be implemented on or through mobile devices. The mobile devices may include navigation devices, cell phones, mobile phones, mobile personal digital assistants, laptops, palmtops, netbooks, pagers, electronic books readers, music players, and the like. These mobile devices may include, apart from other components, a storage medium such as a flash memory, buffer, RAM, ROM and one or more computing devices. The computing devices associated with mobile devices may be enabled to execute methods, program code, instructions, and/or programs stored thereon. Alternatively, the mobile devices may be configured to execute instructions in collaboration with other devices. The mobile devices may communicate with base stations interfaced with servers and configured to execute methods, program code, instructions, and/or programs. The mobile devices may communicate on a peer to peer network, mesh network, or other communications network. The methods, program code, instructions, and/or programs may be stored on the storage medium associated with the server and executed by a computing device embedded within the server. The base station may include a computing device and a storage medium. The storage device may store methods, program code, instructions, and/or programs executed by the computing devices associated with the base station.

The methods, program code, instructions, and/or programs may be stored and/or accessed on machine readable transitory and/or non-transitory media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g., USB sticks or keys), floppy disks, magnetic tape, paper tape, punch cards, stand-alone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

Certain operations described herein include interpreting, receiving, and/or determining one or more values, parameters, inputs, data, or other information. Operations including interpreting, receiving, and/or determining any value parameter, input, data, and/or other information include, without limitation: receiving data via a user input; receiving data over a network of any type; reading a data value from a memory location in communication with the receiving device; utilizing a default value as a received data value; estimating, calculating, or deriving a data value based on other information available to the receiving device; and/or updating any of these in response to a later received data value. In certain embodiments, a data value may be received by a first operation, and later updated by a second operation, as part of the receiving a data value. For example, when communications are down, intermittent, or interrupted, a first operation to interpret, receive, and/or determine a data value may be performed, and when communications are restored an updated operation to interpret, receive, and/or determine the data value may be performed.

Certain logical groupings of operations herein, for example methods or procedures of the current disclosure, are provided to illustrate aspects of the present disclosure. Operations described herein are schematically described and/or depicted, and operations may be combined, divided, re-ordered, added, or removed in a manner consistent with the disclosure herein. It is understood that the context of an operational description may require an ordering for one or more operations, and/or an order for one or more operations may be explicitly disclosed, but the order of operations should be understood broadly, where any equivalent grouping of operations to provide an equivalent outcome of operations is specifically contemplated herein. For example, if a value is used in one operational step, the determining of the value may be required before that operational step in certain contexts (e.g. where the time delay of data for an operation to achieve a certain effect is important), but may not be required before that operation step in other contexts (e.g. where usage of the value from a previous execution cycle of the operations would be sufficient for those purposes). Accordingly, in certain embodiments an order of operations and grouping of operations as described is explicitly contemplated herein, and in certain embodiments re-ordering, subdivision, and/or different grouping of operations is explicitly contemplated herein.

The methods and systems described herein may transform physical and/or or intangible items from one state to another.

The methods and systems described herein may also transform data representing physical and/or intangible items from one state to another.

The elements described and depicted herein, including in flow charts, block diagrams, and/or operational descriptions, depict and/or describe specific example arrangements of elements for purposes of illustration. However, the depicted and/or described elements, the functions thereof, and/or arrangements of these, may be implemented on machines, such as through computer executable transitory and/or non-transitory media having a processor capable of executing program instructions stored thereon, and/or as logical circuits or hardware arrangements. Example arrangements of programming instructions include at least: monolithic structure of instructions; standalone modules of instructions for elements or portions thereof; and/or as modules of instructions that employ external routines, code, services, and so forth; and/or any combination of these, and all such implementations are contemplated to be within the scope of embodiments of the present disclosure Examples of such machines include, without limitation, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers and the like. Furthermore, the elements described and/or depicted herein, and/or any other logical components, may be implemented on a machine capable of executing program instructions. Thus, while the foregoing flow charts, block diagrams, and/or operational descriptions set forth functional aspects of the disclosed systems, any arrangement of program instructions implementing these functional aspects are contemplated herein. Similarly, it will be appreciated that the various steps identified and described above may be varied, and that the order of steps may be adapted to particular applications of the techniques disclosed herein. Additionally, any steps or operations may be divided and/or combined in any manner providing similar functionality to the described operations. All such variations and modifications are contemplated in the present disclosure. The methods and/or processes described above, and steps thereof, may be implemented in hardware, program code, instructions, and/or programs or any combination of hardware and methods, program code, instructions, and/or programs suitable for a particular application. Example hardware includes a dedicated computing device or specific computing device, a particular aspect or component of a specific computing device, and/or an arrangement of hardware components and/or logical circuits to perform one or more of the operations of a method and/or system. The processes may be implemented in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and computer readable instructions, or any other machine capable of executing program instructions.

Thus, in one aspect, each method described above, and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or computer readable instructions described above. All such permutations and combinations are contemplated in embodiments of the present disclosure.

What is claimed is:

1. An apparatus, comprising:
   an inspection description circuit structured to interpret an inspection definition value;
   a payload status circuit structured to provide a payload identification value in response to at least one of a payload specific configuration or signals from a payload of an inspection robot;
   an inspection integrity circuit structured to determine an inspection description value in response to the inspection definition value and the payload identification value; and
   an inspection reporting circuit structured to communicate the inspection description value to an external device.

2. The apparatus of claim 1, wherein the inspection definition value comprises at least one value selected from the values consisting of:
   a sensor type value;
   a sensor identifier;
   a sensor calibration value;
   a sensor processing description;
   an inspection resolution value; and
   a sensor diagnostic value.

3. The apparatus of claim 1, further comprising a drive module status circuit structured to provide a drive module status value in response to communications with a drive module of the inspection robot,
   wherein the inspection integrity circuit is further structured to determine the inspection description value in response to the drive module status value, and
   wherein the inspection definition value comprises at least one of an inspection surface coverage value or an inspection execution value.

4. The apparatus of claim 1, further comprising an encoder status circuit structured to provide an inspection position value in response to communications with an encoder of the inspection robot,
   wherein the inspection integrity circuit is further structured to determine the inspection description value in response to the inspection position value, and
   wherein the inspection definition value comprises at least one of an inspection surface coverage value or an inspection execution value.

5. The apparatus of claim 1, wherein the inspection definition value comprises at least one value selected from the values consisting of:
   an inspection certification value;

an inspection data integrity value;
a sensor diagnostic value;
a drive module diagnostic value; and
an encoder diagnostic value.

6. The apparatus of claim 1, wherein the inspection definition value comprises at least one value selected from the values consisting of:
a calibration version value;
a processing algorithm version value;
a diagnostic version value; and
a control algorithm version value.

7. The apparatus of claim 1, wherein the inspection description value comprises at least one value selected from the values consisting of:
a sensing execution description;
a motive operation execution description;
a diagnostic execution description;
a data communication execution description; and
a couplant delivery execution description.

8. The apparatus of claim 1, wherein the external device at least one device selected from the devices consisting of:
a base station computing device;
a facility computing device;
a computing device communicatively coupled to the inspection robot;
a data acquisition circuit positioned within a housing of the inspection robot, wherein the data acquisition circuit is communicatively coupled to the inspection robot; and
a cloud based computing device communicatively coupled to the inspection robot.

9. The apparatus of claim 1, wherein the inspection definition value comprises at least one value selected from the values consisting of:
a sensor calibration value,
a sensor identifier,
a sensor type value,
a drive module identifier,
a drive module calibration value,
a drive module type value,
a control board identifier, and
a control board type value.

10. The apparatus of claim 1, wherein the apparatus receives an identification verification value in response to communicating the inspection description value to the external device.

11. The apparatus of claim 1, wherein the apparatus receives a calibration verification value in response to communicating the inspection description value to the external device.

12. The apparatus of claim 1, wherein the apparatus receives a type value verification value in response to communicating the inspection description value to the external device.

13. The apparatus of claim 1, wherein the inspection description value comprises at least one value selected from the values consisting of:
a sensor usage value,
a control board usage value, and
a drive module usage value.

14. A method, comprising:
interpreting an inspection definition value, wherein interpreting the inspection definition value further comprises determining at least one of an inspection surface coverage value or an inspection execution value;
providing a payload identification value in response to at least one of a payload specific configuration or signals from a payload of an inspection robot;
determining an inspection description value in response to the inspection definition value and the payload identification value;
determining a drive module status value in response to the at least one of the inspection surface coverage value or the inspection execution value;
determining the inspection description value further in response to the drive module status value; and
communicating the inspection description value to an external device.

15. The method of claim 14, wherein interpreting the inspection definition value further comprises determining at least one of:
a sensor type value;
a sensor identifier;
a sensor calibration value;
a sensor processing description;
an inspection resolution value; or
a sensor diagnostic value.

16. The method of claim 14, further comprising:
determining an encoder status value in response to the at least one of the inspection surface coverage value or the inspection execution value; and
determining the inspection description value further in response to the encoder status value.

* * * * *

UNITED STATES PATENT AND TRADEMARK OFFICE
CERTIFICATE OF CORRECTION

| | | |
|---|---|---|
| PATENT NO. | : 11,992,935 B2 | |
| APPLICATION NO. | : 17/752059 | |
| DATED | : May 28, 2024 | |
| INVENTOR(S) | : Bryner et al. | |

It is certified that error appears in the above-identified patent and that said Letters Patent is hereby corrected as shown below:

In the Drawings

Sheet 77 of 87, Fig. 111, reference numeral 268104, Line 1, delete "268104" and insert --26804-- therefor In the Specification In Column 91, Line 46, delete "250008" and insert --25008-- therefor In Column 97, Line 22, after "command", insert --.--

In Column 97, Line 29, after "limits", insert --.--

Signed and Sealed this
Twentieth Day of August, 2024

Katherine Kelly Vidal
*Director of the United States Patent and Trademark Office*